US008649226B2

(12) United States Patent
Torii

(10) Patent No.: US 8,649,226 B2
(45) Date of Patent: Feb. 11, 2014

(54) NONVOLATILE SEMICONDUCTOR MEMORY DEVICE AND ERASING METHOD OF NONVOLATILE SEMICONDUCTOR MEMORY DEVICE

(75) Inventor: Satoshi Torii, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/479,620

(22) Filed: May 24, 2012

(65) Prior Publication Data

US 2012/0230120 A1 Sep. 13, 2012

Related U.S. Application Data

(63) Continuation of application No. PCT/JP2009/069974, filed on Nov. 26, 2009.

(51) Int. Cl.
*G11C 11/34* (2006.01)

(52) U.S. Cl.
USPC ................................ 365/185.29; 365/185.24

(58) Field of Classification Search
USPC ....................................... 365/185.29, 185.24
See application file for complete search history.

(56) References Cited

U.S. PATENT DOCUMENTS 6,243,292 B1 6/2001 Kobayashi et al.
6,314,022 B1 11/2001 Kawata et al.
6,339,549 B1 1/2002 Jinbo et al.
2005/0195636 A1 9/2005 Umezawa et al.
2005/0218460 A1 10/2005 Hasegawa et al.
2007/0040210 A1 2/2007 Matsunaga
2008/0285345 A1* 11/2008 Shibata et al. ........... 365/185.05
2009/0073766 A1* 3/2009 Shibata .................... 365/185.03
2009/0078985 A1* 3/2009 Shukuri ........................ 257/316

FOREIGN PATENT DOCUMENTS

JP 62-23149 A 1/1987
JP 11-87658 A 3/1999
JP 2000-235797 A 8/2000
JP 2001-28429 A 1/2001
JP 2001-210808 A 8/2001
JP 2001-319489 A 11/2001

(Continued)

OTHER PUBLICATIONS

International Search Report of PCT/JP2009/069974, mailing date of Feb. 23, 2010.

(Continued)

*Primary Examiner* — Michael Tran
(74) *Attorney, Agent, or Firm* — Westerman, Hattori, Daniels & Adrian, LLP

(57) ABSTRACT

A nonvolatile semiconductor memory device including a first bit line commonly coupling drain sides memory cells; a word line commonly coupling control gates of memory cell transistors; a column decoder coupled to a second bit line; a row decoder coupled to a word line; a first transistor having a source coupled to the first bit line and having a drain electrically coupled to the column decoder via the second bit line; and a first control unit for controlling potential of a gate of the first transistor, the memory cell transistor being formed over a first well, the first transistor being formed over a second well electrically isolated from the first well, a film thickness of a gate insulation film of the first transistor being smaller than that of a gate insulation film of a second transistor formed in the row decoder and coupled to the word line.

13 Claims, 80 Drawing Sheets

(56) References Cited

FOREIGN PATENT DOCUMENTS

| | | | |
|---|---|---|---|
| JP | 2004-31568 | A | 1/2004 |
| JP | 2004-228396 | A | 8/2004 |
| JP | 2005-136038 | A | 5/2005 |
| JP | 2005-158167 | A | 6/2005 |
| JP | 2005-183769 | A | 7/2005 |
| JP | 2005-268621 | A | 9/2005 |
| KR | 1999-0029125 | A | 4/1999 |
| KR | 10-0815303 | | 3/2008 |

OTHER PUBLICATIONS

Korean Office Action dated Jun. 25, 2013, issued in corresponding Korean Patent Application No. 10-2012-7007944, w/ English translation.

* cited by examiner

FIG. 6

| | COLUMN DECODER | ROW DECODER | SECTOR SELECT TRANSISTOR | CONTROL CIRCUIT | SECOND VOLTAGE APPLICATION CIRCUIT | FIRST VOLTAGE APPLICATION CIRCUIT | SENSE AMPLIFIER |
|---|---|---|---|---|---|---|---|
| USED TRANSISTOR | 5V Tr | 10V Tr | 5V Tr | 5V Tr | 5V Tr | 10V Tr | 5V Tr |
| VOLTAGE RESISTANCE OF TRANSISTOR | 8V | 12V | 8V | 8V | 8V | 12V | 8V |
| FILM THICKNESS OF GATE INSULATION FILM | 11nm | 16nm | 11nm | 11nm | 11nm | 16nm | 11nm |

FIG. 7

| | SSL11 | SSL12 | SSL21 | SSL22 | MBL1 | MBL2 | WL11 | WL12 | WL21 | WL22 | $V_{B2}$ | $V_{B1}$ |
|---|---|---|---|---|---|---|---|---|---|---|---|---|
| READ | 1.8V | 0V | 0V | 0V | 0.5V | 0.5V | 4.5V | 0V | 0V | 0V | 0V | 0V |
| WRITE | 5V | 0V | 0V | 0V | 4V | 0V | 9V | 0V | 0V | 0V | 0V | 0V |
| ERASE | 5V | 5V | 5V | 5V | F | F | −9V | −9V | F | F | 5V | 9V |

FIG. 33

| | COLUMN DECODER | FIRST ROW DECODER | SECOND ROW DECODER | THIRD ROW DECODER | VOLTAGE BUFFER TRANSISTOR | SECTOR SELECT TRANSISTOR | FIRST CONTROL CIRCUIT/ SECOND CONTROL CIRCUIT | FIRST VOLTAGE APPLICATION CIRCUIT/ SECOND VOLTAGE APPLICATION CIRCUIT | THIRD VOLTAGE APPLICATION CIRCUIT | SENSE AMPLIFIER |
|---|---|---|---|---|---|---|---|---|---|---|
| USED TRANSISTOR | 1.8V Tr | 10V Tr | 1.8V Tr | 10V Tr | 1.8V Tr | 3V Tr | 3V Tr | 10V Tr | 3V Tr | 1.8V Tr |
| VOLTAGE RESISTANCE OF TRANSISTOR | 3V | 12V | 3V | 12V | 3V | 6V | 6V | 12V | 6V | 3V |
| FILM THICKNESS OF GATE INSULATION FILM | 3nm | 16nm | 3nm | 16nm | 3nm | 6nm | 6nm | 16nm | 6nm | 3nm |

FIG. 34A

| | BG | $V_{B3}$ | SSL11 | SSL12 | SSL21 | SSL22 | MBL1 | MBL2 | $V_{B2}$ | $V_{B1}$ | SL11 | SL21 |
|---|---|---|---|---|---|---|---|---|---|---|---|---|
| READ | 1.8V | 0V | 1.8V | 0V | 0V | 0V | 0.5V | 0.5V | 0V | 0V | 0V | 0V |
| WRITE | 3V | 0V | 3V | 0V | 0V | 0V | 0V | F | 0V | 0V | 5.5V | F |
| ERASE | 3V | 3V | 5V | 5V | 5V | 5V | F | F | 6V | 9V | F | F |

FIG. 34B

| | SG11 | SG12 | SG21 | SG22 | CG11 | CG12 | CG21 | CG22 |
|---|---|---|---|---|---|---|---|---|
| READ | 1.8V | 0V | 0V | 0V | ALWAYS 1.8 V | | | |
| WRITE | 2.5V | 0V | 0V | 0V | 9V | 0V | 0V | 0V |
| ERASE | F | F | F | F | −9V | −9V | F | F |

FIG. 58

| | COLUMN DECODER | FIRST ROW DECODER | SECOND ROW DECODER | THIRD ROW DECODER | VOLTAGE BUFFER TRANSISTOR | SECTOR SELECT TRANSISTOR | FIRST CONTROL CIRCUIT/ SECOND CONTROL CIRCUIT | SECOND VOLTAGE APPLICATION CIRCUIT | FIRST VOLTAGE APPLICATION CIRCUIT | SENSE AMPLIFIER |
|---|---|---|---|---|---|---|---|---|---|---|
| USED TRANSISTOR | 1.8V Tr | 10V Tr | 1.8V Tr | 10V Tr | 1.8V Tr | 3V Tr | 3V Tr | 10V Tr | 10V Tr | 1.8V Tr |
| VOLTAGE RESISTANCE BETWEEN DIFFUSED LAYER AND WELL | 6V | 12V | 6V | 12V | 6V | 6V | 6V | 12V | 12V | 6V |
| VOLTAGE RESISTANCE BETWEEN GATE AND DIFFUSED LAYER | 3V | 12V | 3V | 12V | 3V | 6V | 6V | 12V | 12V | 3V |
| FILM THICKNESS OF GATE INSULATION FILM | 3nm | 16nm | 3nm | 16nm | 3nm | 6nm | 6nm | 16nm | 16nm | 3nm |

FIG. 59

| | BG | SSL11 | SSL12 | SSL21 | SSL22 | MBL1 | MBL2 | $V_{B2}$ | $V_{B1}$ | SL11 | SL21 |
|---|---|---|---|---|---|---|---|---|---|---|---|
| READ | 1.8V | 1.8V | 0V | 0V | 0V | 0.5V | 0.5V | 0V | 0V | 0V | 0V |
| WRITE | 3V | 3V | 0V | 0V | 0V | 0V | F | 0V | 0V | 5.5V | F |
| ERASE | 3V | 5V | 5V | 5V | 5V | F | F | 6V | 9V | F | F |

| | SG11 | SG12 | SG21 | SG22 | CG11 | CG12 | CG21 | CG22 |
|---|---|---|---|---|---|---|---|---|
| READ | 1.8V | 0V | 0V | 0V | ALWAYS 1.8V | | | |
| WRITE | 2.5V | 0V | 0V | 0V | 9V | 0V | 0V | 0V |
| ERASE | F | F | F | F | −9V | −9V | F | F |

FIG. 63

| | COLUMN DECODER | FIRST ROW DECODER | SECOND ROW DECODER | THIRD ROW DECODER | SECTOR SELECT TRANSISTOR | CONTROL CIRCUIT | SECOND VOLTAGE APPLICATION CIRCUIT | FIRST VOLTAGE APPLICATION CIRCUIT | SENSE AMPLIFIER |
|---|---|---|---|---|---|---|---|---|---|
| USED TRANSISTOR | 1.8V Tr | 10V Tr | 1.8V Tr | 10V Tr | P1 Tr | 1.8V Tr | 1.8V Tr | 10V Tr | 1.8V Tr |
| VOLTAGE RESISTANCE OF TRANSISTOR | 3V | 12V | 3V | 12V | 8V | 3V | 3V | 12V | 3V |
| FILM THICKNESS OF GATE INSULATION FILM | 3nm | 16nm | 3nm | 16nm | 8~12nm | 3nm | 3nm | 16nm | 3nm |

FIG. 64

| | SSL11 | SSL12 | SSL21 | SSL22 | MBL1 | MBL2 | $V_{B2}$ | $V_{B1}$ | SL11 | SL21 |
|---|---|---|---|---|---|---|---|---|---|---|
| READ | 1.8V | 0V | 0V | 0V | 0.5V | 0.5V | 0V | 0V | 0V | 0V |
| WRITE | 1.8V | 0V | 0V | 0V | 0V | F | 0V | 0V | 5.5V | F |
| ERASE | 1.8V | 1.8V | 1.8V | 1.8V | F | F | 1.8V | 9V | F | F |

| | SG11 | SG12 | SG21 | SG22 | CG11 | CG12 | CG21 | CG22 |
|---|---|---|---|---|---|---|---|---|
| READ | 1.8V | 0V | 0V | 0V | ALWAYS 1.8V | | | |
| WRITE | 2.5V | 0V | 0V | 0V | 9V | 0V | 0V | 0V |
| ERASE | F | F | F | F | −9V | −9V | F | F |

NONVOLATILE SEMICONDUCTOR MEMORY DEVICE AND ERASING METHOD OF NONVOLATILE SEMICONDUCTOR MEMORY DEVICE

CROSS-REFERENCE TO RELATED APPLICATION

This application is a Continuation of PCT application No. PCT/JP2009/069974, which was filed on Nov. 26, 2009, and which designated the United States of America, the entire contents of which are incorporated herein by reference.

FIELD

The embodiments discussed herein are related to a nonvolatile semiconductor memory device and an erasing method of a nonvolatile semiconductor memory device.

BACKGROUND

Recently, a nonvolatile semiconductor memory device including memory cells each including a select transistor and a memory cell transistor is proposed.

In such nonvolatile semiconductor memory device, the memory cell is selected by suitably selecting a bit line, a word line, a source line, etc. by a column decoder and a row decoder to thereby make readings, writings, erasings, etc. in selected one of the memory cells.

The background art is as follows.

Japanese Laid-open Patent Publication No. 2000-235797;

Japanese Laid-open Patent Publication No. 2005-268621; and

Japanese Laid-open Patent Publication No. 2004-228396.

SUMMARY

According to aspects of an embodiment, a nonvolatile semiconductor memory device including a memory cell transistor located on a first well and including a control gate insulation film, a control gate located on the control gate insulation film, a first source and a first drain; a memory cell including a memory cell transistor; a memory cell array including a plurality of the memory cells arranged in a matrix; a first bit line electrically connected to a plurality of the first drains located in a first column of the memory cell array; a word line electrically connected to a plurality of the control gate electrodes located in a first row of the memory cell array; a column decoder electrically connected to a second bit line and controlling electric potential of the second bit line; a row decoder electrically connected to the word line and controlling electric potential of the word line; a first transistor located on a second well and including a first gate insulation film, a first gate electrode, a second source and a second drain; a second transistor including a second gate insulation film, a second gate electrode, a third source and a third drain; a first control unit controlling electric potential of the first gate electrode; a first voltage application unit for applying first voltage to the first well; and a second voltage application unit for applying second voltage to the second well, the first well being electrically isolated from the second well, the first transistor being located between the first bit line and second bit line, the second source being electrically connected to the first bit line, the second drain being electrically connected to the column decoder via the second bit line, the row decoder including the second transistor, the first gate insulation film being thinner than the second gate insulation film.

According to other aspects of an embodiment, an erasing method of a nonvolatile semiconductor memory device including a memory cell transistor located on a first well and including a control gate insulation film, a control gate located on the control gate insulation film, a first source and a first drain; a memory cell including a memory cell transistor; a memory cell array including a plurality of the memory cells arranged in a matrix; a first bit line electrically connected to a plurality of the first drains located in a first column of the memory cell array; a word line electrically connected to a plurality of the control gate electrodes located in a first row of the memory cell array; a column decoder electrically connected to a second bit line and controlling electric potential of the second bit line; a row decoder electrically connected to the word line and controlling electric potential of the word line; a first transistor located on a second well and including a first gate insulation film, a first gate electrode, a second source and a second drain; a second transistor including a second gate insulation film, a second gate electrode, a third source and a third drain; a first control unit controlling electric potential of the first gate electrode; a first voltage application unit for applying first voltage to the first well; and a second voltage application unit for applying second voltage to the second well, the first well being electrically isolated from the second well, the first transistor being located between the first bit line and second bit line, the second source being electrically connected to the first bit line, the second drain being electrically connected to the column decoder via the second bit line, the row decoder including the second transistor, the first gate insulation film being thinner than the second gate insulation film, information written in the memory cell is erased with the first well set at a first electric potential, the first gate electrode set at a second electric potential lower than the first electric potential or set at floating electrically, and the second well set at a third electric potential lower than the first electric potential.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 6 is a view of the species, the withstand voltages and the film thicknesses of the gate insulation films of the transistors used in the respective constituent element of the nonvolatile semiconductor memory device according to the first embodiment;

FIG. 7 is a view of the reading method, the writing method and erasing method of the nonvolatile semiconductor memory device according to the first embodiment;

FIG. 33 is a view of the species, the withstand voltages and the film thicknesses of the gate insulation films of the transistors used in the respective constituent element of the nonvolatile semiconductor memory device according to the second embodiment;

FIG. 34 is a view of the reading method, the writing method and erasing method of the nonvolatile semiconductor memory device according to the second embodiment;

FIG. 58 is a view of the species, the withstand voltages and the film thicknesses of the gate insulation films of the transistors used in the respective constituent element of the nonvolatile semiconductor memory device according to the third embodiment;

FIG. 59 is a view of the reading method, the writing method and erasing method of the nonvolatile semiconductor memory device according to the third embodiment;

FIG. 63 is a view of the species, the withstand voltages and the film thicknesses of the gate insulation films of the transistors used in the respective constituent element of the nonvolatile semiconductor memory device according to the fourth embodiment;

FIG. 64 is a view of a reading method, a writing method and an erasing method of the nonvolatile semiconductor memory device according to the fourth embodiment;

DESCRIPTION OF EMBODIMENTS

The operation speed of the proposed nonvolatile semiconductor memory device is not always enough.

Figure 79:
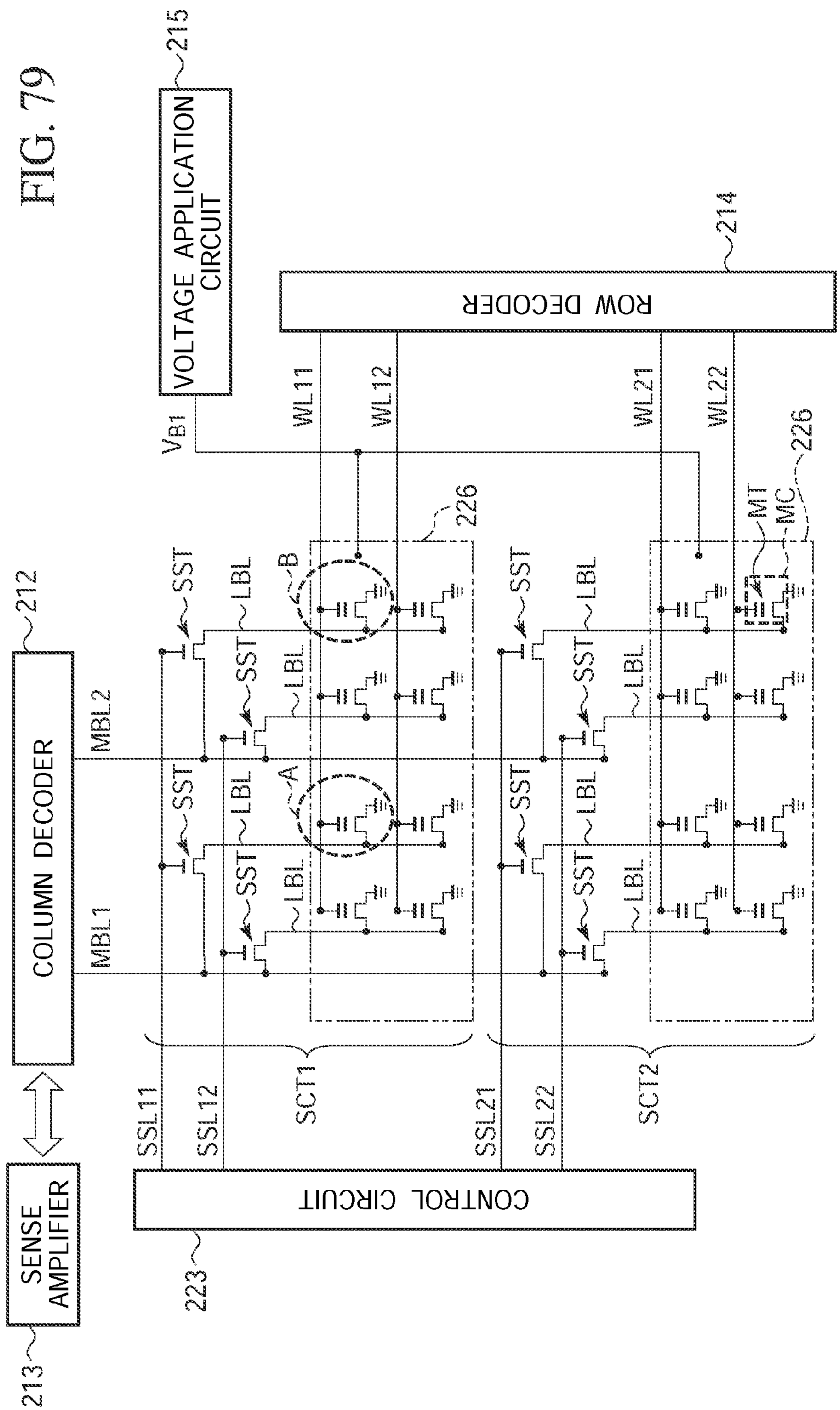
FIG. 79 is a circuit diagram of a nonvolatile semiconductor memory device according to the reference example.
Figure 80:
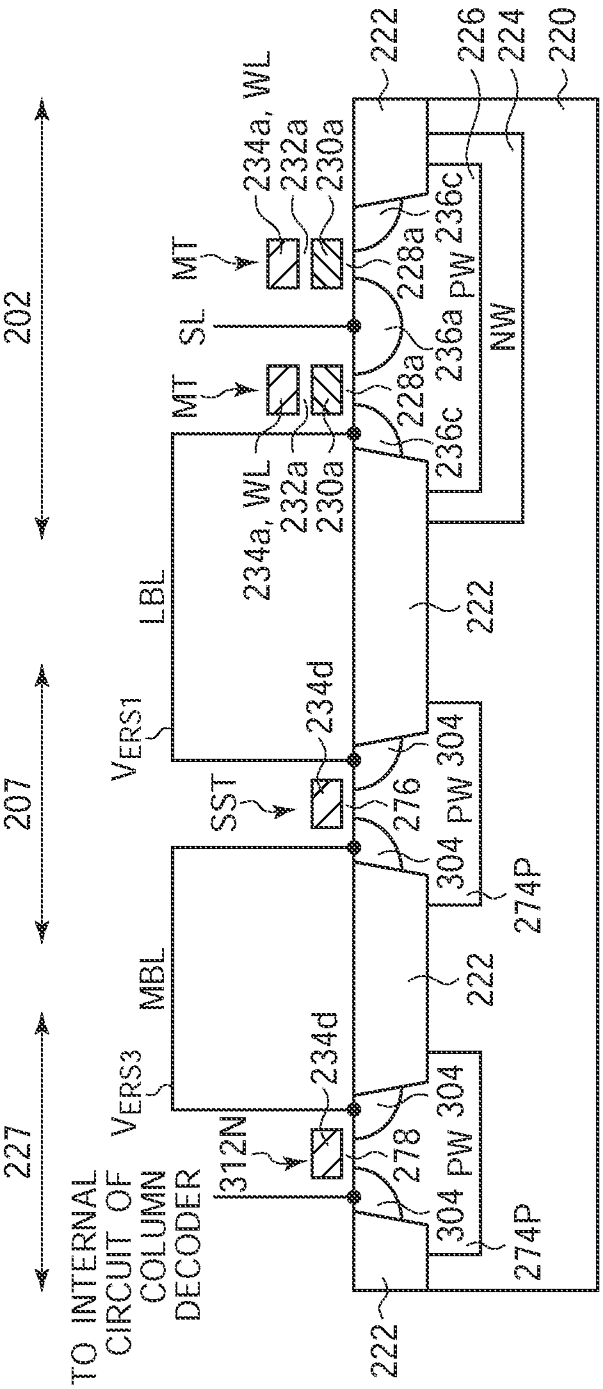
FIG. 80 is a sectional view of the nonvolatile semiconductor memory device according to the reference example.

FIG. 79 is a circuit diagram of the nonvolatile semiconductor memory device according to a reference example. FIG. 80 is a sectional view of the nonvolatile semiconductor memory device according to the reference example.

As illustrated in FIG. 79, the nonvolatile semiconductor memory device according to the reference example includes a plurality of memory cells MC including memory cell transistors MT. The plural memory cells MC arranged in a matrix form a memory cell array. The memory cell array is divided in plural sector SCT.

The drains of the plural memory cell transistors MT in the same column are commonly connected by a local bit line LBL. The control gates of the plural memory cell transistors MT in the same row are commonly connected by a word line WL. The sources of the plural memory cell transistors MT are electrically connected respectively to the source lines.

In each sector SCT, a plurality of sector select transistors SST are provided. The local bit line LBL commonly connecting the drains of the plural memory cell transistors MT existing in the same column is connected to the source of the sector select transistor SST. The drains of the plural sector select transistors SST existing in the same column are commonly connected by the main bit line MBL. The local bit lines LBL are connected to the main bit lines MBL via the sector select transistors SST. The gates of the sector select transistors SST are commonly connected by sector select lines SSL.

A plurality of the main bit lines MBL commonly connecting the drains of the sector select transistors SST are connected to a column decoder 212. The column decoder 212 includes a sense amplifier 213 for detecting currents flowing in the main bit lines MBL. A plurality of the word lines WL commonly connecting the control gates of the memory cell transistors MT are connected to a row decoder 214. A plurality of sector select lines SSL commonly connecting the gates of the sector select transistors SST are connected to a control circuit 223.

As illustrated in FIG. 80, in a semiconductor substrate 220, device isolation regions 222 defining device regions are formed. In the memory cell array region 202, an N-type well (N-type diffused layer) 224 formed in the semiconductor substrate 220, and a p-type well 226 formed in the N-type well 224 are formed. As illustrated in FIG. 79, the P-type well 226 is connected to the first voltage application circuit 215 via an interconnection.

On the P-type well 226, floating gates 230*a* are formed with a tunnel insulation film 228*a* formed therebetween. On the floating gates 230*a*, control gates 234*a* are formed with an insulation film 232*a* formed therebetween. In the semiconductor substrate 220 on both sides of the layered structure including the floating gates 230*a* and the control gates 234*a*, source/drain diffused layers 236*a*, 236*c* are formed. Thus, the memory cell transistors MT each including the floating gate 230*a*, the control gate 234*a* and the source/drain diffused layers 236*a*, 236*c* are formed. The source diffused layer 236 of the memory cell transistors MT is connected to the source line SL.

In the semiconductor substrate 220 in the region 207 where the sector select transistor is formed, a P-type well 274P is formed. On the P-type well 274P, a gate electrode 234*d* is formed with a gate insulation film 276 formed therebetween. In the semiconductor substrate 220 on both sides of the gate electrode 234*d*, a source/drain diffused layer 304 is formed. Thus, the sector select transistor SST including the gate electrode 234*d* and the source/drain diffused layer 304 is formed. The source diffused layer 304 of the sector select transistor SST is connected to the drain diffused layers 236*c* of the memory cell transistors MT via the local bit line LBL.

In the semiconductor substrate 220 in the region 217 where the column decoder is formed, a P-type well 274P is formed. On the P-type well 274P, a gate electrode 234*d* is formed with a gate insulation film 278 formed therebetween. In the semiconductor substrate 220 on both sides of the gate electrode 278, source/drain diffused layers 304 are formed. Thus, an NMOS transistor 312 including the gate electrode 234*d* and the source/drain diffused layers 304 is formed.

The source diffused layer 304 of the NMOS transistor 312 is connected to the drain diffused layer 304 of the sector select transistor SST via the main bit line MBL. The drain diffused layer 304 of the NMOS transistor 312 is connected to the inner circuit of the column decoder.

When information written in the memory cell transistors MT is erased, the potential of the main bit line MBL is set at floating. The potential of the sector select line SSL is set at 0 V.

Next, by the voltage application circuit 215, the potential of the P-type well 226 is set at, e.g., 9 V.

Then, the potential of the word lines WL11, WL12 connected to the memory cells MC in the first sector SCT1 to be erased is set at, e.g., −9 V. On the other hand, the potential of the word lines WL21, WL22 connected to the memory cells MC in the second sector SCT2 not to be erased is set at floating, for example.

When the potential of the word lines WL11, WL12 is set at, e.g., −9 V, the floating gates 230*a* of the memory cell transistors MT are discharged. Thus, no charges are stored in the floating gates 230*a* of the memory cell transistors MT, and the information in the memory cell transistors MT is erased.

As described above, in the nonvolatile semiconductor memory device according to the reference example, when information written in the memory cell transistors MT is erased, a relatively high voltage of, e.g., about 9 V is applied to the P-type well 226. The voltage to be applied to the P-type well 226 is applied to the source diffused layers 304 of the sector select transistors SST via the local bit lines LBL. Accordingly, when information written in the memory cell transistors MT is erased, a relatively high voltage is applied to the sector select transistors SST. Accordingly, as the sector select transistors SST, high withstand voltage transistors of relative high withstand voltages are used.

However, the drive current of the high withstand voltage transistor is relatively smaller than that of the low withstand voltage transistor. Accordingly, with the high withstand voltage transistors used as the sector select transistors SST as in the nonvolatile semiconductor memory device according to the reference example, sufficiently large read current is not obtained. Accordingly, in the non-voltage semiconductor memory device according to the reference example, it is difficult to speedily judge information written in the memory cell transistors MT, and, as a result, it is difficult to speedily read information written in the memory cell transistors MT.

Preferred embodiments of the present invention will be explained with reference to accompanying drawings.

[a] First Embodiment

The nonvolatile semiconductor memory device according to a first embodiment, its reading method, the writing method and the erasing method, and the method of manufacturing the nonvolatile semiconductor memory device will be described with reference to FIGS. 1 to 25.

(Nonvolatile Semiconductor Memory Device)

Figure 1:
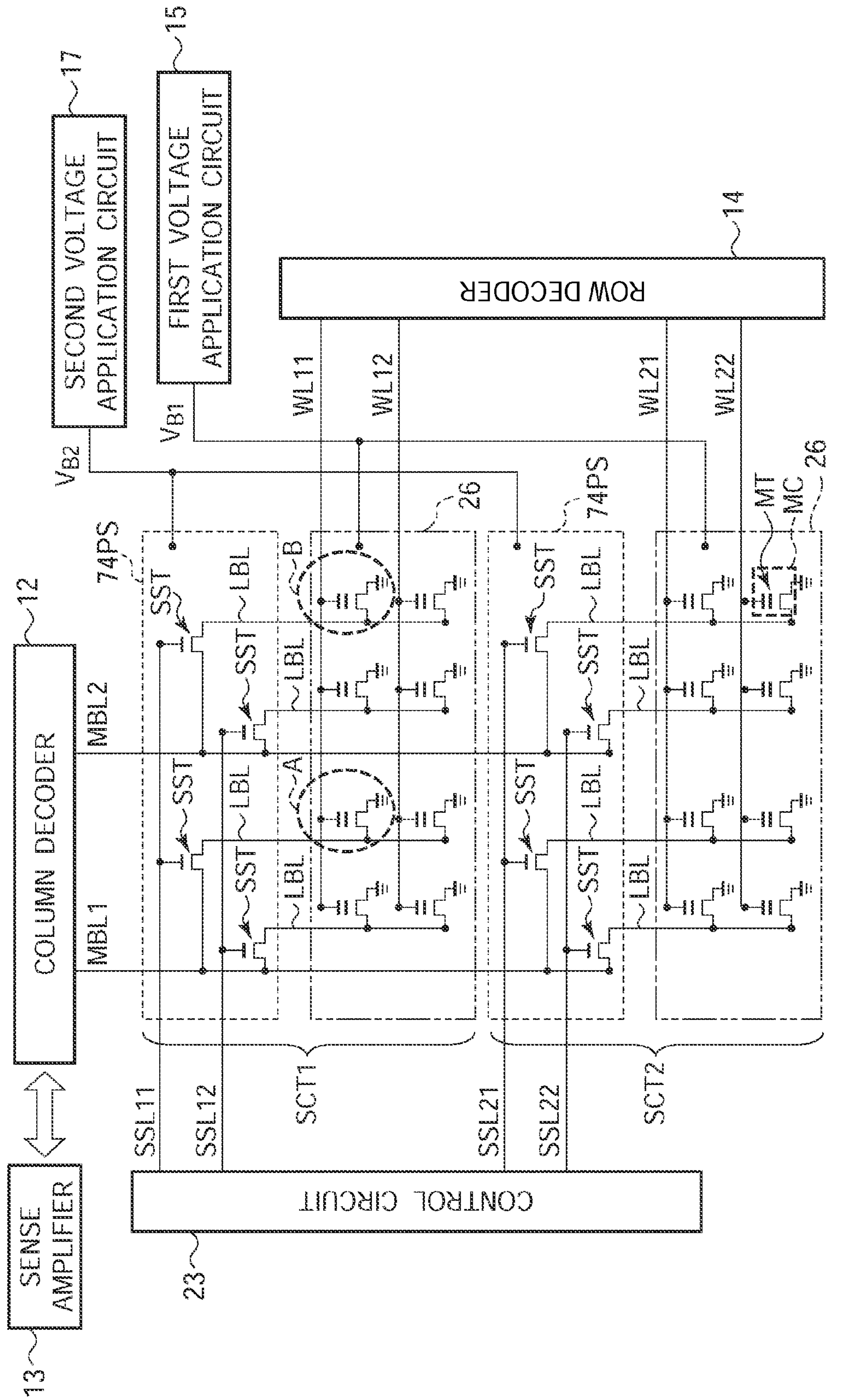
FIG. 1 is a circuit diagram of a nonvolatile semiconductor memory device according to a first embodiment.

First, the nonvolatile semiconductor memory device according to the present embodiment will be described with reference to FIGS. 1 and 2. FIG. 1 is the circuit diagram of the nonvolatile semiconductor memory device according to the present embodiment. FIGS. 2A and 2B are sectional views of the nonvolatile semiconductor memory device according to the present embodiment.

As illustrated in FIG. 1, the nonvolatile semiconductor memory device according to the present embodiment includes a plurality of memory cells MC including memory cell transistors MT. The plural memory cells MC are arranged in a matrix. The plural memory cells MC arranged in the matrix form a memory cell array. The memory cell array is divided in a plurality of sectors SCT.

In FIG. 1, out of the plural sectors SCT, a first sector SCT1 and a second SCT2 are illustrated.

The drains of a plurality of the memory cell transistors exsisting in the same columns are commonly connected to local bit lines (the first bit lines) LBL.

The control gates of a plurality of the memory cell transistors MT exsisting in the same rows are commonly connected by word lines WL.

In FIG. 1, out of the plural word lines WL, the word lines WL11, WL12, WL21, WL22 are illustrated.

The word line WL11 commonly connects the control gates of the plural memory cell transistors MT exsisting in the first row of the first sector SCT1. The word lines WL12 commonly connects the control gates of the plural memory cell transistors MT exsisting in the second row of the first sector SCT1. The word line WL21 commonly connects the control gates of the plural memory cell transistors MT exsisting in the first row of the second sector SCT2. The word line WL22 commonly connects the control gates of the plural memory cell transistors MT exsisting in the second row of the second sector SCT2.

The sources of the plural memory cell transistors MT are electrically connected respectively to source lines SL.

In each sector, a plurality of sector select transistors SST are provided. As the sector select transistors SST, low voltage transistors of a relatively low rated voltage or a relatively low withstand voltage are used.

FIG. 6 is a view of the species of the transistors used in the respective constituent members, the withstand voltage of the transistors, and the film thickness of the gate insulation film of the transistors.

As illustrated in FIG. 6, as the sector select transistors STT, low voltage transistors (5 V Tr) of, e.g., a 5 V rated voltage are used. The withstand voltage of the sector select transistors SST is, e.g., about 8V. The film thickness of the gate insulation films 78 (see FIG. 25) of the sector select transistors SST is, e.g., about 11 nm.

In comparison with the high withstand voltage transistor (high voltage transistor), the low voltage transistor (low withstand voltage transistor) has a small gate length, a small film thickness of the gate insulation film and a large drive current. In the present embodiment, in which low voltage transistors are used as the sector select transistors SST, a large read current can be obtained. Accordingly, because of the large read current, information written in the memory cell transistors MT can be speedily judged, and speedy read can be realized.

The local bit lines LBL commonly connecting the drains of a plurality of the memory cell transistors MT existing in the same columns are connected respectively to the sources of the sector select transistors SST.

The drains of a plurality of the sector select transistors SST existing in the same columns are commonly connected to the main bit lines (the second bit lines, global bit lines) MBL.

In FIG. 1, out of the plurality of the main bit lines MBL, the main bit lines MBL1, MBL2 are illustrated. The local bit lines LBL are connected to the main bit lines MBL via the sector select transistors SST.

The gates of the sector select transistors SST are commonly connected to the sector select lines SSL.

In FIG. 1, out of the plural sector select lines SSL, the sector select lines SSL11, SSL12, SSL21, SSL22 are illustrated.

The plural main bit lines MBL commonly connecting the drains of the sector select transistors SST are connected to a column decoders 12. The column decoder 12 controls the potential of the respective plural main bit lines MBL. The column decoder 12 is formed of a low voltage circuit which operates at a relative low voltage. The low voltage circuit has a relatively low withstand voltage but can speedily operate.

In the low voltage circuit of the column decoder 12, low voltage transistors (low withstand voltage transistors) 112N, 112P (see FIG. 25) are used. As illustrated in FIG. 6, in the column decoder 12, low voltage transistors (5 V Tr) of, e.g., a 5 V rated voltage are used. The withstand voltage of the low voltage transistors 112N, 112P used in the column decoder 12 is, e.g., about 8 V. The film thickness of the gate insulation films 78 (see FIG. 25) of the low voltage transistors 112N, 112P used in the column decoder 12 is, e.g., about 11 nm. The low voltage transistors 112N, 112P are used in the column decoder 12 so that information written in the memory cell transistors MT can be speedily read.

A sense amplifier 13 for detecting currents flowing in the main bit lines MBL is connected to the column decoder 12.

In the sense amplifier 13, the low voltage transistors 112N, 112P (see FIG. 25) are used. As illustrated in FIG. 6, in the sense amplifier 13, low voltage transistors (5 V Tr) of a 5 V rated voltage are used. The withstand voltage of the low voltage transistors used in the sense amplifier 13 is, e.g., about 8 V. The film thickness of the gate insulation films 78 (see FIG. 25) of the low voltage transistors 112N, 112P used in the same amplifier 13 is, e.g., about 11 nm. The sense amplifier 13, in which the low voltage transistors 112N, 112P are used, can speedily judge information written in the memory cell transistors MT, and consequently, high speed read can be realized.

A plurality of the word lines WL commonly connecting the control gates 34*a* of the memory cell transistors MT are connected to a row decoder 14. The row decoder 14 controls the potential of the respective plural word lines WL. The row decoder 14 is formed of a high voltage circuit (high withstand voltage circuit). A high voltage circuit operates relatively slowly but has a relatively high withstand voltage. In the high voltage circuit of the row decoder 14, high voltage transistors (high withstand voltage transistors) 110N, 110P (see FIG. 2 and FIG. 25) are used. As illustrated in FIG. 6, in the row decoder 14, high withstand voltage transistors (10 V Tr) of, e.g., a 10 V rated voltage are used. The withstand voltage between the source and the drain of the high withstand voltage transistors 110N, 110P used in the row decoder 14 is, e.g., about 12 V. The film thickness of the gate insulation films 76 of the high withstand voltage transistors 110N, 110P used in the row decoder 14 is, e.g., about 16 nm.

The high withstand voltage transistors 110N, 110P are used in the row decoder 14, so that when information is written in the memory cell transistors MT or when information written in the memory cell transistors MT is erased, high voltages are applied to the word lines WL.

A plurality of the sector select lines SSL commonly connecting the gates of the sector select transistors SST are connected to a control circuit (control unit) 23. The control circuit 23 controls the potential of the respective plural sector select lines SSL. The control circuit 23 is formed of a low voltage circuit which operates at a relatively low voltage.

In the control circuit 23, a low voltage circuit is used. In the low voltage circuit of the control unit 23, the low voltage transistors (low withstand voltage transistors) 112N, 112P (see FIG. 25) are used. As illustrated in FIG. 6, in the control circuit 23, low voltage transistors (5 V Tr) of, e.g., a 5 V rated voltage are used. The withstand voltage of the low voltage transistors 112N, 112P used in the control circuit 23 is, e.g., about 8V. The film thickness of the gate insulation films 78 of the low voltage transistors 112N, 112P used in the control circuit 23 is, e.g., about 11 nm. The low voltage transistors 112*n*, 112P are used in the control circuit 23 so that the selection of the sectors SCT can be speedy.

Figure 2A:
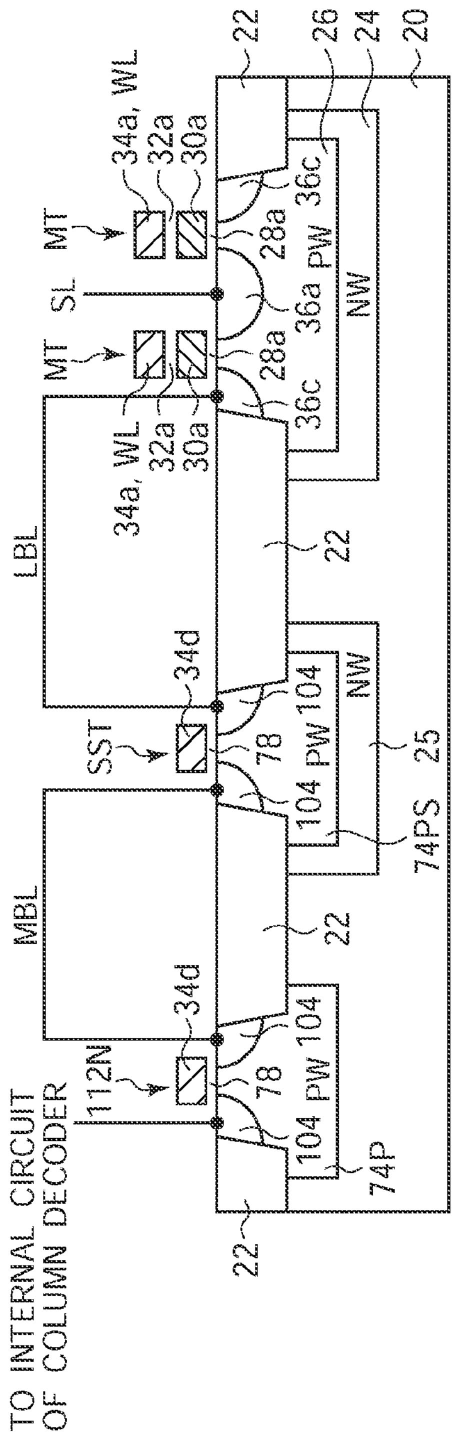
FIGS. 2A and 2B are sectional views of the nonvolatile semiconductor memory device according to the first embodiment.

As illustrated in FIG. 2A, in the memory cell array region 2 of each sector SCT, an N-type well (N-type diffused layer) 24 formed in a semiconductor substrate 20 and a P-type well 26 formed in the N-type well 24 are formed. Such structure is called the triple well. The memory cell transistors MT are formed on such triple well.

As illustrated in FIG. 1, the P-type well 26 is connected to the first voltage application circuit (the first voltage application unit) 15 via an interconnection. The first voltage application circuit 15 controls the potential $V_{B1}$ of the P-type well 26. The first voltage application circuit 15 is formed of a high voltage circuit. In the high voltage circuit of the first voltage application circuit 15, high withstand voltage transistors 110N, 110P (see FIGS. 2A, 2B and 25). As illustrated in FIG. 6, in the first voltage application circuit 15, high withstand voltage transistors (10 V Tr) of, e.g., a 10 V rated voltage are used. The withstand voltage of the high withstand voltage transistors 110N, 110P used in the first voltage application circuit 15 is, e.g., about 12 V. The film thickness of the gate insulation films 76 (see FIGS. 25A and 25B) of the high withstand voltage transistors 110N, 110P used in the first voltage application circuit 15 is, e.g., about 16 nm.

In the first voltage application circuit 15, the high withstand voltage transistors 110N, 110P are used because when information written in the memory cell transistors MT is erased, a high voltage is applied to the P-type well 26.

As illustrated in FIG. 2A, in the semiconductor substrate 20 in the region 7 where the sector select transistor is formed, an N-type well (N-type diffused layer) 25 is formed. In the N-type well 25, a P-type well 74PS is formed. The sector select transistors SST are formed on such triple well.

As illustrated in FIG. 1, the P-type well 74PS is electrically connected to the second voltage application circuit (the second voltage application unit) 17 via an interconnection. The second voltage application circuit 17 controls the potential $V_{B2}$ of the P-type well 74PS. The second voltage application circuit 17 is formed of a low voltage circuit. In the low voltage circuit of the second voltage application circuit 17, low voltage transistors 112N, 112P (see FIG. 25) are used. As illustrated in FIG. 6, in the second voltage application circuit 17, low voltage transistors (5 V Tr) of, e.g., a 5 V rated voltage are used. The withstand voltage of the low voltage transistors 112N, 112P used in the second voltage application circuit 17 is, e.g., about 8 V. The film thickness of the gate insulation films 78 (see FIG. 25) of the low voltage transistors 112N, 112P used in the second voltage application circuit 17 is, e.g., about 11 nm.

Figure 3:
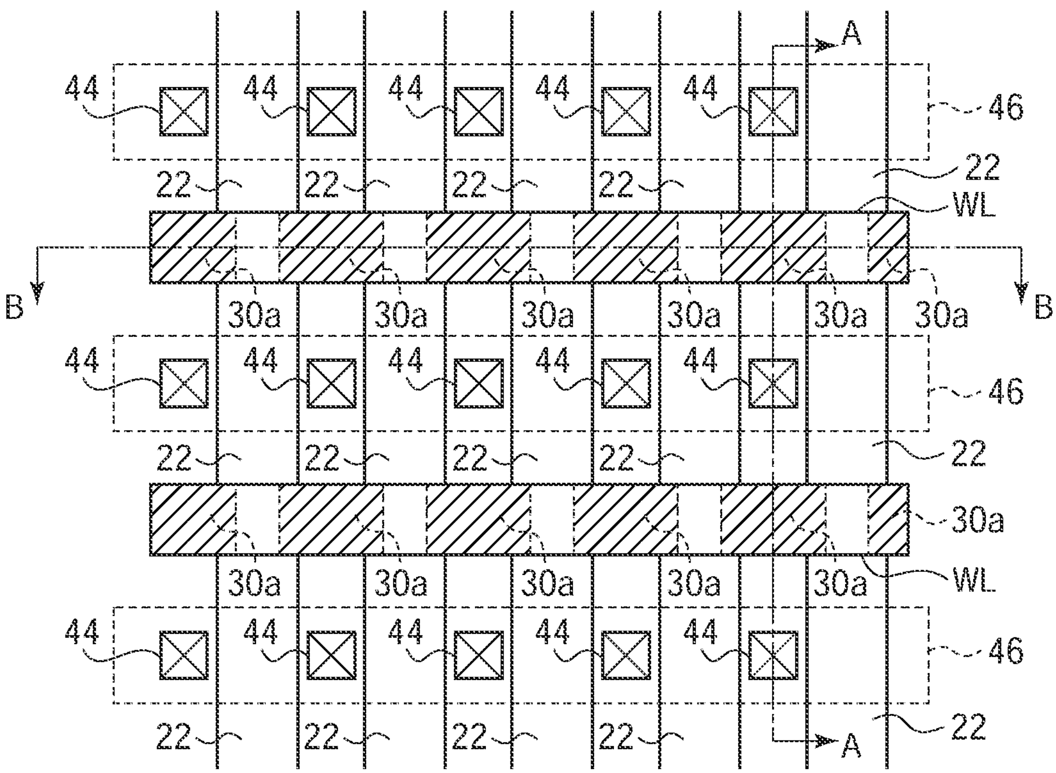
FIG. 3 is a plan view of the nonvolatile semiconductor memory device according to the first embodiment, which illustrates the memory cell array.
Figure 4:
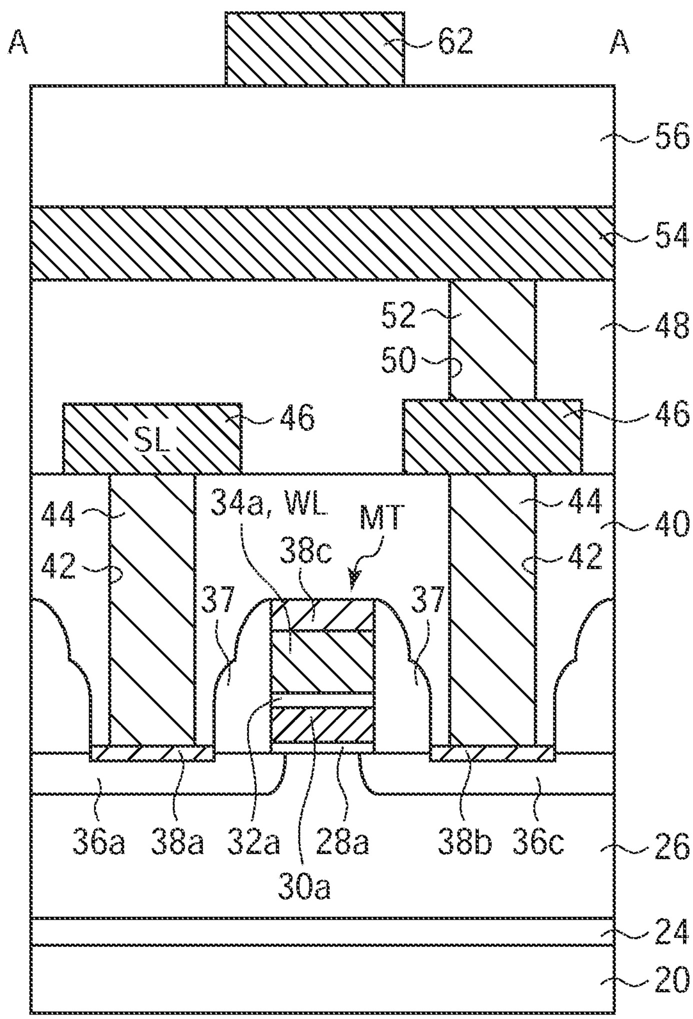
FIG. 4 is a A-A' sectional view of FIG. 3.
Figure 5:
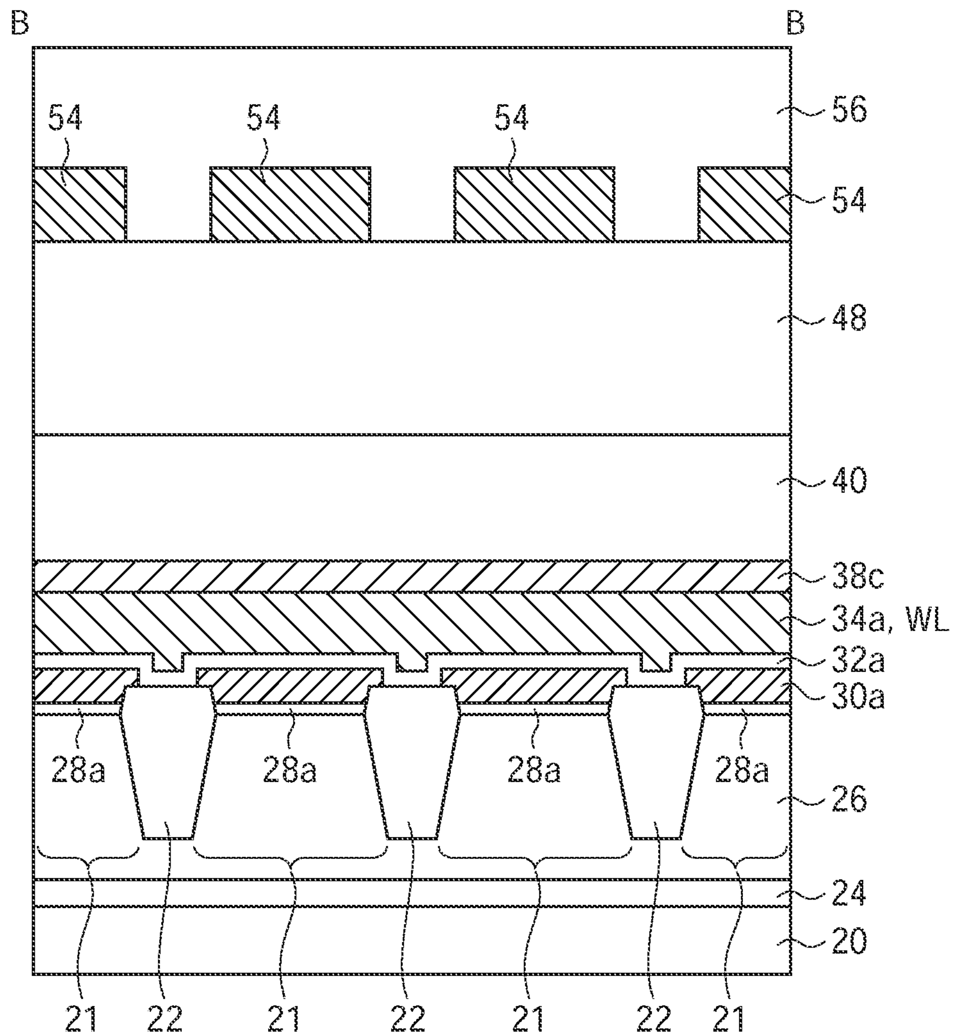
FIG. 5 is a B-B' sectional view of FIG. 3.

Next, the structure of the nonvolatile semiconductor memory device according to the present embodiment will be described with reference to FIGS. 2A to 5. FIG. 3 is a plan view of the memory cell array of the nonvolatile semiconductor memory device according to the present embodiment. FIG. 4 is the A-A' sectional view of FIG. 3. FIG. 5 is the B-B' sectional view of FIG. 3.

In the semiconductor substrate 20, device isolation regions 22 defining device regions 21 are formed. As the semiconductor substrate 20, a P-type silicon substrate, for example, is used. The device isolation regions 22 are formed by, e.g., STI (Shallow Trench Isolation).

As illustrated in FIG. 2A, in the semiconductor substrate 20 in the memory cell array region 2, the N-type well (N-type diffused layer) 24 is formed. Such N-type well 24 is formed in each sector SCT (see FIG. 1). In the N-type well 24, the P-type well 26 is formed. The P-type well 26 is electrically isolated from the semiconductor substrate 20 by the N-type well 24.

On the P-type well 26, floating gates 30*a* are formed with a tunnel insulation film 28*a* formed therebetween. As illustrated in FIG. 5, the floating gates 30*a* are electrically isolated from each other in respective device regions 21.

On the floating gates 30*a*, control gates 34*a* are formed with insulation films 32*a* formed therebetween. The control gates 34*a* of the memory cell transistors MT exsisting in the same row are commonly connected. In other words, on the floating gates 30, the word lines WL commonly connecting the control gates 34*a* are formed with the insulation films 32*a* formed therebetween.

In the semiconductor substrate 20 on both sides of the floating gates 30*a*, N-type impurity diffused layers 36*a*, 36*c* are formed. The sources of the memory cell transistors MT adjacent each other is formed by one and the same impurity diffused layer 36*a*.

As illustrated in FIG. 4, on the side wall of the layered structure including the floating gate 30*a* and the control gate 34*a*, a sidewall insulation film 37 is formed.

On the source region 36*a*, the drain region 36*c* and the control gate 34*a*, silicide layers 38*a*-38*c* of, e.g., cobalt silicide are respectively formed. The silicide layer 38*a* on the source diffused layer 36*a* functions as the source electrode. The silicide layer 38*c* on the drain diffused layer 36*c* functions as the drain electrode.

Thus, the memory cell transistors MT including the floating gates 30*a*, the control gates 34*a* and the source/drain diffused layers 36*a*, 36*c* are formed on the P-type well 26.

In the semiconductor substrate 20 in the sector select transistor formed region 7, an N-type well (N-type diffused layer) 25 is formed. In the N-type well 25, the P-type well 74PS is formed. The P-type well 74PS is electrically isolated from the semiconductor substrate 20 by the N-type well 25.

On the P-type well 74PS, a gate electrode 34*d* is formed with the gate insulation film 78 formed therebetween. In the semiconductor substrate 20 on both sides of the gate electrode 34*d*, source/drain diffused layers 104 which are N-type impurity diffused layers are formed.

Thus, the sector select transistors SST including the gate electrodes 34*d* and the source/drain diffused layers 104 are formed on the P-type well 74PS.

The P-type well 74PS and the P-type well 26 are electrically isolated from each other by the N-type wells 24, 25.

As illustrated in FIG. 2A, the source diffused layer 104 of the sector select transistor SST and the drain diffused layer 36*c* of the memory cell transistor MT are electrically connected by the local bit line LBL.

In the region 27 where the column decoder is formed, a P-type well 74P is formed. On the P-type well 74P, a gate electrode 34*d* is formed with the gate insulation film 78 formed therebetween. In the semiconductor substrate 20 on both sides of the gate electrode 34*d*, source/drain diffused layers 104 which are N-type impurity diffused layers are formed.

Thus, in the region 27 where the column decoder is formed, low voltage N-channel transistors 112N including the gate electrodes 34*d* and the source/drain diffused layers 104 are formed.

As illustrated in FIG. 2A, the source diffused layer 104 of the low voltage N-channel transistor 112N and the drain diffused layer 104 of the sector select transistor SST are electrically connected by the main bit line MBL. The drain diffused layer 104 of the low voltage N-channel transistor 112N is connected to the internal circuit (low voltage circuit) of the column decoder 12.

Figure 2B:
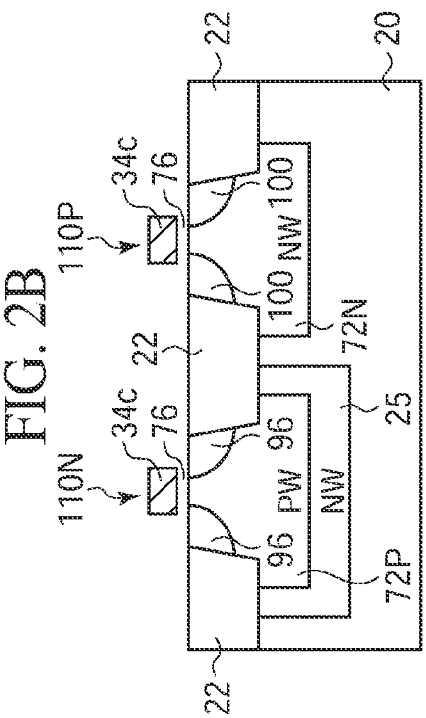

As illustrated in FIG. 2B, in the semiconductor substrate 20, an N-type well (N-type diffused layer) 25 is formed. In the N-type well 25, a P-type well 72P is formed. The P-type well 72P is electrically isolated from the semiconductor substrate 20 by the N-type well 25.

On the P-type well 72P, a gate electrode 34*c* is formed with the gate insulation film 76 formed therebetween. In the semiconductor substrate 20 on both sides of the gate electrode 34*c*, source/drain diffused layers 96 which are the N-type impurity diffused layers are formed.

Thus, the high withstand voltage N-channel transistors 110N including the gate electrodes 34*c* and the source/drain diffused layers 96 are formed on the P-type well 72P.

In the semiconductor substrate 20, an N-type well 72N is formed. On the N-type well 72N, a gate electrode 34*c* is formed with the gate insulation film 76 formed therebetween. In the semiconductor substrate 20 on both sides of the gate electrode 34*c*, source/drain diffused layers 100 which are P-type impurity diffused layers are formed.

Thus, high withstand voltage P-channel transistors 110P including the gate electrodes 34*c* and the source/drain diffused layers 100 are formed.

An inter-layer insulation film 40 is formed on the semiconductor substrate 20 with the memory cell transistors MT, the sector select transistors SST, the low voltage transistors 112N, 112P, the high voltage transistors 110N, 110P, etc. formed on (see FIGS. 4, 5, 24 and 25). The inter-layer insulation film 40 is formed of, e.g., a silicon nitride film 114, and a silicon oxide film 116 formed on the silicon nitride film 114 (see FIGS. 24 and 25).

In the inter-layer insulation film 40, contact holes 42 are formed respectively down to the source electrode 38*a* and the drain electrode 38*b*.

In the contact holes 42, conductor plugs 44 of, e.g., tungsten are buried in.

On the inter-layer insulation film 40 with the conductor plugs 44 buried in, interconnections (first metal interconnection layers) 46 are formed.

On the inter-layer insulation film 40 with the interconnections 46 formed on, an inter-layer insulation film 48 is formed.

In the inter-layer insulation film 48, a contact hole 50 is formed down to the interconnection 46.

In the contact hole 50, a conductor plug 52 of, e.g., tungsten is buried in.

On the inter-layer insulation film 48 with the conductor plug 52 buried in, an interconnection (second metal interconnection layer) 54 is formed.

On the inter-layer insulation film 48 with the interconnection 54 formed on, an inter-layer insulation film 56 is formed.

In the inter-layer insulation film 56, a contact hole 58 is formed down to the interconnection 54.

In the contact hole 58, a conductor plug 60 of, e.g., tungsten is formed.

On the inter-layer insulation film 56 with the conductor plug 60 buried in, an interconnection (third metal interconnection layer) 62 is formed.

(Operation of the Nonvolatile Semiconductor Memory Device)

Figure 8:
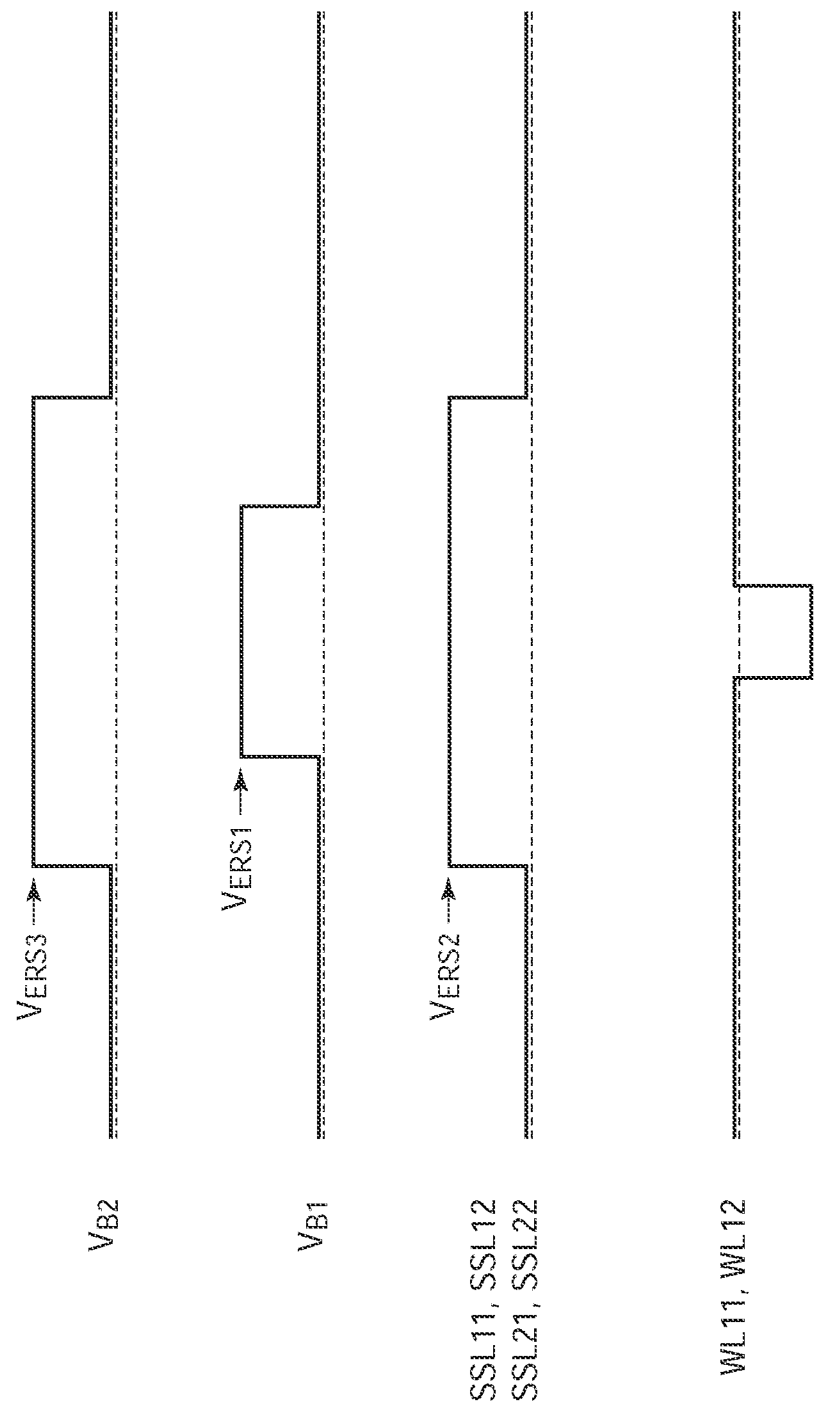
FIG. 8 is a time chart of the erasing method of the nonvolatile semiconductor memory device according to the first embodiment.

Next, the operation method of the nonvolatile semiconductor memory device according to the present embodiment will be described with reference to FIGS. 7 and 8. FIG. 7 is a view illustrating the reading method, the writing method and erasing method of the nonvolatile semiconductor memory device according to the present embodiment. In FIG. 7, F indicates floating.

(Reading Method)

First, the reading method of the nonvolatile semiconductor memory device according to the present embodiment will be described with reference to FIG. 7.

The reading method will be described here by means of an example of reading information written in the memory cell MC enclosed by the broken line A and the memory cell MC enclosed by the broken line B in FIG. 1.

When information written in the memory cell transistors MT is read, the potentials of the respective members are set as follows.

That is, the potential of the sector select line SSL11 connected to the sector select transistors SST connected to the memory cells MC to be selected is set at, e.g., 1.8 V. On the other hand, the potentials of the sector select lines SSL12, SSL21, SSL22 other than the selected sector select line SSL11 are set at 0 V.

The potentials of the main bit lines (bit lines) MBL1, MBL2 connected to the sector select transistors SST connected to the memory cells MC to be selected are set at, e.g., 0.5 V.

The potential of the word line WL11 connected to the memory cells MC to be selected is set at, e.g., 4.5 V. On the other hand, the potentials of the word lines WL12, WL21, WL22 other than the selected word line WL11 are set at 0 V.

The potentials $V_{B1}$ of the P-type wells 26 are set at 0 V. The potentials $V_{B2}$ of the P-type wells 74PS are set at 0 V. The potential of the source lines SL is set at 0 V.

In the present embodiment, as the sector select transistors SST, low voltage transistors are used, whereby when information written in the memory cell transistors MT is read, sufficiently large read currents can be obtained. According to the present embodiment, the sufficiently large read currents make it possible to speedily judge information written in the memory cell transistors MT. Thus, according to the present embodiment, information written in the memory cell transistors MT can be speedily read.

With information written in the memory cell transistors MT, that is, the information in the memory cell transistors MT is “0”, charges are stored in the floating gates 30*a* of the memory cell transistors MT. In this case, no currents flow between the source diffused layers 36*a* and the drain diffused layers 36*c*, of the memory cell transistors MT, and no currents flow in the selected main bit lines MBL. In this case, the information in the memory cell transistors MT is judged to be “0”.

On the other hand, with information written in the memory cell transistors MT erased, that is, the information in the memory cells is “1”, no charges are stored in the floating gates 30*a* of the memory cell transistors MT. In this case, currents flow between the source diffused layers 36*a* and the drain diffused layers 36*c*, of the memory cell transistors MT, and currents flow in the selected main bit lines MBL. The currents flowing in the selected main bit lines MBL are detected by the sense amplifier 13. In this case, the information in the memory cell transistors MT is judged to be “1”.

(Writing Method)

Next, the writing method of the nonvolatile semiconductor memory device according to the present embodiment will be described with reference to FIG. 7.

The writing method will be described by means of an example that information is written in the memory cell MC enclosed by the broken line A in FIG. 1.

When information is written in the memory cell transistor MT, the potentials of the respective members are set as follows.

That is, the potential of the sector select line SSL11 connected to the sector select transistor SST connected to the memory cell MC to be selected is set at, e.g., 5 V. On the other hand, the potentials of the sector select lines SSL12, SSL21, SSL22 other than the selected sector select line SSL11 are set at 0 V.

The potential of the main bit line (bit line) MBL1 connected to the sector select transistor SST connected to the memory cell MC to be selected is set at, e.g., 4 V. On the other hand, the potential of the main bit line MBL2 other than the selected main bit line MBL1 is set at 0 V.

The potential of the word line WL11 connected to the memory cell MC to be selected is set at, e.g., 9 V. On the other hand, the potentials of the word lines WL12, WL21, WL22 other than the selected word line WL11 are set at 0 V.

The potential $V_{B1}$ of the P-type well 26 is set at 0 V. The potential $V_{B2}$ of the P-type well 74PS is set at 0 V. The potential of the source lines SL is set at 0 V.

With the potentials of the respective members set as above, electrons flow between the source diffused layer 36*a* and the drain diffused layer 36*c*, of the memory cell transistor MT, and the electrons are introduced into the floating gate 30*a* of the memory cell transistor MT. Thus, a charge is stored in the floating gate 30*a* of the memory cell transistor MT, and information is written in the memory cell transistor MT.

(Erasing Method)

Figure 9:
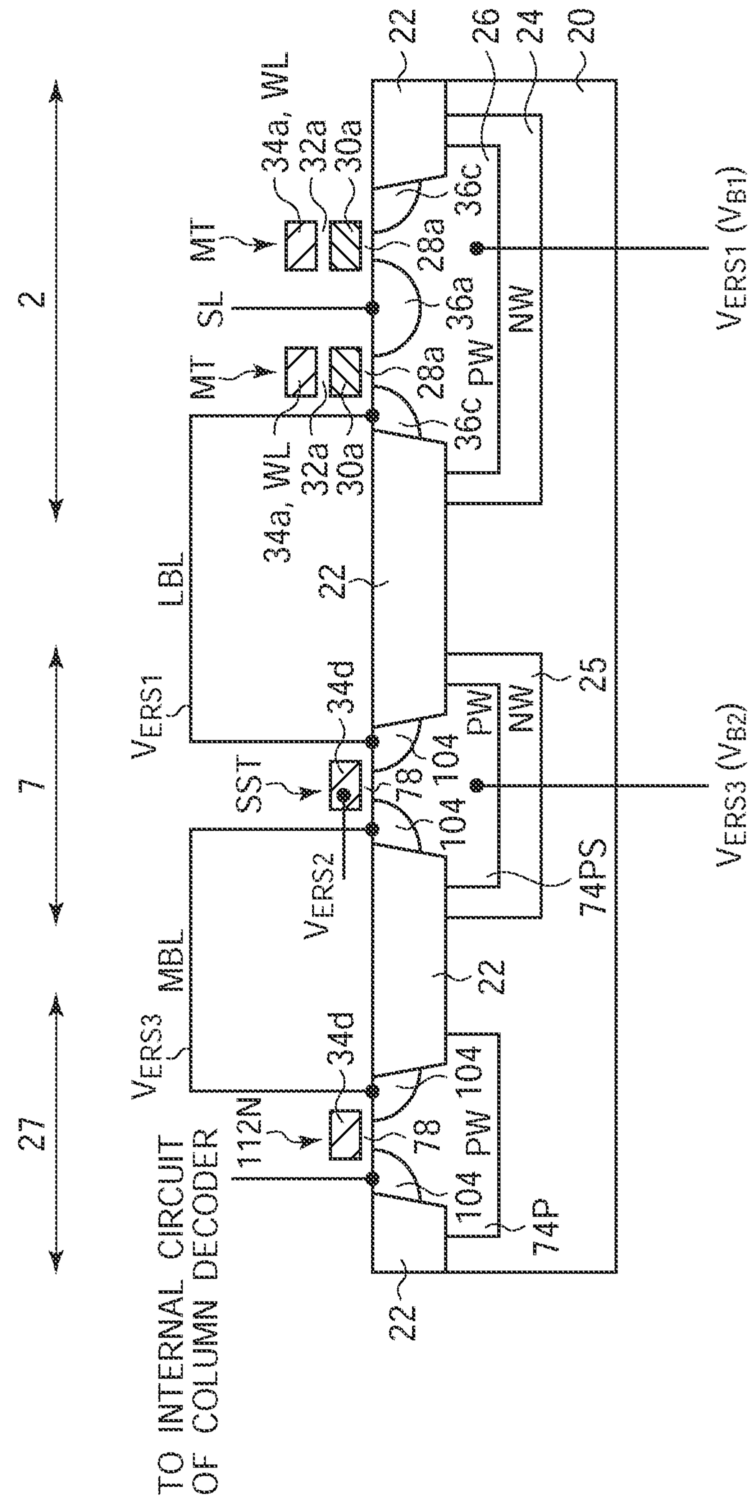
FIG. 9 is a sectional view of the nonvolatile semiconductor memory device according to the first embodiment, which illustrates the erasing method.

Next, the erasing method of the nonvolatile semiconductor memory device according to the present embodiment will be described with reference to FIGS. 7 to 9. FIG. 8 is the time chart of the erasing method of the nonvolatile semiconductor memory device according to the present embodiment. In FIG. 8, the broken lines indicate 0 V potential. FIG. 9 is a sectional view of the nonvolatile semiconductor memory device according to the present embodiment, which illustrates the erasing method.

The erasing of information written in the memory cell array is made e.g., for each sector SCT. The erasing method will be described by the example that information written in a plurality of the memory cells MC exsisting in a first sector SCT1 is erased in a lump.

In the present embodiment, information written in the memory cell transistors MT is erased as follows:

When information written in the memory cell transistors MT is erased, the potentials of the main bit lines MBL are set always floating. When information written in the memory cell transistors MT is erased, the potentials of the source lines SL are set always floating. The potential of the semiconductor substrate 20 is set at 0 V (ground).

When information written in the memory cell transistors MT is erased, first, the potentials $V_{B2}$ of the P-type wells 74PS are set at a third potential $V_{ERS3}$ by the second voltage application circuit 17. The third potential $V_{ERS3}$ is, e.g., 5 V here.

The potentials of the sector select line SSL are set at a second potential $V_{ERS2}$. The second potential $V_{ERS2}$ is, e.g., 5 V here.

Then, the potentials $V_{B1}$ of the P-type wells 26 are set at the first potential $V_{ERS1}$ by the first voltage application circuit 15. The first potential $V_{ERS1}$ is, e.g., 9 V.

Next, the potentials of the word lines WL11, WL12 connected to the memory cells MC in the first sector SCT1 to be erased are set at, e.g., −9 V. On the other hand, the potentials of the word lines WL21, WL22 connected to the memory cells MC in the second sector SCT 2 not to be erased are set, e.g., floating.

With the potentials of the word lines WL11, WL12 set at, e.g., −9 V, the floating gates 30*a* of the memory cell transistors MT are discharged. Thus, no charges are stored in the floating gates 30*a* of the memory cell transistors MT, and the information of the memory cell transistors MT is erased.

As described above, when information written in the memory cell transistors MT is erased, the potentials (the first potential) $V_{ERS1}$ of the P-type wells 26 are set at, e.g., 9 V. With the potential $V_{ERS1}$ of the P-type wells 26 set at 9 V, the potentials $V_{ERS1}'$ of the source diffused layers 104 of the sector select transistors SST become, e.g., about 8.5-8.7 V. The potentials $V_{ERS1}'$ of the source diffused layers 104 becomes lower than the bias voltage $V_{ERS1}$ applied to the P-type wells 26, because voltage drops are caused by the diodes formed by the P-type wells 26 and the drain diffused layers 36*c*.

With the potentials (the third potential) $V_{ERS3}$ of the P-type wells 74PS set at, e.g., 5 V, the potential difference ($V_{ERS1}'-V_{ERS3}$) between the source diffused layers 104 of the sector select transistors SST and the P-type wells 74PS are, e.g., about 3.5-3.7 V. The withstand voltage of the sector select transistors SST is, e.g., about 8 V as described above, and no breakage takes place between the source diffused layers 104 of the sector select transistors SST and the P-type wells 74PS.

With the potentials (the second potential) $V_{ERS2}$ of the sector select lines SSL set at, e.g., 5 V, the potential difference ($V_{ERS1}'-V_{ERS2}$) between the gate electrodes 34*d* and the source diffused layers 104, of the sector select transistors SST are, e.g., about 3.5-3.7 V. The withstand voltage of the sector select transistors SST is, e.g., about 8 V, and no breakage takes place between the gate electrodes 34 and the source diffused layers 104, of the sector select transistors SST.

With the potential (the third potential) $V_{ERS3}$ of the P-type wells 74PS set at, e.g., 5V, the potential $V_{ERS3}'$ of the source diffused layer 104 of the low voltage transistor 112N of the column decoder 12 becomes, e.g., about 4.5-4.7 V. The potential $V_{ERS3}'$ of the source diffused layer 104 of the low voltage transistor 112N of the column decoder 12 is lower than the bias voltage $V_{ESR3}$ applied to the P-type wells 74PS, because voltage drops are caused by the diodes formed by the P-type wells 74PS and the drain diffused layers 104.

The withstand voltage of the low voltage transistor used in the column decoder 12 is, e.g., about 8 V as described above, and accordingly no breakage take place in the low voltage transistor 12N of the column decoder 12.

The potentials of the respective members are not limited to the above.

The potentials $V_{ERS1}$, $V_{ERS3}$ of the respective members are so set that the difference between the potential (the first potential) $V_{ERS1}$ of the P-type well 26 and the potential (the third potential) $V_{ERS3}$ of the P-type well 74PS is smaller than the withstand voltage of the sector select transistor SST.

More specifically, the bias potentials $V_{ERS1}$, $V_{ERS3}$ are so set that the difference between the potential $V_{ERS1}'$ of the source diffused layer 104 of the sector select transistor SST and the potential $V_{ERS3}$ of the P-type well 74PS is smaller than the withstand voltage of the sector select transistor SST.

The respective potentials $V_{ERS1}$, $V_{ERS3}$ are so set that the difference between the potential (the second potential) $V_{ERSE}$ of the gate electrode 34*d* of the sector select transistor SST and the potential (the first potential) $V_{ERS1}$ of the P-type well 26 is smaller than the withstand voltage of the sector select transistor SST.

More strictly, the potentials of the respective potentials $V_{ERS1}$, $V_{ERS2}$ are so set that the difference between the potential $V_{ERS2}$ of the gate electrode 34*d* of the sector select transistor SST and the potential $V_{ERS1}'$ of the source diffused layer 104 is smaller than the withstand voltage of the sector select transistor SST.

The potential $V_{ERS3}$ of the P-type well 74PS is so set that the potential (the third potential) $V_{ERS3}$ of the P-type well 74PS is smaller than the withstand voltage of the low voltage transistor 112N of column decoder 12.

More strictly, the third potential $V_{ERS3}$ is so set that the difference between the potential $V_{ERS3}'$ of the source diffused layer 104 of the low voltage transistor 112N of the column decoder 12 and the potential of the P-type well 74P is smaller than the withstand voltage of the low voltage transistor 112N of the column decoder 12.

With all of the first potential $V_{ERS1}$, the second potential $V_{ERS2}$ and the third potential $V_{ERS3}$ being positive, the second potential $V_{ERS2}$ is set lower than the first potential $V_{ERS1}$, and the third potential $V_{ERS3}$ is set lower than the first potential $V_{ERS1}$.

As described above, in the present embodiment, the P-type well 74PS and the P-type well 26 are electrically isolated by the N-type wells 24, 25, and on the P-type well 74PS, the sector select transistor SST is formed. Accordingly, in the present embodiment, when information written in the memory cell transistor MT is erased, a bias voltage different from a voltage to be applied to the P-type well 26 can be applied to the P-type well 74PS. Accordingly, even when a relatively large voltage is applied to the P-type well 26 upon the erasing of information, a potential difference between the source diffused layer 104 of the sector select transistor SST and the P-type well 74PS can be made relatively small. A bias voltage is applied to the gate electrode 34*d* of the sector select transistor SST, whereby the potential difference between the gate electrode 34*d* and the source diffused layer 104, of the sector transistor SST can be made relatively small. Thus, according to the present embodiment, even in the case that a low voltage transistor of a relatively low withstand voltage is used as the sector select transistor SST, the breakage in the sector select transistor SST upon the erasing can be prevented. In the present embodiment, a low voltage transistor can be used as the sector select transistor SST, whereby a sufficiently large read current can be obtained when information written in the memory cell transistor MT is read. Thus, according to the present embodiment, information written in the memory cell transistors MT can be speedily judged, and consequently, information written in the memory cell transistors MT can be speedily read.

The erasing method has been described here by means of the example that when information written in the memory cell transistors MT is erased, the potential $V_{ERS2}$ of the sector select line SSL is 5 V, but the sector select line SSL may be electrically floating. The gate electrode 34*d* of the sector select transistor SST is capacitively coupled with the source diffused layer 104 of the sector select transistor SST and the P-type well 74PS. Accordingly, with the sector select line SSL floating, the potential of the gate electrode 34*d* of the sector select transistor SST rises corresponding to the potential $V_{ESR3}$ of the P-type well 74PS and the potential $V_{ERS1}'$ of the source diffused layer 104 of the sector select transistor SST. Thus, when information written in the memory cell transistors MT is erased, even with the potentials of the sector select lines SSL floating, the potential difference between the gate electrode 34*d* of the sector select transistors SST and the P-type wells 74PS are retained relatively small. The potential difference between the gate electrodes 34*d* of the sector select transistors SST and the source/drain diffused layers 102 of the sector select transistors SST is retained relatively small. Thus, when information written in the memory cell transistors MT is erased, even with the potential of the sector select line SSL floating, breakage of the sector select transistors SSL can be prevented upon the erasing.

(Method of Manufacturing the Nonvolatile Semiconductor Memory Device)

Next, the method of manufacturing the nonvolatile semiconductor memory device according to the present embodiment will be described with reference to FIGS. 10A to 25. FIGS. 10A to 25 are sectional views of the nonvolatile semiconductor memory device according to the present embodiment in the steps of the method of manufacturing the nonvolatile semiconductor memory device, which illustrate the manufacturing method.

FIGS. 10A, 11A, 12A, 13A, 14A, 15A, 16A, 17A, 18A, 19A, 20A, 21A, 22 and 24 illustrate the memory cell array region (core region) 2. The views on the left sides of FIGS. 10A, 11A, 12A, 13A, 14A, 15A, 16A, 17A, 18A, 19A, 20A, 21A, 22 and 24 correspond to the B-B' section in FIG. 3. The views on the right sides of 10A, 11A, 12A, 13A, 14A, 15A, 16A, 17A, 18A, 19A, 20A, 21A, 22 and 24 correspond to the A-A' section in FIG. 3.

FIGS. 10B, 11B, 12B, 13B, 14B, 15B, 16B, 17B, 18B, 19B, 20B, 21B, 23 and 25 illustrate the peripheral circuit region 4.

The views on the left sides of FIGS. 10B, 11B, 12B, 13B, 14B, 15B, 16B, 17B, 18B, 19B, 20B, 21B, 23 and 25 illustrate a region 6 for the high withstand voltage transistors to be formed in.

That of the region 6 for the high voltage transistors to be formed in, which is on the left sides of the drawings is a region 6N for the high withstand voltage N-channel transistor to be formed in. The region of the drawings, which is right sides of the region 6N for the high withstand voltage N-channel transistor to be formed in is a region 6P for the high withstand voltage P-channel transistor to be formed in.

The region of the drawings, which is right sides of the region 6P for the high withstand voltage transistor to be formed in is a region 7 for the sector select transistor to be formed in.

The views on the right sides of FIGS. 10B, 11B, 12B, 13B, 14B, 15B, 16B, 17B, 18B, 19B, 20B, 21B, 23 and 25 are a region 8 for the low voltage transistors to be formed in.

That of the region 8 for the low voltage transistors to be formed in, which is on the left sides of the drawings is a region 8N for the low voltage N-channel transistor to be formed in, and that of the region 8 for the low voltage transistors to be formed in, which is on the right sides of the drawings is a region 8P for the low voltage P-channel transistor to be formed in.

Figure 10A:
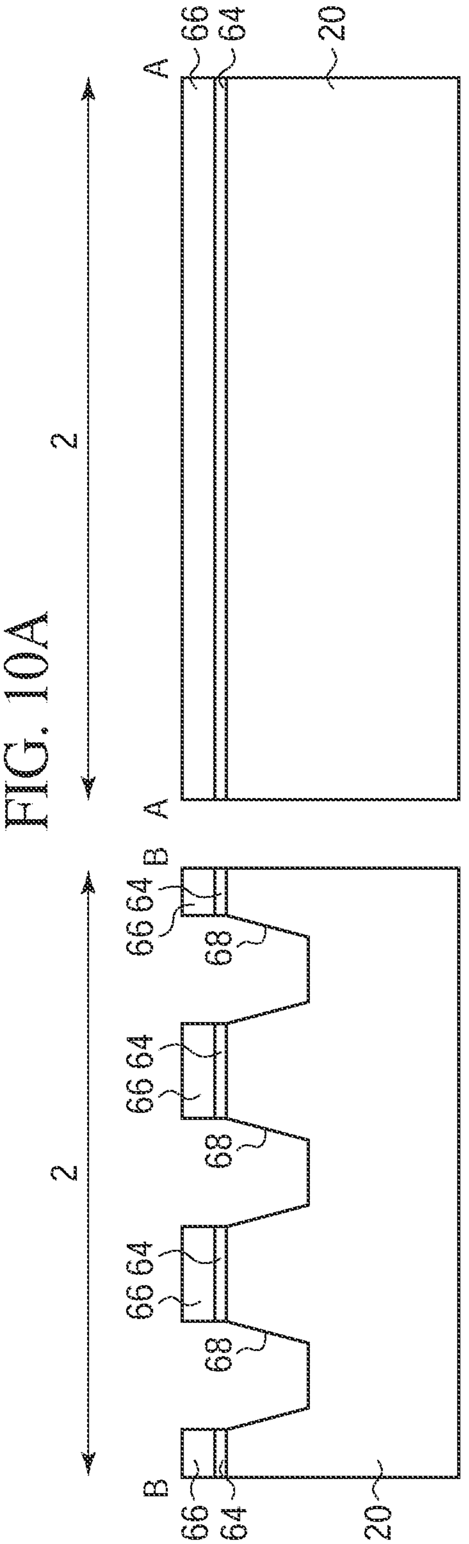
FIGS. 10A to 25 are sectional views of the nonvolatile semiconductor memory device according to the first embodiment in the steps of the method of manufacturing the nonvolatile semiconductor memory device, which illustrate the method.
Figure 10B:
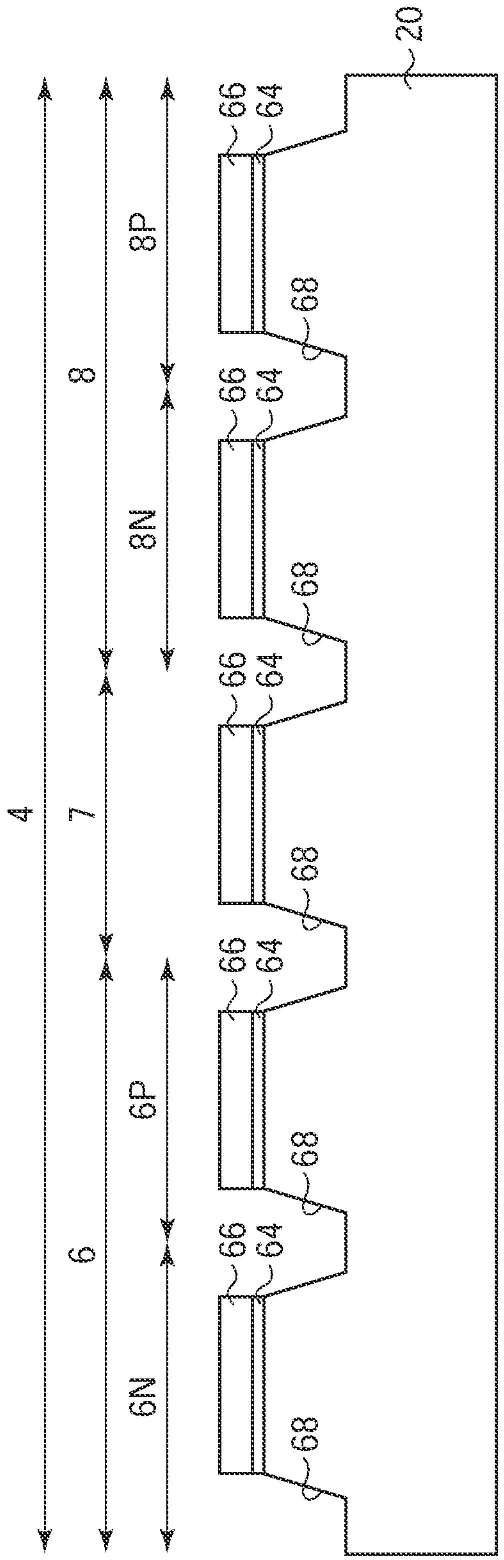
Figure 11A:
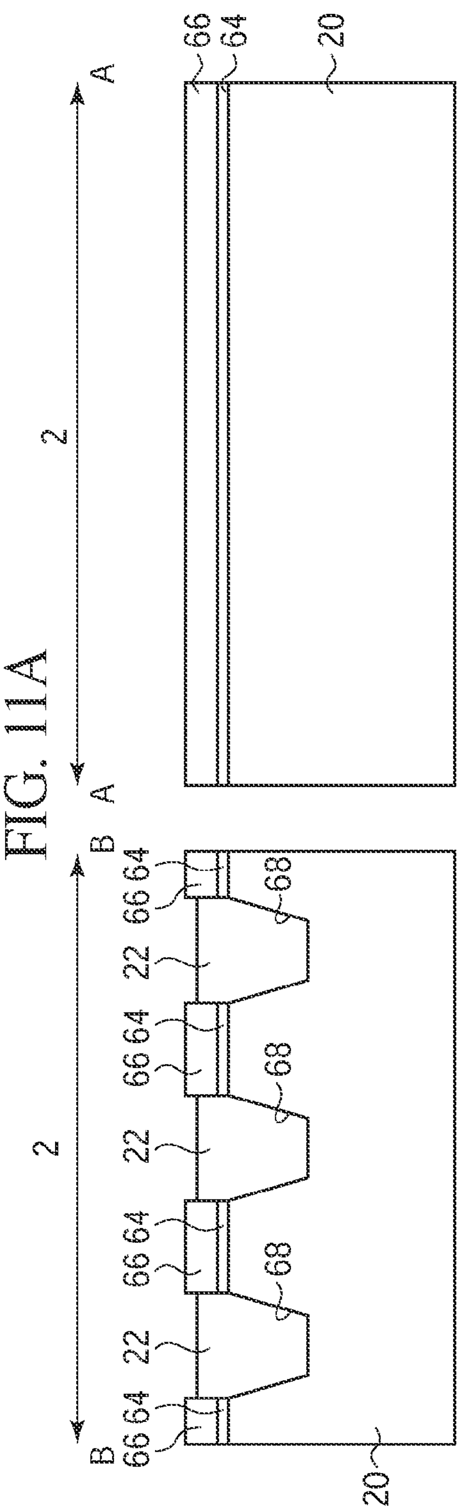
Figure 11B:
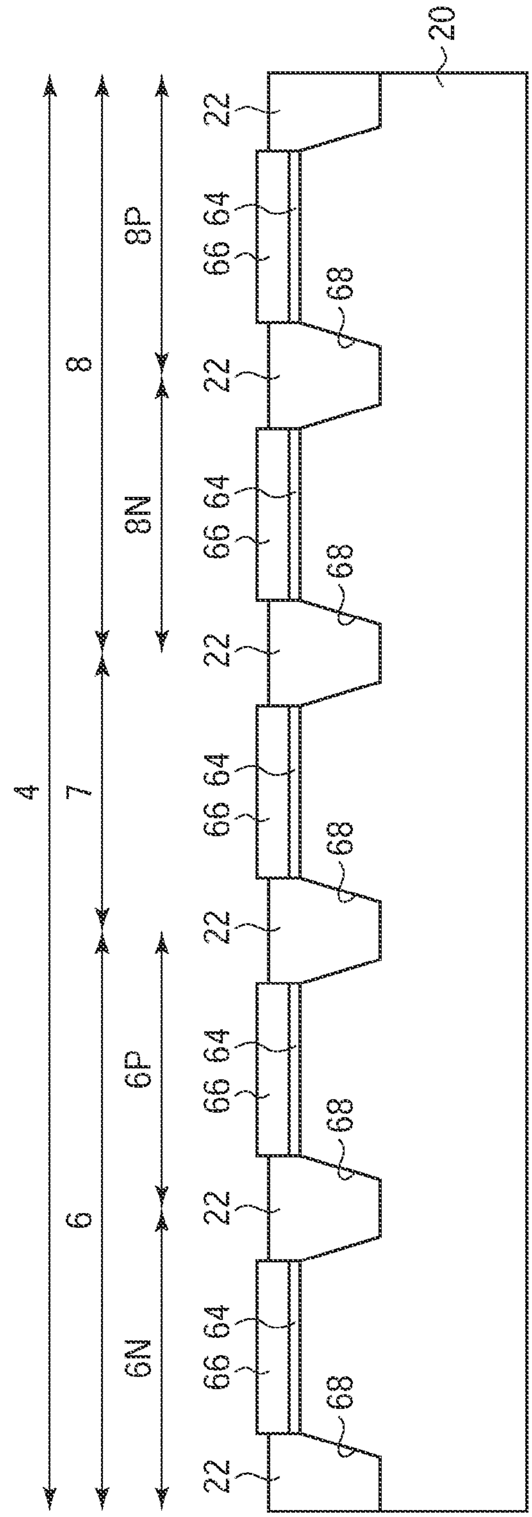

First, as illustrated in FIGS. 10A and 10B, the semiconductor substrate 20 is prepared. As the semiconductor substrate 20, a P-type silicon substrate, for example, is prepared.

Next, a thermal oxide film 64 of, e.g., a 15 nm-film thickness is formed on the entire surface by, e.g., thermal oxidation.

Next, on the entire surface, a silicon nitride film 66 of, e.g., a 150 nm-film thickness is formed by, e.g., CVD.

Next, on the entire surface, a photoresist film (not illustrated) is formed by, e.g. spin coating.

Then, openings (not illustrated) are formed in the photoresist film by photolithography. The openings are for patterning the silicon nitride film 66.

Next, with the photoresist film as the mask, the silicon nitride film 66 is patterned. Thus, a hard mask 66 of silicon nitride film is formed.

Then, the semiconductor substrate 20 is etched by dry etching with the hard mask 66 as the mask. Thus, trenches 68 are formed in the semiconductor substrate 20. The depth of the trenches 68 to be formed in the semiconductor substrate 20 is, e.g., 400 nm from the surface of the semiconductor substrate 20.

Next, the exposed parts of the semiconductor substrate 20 are oxidized by thermal oxidation. Thus, a silicon oxide film (not illustrated) is formed on the exposed parts of the semiconductor substrate 20.

Then, a silicon oxide film 22 of, e.g., a 700 nm-film thickness is formed on the entire surface by high density plasma-enhanced CVD.

Next, the silicon oxide film 22 is polished by CMP (Chemical Mechanical Polishing) until the surface of the silicon nitride film 66 is exposed. Thus, the device isolation regions 22 of silicon oxide film are formed (see FIGS. 11A and 11B).

Next, thermal processing for curing the device isolation regions 22 is made. The thermal processing conditions are, e.g., nitrogen atmosphere, 900° C. and 30 minutes.

Then, the silicon nitride film 66 is removed by wet etching.

Figures 12A, 12B:
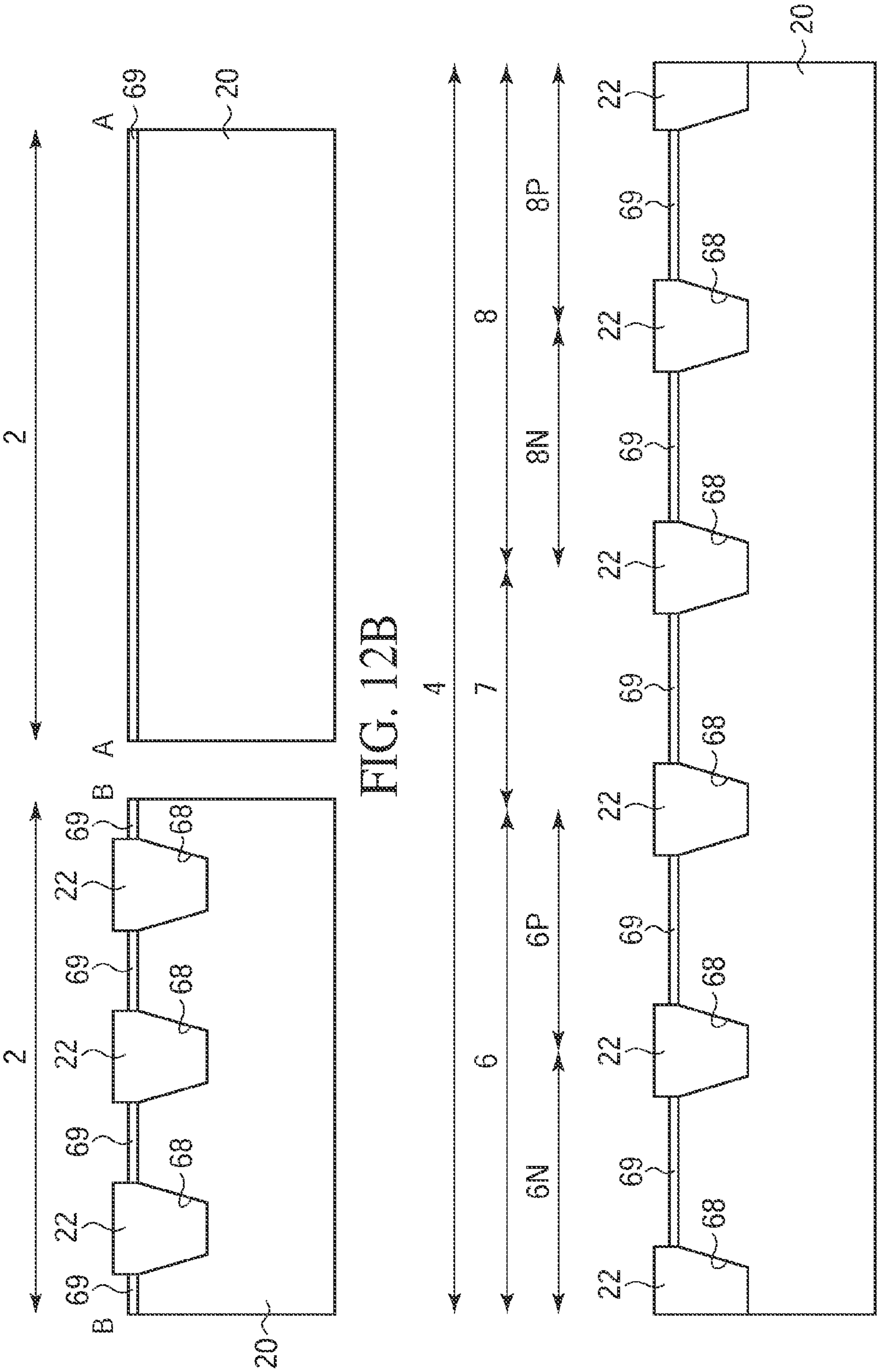

Next, as illustrated in FIGS. 12A and 12B, a sacrifice oxide film 69 is grown on the surface of the semiconductor substrate 20 by thermal oxidation.

Figure 13A:
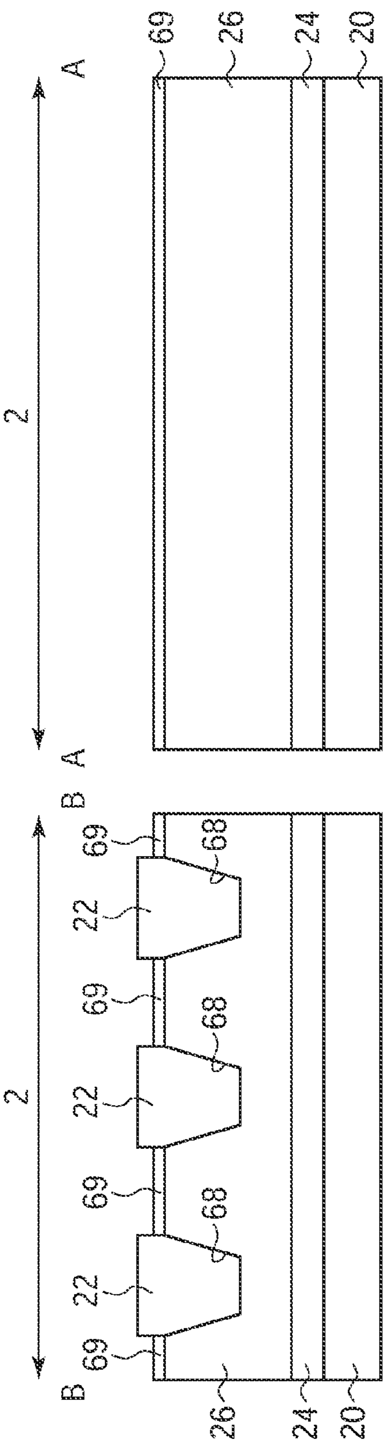
Figure 13B:
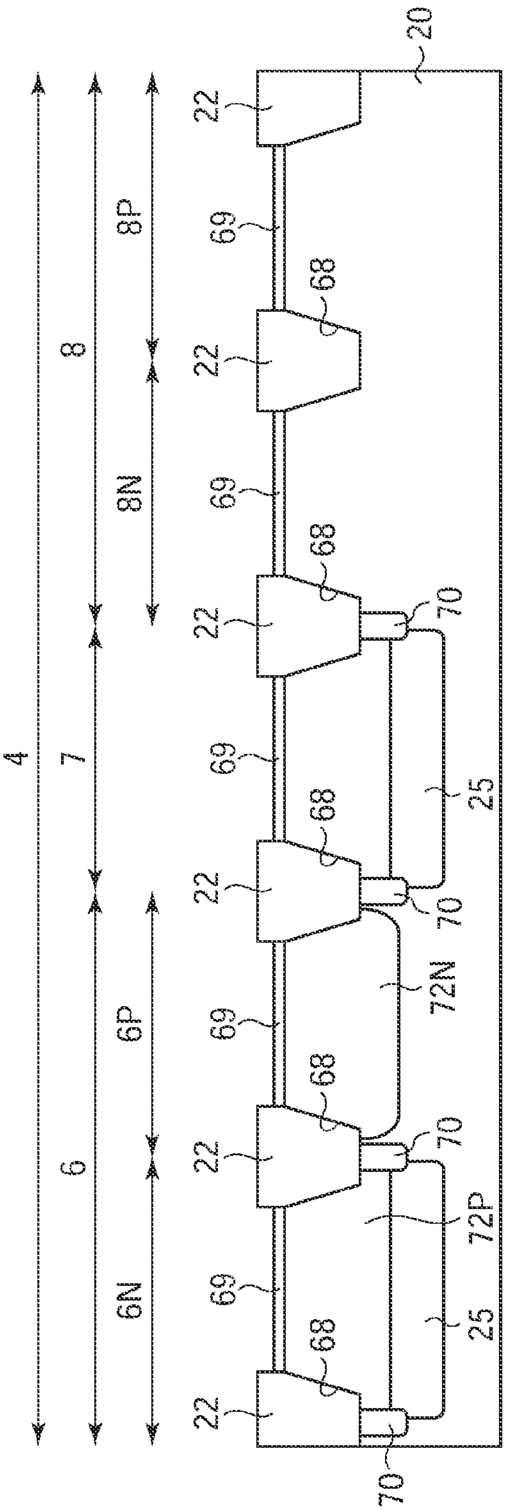

Then, as illustrated in FIGS. 13A and 13B, an N-type dopant impurity is implanted deep in the memory cell array region 2 to thereby form an N-type buried diffused layer 24. Also in the region 6N for the high withstand voltage N-channel transistor to be formed in, the N-type dopant impurity is implanted deep to thereby form an N-type buried diffused layer 25. Also in the region 7 for the sector select transistor to be formed in, the N-type dopant impurity is implanted deep to thereby form an N-type buried diffused layer 25. In the memory cell array region 2, a P-type dopant impurity is implanted shallower than the buried diffused layer 24 to thereby form the P-type well 26. In the region 6N for the high withstand voltage N-channel transistor to be formed in the P-type dopant impurity is implanted shallower than the buried diffused layer 25 to thereby form the P-type well 72P.

Then, in the region 6N for the high withstand voltage N-channel transistor to be formed in, an N-type diffused layer

70 is formed in a frame shape. Such frame-shaped diffused layer 70 is formed from the surface of the semiconductor substrate 20 to the periphery of the buried diffused layer 25. The P-type well 72P is enclosed by the buried diffused layer 25 and the diffused layer 70.

Also in the region 7 for the sector select transistor to be formed in, the N-type diffused layer 70 is formed in the frame shape. Such frame-shaped diffused layer 70 is formed from the surface of the semiconductor substrate 20 to the periphery of the buried diffused layer 25.

Although not illustrated, the P-type well 26 of the memory cell array region 2 is enclosed also by the buried diffused layer 24 and the frame-shaped diffused layer 70.

Then, in the region 6P for the high withstand voltage P-channel transistor to be formed in, an N-type dopant impurity is implanted to thereby form an N-type well 72N.

Next, in the memory cell array region 2, channel doping is made (not illustrated).

Then, channel doping is made in the region 6N for the high withstand voltage N-channel transistor to be formed in and the region 6P for the high withstand voltage P-channel transistor to be formed in.

Next, the sacrifice oxide film 69 on the surface of the semiconductor substrate 20 is etched off.

Figure 14A:
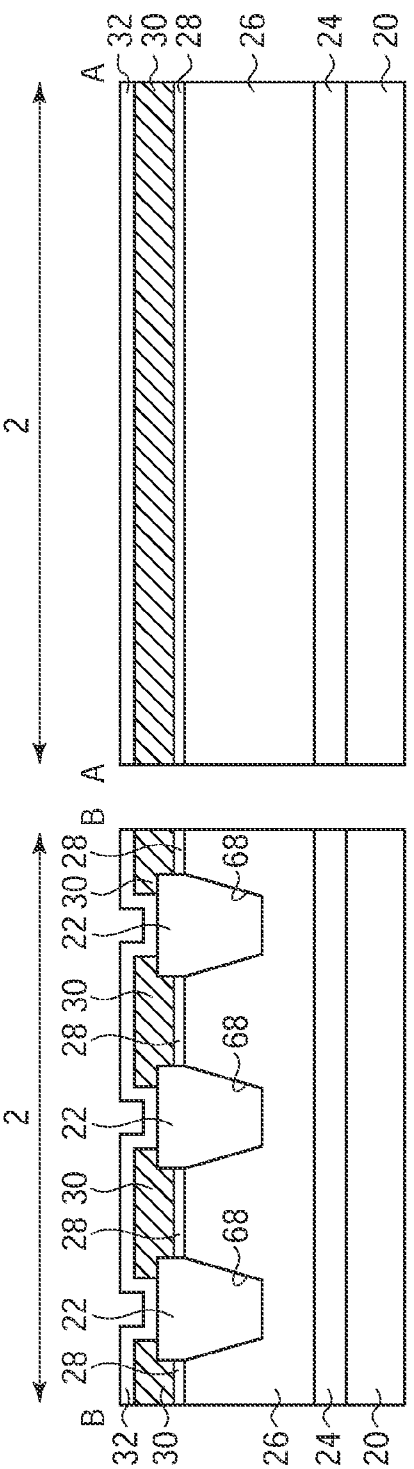
Figure 14B:
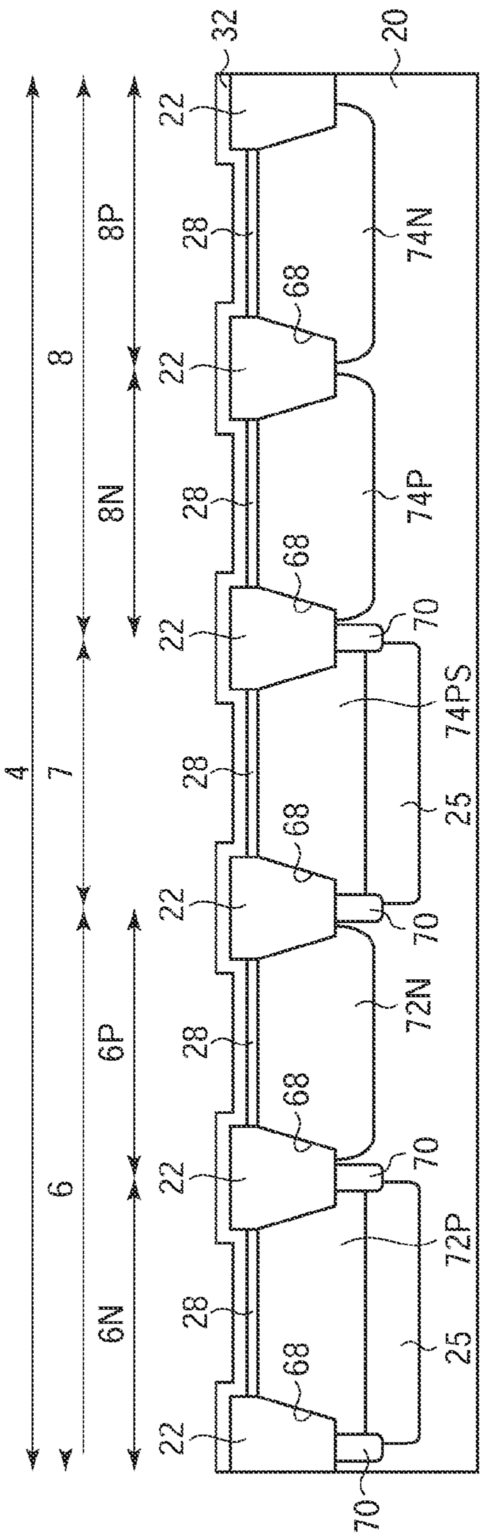

Next, a 10 nm-film thickness tunnel insulation film 28 is formed on the entire surface by thermal oxidation (see FIGS. 14A and 14B).

Then, a 90 nm-film thickness polysilicon film 30 is formed on the entire surface by, e.g., CVD. As such polysilicon film 30, polysilicon film with an impurity doped is formed.

Then, the polysilicon film 30 in the memory cell region 2 is patterned, and the polysilicon film 30 in the peripheral circuit region 4 is etched off.

Then, on the entire surface, an insulation film (ONO film) 32 of silicon oxide film, silicon nitride film and silicon oxide film sequentially stacked is formed. The insulation film 32 is for insulating the floating gate 30*a* and the control gate 34*a*.

Next, a P-type dopant impurity is implanted in the region 8N for the low voltage N-channel transistor to be formed in to thereby form the P-type well 74P. A P-type dopant impurity is implanted in the region 7 for the sector select transistor to be formed in to thereby form the P-type well 74PS.

Then, into the region 8P for the low voltage P-channel transistor to be formed in, an N-type dopant impurity is implanted to form the N-type well 74N.

Then, channel doping is made in the region 8N for the low voltage N-channel transistor to be formed in, the region 8P for the low voltage P-channel transistor to be formed in and the region 7 for the sector select transistor to be formed in (not illustrated).

Next, the insulation film (ONO film) 32 existing in the peripheral circuit region 4 is etched off.

Figures 15A, 15B:
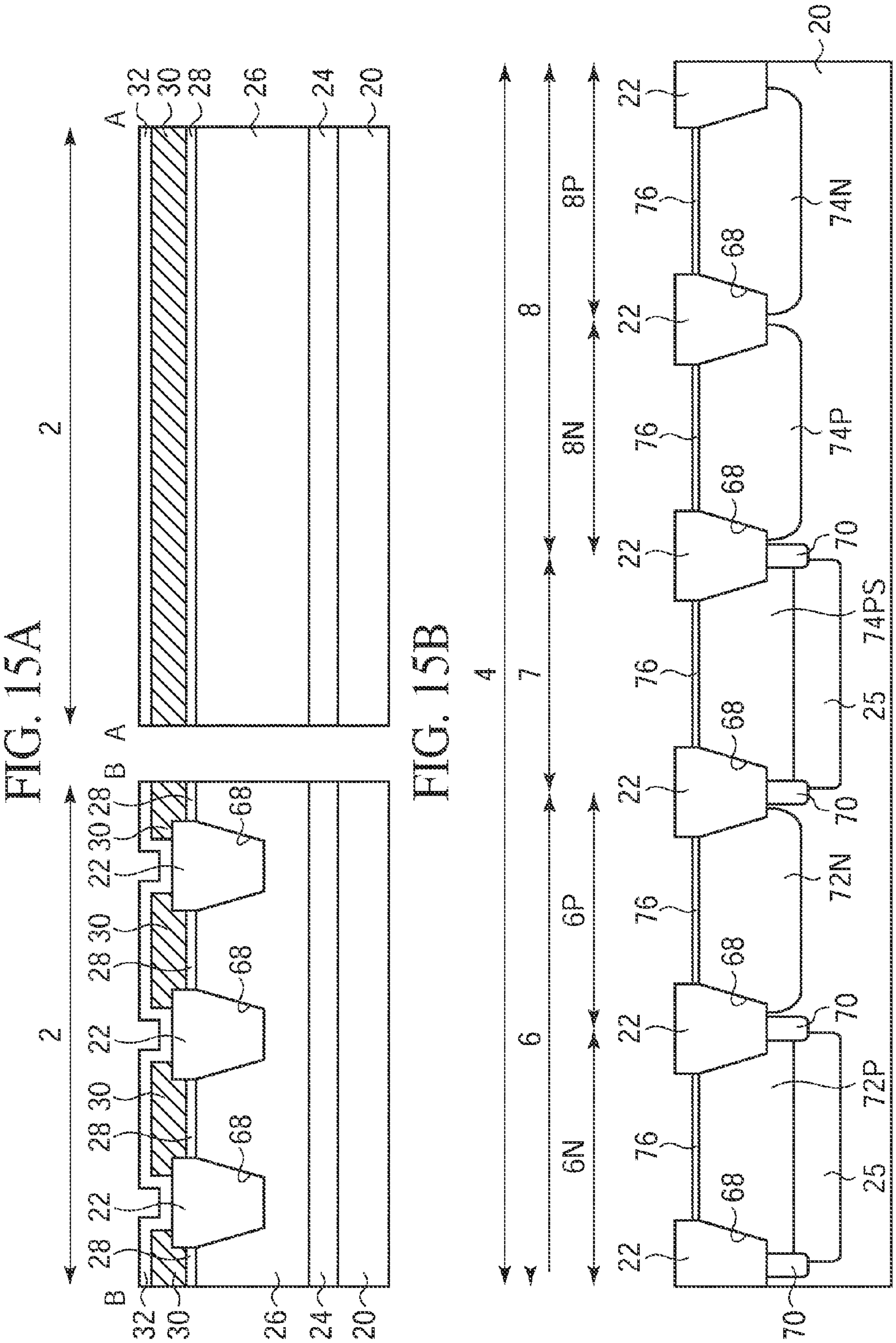
Figures 16A, 16B:
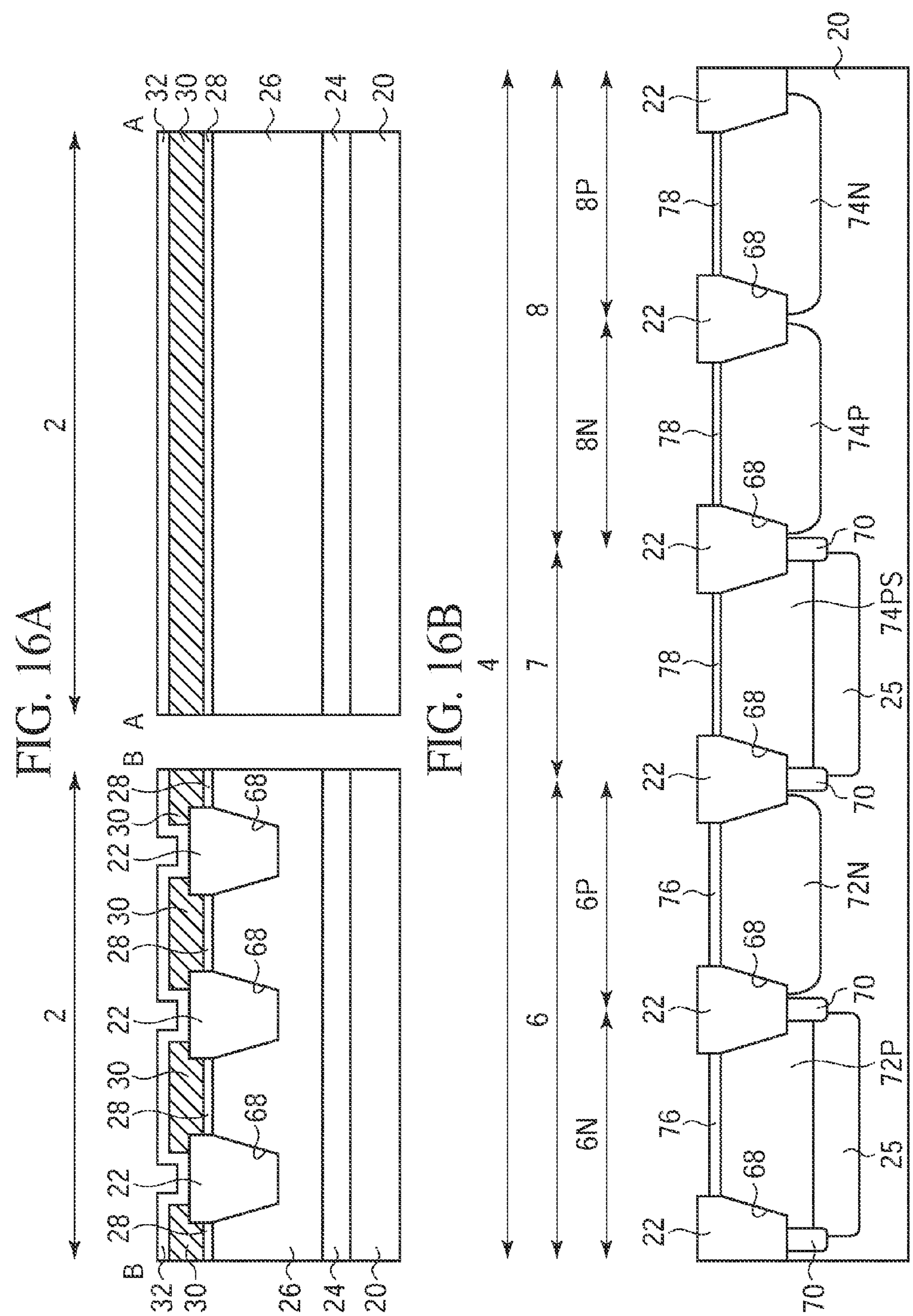

Then, on the entire surface, a gate insulation film 76 of, e.g., a 9 nm-film thickness is formed by thermal oxidation (see FIGS. 15A and 15B).

Then, by wet etching, the gate insulation film existing in the region 7 for the sector select transistor to be formed in and in the region 8 for the low voltage transistor to be formed in is etched off.

Next, the gate insulation film 78 of, e.g., an 11 nm-film thickness is formed on the entire surface by thermal oxidation. Thus, the gate insulation film 78 of, e.g., an 11 nm-film thickness is formed in the region 7 for the sector select transistor to be formed in and in the region 8 for the low voltage transistor to be formed in. In the region 6 for the high voltage transistor to be formed in, the film thickness of the gate insulation film 76 becomes, e.g., about 16 nm (see FIGS. 16A and 16B).

Then, a polysilicon film 34 of, e.g., a 180 nm-film thickness is formed on the entire surface by, e.g., CVD.

Figures 17A, 17B:
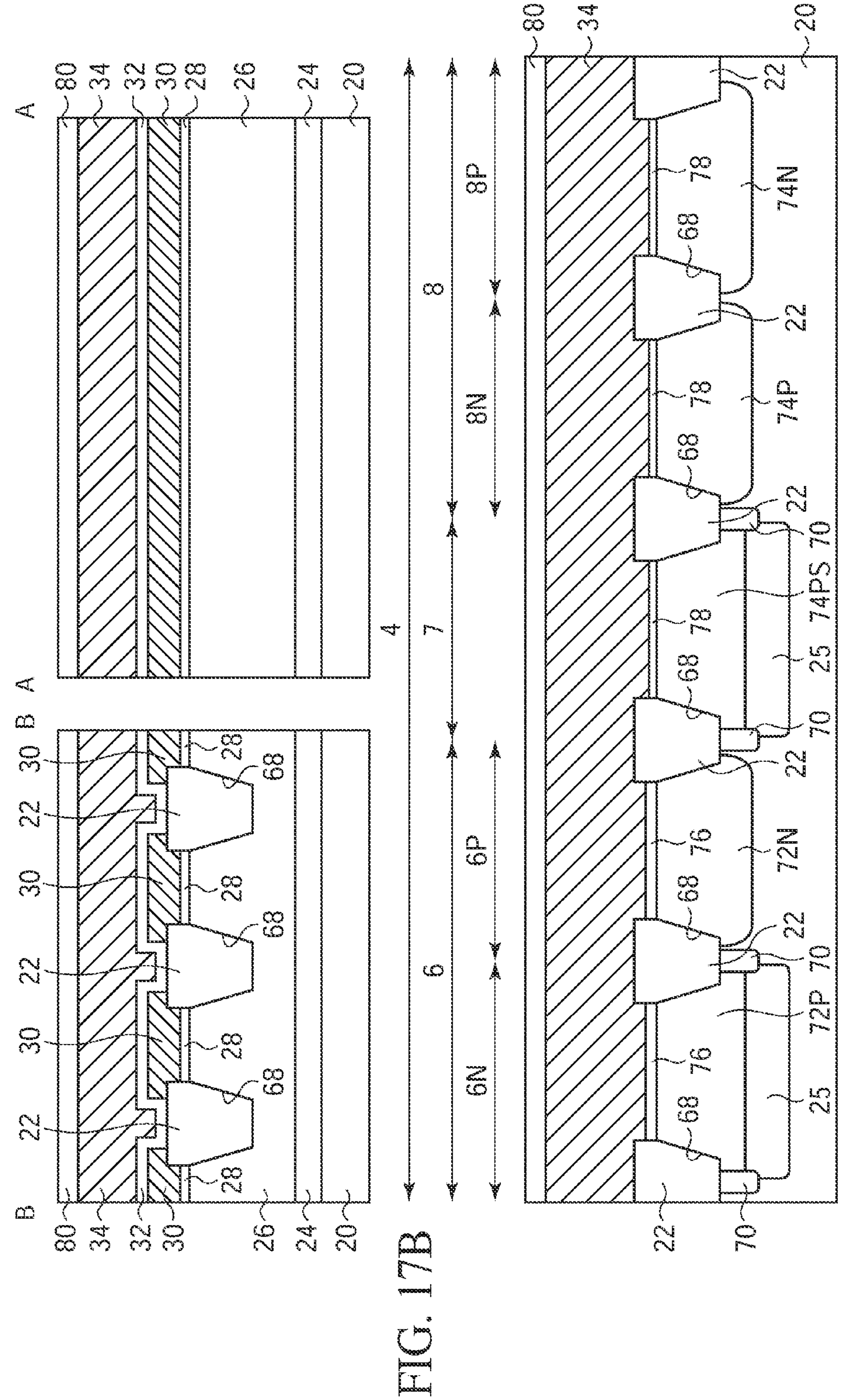

Next, an antireflection film 80 is formed on the entire surface (see FIGS. 17A and 17B).

Figure 18A:
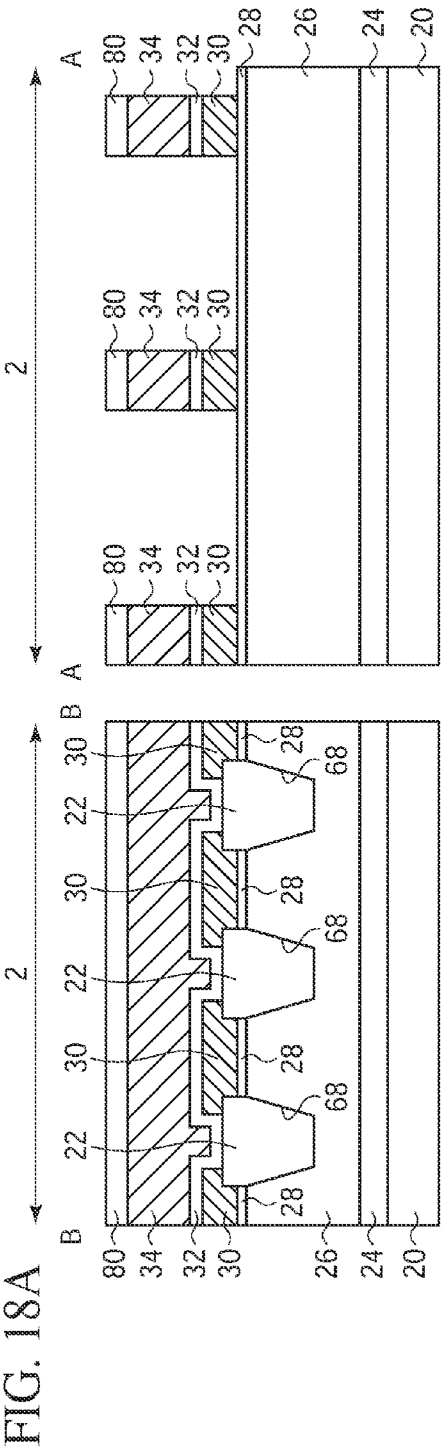
Figure 18B:
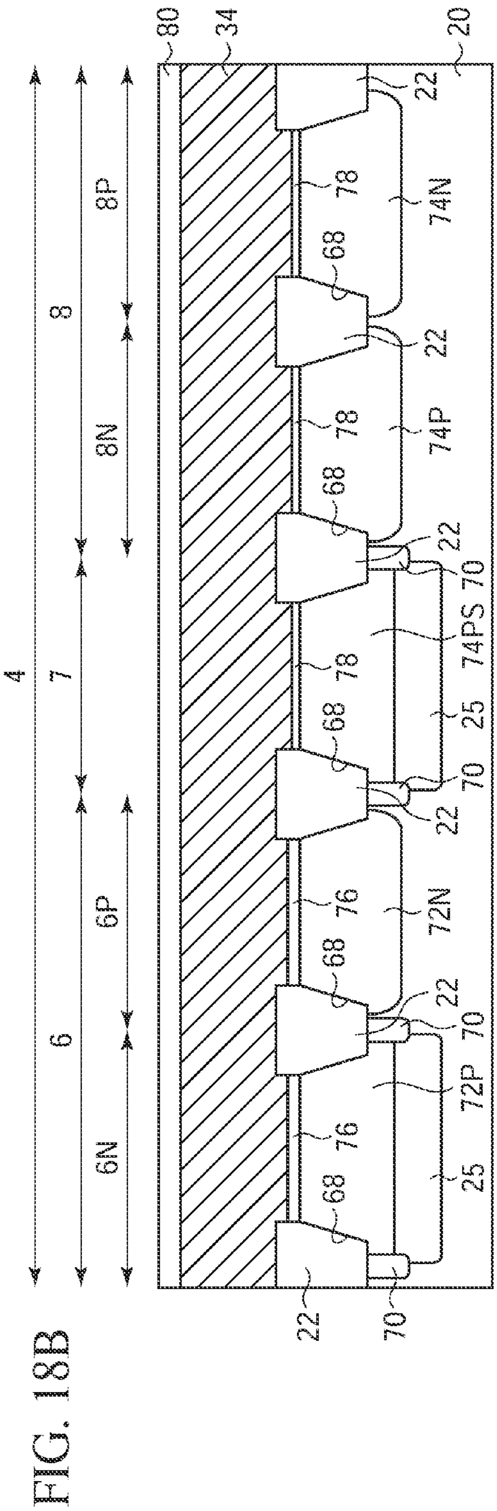
Figure 19A:
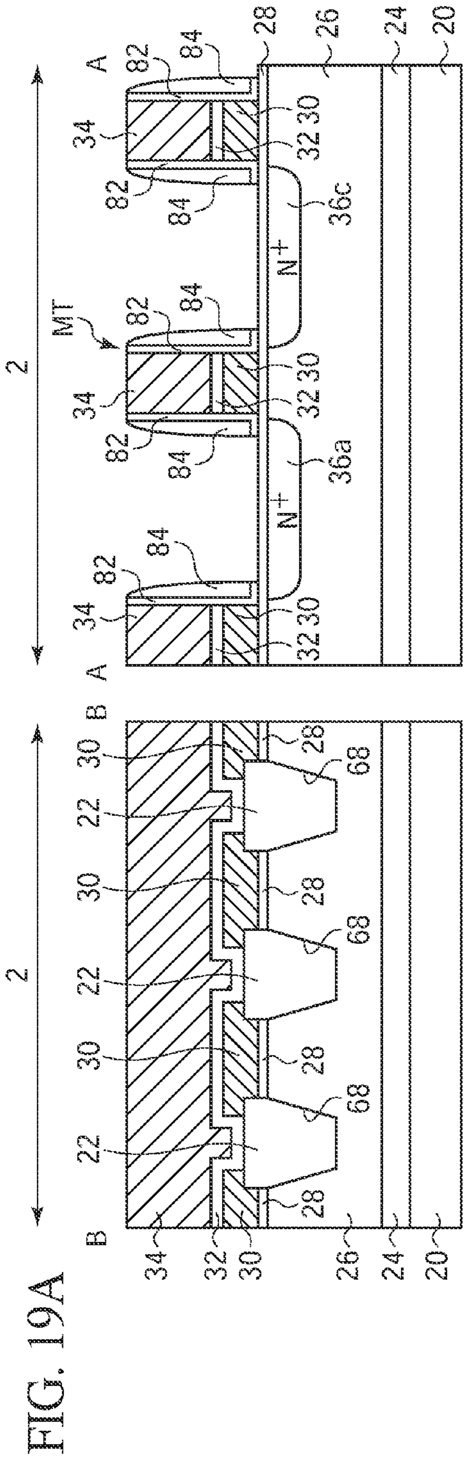
Figure 19B:
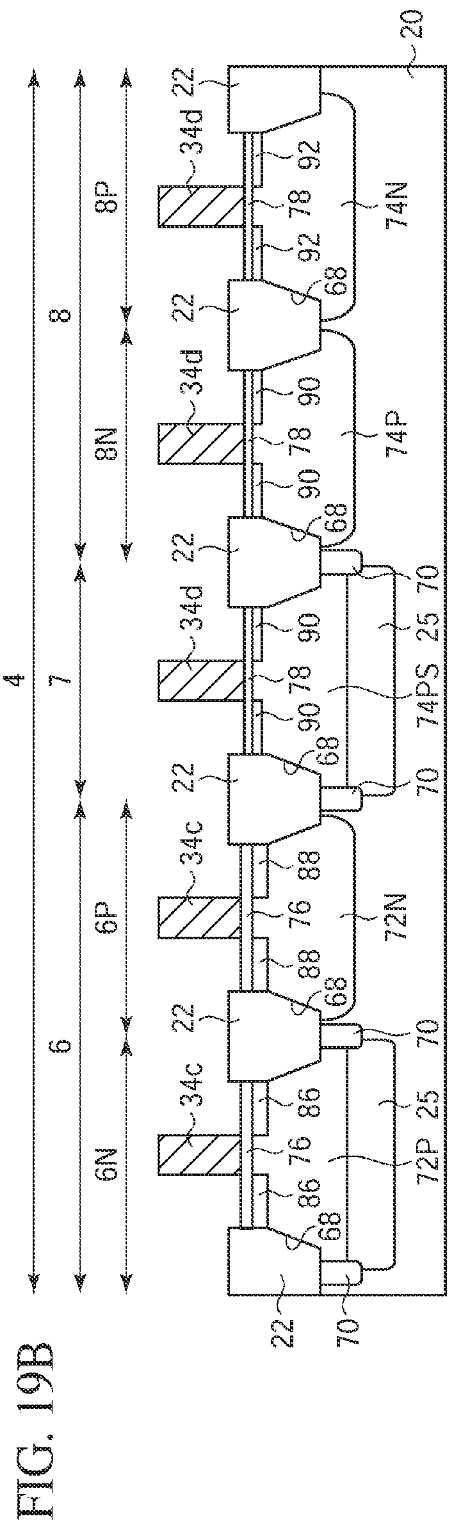
Figure 20A:
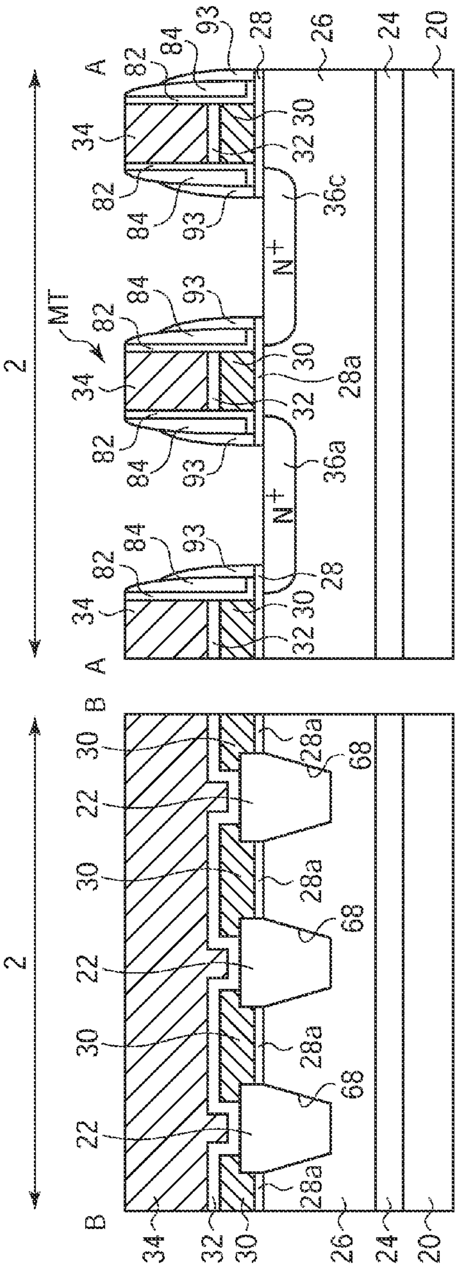
Figure 20B:
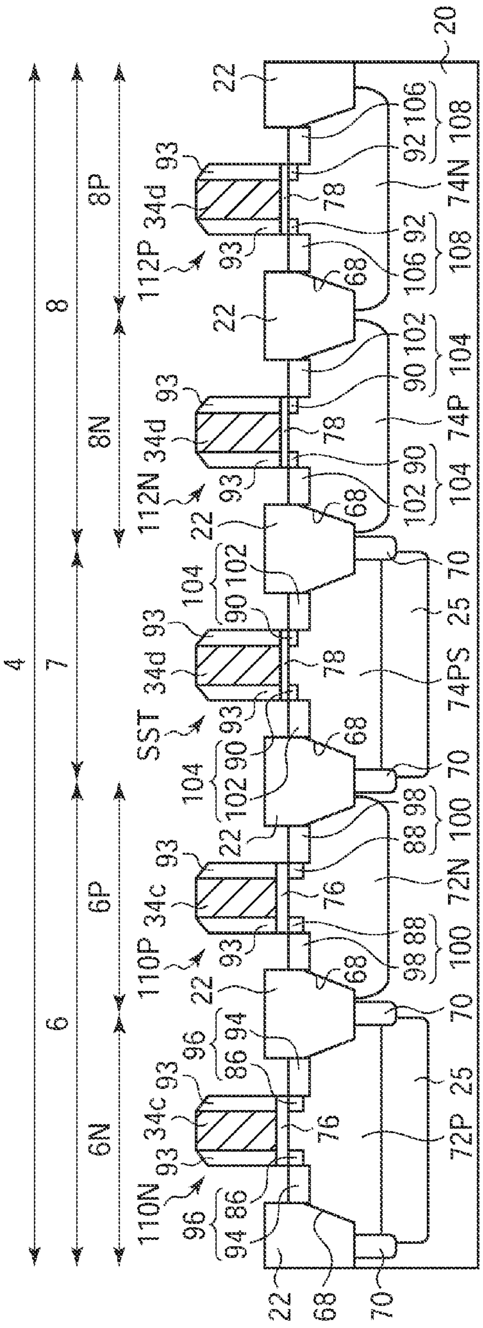

Then, as illustrated in FIGS. 18A and 18B, the anti-reflection coating 80, the polysilicon film 34, the insulation film 32 and the silicon film 30 are dry etched by photolithography. Thus, the layered structures including the floating gate 30*a* of polysilicon and the control gate 34*a* of polysilicon are formed in the memory cell array region 2.

Then, by thermal oxidation, a silicon oxide film (not illustrated) is formed on the side walls of the floating gates 30*a* and on the side wall of the control gates 34*a*.

Next, on the entire surface, a photoresist film (not illustrated) is formed by spin coating.

Next, by photolithography, an opening (not illustrated) exposing the memory cell array region 2 is formed in the photoresist film.

Next, with the photoresist film as the mask, an N-type dopant impurity is implanted into the semiconductor substrate 20. Thus, in the semiconductor substrate 20 on both sides of the floating gates 30*a*, impurity diffused layers 36*a*, 36*c* are formed. Then, the photoresist film is released.

Thus, the memory cell transistors MT including the floating gates 30*a*, the control gates 34*a* and the source/drain diffused layers 36*a*, 36*c* are formed.

Then, by thermal oxidation, a silicon oxide film 82 is formed on the side walls of the floating gates 30*a* and on the side walls of the control gates 34*a*.

Next, by, e.g., CVD, a 50 nm-film thickness silicon nitride film 84 is formed.

The silicon nitride film 84 is anisotropically etched by dry etching to thereby form the sidewall insulation film 84 of silicon nitride film. At this time, the antireflection film 80 is etched off.

Then, by photolithography, the polysilicon film 34 in the region 6 for the high voltage transistor to be formed in and the region 8 for the low voltage transistor to be formed in is patterned. Thus, the gate electrodes 34*c* of the high voltage transistors 110N, 110P are formed of the polysilicon film 34. The gate electrodes 34*d* of the low voltage transistors 112N, 112P are also formed of the polysilicon 34. The gate electrode 34*d* of the sector select transistor SST is also formed of the polysilicon film 34.

Then, on the entire surface, a photoresist film (not illustrated) is formed by spin coating.

Next, by photolithography, an opening (not illustrated) exposing the region 6N for the high withstand voltage N-channel transistor to be formed in is formed in the photoresist film.

Then, with the photoresist film as the mask, an N-type dopant impurity is implanted into the semiconductor substrate 20. Thus, in the semiconductor substrate 20 on both sides of the gate electrode 34*c* of the high withstand voltage N-channel transistor 110N, N-type lightly doped diffused layers 86 are formed. Then, the photoresist film is released.

Next, on the entire surface, a photoresist film (not illustrated) is formed by spin coating.

Next, by photolithography, an opening (not illustrated) exposing the region 6P for the high withstand voltage P-channel transistor to be formed in is formed in the photoresist film.

Next, with the photoresist film as the mask, a P-type dopant impurity is implanted into the semiconductor substrate 20. Thus, P-type lightly doped diffused layers 88 are formed in the semiconductor substrate 20 on both sides of the gate electrode 34*c* of the high withstand voltage P-channel transistor 110P. Then, the photoresist film is released.

Next, on the entire surface, a photoresist film (not illustrated) is formed by spin coating.

Next, by photolithography, an opening (not illustrated) exposing the region 7 for the sector transistor to be formed in and an opening (not illustrated) exposing the region 8N for the low voltage N-channel transistor to be formed in are formed in the photoresist film.

Next, with the photoresist film as the mask, an N-type dopant impurity is implanted into the semiconductor substrate 20. Thus, in the semiconductor substrate 20 on both sides of the gate electrode 34*d* of the sector select transistor SST, N-type lightly doped diffused layers 90 are formed. In the semiconductor substrate 20 on both sides of the gate electrode 34*d* of the low voltage N-channel transistor 112N, an N-type lightly doped diffused layer 90 is formed. Then, the photoresist film is released.

Then, on the entire surface, a photoresist film (not illustrated) is formed by spin coating.

Next, by photolithography, an opening (not illustrated) exposing the region 8P for the low voltage P-channel transistor formed in is formed in the photoresist film.

Next, with the photoresist film as the mask, a P-type dopant impurity is implanted into the semiconductor substrate 20. Thus, a P-type lightly doped diffused layer 92 is formed in the semiconductor substrate 20 on both side of the gate electrode 34*d* of the low voltage P-channel transistor 112P. Then, the photoresist film is released (see FIGS. 19A and 19B).

Then, a 100 nm-film thickness silicon oxide film 93 is formed by, e.g., CVD.

Next, the silicon oxide film 93 is anisotropically etched by dry etching. Thus, sidewall insulation films 93 of silicon oxide film are formed on the side walls of the layered structures including the floating gate 30*a* and the control gate 34*a*. On the side walls of the gate electrodes 34*c*, 34*d*, sidewall insulation films 93 of silicon oxide film are formed.

Next, on the entire surface, a photoresist film (not illustrated) is formed by spin coating.

Then, by photolithography, an opening (not illustrated) exposing the region 6N for the high withstand voltage N-channel transistor to be formed in is formed in the photoresist film.

Next, with the photoresist film as the mask, an N-type dopant impurity is implanted into the semiconductor substrate 20. Thus, in the semiconductor substrate 20 on both sides of the gate electrode 34*c* of the high withstand voltage N-channel transistor 110N, N-type heavily doped diffused layers 94 are formed. The N-type lightly doped diffused layer 86 and the N-type heavily doped diffused layer 94 form the N-type source/drain diffused layers 96 of the LDD structure. Thus, the high withstand voltage N-channel transistor 110N including the gate electrode 34*c* and the source/drain diffused layers 96 is formed. The high withstand voltage N-channel transistor 110N is used in the high voltage circuit (high withstand voltage circuit). Then, the photoresist film is released.

Next, on the entire surface, a photoresist film (not illustrated) is formed by spin coating.

Then, by photolithography, an opening (not illustrated) exposing the region 6P for the high voltage P-channel transistor to be formed in is formed in the photoresist film.

Then, with the photoresist film as the mask, a P-type dopant impurity is implanted into the semiconductor substrate 20. Thus, in the semiconductor substrate 20 on both sides of the gate electrode 34*c* of the high withstand voltage P-channel transistor 110P, P-type heavily doped diffused layers 98 are formed. The P-type lightly doped diffused layer 88 and the P-type heavily doped diffused layer 98 form a P-type source/drain diffused layer 100 of the LDD structure. Thus, the high withstand voltage P-channel transistor 110P including the gate electrode 34*c* and the source/drain diffused layers 100 is formed. The high withstand voltage P-channel transistor 110P is used in the high voltage circuit (high withstand voltage circuit). Then, the photoresist film is released.

Next, on the entire surface, a photoresist film (not illustrated) is formed by spin coating.

Then, by photolithography, an opening (not illustrated) exposing the region 7 for the sector select transistor to be formed in and an opening (not illustrated) exposing the region 8N for the low voltage N-channel transistor to be formed in are formed in the photoresist film.

Next, with the photoresist film as the mask, an N-type dopant impurity is implanted into the semiconductor substrate 20. Thus, in the semiconductor substrate 20 on both sides of the gate electrode 34*d* of the sector select transistor SST, N-type heavily doped diffused layers 102 are formed. In the semiconductor substrate 20 on both sides of the gate electrode 34*d* of the low voltage N-channel transistor 112N, an N-type heavily doped impurity layer 102 is formed. The N-type lightly doped diffused layer 90 and the N-type heavily doped diffused layer 102 form source/drain diffused layers 104 of the LDD structure. Thus, the sector select transistor SST including the gate electrode 34*d* and the source/drain diffused layers 104 is formed. The low voltage N-channel transistor 112N including the gate electrode 34*d* and the source/drain diffused layer 104 is formed. The low voltage N-channel transistor 112N is used as the low voltage circuit. Then, the photoresist film is released.

Next, on the entire surface, a photoresist film (not illustrated) is formed by spin coating.

Next, by photolithography, an opening (not illustrated) exposing the region 8P for the low voltage P-channel transistor to be formed in is formed in the photoresist film.

Next, with the photoresist film as the mask, a P-type dopant impurity is implanted into the semiconductor substrate 20. Thus, in the semiconductor substrate 20 on both sides of the gate electrode 34*d* of the low voltage P-channel transistor 112P, P-type heavily doped diffused layers 106 are formed. The P-type lightly doped diffused layer 92 and the P-type heavily doped diffused layer 106 form the P-type source/drain diffused layers 108 of the LDD structure. Thus, the low voltage P-channel transistor 112P including the gate electrode 34*d* and the source/drain diffused layers 108 is formed. The low voltage P-channel transistor 112P is used in the low voltage circuit. Then, the photoresist film is released (see FIGS. 20A and 20B).

Next, by, e.g., sputtering, a cobalt film of, e.g., a 10 nm-film thickness is formed on the entire surface.

Next, thermal processing is made to react the silicon atoms in the surface of the semiconductor substrate 20 and the cobalt atoms of the cobalt film with each other, the silicon atoms in the surface of the control gate 34*c* and the cobalt atoms in the cobalt film with each other, the silicon atoms in the surface of the polysilicon film 34*d* and the cobalt atoms in the cobalt film with each other, and the silicon atoms in the surface of the gate electrodes 34*c*, 34*d* and the cobalt atoms in the cobalt film with each other. Thus, cobalt silicide films 38*a*, 38*b* are formed on the source/drain diffused layer 36*a*, 36*c*, a cobalt silicide film 38*c* is formed on the control gate 34*a*, cobalt silicide films 38*e* are formed on the source/drain diffused layers 96, 100, 104, 108 and a cobalt silicide film 38*f* is formed on the gate electrodes 34*c*, 34*d*.

Next, the unreacted cobalt film is etched off.

The cobalt silicide films 38*a* formed on the source diffused layer 36*a* of the memory cell transistors MT function as the source electrodes. The cobalt silicide films 38*b* formed on the drain diffused layers 36*c* of the memory cell transistors MT function as the drain electrodes.

The cobalt silicide films 38*e* formed on the source/drain diffused layers 96, 100 of the high withstand voltage transistors 110N, 110P function as the source/drain electrodes.

The cobalt silicide films 38*e* formed on the source/drain diffused layers 104 of the sector select transistor SST function as the source/drain electrodes.

Figure 21A:
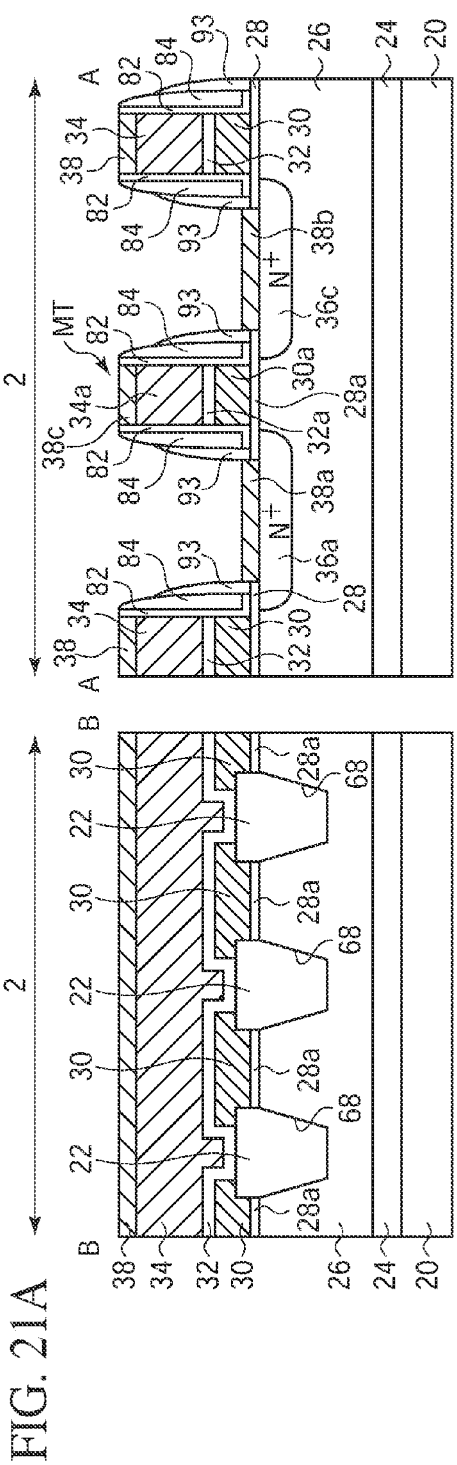
Figure 21B:
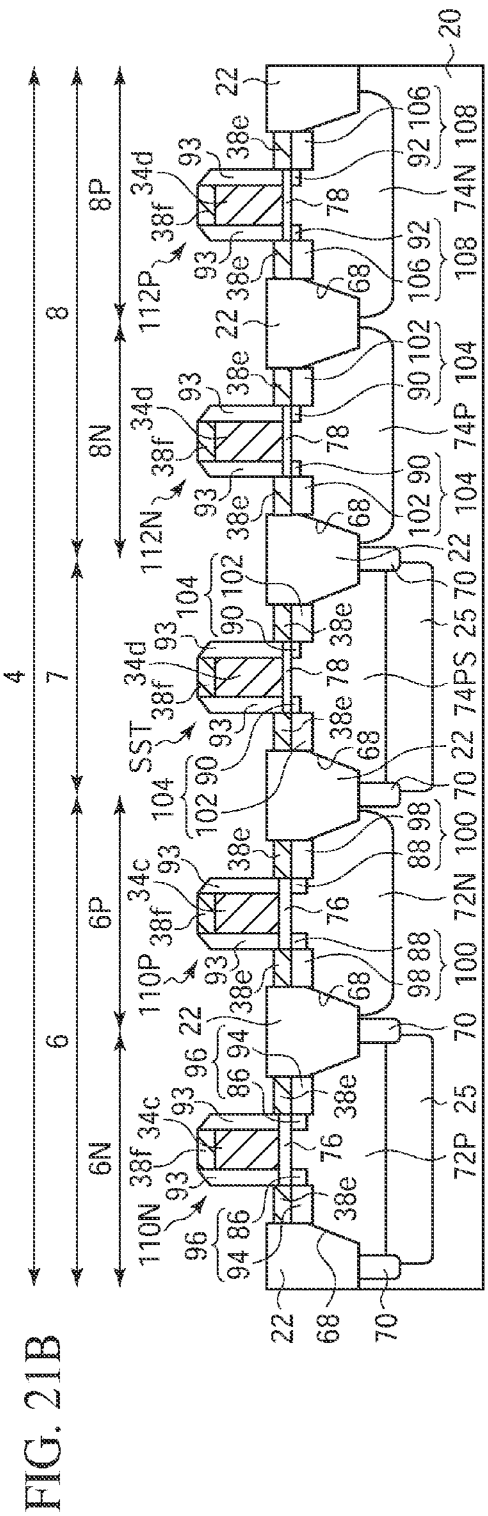

The cobalt silicide films 38*e* formed on the source/drain diffused layers 104, 108 of the low voltage transistors 112N, 112P function as the source/drain electrodes (see FIGS. 21A and 21B).

Next, on the entire surface, a 100 nm-film thickness silicon nitride film 114 is formed by, e.g., CVD. The silicon nitride film 114 functions as the etching stopper.

Then, on the entire surface, a 1.6 μm-film thickness silicon oxide film 116 is formed by CVD. Thus, an inter-layer insulation film 40 of the silicon nitride film 114 and the silicon oxide film 116 is formed.

Next, the surface of the inter-layer insulation film 40 is planarized by CMP.

Next, by photolithography, contact holes 42 arriving at the source/drain electrodes 38*a*, 38*b*, a contact hole 42 arriving at the cobalt silicide film 38*e* and a contact hole 42 arriving at the cobalt silicide film 38*f* are formed.

Then, on the entire surface, a barrier layer (not illustrated) of a Ti film and a TiN film is formed by sputtering.

Next, on the entire surface, a 300 nm-film thickness tungsten film 44 is formed by, e.g., CVD.

Then, the tungsten film 44 and the barrier film are polished until the surface of the inter-layer insulation film 40 is exposed by CMP. Thus, in the contact holes 42, conductor plugs 44 of, e.g. tungsten are buried.

Then, on the inter-layer insulation film 40 with the conductor plugs 44 buried in, a Ti film, a TiN film, an Al film, a Ti film and a TiN film are sequentially stacked by, e.g., sputtering to form a layered film 46.

Figure 22:
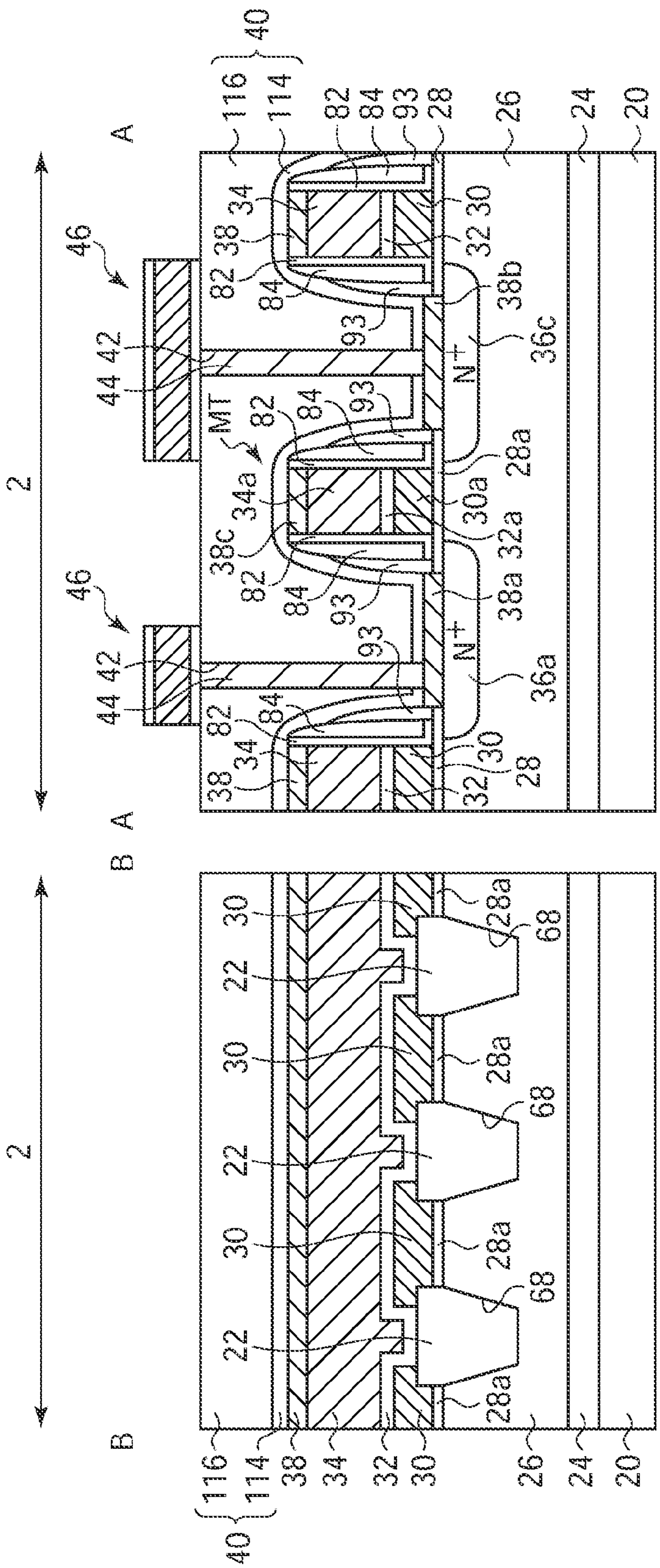
Figure 23:
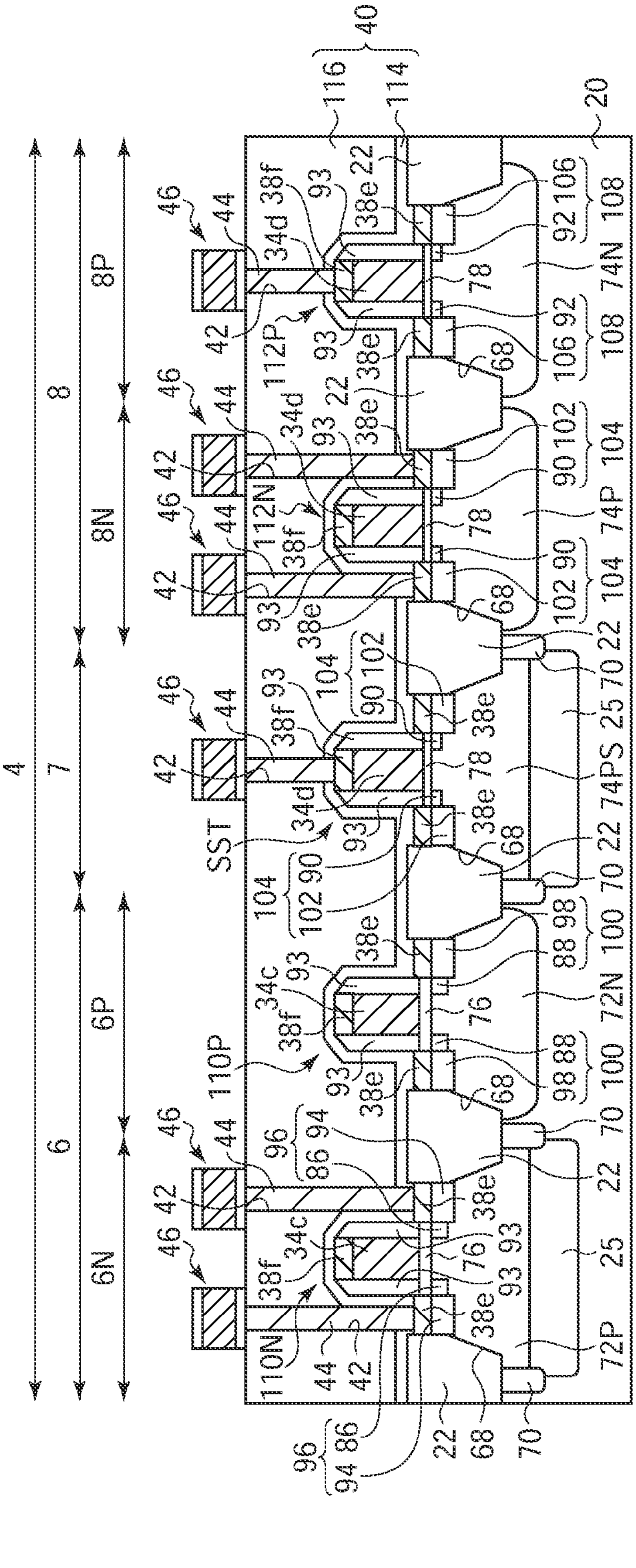

Then, by photolithography, the layered film 46 is patterned, and interconnections (the first metal interconnection layer) 46 of the layered film is formed (see FIGS. 22 and 23).

Figure 24:
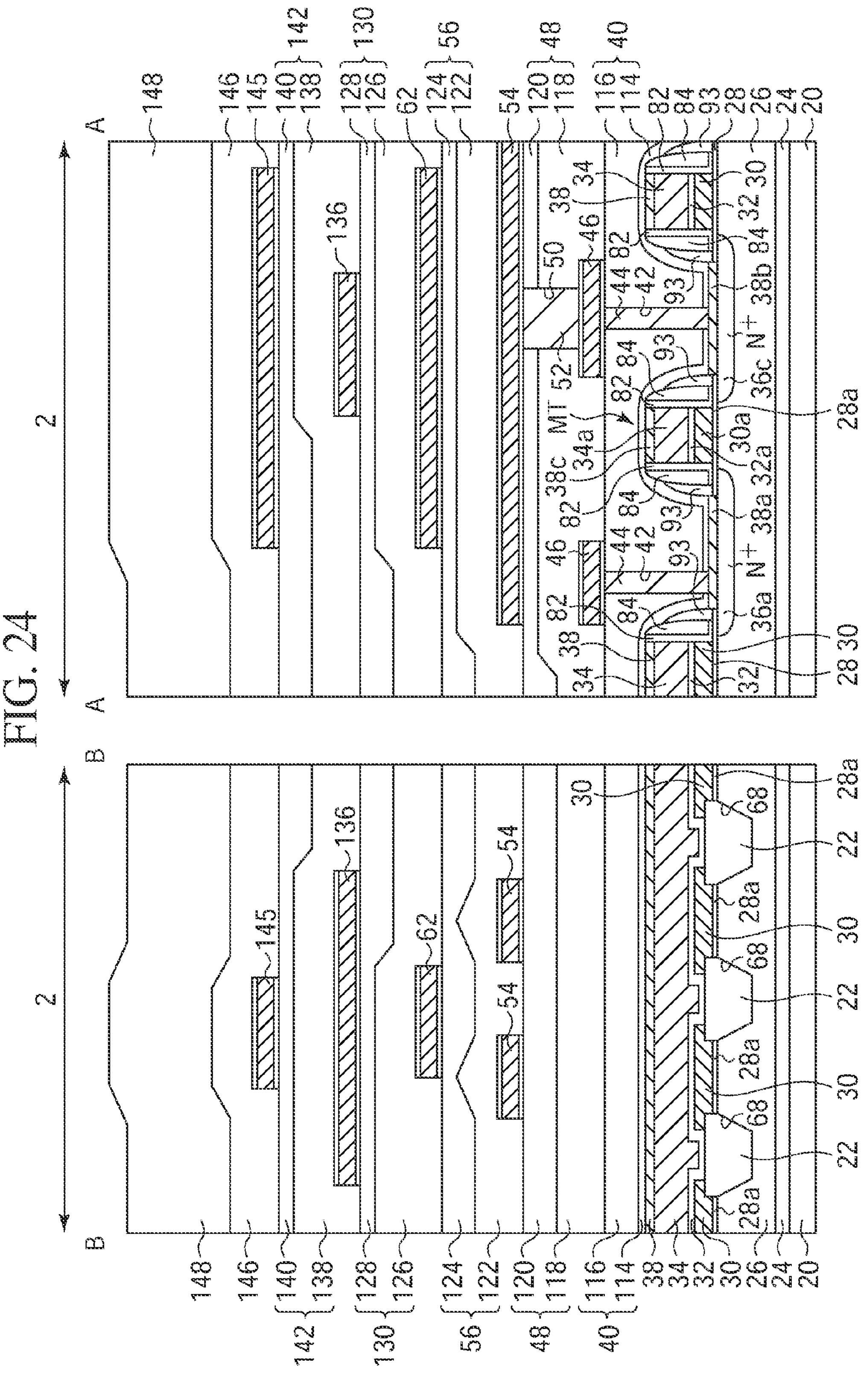
Figure 25:
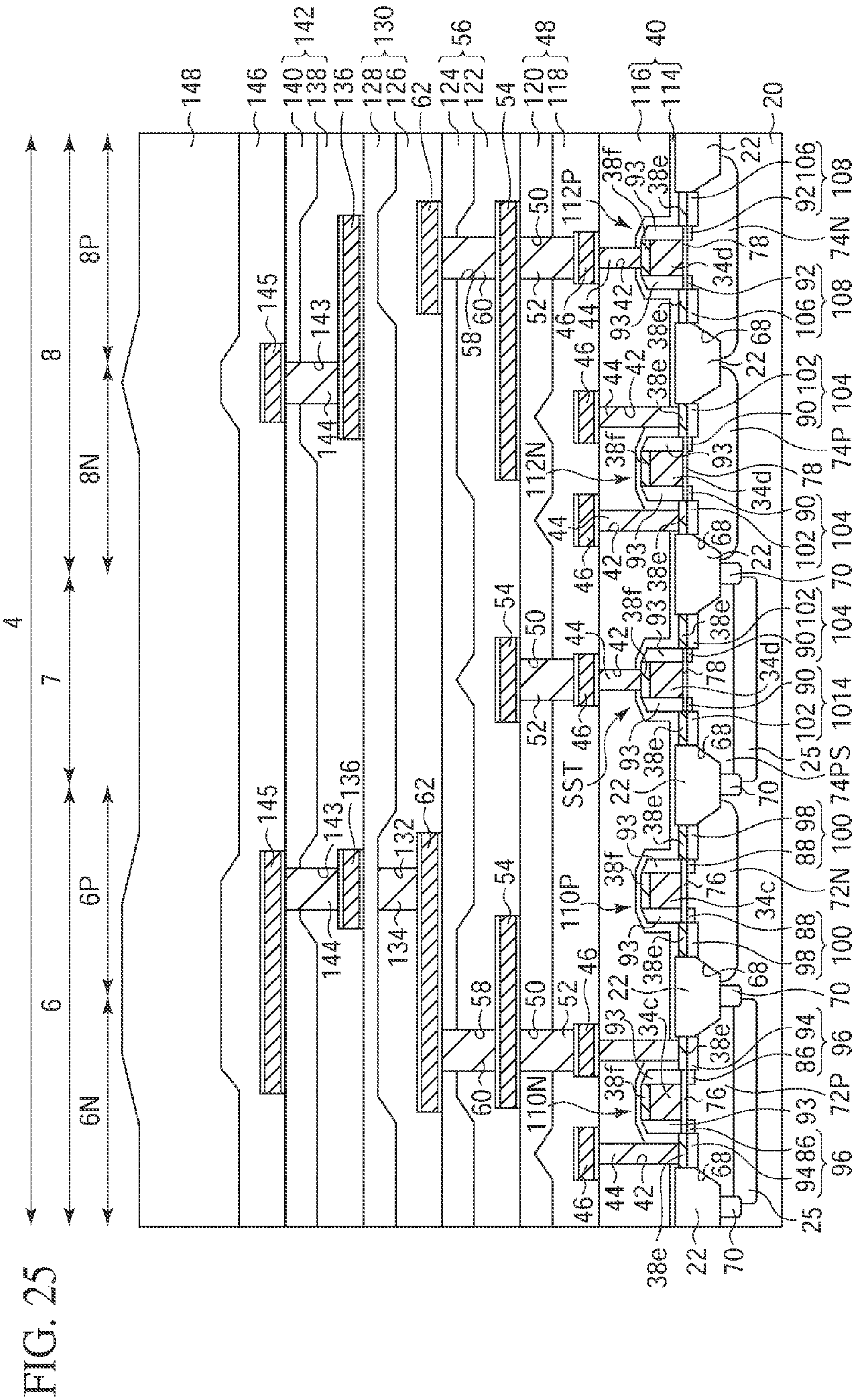

Next, as illustrated in FIGS. 24 and 25, a 700 nm-film thickness silicon oxide film 118 is formed by, e.g., high density plasma-enhanced CVD.

Next, by TEOSCVD, a silicon oxide film 120 is formed. The silicon oxide film 118 and the silicon oxide film 120 form an inter-layer insulation film 48.

Next, by photolithography, a contact hole 50 arriving at the interconnection 46 is formed in the inter-layer insulation film 48.

Next, on the entire surface, a barrier layer (not illustrated) of a Ti film and a TiN film is formed by sputtering.

Next, on the entire surface, a 300 nm-film thickness tungsten film 52 is formed by, e.g., CVD.

Next, the tungsten film 52 and barrier film are polished by CMP until the surface of the inter-layer insulation film 48 is exposed. Thus, conductor plugs 52 of, e.g., tungsten are buried in the contact holes 50.

Next, on the inter-layer insulation film 48 with the conductor plugs 52 buried in, a Ti film, a TiN film, an Al film, a Ti film and a TiN film are sequentially stacked by, e.g., sputtering to form a layered film 54.

Next, the layered film 54 is patterned by photolithography. Thus, interconnections (the second metal interconnection layers) 54 of the layered film are formed.

Next, a silicon oxide film 122 is formed by, e.g., high density plasma-enhanced CVD.

Next, a silicon oxide film 124 is formed by TEOSCVD. An inter-layer insulation film 56 is formed of the silicon oxide film 122 and the silicon oxide film 124.

Next, by photolithography, contact holes 58 arriving at the interconnections 54 are formed in the inter-layer insulation film 56.

Next, a barrier layer (not illustrated) of a Ti film and a TiN film is formed on the entire surface by sputtering.

Next, a 300 nm-film thickness tungsten film 60 is formed on the entire surface by, e.g. CVD.

Next, the tungsten film 60 and the barrier film are polished by CMP until the surface of the inter-layer insulation film 56 is exposed. Thus, conductor plugs 60 of, e.g., tungsten are buried in the contact holes 58.

Then, a layered film 62 is formed by, e.g., sputtering on the inter-layer insulation film 56 with the conductor plugs 60 buried in.

Next, the layered film 62 is patterned by photolithography. Thus, an interconnection (the third metal interconnection layer) 62 of the layered film is formed.

Next, the silicon oxide film 126 is formed by, e.g., high density plasma-enhanced CVD.

Then, a silicon oxide film 128 is formed by TEOSCVD. An inter-layer insulation film 130 is formed of the silicon oxide film 126 and the silicon oxide film 128.

Next, by photolithography, a contact hole 132 arriving at the interconnection 62 is formed in the inter-layer insulation film 130.

Next, a barrier layer (not illustrated) of a Ti film and a TiN film is formed on the entire surface by sputtering.

Next, a 300 nm-film thickness tungsten film 134 is formed on the entire surface by, e.g., CVD.

Then, the tungsten film 134 and the barrier film are polished by CMP until the surface of the inter-layer insulation film 130 is exposed. Thus, a conductor plug 134 of, e.g., tungsten is buried in the contact hole 132.

Next, by, e.g., sputtering, a layered film 136 is formed on the inter-layer insulation film 130 with the conductor plug 134 buried in.

Next, by photolithography, the layered film 136 is patterned. Thus, interconnections (the fourth metal interconnection layers) 136 are formed of the layered film.

Next, a silicon oxide film 138 is formed by, e.g., high density plasma-enhanced CVD.

Next, a silicon oxide film 140 is formed by TEOSCVD. An inter-layer insulation film 142 is formed of the silicon oxide film 138 and the silicon oxide film 140.

Next, by photolithography, contact holes 143 arriving at the interconnections 136 are formed in the inter-layer insulation film 142.

Next, on the entire surface, a barrier layer (not illustrated) formed of a Ti film and a TiN film is formed by sputtering.

Next, a 300 nm-film thickness tungsten film 146 is formed on the entire surface by, e.g., CVD.

Then, by CMP, the tungsten film 146 and the barrier film are polished until the surface of the inter-layer insulation film 142 is exposed. Thus, conductor plugs 144 of, e.g., tungsten are buried in the contact holes 143.

Next, by sputtering, a layered film 145 is formed on the inter-layer insulation film 142 with the conductor plugs 144 buried in.

Next, by photolithography, the layered film 145 is patterned. Thus, interconnections (the fifth metal interconnection layers) 145 of the layered film are formed.

Next, a silicon oxide film 146 is formed by, e.g., high density plasma-enhanced CVD.

Next, a 1 μm-film thickness silicon nitride film 148 is formed by plasma-enhanced CVD.

Thus, the nonvolatile semiconductor memory device according to the present embodiment is manufactured.

(Modifications)

Figures 26A, 26B:
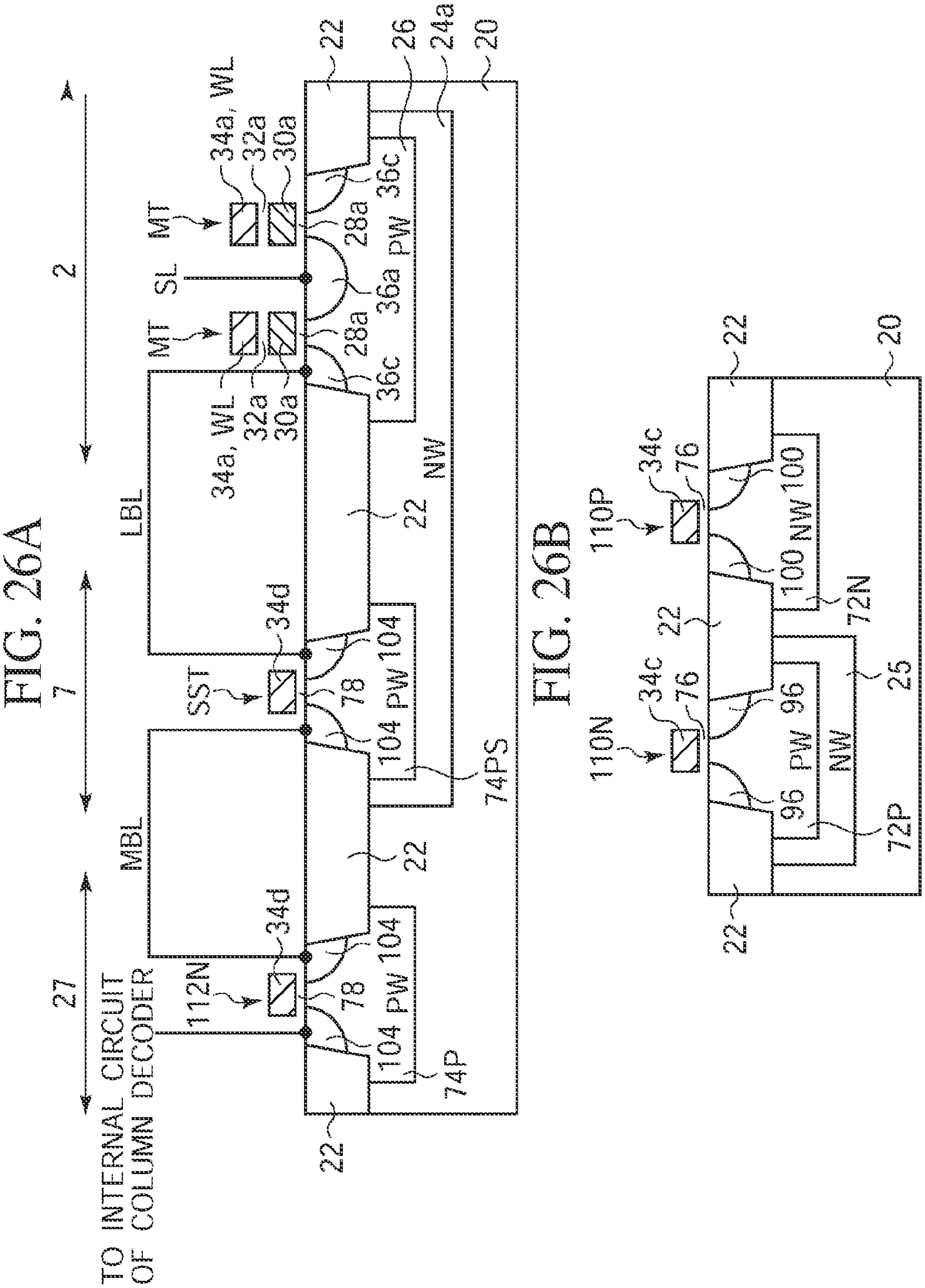
FIGS. 26A and 26B are sectional views of the nonvolatile semiconductor memory device according to a modification of the first embodiment.

The nonvolatile semiconductor memory device according to a modification of the present embodiment will be described with reference to FIGS. 26A and 26B. FIGS. 26A and 26*b* are sectional views of the nonvolatile semiconductor memory device according to the present modification.

The nonvolatile semiconductor memory device according to the present modification is characterized mainly in that the N-type well (N-type diffused layer) in the memory cell array region 2 and the N-type well (N-type diffused layer) in the sector select transistor formed region 7 are formed integral.

As illustrated in FIGS. 26A and 26B, the N-type well (N-type diffused layer) 24*a* is formed in the memory cell array region 2 and the sector select transistor formed region 7. The N-type well 24*a* is formed each sector SCT.

In the N-type well 24*a* in the memory cell array region 2, a P-type well 26 is formed.

In the N-type well 24*a* in the sector select transistor formed region 7, a P-type well 74PS is formed.

The P-type well 74PS and the P-type well 26 are electrically isolated by the N-type well 24*a*.

Thus, the N-type well 24*a* in the memory cell array region 2 and the N-type well 24*a* in the sector select transistor formed region 7 are formed integral.

[b] Second Embodiment

The nonvolatile semiconductor memory device according to a second embodiment, its reading method, its writing method and its erasing method, and the method of manufacturing the nonvolatile semiconductor memory device will be described with reference to FIGS. 27 to 56. The same members of the present embodiment as those of the nonvolatile semiconductor memory device, etc. according to the first embodiment will be represented by the same reference numbers not to repeat or to simplify the description.

(Nonvolatile Semiconductor Memory Device)

Figure 27:
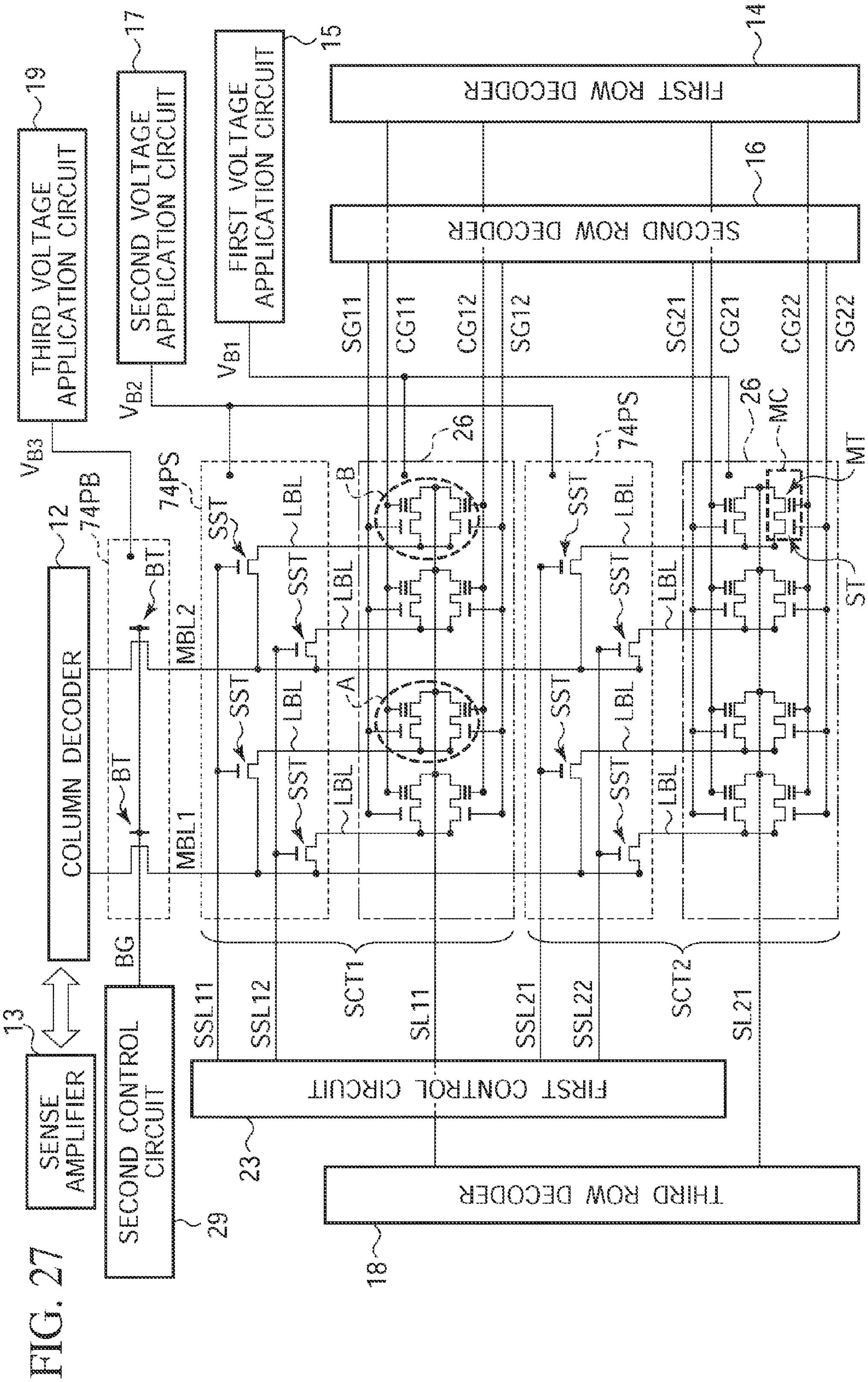
FIG. 27 is a circuit diagram of the nonvolatile semiconductor memory device according to a second embodiment.
Figure 28A:
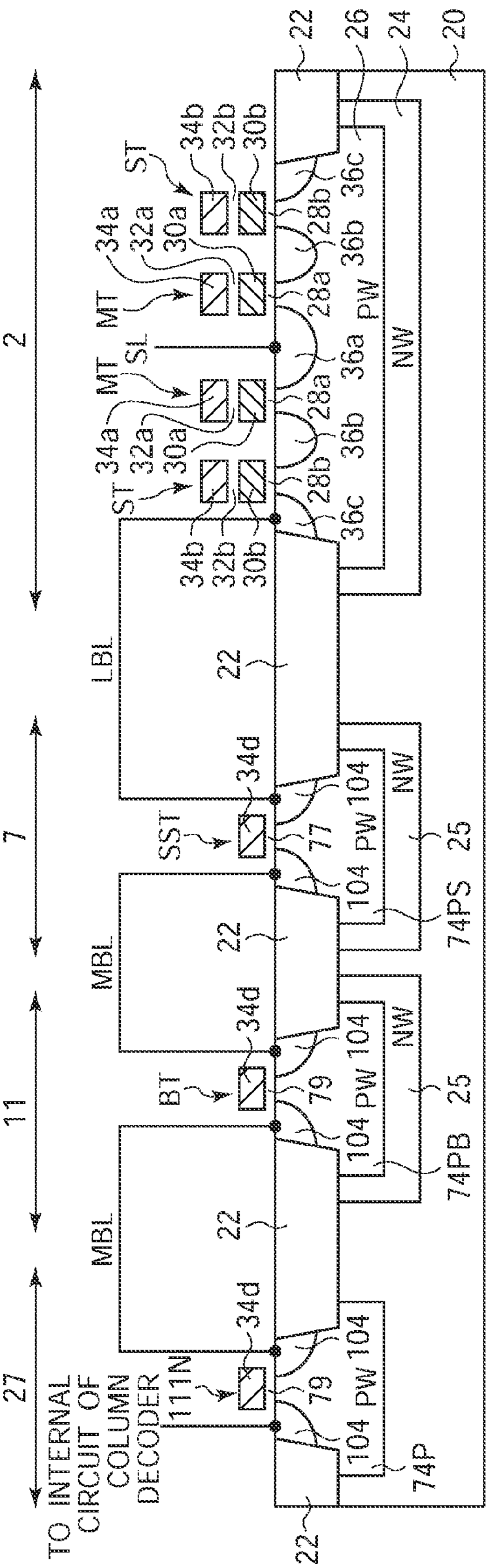
FIGS. 28A and 28B are sectional views of the nonvolatile semiconductor memory device according to the second embodiment.
Figure 28B:
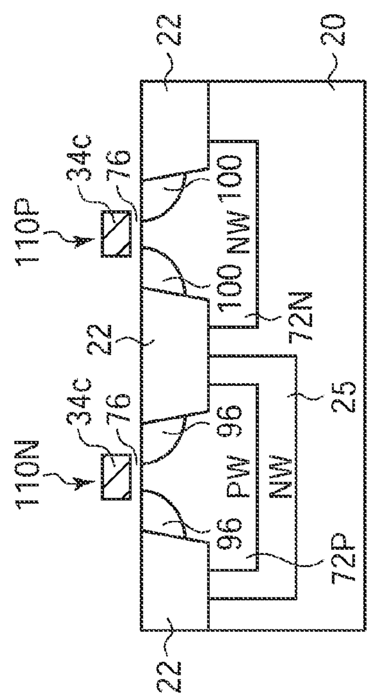

First, the nonvolatile semiconductor memory device according to the present embodiment will be described with reference to FIGS. 27 to 36. FIG. 27 is the circuit diagram of the nonvolatile semiconductor memory device according to the present embodiment. FIGS. 28A and 28B are sectional views of the nonvolatile semiconductor memory device according to the present embodiment.

As illustrated in FIG. 27, a select transistor ST and a memory cell transistor MT connected to the select transistor ST form a memory cell MC. The source of the select transistor ST is connected to the drain of the memory cell transistor MT. More specifically, the source of the select transistor ST and the drain of the memory cell transistor MT are formed integral by one impurity diffused layer 36*b*. (see FIGS. 28A and 28B).

The drains of a plurality of the select transistors ST exsisting in the same column are connected commonly by a local bit line LBL.

The control gates of a plurality of the memory cell transistors MT exsisting in the same row are connected commonly by a first word line CG.

In FIG. 27, out of a plurality of the first word lines CG, the first word lines CG11, CG12, CG21, CG22 are illustrated.

The select gates of a plurality of the select transistors ST exsisting in the same row are connected commonly by a second word line SG.

In FIG. 27, out of a plurality of the second word lines SG, the second word lines SG11, SG12, SG21, SG22 are illustrated.

The sources of a plurality of the memory cell transistors MT preset in the same row are connected commonly by a source line SL. The sources of the memory cell transistors MT neighboring each other are connected by a common source line SL.

In FIG. 27, out of a plurality of the source lines SL, the source lines SL11, SL21 are illustrated.

In each sector, a plurality of the sector select transistors SST are provided. As the sector select transistors SST, low voltage transistors of a relatively low withstand voltage are used.

FIG. 33 is a views illustrating the species of the transistors used in the respective constituent members, the withstand voltages of the transistors and the film thicknesses of the gate insulation films of the transistors.

As illustrated in FIG. 33, as the sector select transistors SST, low voltage transistors (3 V Tr) of, e.g., a 3 V rated voltage are used. The withstand voltage of the sector select transistors SST is, e.g., about 6 V. The film thickness of the gate insulation films 77 of the sector select transistors SST is, e.g., about 6 nm. The gate insulation film 77 of the sector select transistors SST is formed of the same gate insulation film of second low voltage transistors 113N, 113P to be described later (see FIG. 55). Accordingly, the film thickness of the gate insulation films 77 of the sector select transistors SST is equal to the film thickness of the gate insulation film 77 of the second low voltage transistors 113N, 113P.

In comparison with the high voltage transistors 110N, 110P (see FIG. 54), the sector select transistors SST have a shorter gate length, a smaller film thickness of the gate insulation films 77 and a large drive current. In the present embodiment, in which low voltage transistors are sued as the sector select transistors SST, a large read current can be obtained. Thus, in the present embodiment, information written in the memory cell transistors MT can be speedily judged, and consequently, high speed reading can be realized.

The local bit lines LBL commonly connecting the drains of a plurality of the memory cell transistors MT existing in the same column are respectively connected to the sources of the sector select transistors SST.

The drains of a plurality of the sector select transistors SST exsisting in the same column are connected commonly to a main bit line (bit line, global bit line) MBL. The respective local bit lines LBL are electrically connected to the main bit lines MBL via the sector select transistors SST.

In FIG. 27, out of a plurality of the main bit lines MBL, the main bit lines MBL1, MBL2 are illustrated.

The gates of the sector select transistors SST are connected commonly by sector select lines SSL. In FIG. 27, out of a plurality of the sector select lines SSL, the sector select lines SSL11, SSL12, SSL21, SSL22 are illustrated.

A plurality of the main bit lines MBL commonly connecting the drains of the sector select transistors SSL are connected to the sources of voltage buffer transistors (protection transistors) BT. The drains of the voltage buffer transistors BT are connected to the column decoder 12.

As the voltage buffer transistors BT, first low voltage transistors (low withstand voltage transistors) are used. As illustrated in FIG. 33, as the voltage buffer transistors BT, the first low voltage transistors (1.8 V Tr) of, e.g., a 1.8 V rated voltage are used. The withstand voltage of the voltage buffer transistors BT is, e.g., about 3 V. The film thickness of the gate insulation films 79 of the voltage buffer transistors BT (see FIG. 55) is, e.g., about 3 nm.

As illustrated in FIG. 28A, a voltage buffer transistor formed region 11 of each sector SCT, an N-type well (N-type diffused layer) 25 formed in the semiconductor substrate 20, and a P-type well 74PB formed in the N-type well 25 are formed. The voltage buffer transistor BT is formed on such triple well.

The column decoder 12 controls the potential of the plural main bit lines MBL commonly connecting the drains of the sector select transistors SST. The column decoder 12 is formed of a low voltage circuit which operates at a relatively low voltage.

In the low voltage circuit of the column decoder 12, first low voltage transistors 111N, 111P (see FIG. 55) are used. The first low voltage transistors 111N, 111P are transistors whose rated voltage is lower than second low voltage transistors 113N, 113P to be described later. The first low voltage transistors 111N, 111P have a smaller film thickness of the gate insulation film 79 than the second low voltage transistors 113N, 113P. As illustrated in FIG. 33, in the column decoder 12, the first low voltage transistors (1.8 V Tr) of, e.g., a 1.8 V rated voltage are used. The withstand voltage of the first low voltage transistors 111N, 111P used in the row decoder 12 is, e.g., about 3 V. The film thickness of the gate insulation film 79 of the first low voltage transistors 111N, 111P used in the column decoder 12 is, e.g., about 3 nm. The first voltage transistors 111N, 111P are used in the column decoder 12 so that information written in the memory cell transistors MT can be speedily read.

The column decoder 12 is connected to the sense amplifier 13 which detects currents flowing in the main bit lines MBL.

As illustrated in FIG. 33, in the sense amplifier 13, the first low voltage transistors (1.8 V Tr) of, e.g., a 1.8 V rated voltage are used. The withstand voltage of the first low voltage transistors 111N, 111P used in the sense amplifier 13 is, e.g., about 3V. The film thickness of the gate insulation films 79 of the first low voltage transistors 111N, 111P used in the sense amplifier 13 is, e.g., about 3 nm.

A plurality of first word lines CG commonly connecting the control gates of the memory cell transistors MT are connected to a first row decoder 14. The first row decoder 14 controls the potential of the respective plural first word lines CG commonly connecting the control gates 34*a* of the memory cell transistors MT. The first row decoder 14 is formed by a high voltage circuit. In the high voltage circuit of the first row decoder 14, high voltage transistors 110N, 110P (see FIGS. 28A, 28B and 54) are used. As illustrated in FIG. 33, in the first row decoder 14, high voltage transistors (10 V Tr) of, e.g., a 10 V rated voltage are used. The withstand voltage of the high withstand voltage transistors 110N, 110P used in the first row decoder 14 is, e.g., about 12V. The film thickness of the gate insulation film 76 of the high withstand voltage transistors 110N, 110P used in the first row decoder 14 is, e.g., about 16 nm.

The high withstand voltage transistors 110N, 110P are used in the first row decoder 14 because when information is written in the memory cell transistors MT or when information is erased, high voltages is applied to the word lines WL.

A plurality of second word lines SG commonly connecting the select gates 30*b* of the select transistors ST are connected to a second row decoder 16. The second row decoder 16 controls the potential of the respective plural second word lines SG. The second row decoder 16 is formed by a low voltage circuit. In the low voltage circuit of the second row decoder 16, the first low voltage transistors 111N, 111P are used. As illustrated in FIG. 33, in the second row decoder 16, low voltage transistors (1.8 V Tr) of, e.g., a 1.8 V rated voltage are used. The withstand voltage of the firsts low voltage transistors 111N, 111P used in the second row decoder 16 is, e.g., about 3 V. The film thickness of the gate insulation film 79 of the first low withstand voltage transistors 111N, 111P used in the second row decoder 16 is, e.g., about 3 nm.

The source lines SL commonly connecting the sources of the memory cell transistors MT are connected to a third row decoder 18. The third row decoder 18 controls the potential of the respective plural source lines SL. The third row decoder 18 is formed by a high voltage circuit. In the high voltage circuit of the third row decoder 18, the high voltage transistors 110N, 110P are used. As illustrated in FIG. 33, in the third row decoder 18, high withstand voltage transistors (10 V Tr) of, e.g., a 10 V rated voltage are used. The withstand voltage of the high withstand voltage transistors 110N, 110P used in the third row decoder 18 is, e.g., about 12 V. The film thickness of the gate insulation films 76 of the high withstand voltage transistors 110N, 110P used in the third row decoder 18 is, e.g., about 16 nm.

A plurality of sector select lines SSL commonly connecting the gates of the sector select transistors SST are connected to a first control circuit (a first control unit) 23. The first control circuit 23 is for controlling the potential of the plural sector select lines SSL. The first control circuit 23 is formed by a low voltage circuit which operates at a relatively low voltage.

In the low voltage circuit of the first control circuit 23, second low voltage transistors (second low withstand voltage transistors) 113N, 113P (see FIG. 55) are used. As illustrated in FIG. 33, in the first control circuit 23, the second low voltage transistors (3 V Tr) of, e.g., a 3 V rated voltage are used. The withstand voltage of the second low voltage transistors 113N, 113P used in the first control circuit 23 is, e.g., about 6 V. The film thickness of the gate insulation films 77 of the second low voltage transistors 113N, 113P used in the first control circuit 23 is, e.g., about 6 nm.

The gates BG of the voltage buffer transistors BT are electrically connected to the second control circuit 29. The second control circuit 29 is for controlling the potential of the gates BG of the voltage buffer transistors. The second control circuit 29 is formed by a low voltage circuit which operates at a relatively low voltage.

In the low voltage circuit of the second control circuit 29, second low voltage transistors (second low withstand voltage transistors) 113N, 113P are used. As illustrated in FIG. 33, in the second control circuit 29, the second low voltage transistors (3 V Tr) of, e.g., a 3 V rated voltage are used. The withstand voltage of the second low voltage transistors 113N, 113P used in the second control circuit 29 is, e.g. about 6 V. The film thickness of the gate insulation films 77 of the second low voltage transistors 113N, 113P is, e.g., about 6 nm.

The respective P-type wells 26 are electrically connected to a first voltage application circuit 15. The first voltage application circuit 15 is controlling the potential $V_{B1}$ of the P-type wells 26. The first voltage application circuit 15 is formed by a high voltage circuit. In the high voltage circuit of the first voltage application circuit 15, high withstand voltage transistors 110N, 110P are used. As illustrated in FIG. 33, in the first voltage application circuit 15, high withstand voltage transistors (10 V Tr) of, e.g., a 10 V rated voltage are used. The withstand voltage of the high withstand voltage transistors 110N, 110P used in the first voltage application circuit 15 is, e.g., about 12V. The film thickness of the gate insulation films 76 of the high withstand voltage transistors 110N, 110P used in the first voltage application circuit 15 is, e.g., about 16 nm.

The high withstand voltage transistors 110N, 110P are used in the first voltage application circuit 15 because when information written in the memory cell transistors MT is erased, a high voltage is applied to the P-type wells 26.

The respective P-type wells 74PS are electrically connected to the second voltage application circuit 17. The second voltage application circuit 17 is for controlling the potential $V_{B2}$ of the P-type wells 74PS. The second voltage application circuit 17 is formed by a high voltage circuit. In the high voltage circuit of the second voltage application circuit 17, the high voltage transistors 110N, 110P are used. Specifically, as illustrated in FIG. 33, in the second voltage application circuit 17, high withstand voltage transistors (10 V Tr) of, e.g., a 10 V rated voltage. The withstand voltage of the high withstand voltage transistors 110N, 110P used in the second voltage application circuit 17 is, e.g., about 12V. The film thickness of the gate insulation films 76 of the high withstand voltage transistors 110N, 110P used in the second voltage application circuit 17 is, e.g. about 16 nm.

The P-type well 74PB is electrically connected to a third voltage application circuit (a third voltage application circuit) 19. The third voltage application circuit 19 is for controlling the potential $V_{B3}$ of the P-type well 74PB. The third voltage application circuit 19 is formed by a low voltage circuit. In the low voltage circuit of the third voltage application circuit 19, second low voltage transistors are used. Specifically, as illustrated in FIG. 33, in the third voltage application circuit 19, the second low voltage transistors (3 V Tr) 113N, 113P of, e.g., a 3 V rated voltage are used. The withstand voltage of the second low voltage transistors 113N, 113P used in the third voltage application circuit 19 is, e.g., about 6 V. The film thickness of the gate insulation films 77 of the second low voltage transistors 113N, 113P used in the third voltage application circuit 19 is, e.g., about 6 nm.

Figure 29:
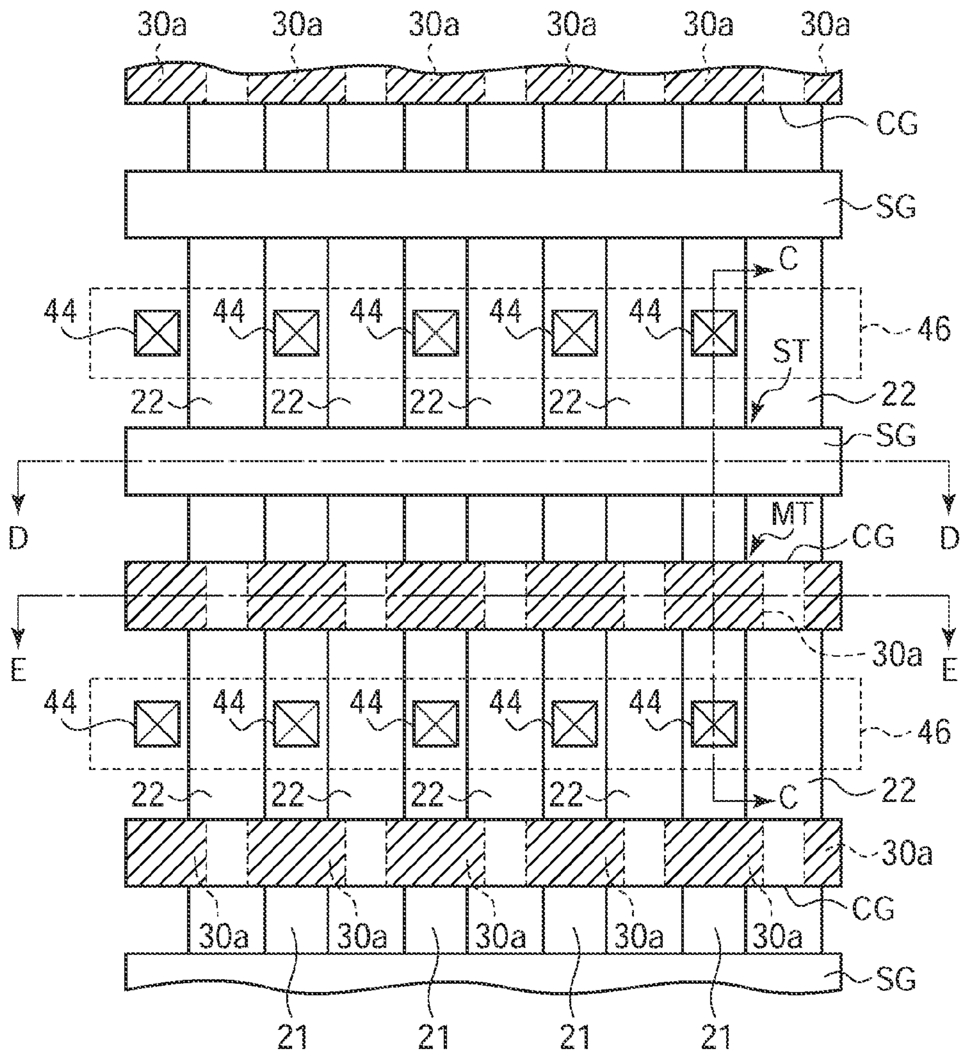
FIG. 29 is a plan view of the nonvolatile semiconductor memory device according to the second embodiment, which illustrates the memory cell array.
Figure 30:
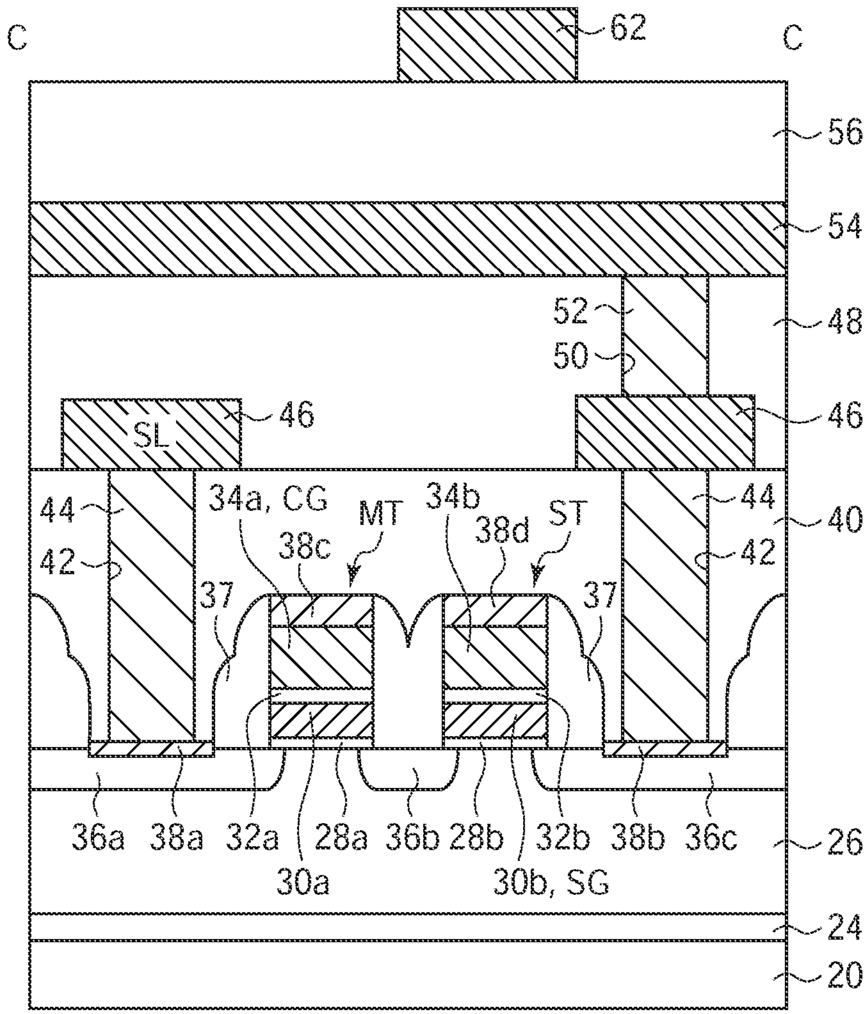
FIG. 30 is a C-C' sectional view of FIG. 29.
Figure 31:
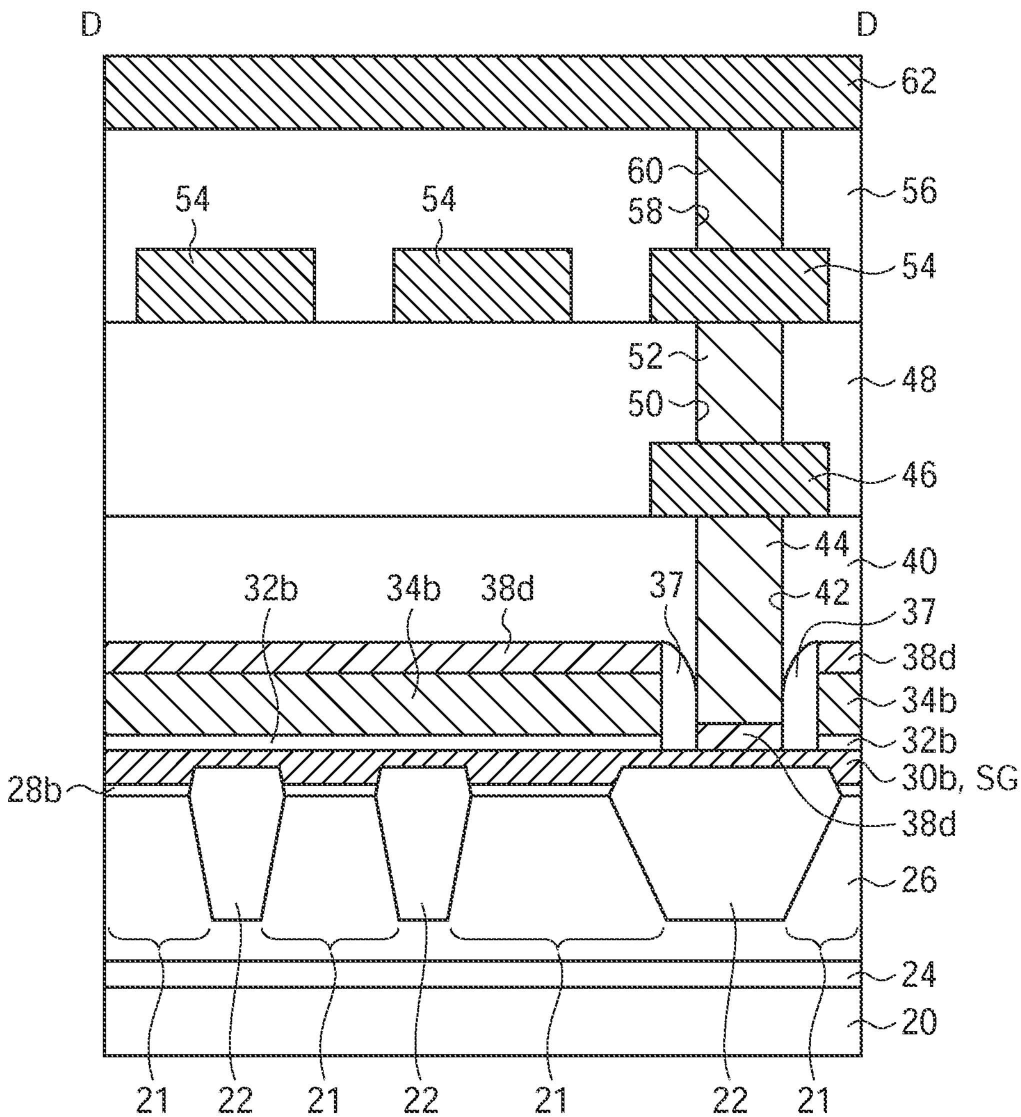
FIG. 31 is a D-D' sectional view of FIG. 29.
Figure 32:
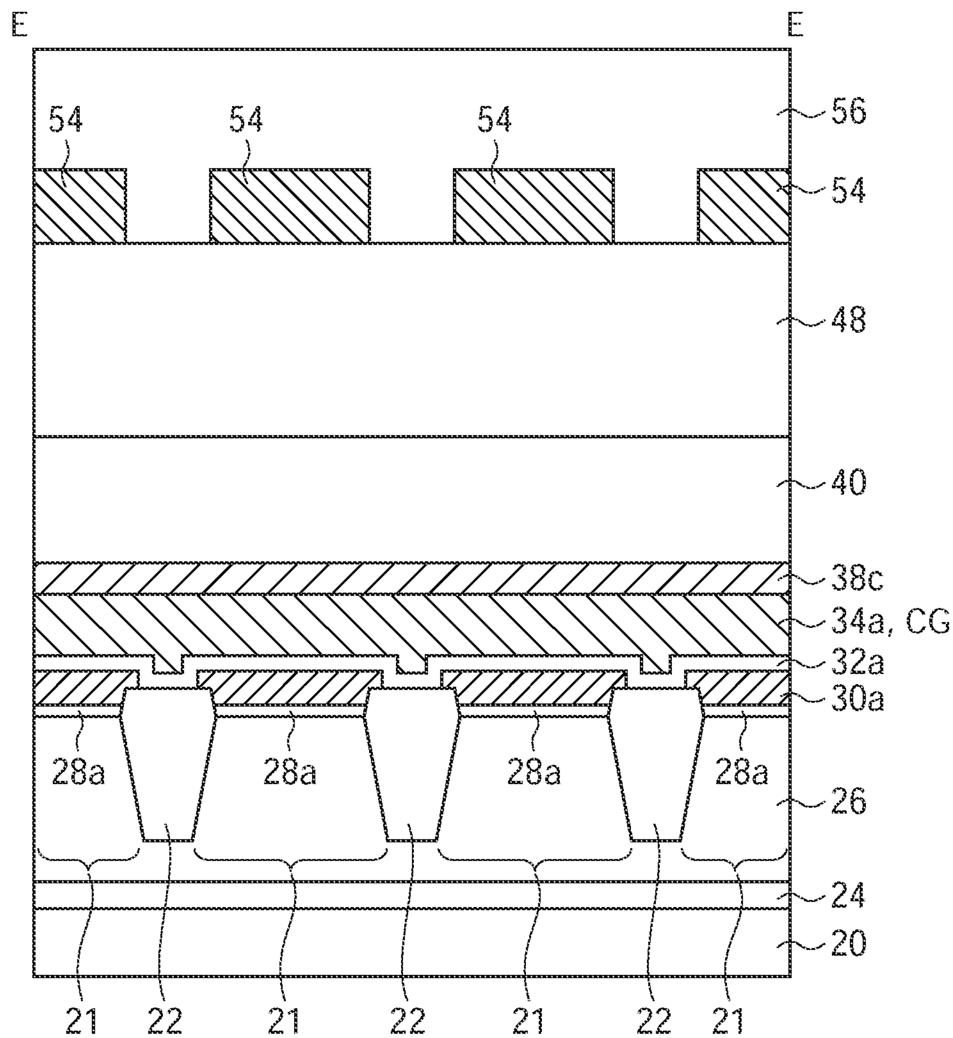
FIG. 32 is an E-E' sectional view of FIG. 29.

Then, the structure of the nonvolatile semiconductor memory device according to the present embodiment will be described with reference to FIGS. 28A to 32. FIG. 29 is a plan view of the nonvolatile semiconductor memory device according to the present embodiment, which illustrates the memory cell array. FIG. 30 is the C-C' section of FIG. 29. FIG. 31 is the D-D' section of FIG. 29. FIG. 32 is the E-E' section of FIG. 29.

As illustrated in FIG. 28A, in the semiconductor substrate 20 in the memory cell array region 2, the N-type well (N-type diffused layer) 24 is formed. The N-type well 24 is formed in each sector SCT (see FIG. 27). In the N-type well 24, the P-type well 26 is formed. The P-type well 26 is electrically isolated from the semiconductor substrate 20 by the N-type well 24. Thus, in the memory cell array region 2, the triple well is formed.

On the P-type well 26, the floating gates 30*a* are formed with the tunnel insulation films 28*a* formed therebetween. The floating gates 30*a* are electrically isolated between the device regions 21 (see FIG. 32).

On the floating gates 30*a*, the control gates 34*a* are formed with the insulation films 32*a* formed therebetween. The control gates 34*a* of the memory cell transistors MT exsisting in the same row are commonly connected. In other words, on the floating gates 30, first word lines CG commonly connecting the control gates 34*a* are formed with the insulation film 32 formed therebetween.

On the P-type well 26, the select gates 30*b* of the select transistors ST are formed in parallel with the floating gates 30*a*. The select gates 30*b* of the select transistors ST exsisting in the same row are commonly connected. In other words, on the semiconductor substrate 20, second word lines SG commonly connecting the select gates 30*b* are formed with the gate insulation film 28*b* formed therebetween. The film thickness of the gate insulation film 28*b* of the select transistors ST are equal to the film thickness of the tunnel insulation films 32*b* of the memory cell transistors MT.

On the select gates 30*b*, polysilicon layers (conduction layers) 34*b* are formed with tunnel insulation films 28*a* formed therebetween.

In the semiconductor substrate 20 on both sides of the floating gates 30*a*, and in the semiconductor substrate 20 on both sides of the select gates 30*b*, N-type impurity diffused layers 36*a*, 36*b*, 36*c* are formed. The sources of the memory cell transistors MT adjacent each other are formed of one and the same impurity diffused layer 36*a*. The impurity diffused layers 36*b* forming the drains of the memory cell transistors MT and the impurity diffused layers 36*b* forming the sources of the select transistors ST are formed of one and the same impurity diffused layer 36*b*.

On the side walls of the layered structures including the floating gate 30*a* and the control gate 34*a*, sidewall insulation films 37 are formed.

On the side walls of the layered structures including the select gate 30*b* and the polysilicon layer 34*b*, the sidewall insulation film 37 are formed.

On the source regions 36*a* of the memory cell transistors MT, on the drain regions 36*c* of the select transistors ST, at the upper part of the control gates 34*a* and at the upper part of the polysilicon layers 34*b*, silicide layers 38*a*-38*d* of cobalt silicide are respectively formed. The silicide layers 38*a* on the source electrodes 36*a* function as the source electrodes. The silicide layers 38*c* on the drain electrodes 36*c* function as the drain electrodes.

Thus, the memory cell transistors MT including the floating gates 30*a*, the control gates 34*a* and the source/drain diffused layers 36*a*, 36*b* are formed on the P-type well 26.

The select transistors ST including the select gates 30*b* and the source/drain diffused layers 36*b*, 36*c* are formed on the P-type well 26.

Thus, the memory cell array of the nonvolatile semiconductor memory device according to the present embodiment is formed.

In the semiconductor substrate 20 in the sector select transistor formed region 7, the N-type well (N-type diffused layer) 25 is formed. In the N-type well 25, the P-type well 74PS is formed. The P-type well 74PS is electrically isolated from the semiconductor substrate 20 by the N-type well 25.

On the P-type well 74PS, the gate electrode 34*d* is formed with the gate insulation film 77 formed therebetween. In the semiconductor substrate 20 on both sides of the gate electrode 34*d*, the source/drain diffused layers 104 of the N-type impurity diffused layers are formed.

Thus, the sector select transistor SST including the gate electrode 34*d* and the source/drain diffused layers 104 is formed on the P-type well 74PS.

The P-type well 74PS and the P-type well 26 are electrically isolated from each other by the N-type wells 24, 25.

The source diffused layer 104 of the sector select transistor SST and the drain diffused layer 36*c* of the memory cell transistor MT are electrically connected by the local bit line LBL.

In the region 11 where the voltage buffer transistor is formed, the N-type well (N-type diffused layer) 25 is formed.

In the N-type well 25, the P-type well 74PB is formed. The P-type well 74PB is electrically isolated from the semiconductor substrate 20 by the N-type well 25.

On the P-type well 74PB, the gate electrode 34*d* is formed with the gate insulation film 79 formed therebetween. In the semiconductor substrate 20 on both sides of the gate electrode 34*d*, the source/drain diffused layers 104 of the N-type impurity diffused layers are formed.

Thus, the voltage buffer transistor BT including the gate electrode 34*d* and the source/drain diffused layers 104 is formed on the P-type well 74PB.

The P-type well 74PB, the P-type well 74PS and the P-type well 26 are electrically isolated from each other by the N-type wells 24, 25.

The source diffused layer 104 of the voltage buffer transistor BT and the drain diffused layer 104 of the sector select transistor SST are electrically connected by the main bit line (interconnection) MBL.

In the region 27 where the column decoder is formed, the P-type well 74P is formed. On the P-type well 74P, the gate electrode 34*d* is formed with the gate insulation film 79 formed therebetween. In the semiconductor substrate 20 on both sides of the gate electrode 34*a*, the source/drain diffused layers 104 of the N-type impurity diffused layers are formed.

Thus, in the region 27 where the column decoder is formed, the first low voltage transistor (the first low voltage N-channel transistor) 111N including the gate electrode 34*d* and the source/drain diffused layers 104 is formed.

The source diffused layer 104 of the first low voltage transistor 111N used in the column decoder 12 and the drain diffused layer 104 of the voltage buffer transistor BT are electrically connected by the main bit line (interconnection) MBL. The source diffused layer 104 of the low voltage N-channel transistor 111N of the column decoder 12 is connected to the internal circuit (low voltage circuit) of the column decoder 12.

As illustrated in FIG. 28B, in the semiconductor substrate 20, the N-type well (N-type diffused layer) 25 is formed. In the N-type well 25, the P-type well 72P is formed. The P-type well 72P is electrically isolated from the semiconductor substrate 20 by the N-type well 25.

On the P-type well 72P, the gate electrode 34*c* is formed with the gate insulation film 76 formed therebetween. In the semiconductor substrate 20 on both sides of the gate electrode 34*c*, the source/drain diffused layers 96 which are N-type impurity diffused layers are formed.

Thus, the high withstand voltage N-channel transistor 110N including the gate electrode 34*c* and the source/drain diffused layers 96 is formed on the P-type well 72P.

In the semiconductor substrate 20, the N-type well 72N is formed. On the N-type well 72, the gate electrode 34*c* is formed with the gate insulation film 76 formed therebetween. In the semiconductor substrate 20 on both sides of the gate electrode 34*c*, the source/drain diffused layers 100 which are P-type impurity diffused layers are formed.

Thus, the high withstand voltage P-channel transistor 110P including the gate electrode 34*c* and the source/drain diffused layers 100 is formed.

(Operation of the Non-Volatile Semiconductor Memory Device)

Figure 35:
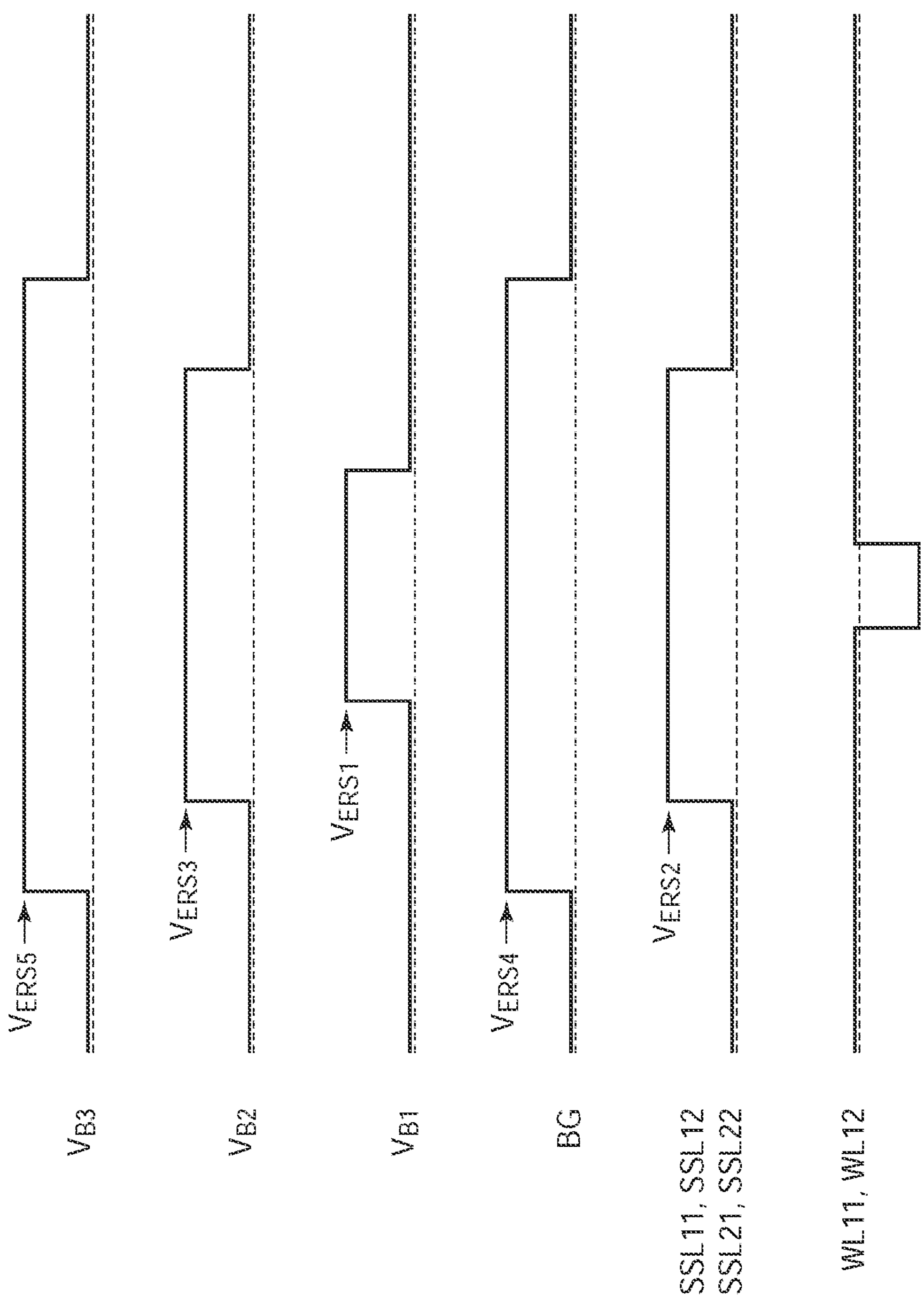
FIG. 35 is the time chart of the erasing method of the nonvolatile semiconductor memory device according to the second embodiment.
Figure 36:
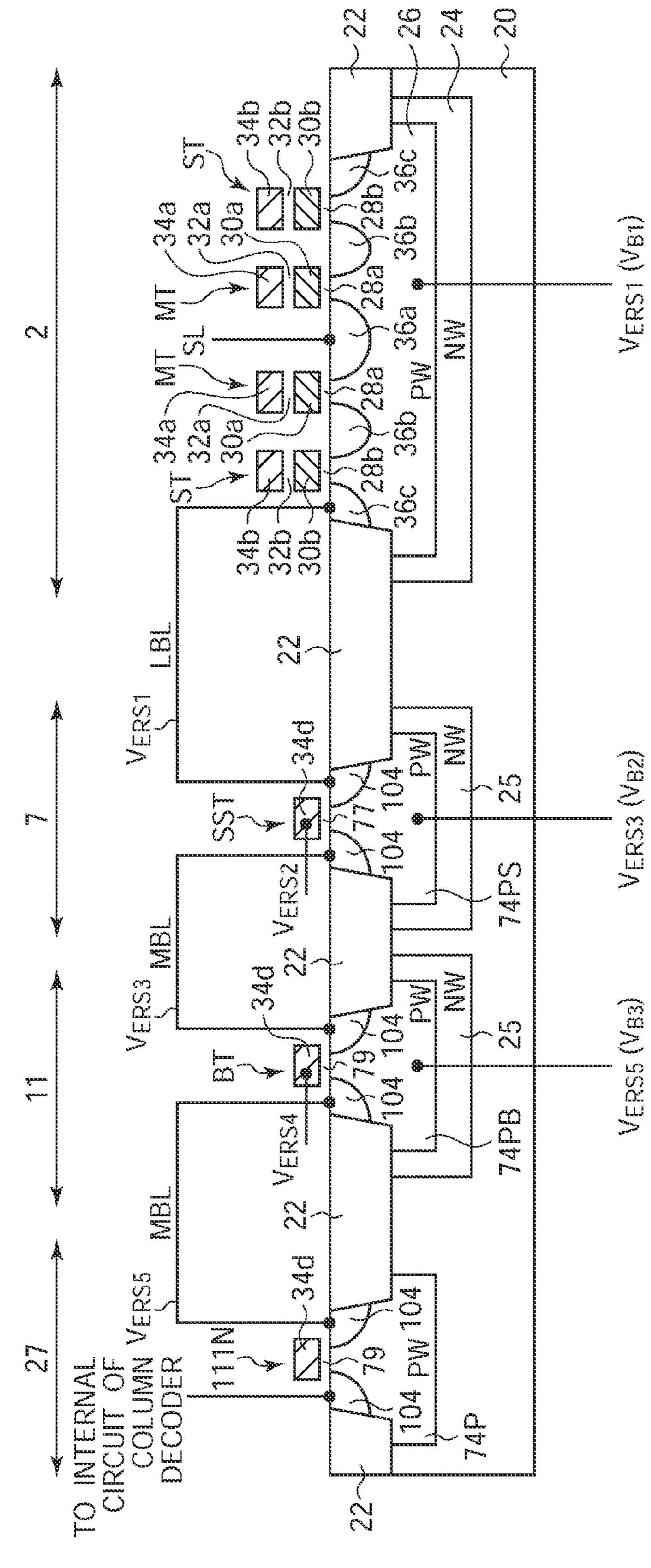
FIG. 36 is a sectional view of the nonvolatile semiconductor memory device according to the second embodiment, which illustrates the erasing method.

Next, the operation method of the nonvolatile semiconductor memory device according to the present embodiment will be described with reference to FIGS. 34 to 36. FIG. 34 is a view illustrating the reading method, the writing method and the erasing method of the nonvolatile semiconductor memory device according to the present embodiment. In FIG. 34, F indicates floating.

(Reading Method)

First, the reading method of the nonvolatile semiconductor memory according to the present embodiment will be described with reference to FIG. 34.

The reading method will be described here by means of the example that information written in the memory cell MC enclosed by the broken line A and the memory cell MC enclosed by the broken line B in FIG. 27 is read.

When information written in the memory cell transistors MT is read, the potentials of the respective parts are set as follows.

That is, the potential of the sector select line SSL11 connected to the sector select transistors SST connected to the memory cells MC to be selected is set at, e.g., 1.8 V. On the other hand, the potentials of the sector select lines SSL12, SSL21, SSL22 other than the selected sector select line SSL11 are set at 0 V.

The potential BG of the gate of the voltage buffer transistor BT is set at, e.g., 1.8 V.

The potentials of the main bit lines (bit lines) MBL1, MBL2 connected to the sector select transistors SST connected to the memory cell MC to be selected are set at, e.g., 0.5 V.

The potentials of the first word lines CG11, CG12, CG21, CG22 are set always at 1.8 V.

The potential of the second word line SG11 connected to the memory cells MC to be selected is set at, e.g., 1.8 V. On the other hand, the potentials of the second word lines SG12, SG21, SG22 other than the selected second word line SG11 are set at 0 V.

The potentials $V_{B1}$ of the P-type wells 26 are set at 0 V. The potentials $V_{B2}$ of the P-type wells 74PS are set at 0V. The potentials $V_{B3}$ of the P-type wells 74PB are set at 0 V. The potentials of the source lines SL11, SL21 are set at 0 V.

Also in the present embodiment, wherein low voltage transistors are used as the sector select transistors SST and the voltage buffer transistors BT, when information written in the memory cell transistors MT is read, sufficiently large read currents can be obtained. Thus, according to the present embodiment, information written in the memory cell transistors MT can be speedily judged, and consequently, information written in the memory cell transistors MT can be speedily read.

(Writing Method)

Next, the writing method of the nonvolatile semiconductor memory device according to the present embodiment will be described with reference to FIG. 34.

The writing method will be described here by means of the example that information is written in the memory cell MC enclosed by the broken line A in FIG. 27.

When information is written in the memory cell transistor MT, the potentials of the respective parts are set as follows.

That is, the potential of the sector select line SSL11 connected to the sector select transistor SST connected to the memory cell MC (memory cell A) to be selected is set at, e.g., 3 V. On the other hand, the potentials of the sector select lines SSL12, SSL21, SSL 22 other than the selected sector select line SSL11 are set at 0 V.

The potential BG of the gate of the voltage buffer transistor BT is set at, e.g., 3 V.

The potential of the main bit line (bit line) MBL1 connected to the sector select transistor SST connected to the memory cells MC to be selected is set at, e.g., 0 V. On the other hand, the potential of the main bit line MBL2 other than the selected main bit line BL1 is set floating.

The potential of a first word line CG11 connected to the memory cells MC to be selected is set at, e.g., 9 V. On the other hand, the potentials of the first word lines CG12, CG21, CG22 other than the selected first word line CG11 are set at 0 V.

The potential of a second word line SG11 connected to the memory cell MC to be selected is set at, e.g., 2.5 V. On the other hand, the potentials of second word lines SG12, SG21, SG22 other than the selected second word lines are set at 0 V.

The potential of a source line SL11 connected to the memory cell MC to be selected is set at, e.g., 5.5 V. On the other hand, the potential of a source line SL21 other than the selected source line SL11 is set floating.

The potentials $V_{B1}$ of the P-type wells 26 are set at 0 V. The potentials $V_{B2}$ of the P-type wells 74PS are set at 0 V. The potentials of the P-type wells 74PB are set at 0 V.

With the potentials of the respective parts set as described above, electrons flow between the source diffused layer 36*a* and the drain diffused layer 36*b*, of the memory cell transistor MT, and the electrons are introduced into the floating gate 30*a* of the memory cell transistors MT. Thus, a charge is accumulated in the floating gate 30*a* of the memory cell transistor MT, and information is written in the memory cell transistor MT.

(Erasing Method)

Next, the erasing method of the nonvolatile semiconductor memory device according to the present embodiment will be described with reference to FIGS. 34 to 36. FIG. 35 is the time chart of the erasing method of the nonvolatile semiconductor memory device according to the present embodiment. The broken lines in FIG. 35 indicate the potential of 0 V. FIG. 36 is a sectional view of the nonvolatile semiconductor memory device according to the present embodiment, which shows the erasing method.

The erasing of information written in the memory cell array is made for, e.g., each sector SCT. The erasing method will be described here by means of the example that information written in a plurality of the memory cells MC exsisting in the first sector SCT1 is erased in a lump.

In the present embodiment, the information written in the memory cell transistors MT is eased as follows.

When information written in the memory cell transistors MT is erased, the potentials of the main bit lines MBL1, MBL2 are set always floating. When information written in the memory cell transistors MT is erased, the potentials of the source lines SL11, SL21 are set always floating. The potential of the semiconductor substrate 20 is 0 V (ground). The potentials of the gates SG11, SG12, SG21, SG22 of the select transistors ST are set always floating.

When information written in the memory cell transistors MT is erased, first, the potentials $V_{B3}$ of the P-type wells 74PB is set at a fifth voltage $V_{ERS5}$ by the third voltage application circuit 19. The fifth voltage $V_{ERS5}$ is, e.g., 3 V here.

By the second control circuit (the second control unit) 29, the potentials BG of the gates of the voltage buffer transistors BT are set at a fourth voltage $V_{ERS4}$. The potentials (the fourth potential) of the gates of the voltage buffer transistors BT are set at, e.g., 3 V.

Then, by the second voltage application circuit 17, the potentials $V_{B2}$ of the P-type wells 74PS are set at a third potential $V_{ERS3}$. The third potential $V_{ERS3}$ is, e.g., 6 V here.

The potentials of the sector select lines SSL11, SSL12, SSL21, SSL22 are set at a second potential $V_{ERS2}$. The potentials (the second potential) $V_{ERS2}$ of the sector select lines SSL11, SSL12, SSL21, SSL22 are, e.g., 5 V here.

Next, by the first voltage application circuit 15, the potentials $V_{B1}$ of the P-type wells 26 are set at the first potential $V_{ERS1}$. The first potential $V_{ERS1}$ is, e.g., 9 V here.

Then, the potentials of the first word lines CG11, CG12 connected to the memory cells MC in the first sector SCT1 to be erased are set at, e.g., −9 V. On the other hand, the word lines CG21, CG22 connected to the memory cells MC in the second sector SCT2 not to be erased are set at, e.g., floating.

With the potentials of the first word lines CG11, CG12 set at, e.g., −9V, charges are withdrawn from the floating gates 30*a* of the memory cell transistors MT. Thus, no charges are stored in the floating gates 30*a* of the memory cell transistors MT, and the information in the memory cell transistors MT is erased.

As described above, when information written in the memory cell transistors MT is erased, the potentials (the first potential) $V_{ERS1}$ of the P-type wells 26 are set at, e.g., 9V. With the potentials $V_{ERS1}$ of the P-type wells 26 set at 9 V, the potentials $V_{ERS1}'$ of the source diffused layers 104 of the sector select transistors SST are, e.g., about 8.5-8.7 V. The potentials $V_{ERS1}'$ of the source diffused layers 104 are lower than the potentials (the first potential) $V_{ERS1}$ of the P-type wells 26 because voltage drops are caused by the diodes formed by the P-type wells 26 and the drain diffused layers 36*c*.

With the potentials (the third potential) $V_{ERS3}$ of the P-type wells 74PS set at, e.g., 6 V, the potential difference ($V_{ERS1}'-V_{ERS3}$) between the source diffused layers 104 of the sector select transistors SST and the P-type wells 74PS is about, e.g., 2.5-2.7 V. The withstand voltage of the sector select transistors SST is, e.g., about 6 V as described above, and accordingly no breakage takes place between the source diffused layers 104 of the sector select transistors SST and the P-type wells 74PS.

With the potentials (the second potential) $V_{ERS2}$ of the sector select lines SSL set at, e.g., 5 V, the potential difference ($V_{ERS1}'-V_{ERS2}$) between the gate electrodes 34*d* and the source diffused layers 104, of the sector select transistors SST is, e.g., about 3.5-3.7 V. The withstand voltage of the second low voltage transistors 113N, 113P used in the sector select transistors SST is, e.g., about 6 V as described above, and accordingly no breakage takes place between the gate electrodes 34*d* and the source diffused layers 104, of the sector select transistors SST.

With the potentials (the third potential) $V_{ERS3}$ of the P-type wells 74PS set at, e.g., 6 V, the potentials $V_{ERS3}'$ of the source diffused layers 104 of the voltage buffer transistors BT are, e.g., about 5.5-5.7 V. The potentials $V_{ERS3}'$ of the source diffused layers 104 are lower than the potentials (the third potential) $V_{ERS3}$ of the P-type wells 74PS because voltage drops are caused by the diodes formed by the P-type wells 74PS and the drain diffused layers 104.

With the potentials (the fifth potential) $V_{ERS5}$ of the P-type wells 74PB set at, e.g., 3 V, the potential difference ($V_{ERS3}'-V_{ERS5}$) between the source diffused layers 104 of the voltage buffer transistors BT and the P-type wells 74PB is, e.g., about 2.5-2.7 V. The withstand voltage of the first low voltage transistors 111N, 111P used in the voltage buffer transistors BT is, e.g., about 3 V as described above, and accordingly no breakage takes place between the source diffused layers 104 of the voltage buffer transistors BT and the P-type wells 74PB.

With the potentials (the fourth potential) $V_{ERS4}$ of the gates BG of the voltage buffer transistors BT set at, e.g., 3 V, the potential difference ($V_{ERS3}'-V_{ERS4}$) between the gate electrodes 34*d* and the source diffused layers 104, of the voltage buffer transistors BT is, e.g., about 2.5-2.7 V. The withstand voltage of the second low voltage transistors 113N, 113P used as the voltage buffer transistor BT is, e.g., about 3 V as described above, and accordingly no breakage takes place between the gate electrodes 34$d$ and the source diffused layers 104, of the voltage buffer transistors BT.

With the potentials (the fifth potential) $V_{ERS5}$ of the P-type wells 74PB set at, e.g., 3 V, the potential $V_{ERS5}$' of the source diffused layers 104 of the first low voltage transistor 111N used in the column decoder 12 is, e.g., about 2.5-2.7 V. The potential $V_{ERS5}$' of the source diffused layer 104 of the first low voltage transistor 111N of the column decoder 12 is lower than the potential $V_{ERS5}$ of the P-type wells 74PB because voltage drops are caused by the diodes formed by the P-type wells 74PB and the drain diffused layers 104.

The withstand voltage of the first low voltage transistor 111N used in the column decoder 12 is, e.g., about 3V as described above, and accordingly, no breakage takes place in the first low voltage transistor 111N of the column decoder 12.

The potentials of the respective parts are not limited to the above.

The respective potentials $V_{ERS1}$, $V_{ERS3}$ are so set that the difference between the potential (the first potential) of the P-type well 26 and the potential (the third potential) $V_{ERS3}$ of the P-type well 74PS is smaller than the withstand voltage of the sector select transistor SST.

More specifically, the respective potentials $V_{ERS1}$, $V_{ERS3}$ are so set that the difference between the potential $V_{ERS1}$' of the source diffused layer 104 of the sector select transistor SST and the potential $V_{ERS3}$ of the P-type well 74PS is smaller than the withstand voltage of the sector select transistor SST.

The respective potentials $V_{ERS1}$, $V_{ERS2}$ are so set that the difference between the potential $V_{ERS2}$ of the gate electrode 34$d$ of the sector select transistor SST and the potential $V_{ERS1}$ of the P-type well 26 is smaller than the withstand voltage of the sector select transistor SST.

More strictly, the respective potentials $V_{ERS1}$, $V_{ERS2}$ are so set that the difference between the potential $V_{ERS2}$ of the gate electrode 34$d$ of the sector select transistor SST and the potential $V_{ERS1}$' of the source diffused layer 104 is smaller than the withstand voltage of the sector select transistor SST.

The respective potentials $V_{ERS3}$, $V_{ERS5}$ are so set that the difference between the potential (the third potential) $V_{ERS3}$ of the P-type well 74PS and the potential (the fifth potential) $V_{ERS5}$ of the P-type well 74PB is smaller than the withstand voltage of the voltage buffer transistor BT.

More strictly, the respective potentials $V_{ERS3}$, $V_{ERS5}$ are so set that the difference between the potential $V_{ERS3}$' of the source diffused layer 104 of the voltage buffer transistor BT and the potential $V_{ERS5}$ of the P-type well 74PB is smaller than the withstand voltage of the voltage buffer transistor BT.

The respective potentials $V_{ERS3}$, $V_{ERS4}$ are so set that the difference between the potential (the fourth potential) $V_{ERS4}$ of the gate electrode 34$d$ of the voltage buffer transistor BT and the potential (the third potential) $V_{ERS3}$ of the P-type well 74PS is smaller than the withstand voltage of the voltage buffer transistor BT.

More strictly, the respective potentials $V_{ERS3}$, $V_{ERS4}$ are so set that the potential $V_{ERS4}$ of the gate electrode 34$d$ of the voltage buffer transistor BT and the potential $V_{ERS3}$' of the source diffused layer 104 is smaller than the withstand voltage of the voltage buffer transistor BT.

The potential $V_{ERS5}$ of the P-type well 74PB is so set that the potential (the fifth potential) $V_{ERS5}$ of the P-type well 74PB is smaller than the withstand voltage of the first low voltage transistor 111N of the column decoder 12.

More strictly, the fifth potential $V_{ERS5}$ is so set that the difference between the potential $V_{ERS5}$' of the source diffused layer 104 of the first low voltage transistor 111N of the column decoder 12 and the potential of the P-type well 74P is smaller than the withstand voltage of the first low voltage transistor 111N of the column decoder 12.

When the first potential $V_{ERS1}$ to the fifth potential $V_{ERS5}$ are all positive, the second potential $V_{ERS2}$ is set lower than the first potential $V_{ERS1}$, and the third potential $V_{ERS3}$ is set also lower than the first potential $V_{ERS1}$. The fourth potential $V_{ERS4}$ is set lower than the third potential $V_{ERS3}$, and the fifth potential $V_{ERS5}$ is set also lower than the third potential $V_{ERS3}$.

As described above, in the present embodiment, the P-type well 74PB, the P-type well 74PS and the P-type well 26 are electrically isolated from each other by the N-type wells 24, 25. On the P-type well 74PS, the sector transistor SST is formed, the voltage buffer transistor BT is formed on the P-type well 74PB. Thus, in the present embodiment, when information written in the memory cell transistors MT is erased, a bias voltage different from a voltage to be applied to the P-type well 26 can be applied to the P-type well 74PS. When information written in the memory cell transistor MT is erased, a bias voltage different from a voltage to be applied to the P-type well 74PS can be applied to the P-type well 74PB. When information written in the memory cell transistors MT is erased, a bias voltage is applied to the P-type well 74PS so that the potential difference between the P-type well 26 and the P-type well 74PS is smaller than the withstand voltage of the sector select transistor SST. A bias voltage is applied to the gate electrode 34$d$ of the sector select transistor SST so that the potential difference between the gate electrode 34$d$ and the source diffused layer 104, of the sector select transistor SST is smaller than the withstand voltage of the sector select transistor SST. A bias voltage is applied to the P-type well 74PB so that the potential difference between the P-type well 74PS and the P-type well 74PB is smaller than the withstand voltage of the voltage buffer transistor BT. A bias voltage is applied to the P-type well 74PB so that a voltage to be applied to the first low voltage transistor 111N in the column decoder 12 is smaller than the withstand voltage of the first low voltage transistor 111N. A bias voltage is applied to the gate electrode 34$d$ of the voltage buffer transistor BT so that the potential difference between the gate electrode 34$d$ and the source diffused layer 104, of the voltage buffer transistor BT is smaller than the withstand voltage of the voltage buffer transistor BT. Thus, according to the present embodiment, because the voltage buffer transistor BT is formed, the voltage to be applied to the sector select transistor SST on an erasing can be suppressed small, whereby the breakage of the sector select transistor SST can be prevented. Because the voltage buffer transistor BT is formed, the first low voltage transistor 112N whose withstand voltage is extremely low can be used in the column decoder 12. According to the present embodiment, further speed up, low power consumption, etc. can be further realized.

The description has been made here by means of the example that when information written in the memory cell transistors MT is erased, the potential $V_{ERS2}$ to be applied to the sector select lines SSL is, e.g. 5 V. However, the potentials of the sector select lines SSL may be floating. Even with the potentials of the sector select lines SSL set floating when information written in the memory cell transistors MT is erased, breakages of the sector select transistors SST can be prevented upon erasings.

(Method of Manufacturing the Nonvolatile Semiconductor Memory Device)

The method of manufacturing the nonvolatile semiconductor memory device according to the present embodiment will be described with reference to FIGS. 37A to 55. FIGS. 37A to 55 are sectional views of the nonvolatile semiconductor memory device according to the present embodiment, which illustrate the manufacturing method.

FIGS. 37A, 39A, 41A, 43A, 45A, 47A, 51A and 53 illustrate the memory cell array region 2. The views on the left sides of FIGS. 37A, 39A, 41A, 43A, 45A, 47A, 49A, 51A and 53 correspond to the E-E' section of FIG. 29. The views on the left sides of FIGS. 37A, 39A, 41A, 43A, 45A, 47A, 49A, 51A and 53 correspond to the C-C' section of FIG. 29.

FIGS. 37B, 38, 39B, 40, 41B, 42, 43B, 44, 45B, 46, 47B, 48, 49B, 50, 51B, 52, 54 and 55 illustrate the peripheral circuit region 4.

The views on the left sides of FIGS. 37B, 39B, 41B, 43B, 45B, 47B, 49B, 51B and 54 illustrate the region 6 for the high withstand voltage transistor to be formed in. The views on the left sides of the region 6 for the high withstand voltage transistor to be formed in illustrate the region 6N for the high withstand voltage N-channel transistor to be formed in. The views right of the region 6N for the high withstand voltage N-channel transistor to be formed in illustrates the region 6P for the high withstand voltage P-channel transistor to be formed in.

The views right of the region 6P for the high withstand voltage P-channel transistor to be formed in illustrate the region 7 for the sector select transistor to be formed in.

The views on the right sides of FIGS. 37B, 39B, 41B, 43B, 45B, 47B, 46B, 51B and 54 illustrate the region 8 for the first low voltage transistor to be formed in. The views on the left sides of the region 8 for the first low voltage transistor to be formed in illustrate the region 8N for the first low voltage N-channel transistor to be formed in. The views on the right sides of the region 8 for the low voltage transistor to be formed in illustrate the region 8P for the first low voltage P-channel transistor to be formed in.

The views on the left sides of FIGS. 38, 40, 42, 44, 48, 50, 52 and 55 illustrate the region 9 where the second low voltage transistor whose withstand voltage is lower than that of the first low voltage transistors are to be formed. The views on the left sides of the region 9 for the second low voltage transistor to be formed in illustrate the region 9N for the second low voltage N-channel transistor to be formed in. The views on the right sides of the region 9 for the second low voltage transistor to be formed in illustrate the region 9P for the second low voltage P-channel transistor to be formed in.

The step of preparing the semiconductor substrate 20 to the step of growing the sacrifice oxide film 69 are the same as the method of manufacturing the nonvolatile semiconductor memory device according to the first embodiment described above with reference to FIGS. 10A to 12B, and their description is not repeated.

Figure 37A:
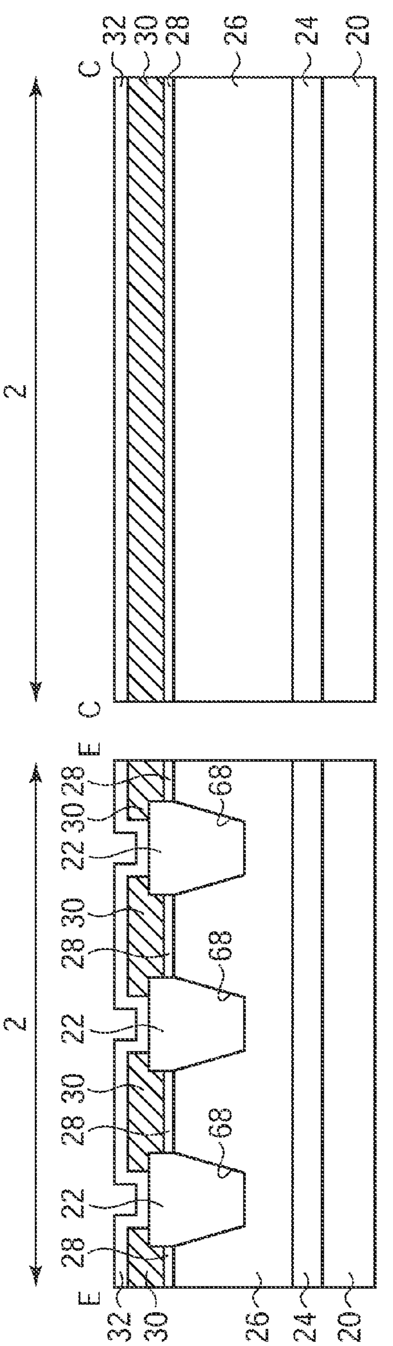
FIGS. 37A to 55 are sectional views of the nonvolatile semiconductor memory device according to the second embodiment in the steps of the method of manufacturing the nonvolatile semiconductor device, which illustrate the method.
Figure 37B:
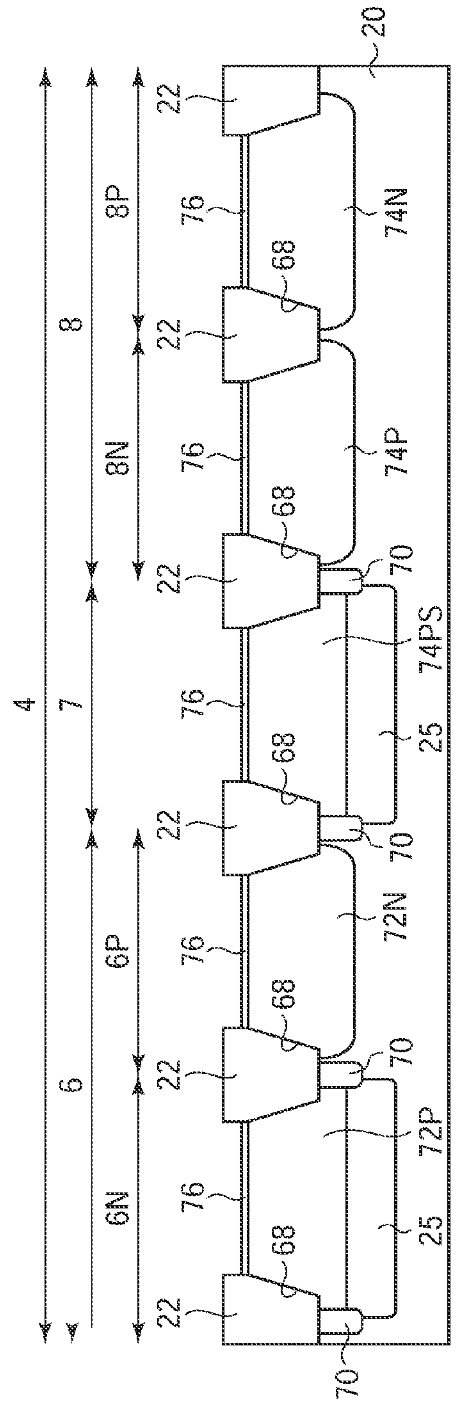
Figure 38:
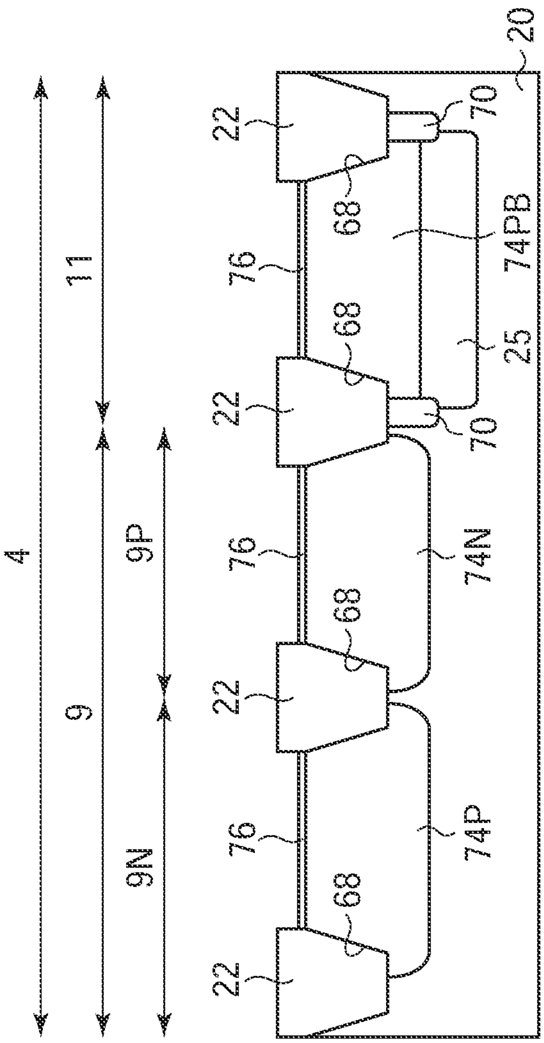
Figure 39A:
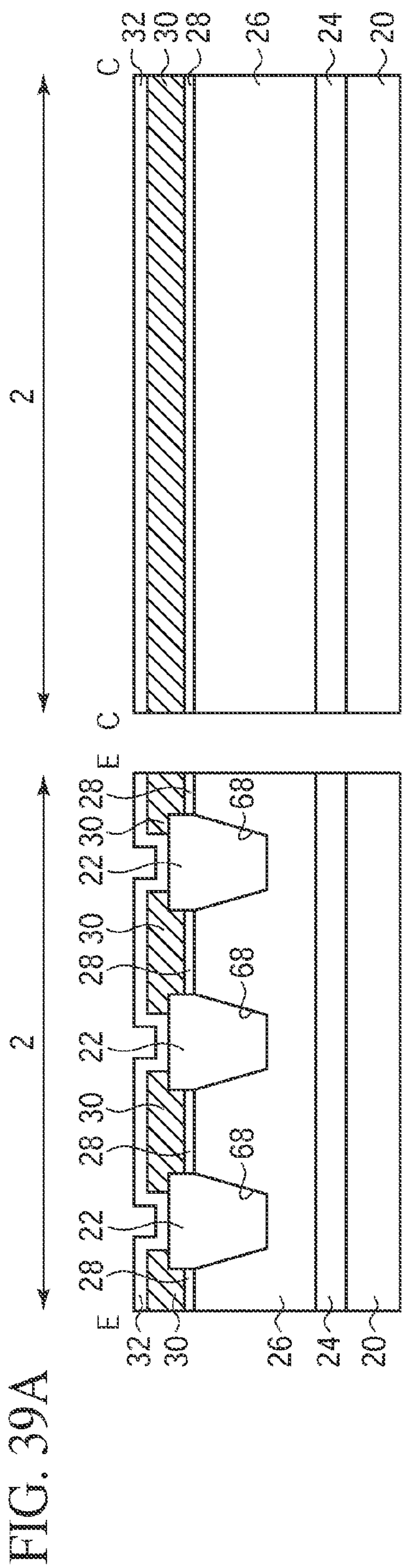
Figure 39B:
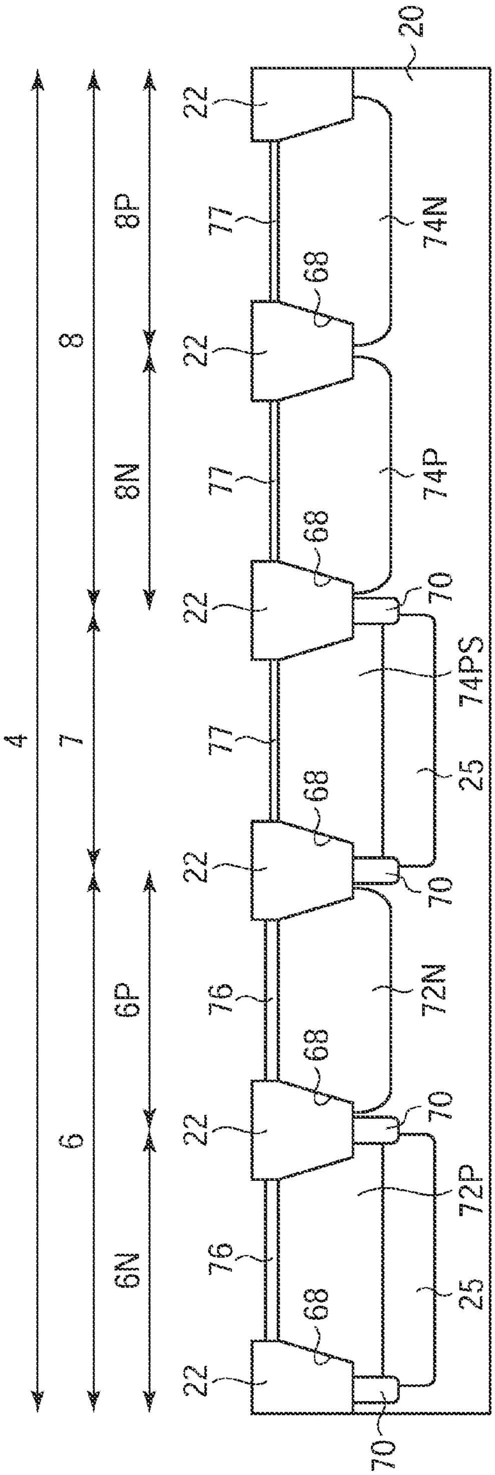
Figure 40:
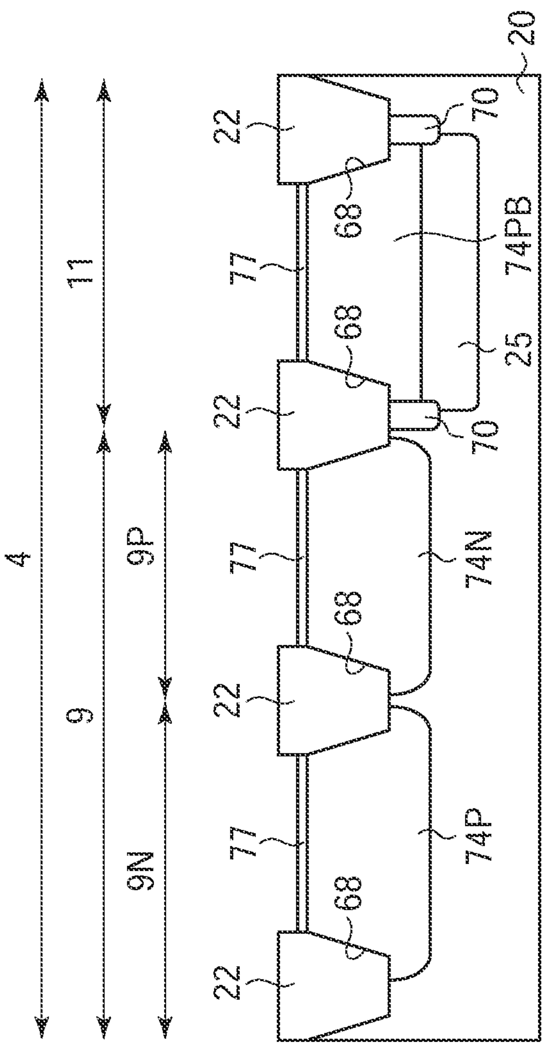
Figure 41A:
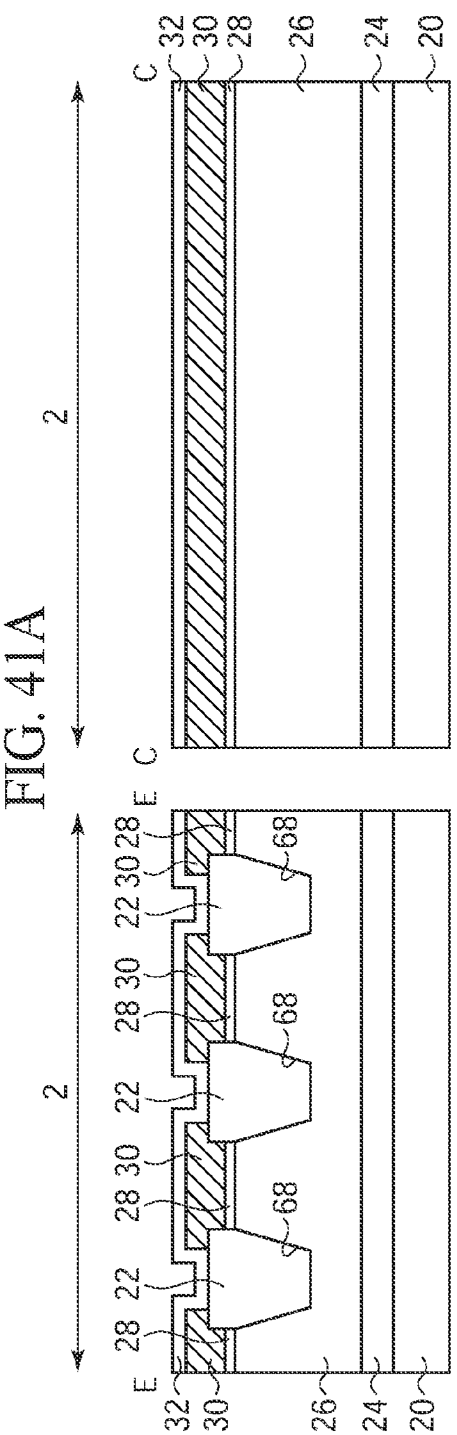
Figure 41B:
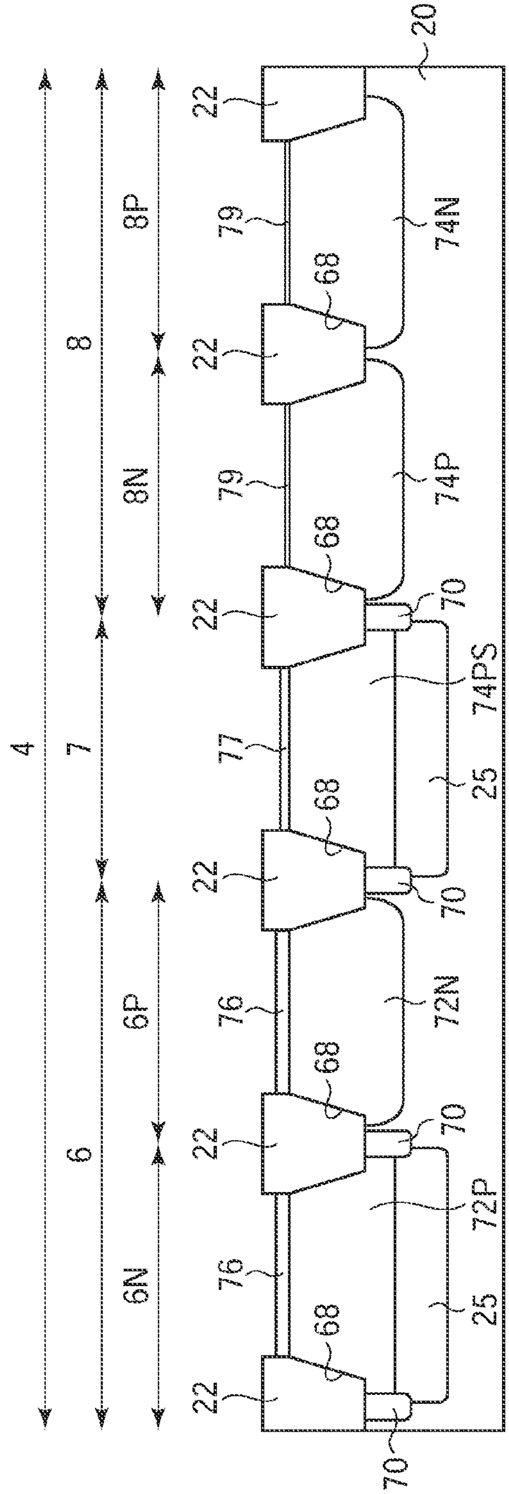
Figure 42:
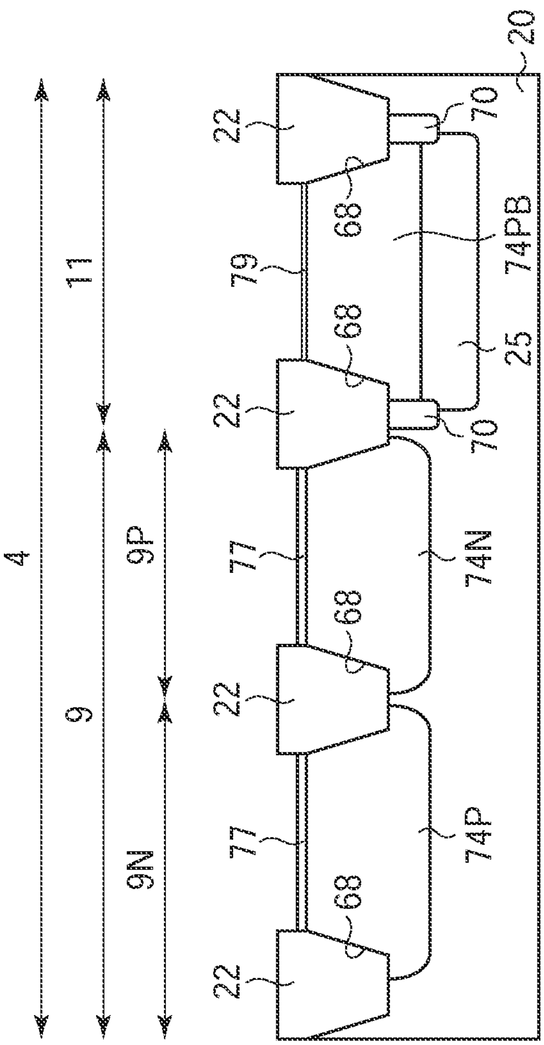

Then, as illustrated in FIGS. 37A and 37B, an N-type dopant impurity is implanted deep in the memory cell array region 2 to form the N-type buried diffused layer 24. Also in the region 6N for the high withstand voltage N-channel transistor to be formed in, the N-type dopant impurity is implanted deep to form the N-type buried diffused layer 25. In the region 7 for the sector select transistor to be formed in, the N-type dopant impurity is implanted deep to form the N-type buried diffused layer 25. As illustrated in FIG. 38, in the region for the voltage buffer transistor to be formed in, the N-type dopant impurity is implanted deep to form the N-type buried diffused layer 25. In the memory cell array region 2, a P-type dopant impurity is implanted shallower than the buried diffused layer 24 to form the P-type well 26. In the region 6N for the high withstand voltage N-channel transistor to be formed in, the P-type dopant impurity is shallower than the buried diffused layer 25 to form the P-type well 72P.

Then, in the region 6N for the high withstand voltage N-channel transistor to be formed in, the N-type diffused layer 70 is formed in a frame shape. The frame-shaped diffused layer 70 is formed from the surface of the semiconductor substrate 20 to the peripheral edge of the buried diffused layer 25. The P-type well 72P is enclosed by the buried diffused layer 25 and the diffused layer 70.

Also in the region 7 for the sector select transistor to be formed in, the N-type diffused layer 70 is formed in a frame shape. The frame-shaped diffused layer 70 is formed from the surface of the semiconductor substrate 20 to the peripheral edge of the buried diffused layer 25.

Also in the region 11 for the voltage buffer transistor to be formed in, the N-type diffused layer 70 is formed in a frame shape. The frame-shaped diffused layer 70 is formed from the surface of the semiconductor substrate 20 to the peripheral edge of the buried diffused layer 25.

Although no illustrated, the P-type well 26 of the memory cell array region 2 is also enclosed by the buried diffused layer 24 and the frame-shaped diffused layer 70.

Then, an N-type dopant impurity is implanted into the region 6P for the high withstand voltage P-channel transistor to be formed in to form the N-type well 72N.

Next, channel doping is made into the memory cell array region 2 (not illustrated).

Next, into the region 6N for the high withstand voltage N-channel transistor to be formed in and in the region 6P for the high withstand voltage P-channel transistor to be formed in channel doping is made (not illustrated).

Next, the sacrifice oxide film 69 exsisting on the surface of the semiconductor substrate 20 (see FIGS. 13A and 13B) is etched off.

Next, on the entire surface, the tunnel insulation film 28 of a 10 nm-film thickness is formed by the thermal oxidation.

Then, on the entire surface, a 90 nm-film thickness polysilicon film 30 is formed. As the polysilicon film 30, impurity-doped polysilicon film is formed.

Then, the polysilicon film 30 in the memory cell array region 2 is patterned, and the polysilicon film 30 in the peripheral circuit region 4 is etched off.

Next, on the entire surface, the insulation film (ONO film) 32 of a silicon oxide film and a silicon nitride film and a silicon oxide film sequentially stacked is formed. The insulation film 32 is for insulating the floating gates 30*a* and the control gates 34*a* from each other.

Next, into the region 8N for the first low voltage N-channel transistor to be formed in, a P-type dopant impurity is implanted to form the P-type well 74P. Into the region 7 for the sector select transistor to be formed in, the P-type dopant impurity is implanted to form the P-type well 74PS. Into the region 11 for the voltage buffer transistor to be formed in, the P-type dopant impurity is implanted to form the P-type well 74PB. Into the region 9N for the second low voltage N-channel transistor to be formed in, the P-type dopant impurity is implanted to form the P-type well 74P.

Then, into the region 8P for the first low voltage P-channel transistor to be formed in, an N-type dopant impurity is implanted to form the N-type well 74N. Into the region 9P for the second low voltage P-channel transistor to be formed in, the N-type dopant impurity is implanted to form the N-type well 74N.

Then, into the region 8N for the first low voltage N-channel transistor to be formed in and into the region 8P for the first low voltage P-channel transistor to be formed in, channel doping is made. Channel doping is made into the region 7 for the sector select transistor to be formed in, into the region 9N for the second low voltage N-channel transistor to be formed in and into the region 9P for the second low voltage P-channel transistor to be formed in (not illustrated).

Next, the insulation film (ONO film) 32 exsisting in the peripheral circuit region 4 is etched off.

Then, on the entire surface, the gate insulation film 76 of, e.g. an 11 nm-film thickness is formed by thermal oxidation (see FIGS. 37A to 38).

Next, the gate insulation film 76 in the region 7 for the sector select transistor to be formed in, the region 8 for the first low voltage transistor to be formed in, the region 9 for the second low voltage transistor to be formed in and the region 11 for the voltage buffer transistor to be formed in is removed by wet etching.

Then, the gate insulation film 77 of, e.g., a 4 nm-film thickness is formed on the entire surface by thermal oxidation. The gate insulation film 77 of, e.g., a 4 nm-film thickness is formed in the region 7 for the sector select transistor to be formed in, the region 8 for the first low voltage transistor to be formed in the region 9 for the second low voltage transistor to be formed in and in the region 11 for the voltage buffer transistor to be formed in. On the other hand, in the region 6 of the high withstand voltage transistor to be formed in, the film thickness of the gate insulation film 76 becomes, e.g., about 14 nm (see FIGS. 39A to 40).

Then, the gate insulation film 76 in the region 8 for the first low voltage transistor to be formed in and the region 11 for the voltage buffer transistor to be formed in is removed by wet etching.

Next, the gate insulation film 79 of, e.g., a 3 nm-film thickness is formed on the entire surface by thermal oxidation. Thus, in the region 8 for the first low voltage transistor to be formed in and the region 11 for the voltage buffer transistor to be formed in, the gate insulation film 79 of, e.g., a 3 nm-film thickness is formed. In the region 9 for the second low voltage transistor to be formed in and the region 7 for the sector select transistor to be formed in, the film thickness of the gate insulation film 77 is, e.g., about 6 nm. In the region 6 for the high withstand voltage transistor to be formed in, the film thickness of the gate insulation film 76 becomes, e.g., about 16 nm (see FIGS. 41A to 42).

Then, on the entire surface, a polysilicon film 34 of, e.g., a 180 nm-film thickness is formed by, e.g., CVD.

Figure 43A:
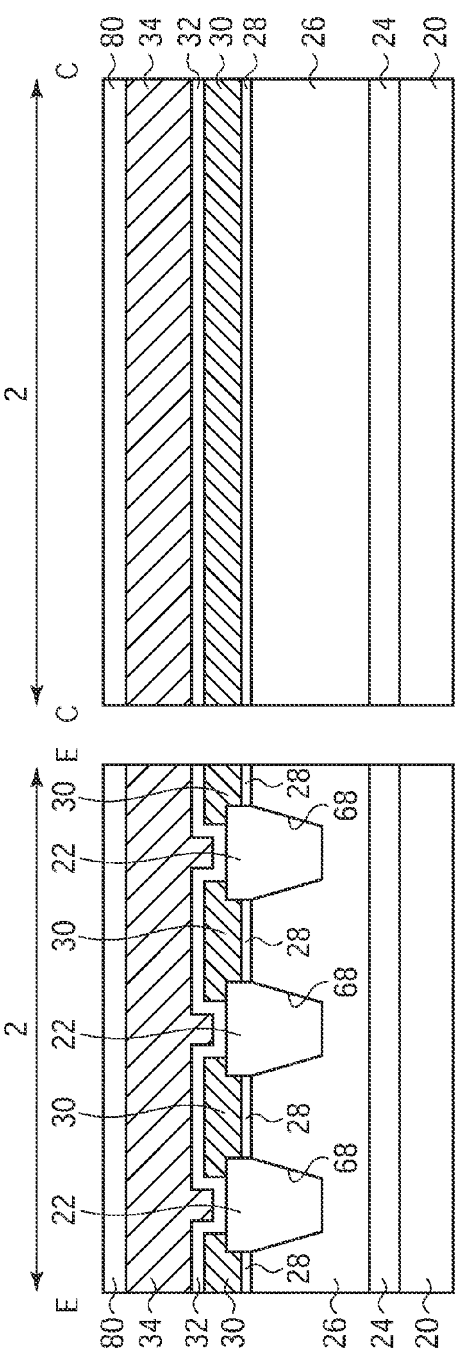
Figure 43B:
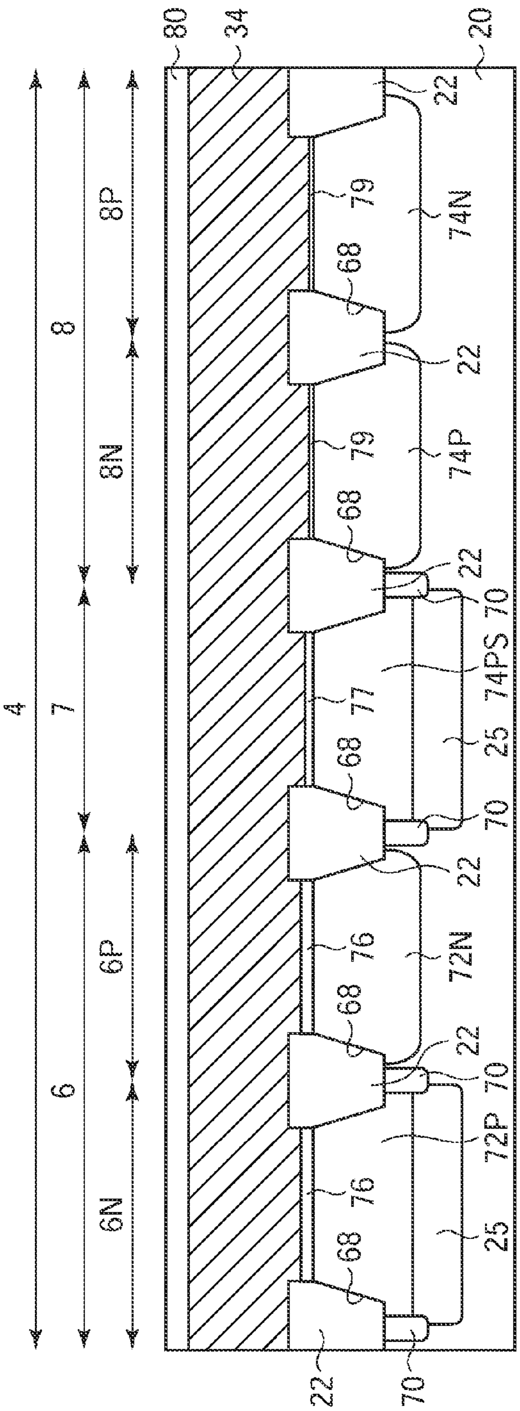
Figure 44:
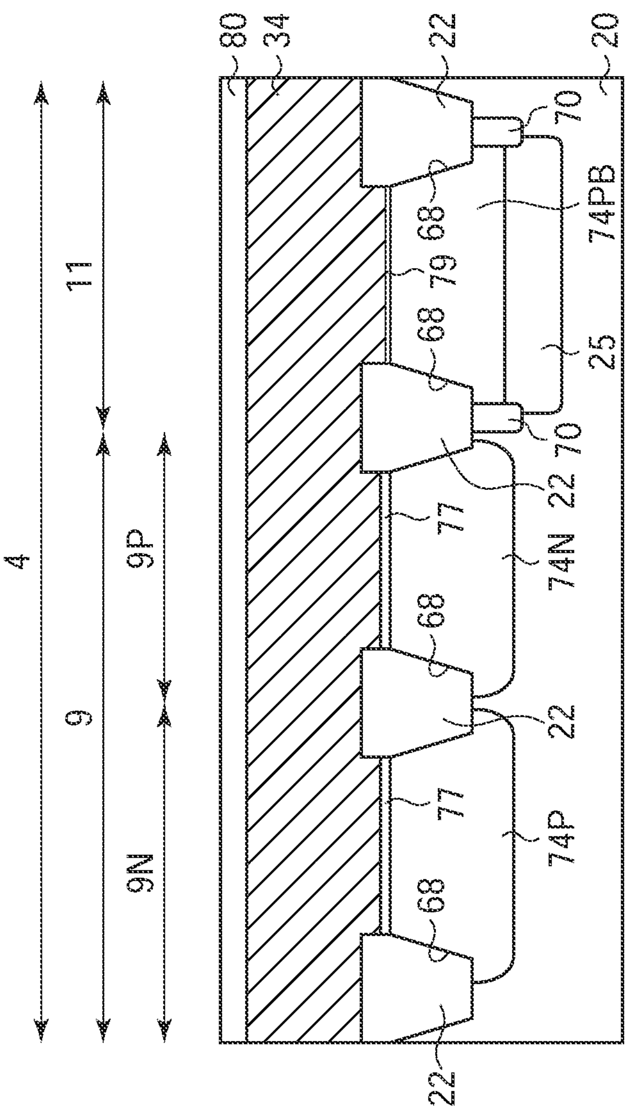

Then, the antireflection film 80 is formed on the entire surface (see FIGS. 43A to 44).

Figures 45A, 45B:
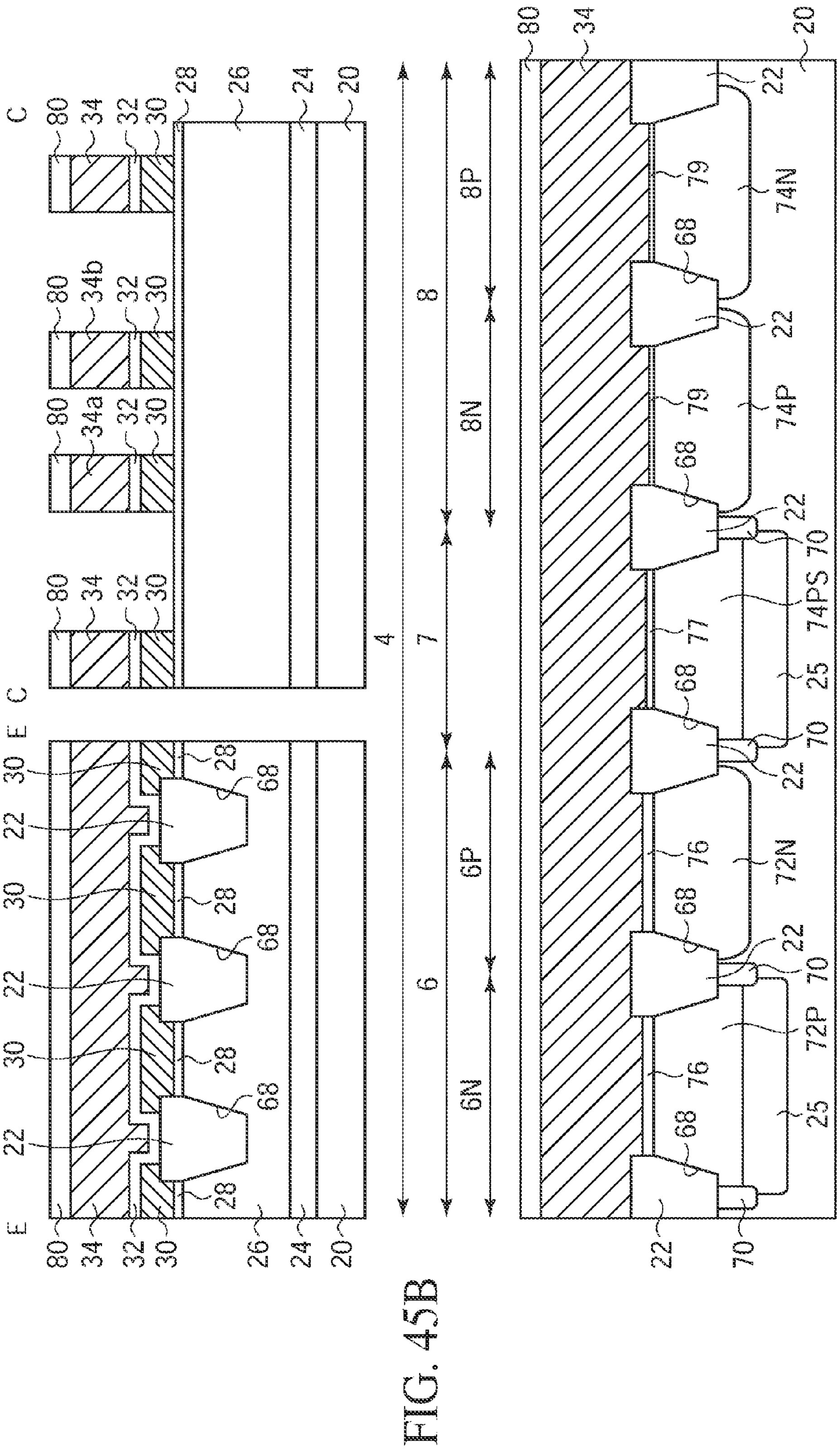
Figure 46:
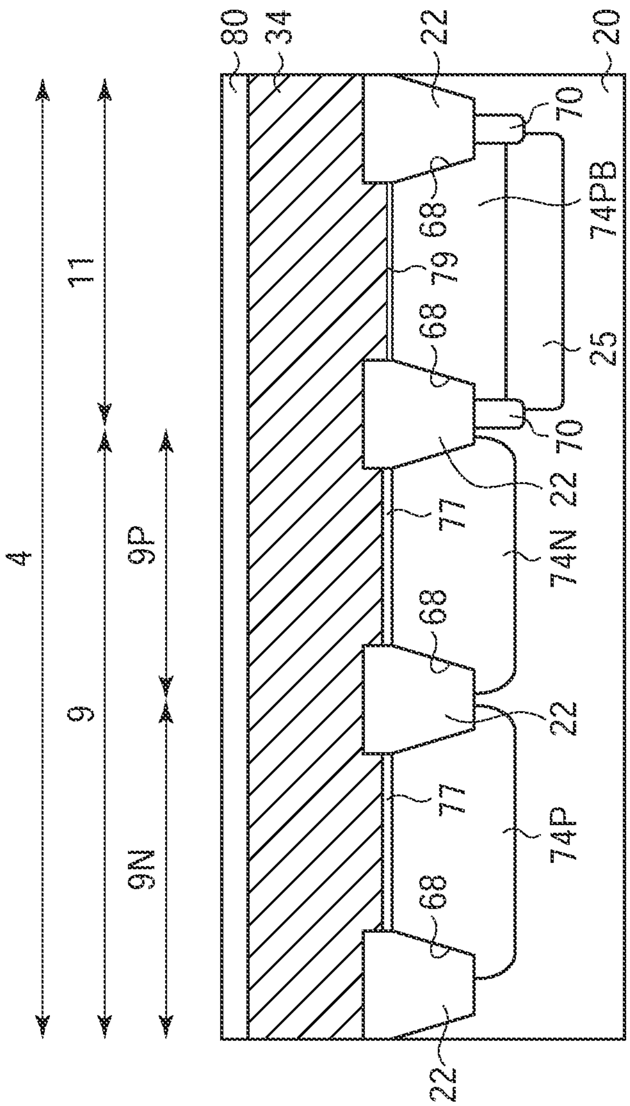

Next, as illustrated in FIGS. 45A to 46, by photolithography, the antireflection film 80, the polysilicon film 34, the insulation film 32 and the polysilicon film 30 are etched by dry etching. Thus, the layered structures of the floating gate 30*a* of polysilicon and the control gate 34*a* of polysilicon are formed in the memory cell array region 2. The layered structures including the select gate 30*b* of polysilicon and the polysilicon film 34*b* are formed in the memory cell array region 2.

Then, the polysilicon film 34*b* in the regions where the interconnection (the first metal interconnection) 46 and the select gate 30*b* are to be connected to each other is etched off (not illustrated).

Next, by thermal oxidation, a silicon oxide film (not illustrated) is formed on the side walls of the floating gates 30*a*, the side walls of the control gates 34*a*, the side walls of the select gates 30*b* and the side walls of the polysilicon films 34*b*.

Next, on the entire surface, a photoresist film (not illustrated) is formed by spin coating.

Then, by photolithography, an opening (not illustrated) exposing the memory cell array region 2 is formed in the photoresist film.

Then, with the photoresist film as the mask, an N-type dopant impurity is implanted into the semiconductor substrate 20. Thus, the impurity diffused layers 36*a*-36*c* are formed in the semiconductor substrate 20 on both sides of the floating gates 30*a* and in the semiconductor substrate 20 on both sides of the select gates 30*b*. Then, the photoresist film is released.

Thus, the memory cell transistors MT each including the floating gate 30*a*, the control gate 34*a* and the source/drain diffused layers 36*a*, 36*b* are formed. The select transistors ST each including the control gates 30*b* and the source/drain diffused layers 36*b*, 36*c* are formed.

Next, the silicon oxide film 82 is formed on the side walls of the floating gates 30*a*, the side walls of the control gates 34*b*, the side walls of the select gates 30*b* and the side walls of the polysilicon films 34*b* by thermal oxidation.

Next, the 50 nm-film thickness silicon nitride film 84 is formed by, e.g., CVD.

Next, the silicon nitride film 84 is anisotropically etched by dry etching to form the sidewall insulation film 84 of silicon nitride film. At this time, the antireflection film 80 is etched off.

Next, by photolithography, the polysilicon film 34 in the peripheral circuit region 4 is patterned. Thus, in the region 6 for the high withstand voltage transistor to be formed in, the gate electrode 34*c* of the high withstand voltage transistors 110N, 110P of the polysilicon film 34 are formed. In the region 7 for the sector select transistor to be formed in, the gate electrode 34*d* of the sector select transistor SST of the polysilicon film 34 is formed. In the region 8 for the first low voltage transistor to be formed in, the gate electrodes 34*d* of the first low voltage transistors 111N, 111P of the polysilicon film 34 are formed. In the region 9 where the second low voltage transistor to be formed in, the gate electrodes 34*d* of the second low voltage transistors 113N, 113P of the polysilicon film 34 are formed. In the region 11 for the voltage buffer transistor to be formed in, the gate electrode 34*d* of the voltage buffer transistor BT of the polysilicon film 34 is formed.

Next, on the entire surface, a photoresist film (not illustrated) is formed by spin coating.

Then, by photolithography, an opening (not illustrated) exposing the region 6N for the high withstand voltage N-channel transistor to be formed in is formed in the photoresist film.

Then, with the photoresist film as the mask, an N-type dopant impurity is implanted into the semiconductor substrate 20. Thus, in the semiconductor substrate 20 on both sides of the gate electrode 34*c* of the high withstand voltage N-channel transistor 110N, the N-type lightly doped diffused layers 86 are formed. Then, the photoresist film is released.

Next, on the entire surface, a photoresist film (not illustrated) is formed by spin coating.

Then, by photolithography, an opening (not illustrated) exposing the region 6P for the high withstand voltage P-channel transistor to be formed in is formed in the photoresist film.

Then, with the photoresist film as the mask, a P-type dopant impurity is implanted into the semiconductor substrate 20. Thus, in the semiconductor substrate 20 on both sides of the gate electrode 34*c* of the high withstand voltage P-channel transistor 110P, the P-type lightly doped diffused layers 88 are formed. Then, the photoresist film is released.

Then, on the entire surface, a photoresist film (not illustrated) is formed by spin coating.

Next, by photolithography, an opening (not illustrated) exposing the region 9N for the second low voltage transistor to be formed in is formed in the photoresist film. At this time, in the photoresist film, an opening (not illustrated) exposing the region 7 for the sector select transistor to be formed in is also formed.

Then, with the photoresist film as the mask, an N-type dopant impurity is implanted into the semiconductor substrate 20. Thus, in the semiconductor substrate 20 on both sides of the gate electrode **34*d* of the second low voltage N-channel transistor 113N, the N-type lightly doped diffused layers 90*a* are formed. In the semiconductor substrate 20 on both sides of the gate electrode 34*d* of the sector select transistor SST, the N-type lightly doped diffused layers 90*a*** are formed. Then, the photoresist film is released.

Then, on the entire surface, a photoresist film (not illustrated) is formed by spin coating.

Next, by photolithography, an opening (not illustrated) for the region 9P for the second low voltage P-channel transistor to be formed in is formed in the photoresist film.

Next, with the photoresist film as the mask, a P-type dopant impurity is implanted into the semiconductor substrate 20. Thus, in the semiconductor substrate 20 on both sides of the gate electrode **34*d* of the second low voltage P-channel transistor 113P, the P-type lightly doped diffused layers 92*a*** are formed. Then, the photoresist film is released.

Then, on the entire surface, the photoresist film (not illustrated) is formed by spin coating.

Next, by photolithography, an opening (not illustrated) exposing the region 8N for the first low voltage N-channel transistor to be formed in is formed. At this time, in the photoresist film, an opening (not illustrated) exposing the region 11 for the voltage buffer transistor to be formed in is formed.

Then, with the photoresist film as the mask, an N-type dopant impurity is implanted into the semiconductor substrate 20. Thus, in the semiconductor substrate 20 on both sides of the gate electrode **34*d* of the first low voltage N-channel transistor 111N, the N-type lightly doped diffused layers 90 are formed. In the semiconductor substrate 20 on both sides of the gate electrode 34*d* of the voltage buffer transistor BT, the N-type lightly doped diffused layers 90** are formed. Then, the photoresist film is released.

Next, on the entire surface, a photoresist film (not illustrated) is formed by spin coating.

Next, by photolithography, an opening (not illustrated) exposing the region 8P for the first low voltage P-channel transistor to be formed in is formed in the photoresist film.

Figure 47A:
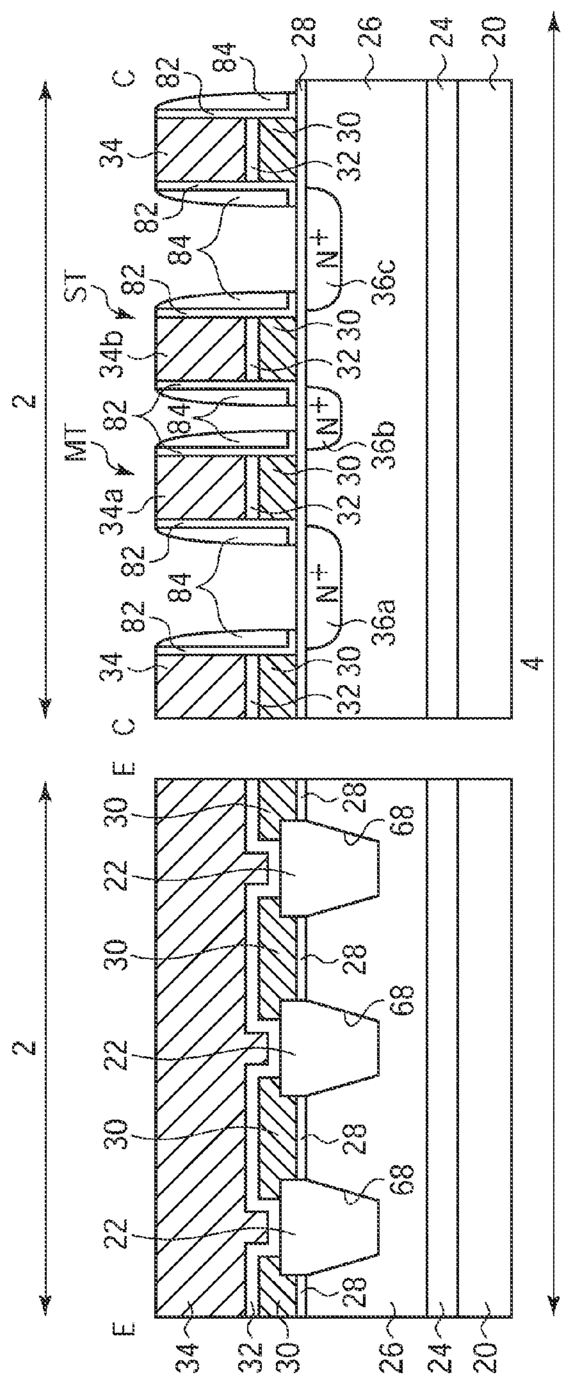
Figure 47B:
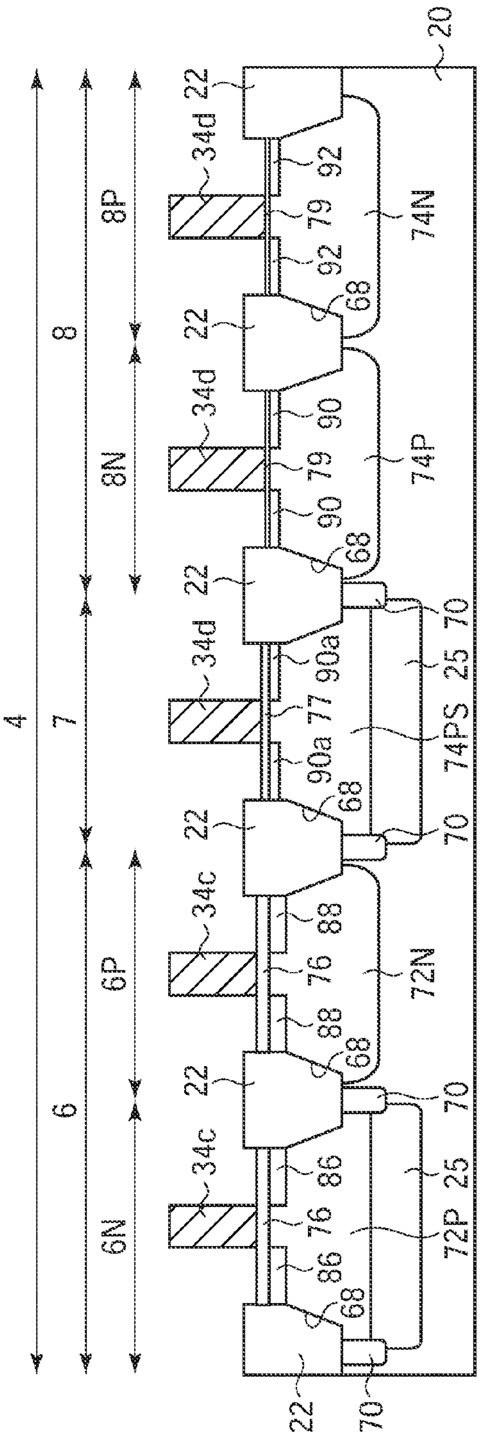
Figure 48:
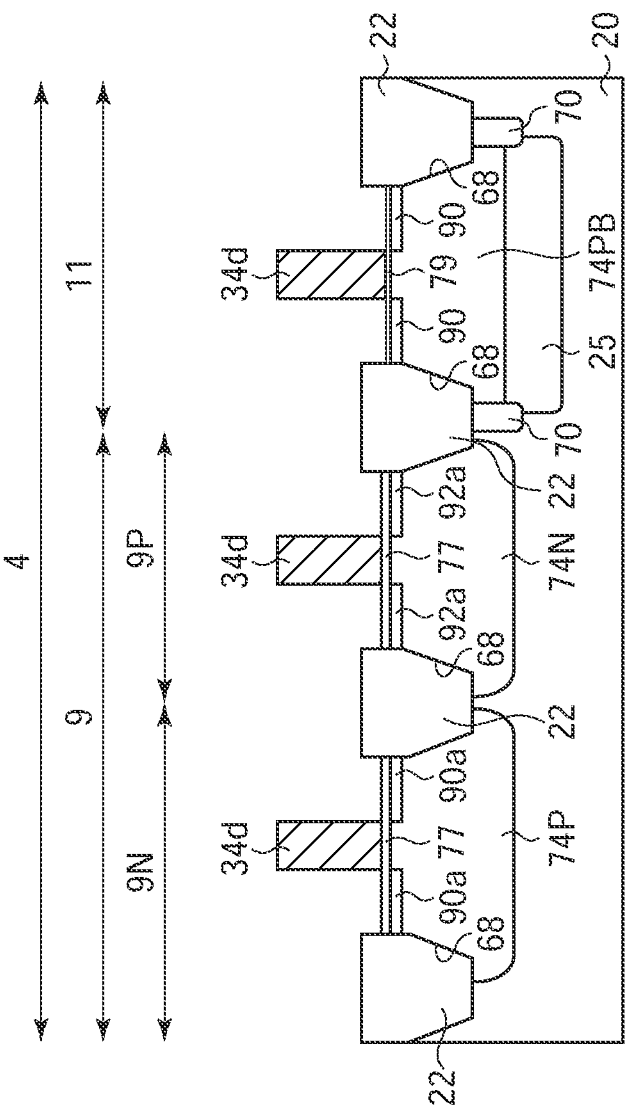

Next, with the photoresist film as the mask, a P-type dopant impurity is implanted into the semiconductor substrate 20. Thus, in the semiconductor substrate 20 on both sides of the gate electrode **34*d* of the first low voltage P-channel transistor 111P, the P-type lightly doped diffused layers 92 are formed. Then, the photoresist film is released (FIGS. 47A to 48**).

Then, the 100 nm-film thickness silicon oxide film 93 is formed by, e.g., CVD.

Next, by dry etching, the silicon oxide film 93 is anisotropically etched. Thus, the sidewall insulation film 93 of silicon oxide film is formed on the side wall of the layered structure of the floating gate **30*a* and the control gate 34*a* (see FIGS. 49A to 50). On the side wall of the layered structure of the select gate 30*b* and the polysilicon film 34*b* the sidewall insulation film 93 of silicon oxide film is formed. On the side walls of the gate electrodes 34*c*, 34*d*, the sidewall insulation film 93** of silicon oxide film is formed.

Next, on the entire surface, a photoresist film (not illustrated) is formed by spin coating.

Next, by photolithography, an opening (not illustrated) exposing the region 6N for the high withstand voltage N-channel transistor to be formed in is formed in the photoresist film.

Next, with the photoresist film as the mask, an N-type dopant impurity is implanted into the semiconductor substrate 20. Thus, in the semiconductor substrate 20 on both sides of the gate electrode **34*c* of the high withstand voltage N-channel transistor, the N-type heavily doped diffused layer 94 is formed. The N-type lightly doped diffused layer 86 and the N-type heavily doped diffused layer 94 form the N-type source/drain diffused layers 96 of the LDD structure. Thus, the high withstand voltage N-channel transistor 110N including the gate electrode 34*c* and the source/drain diffused layers 96 is formed. The high withstand voltage N-channel transistor 110N is used in the high voltage circuits of the first row decoder 14, the third row decoder 18, the first voltage application circuit 15, the second voltage application circuit 17, the third voltage application circuit 19**, etc.

Then, the photoresist film is released.

Next, on the entire surface, a photoresist film (not illustrated) is formed by spin coating.

Next, by photolithography, an opening (not illustrated) exposing the region 6P for the high withstand voltage P-channel transistor to be formed in is formed in the photoresist film.

Next, with the photoresist film as the mask, a P-type dopant impurity is implanted into the semiconductor substrate 20. Thus, in the semiconductor substrate 20 on both sides of the gate electrode **34*c* of the high withstand voltage P-channel transistor 110P, the P-type heavily doped diffused layer 98 is formed. The P-type lightly doped diffused layer 88 and the P-type heavily doped diffused layer 98 form the P-type source/drain diffused layers 100 of the LDD structure. Thus, the high withstand voltage P-channel transistor 110P including the gate electrode 34*c* and the source/drain diffused layers 100 is formed. The high voltage P-channel transistor 110P is used in the high voltage circuits of the first row decoder 14, the third row decoder 18, the first voltage application circuit 15, the second voltage application circuit 17, the third voltage application circuit 19**, etc. Then, the photoresist film is released.

Next, on the entire surface, a photoresist film (not illustrated) is formed by spin coating.

Then, by photolithography, an opening (not illustrated) exposing the region 8N for the first low voltage N-channel transistor to be formed in and an opening (not illustrated) exposing the region 9N for the second low voltage N-channel transistor to be formed in are formed in the photoresist film. At this time, in the photoresist film, an opening (not illustrated) exposing the region 7 for the sector select transistor to be formed in and an opening (not illustrated) exposing the region 11 for the voltage buffer transistor to be formed in are also formed.

Then, with the photoresist film as the mask, an N-type dopant impurity is implanted into the semiconductor substrate 20. Thus, in the semiconductor substrate 20 on both sides of the gate electrode **34*d* of the first low voltage N-channel transistor 111N, the N-type heavily doped diffused layers 102 are formed. In the semiconductor substrate 20 on both sides of the gate electrode 34*d* of the second low voltage N-channel transistor 113N, the N-type heavily doped diffused layers 102 are formed. In the semiconductor substrate 20 both sides of the gate electrode 34*d* of the sector select transistor SST, the N-type heavily doped diffused layer 102 is formed. In the semiconductor substrate 20 on both sides of the gate electrode 34*d* of the voltage buffer transistor BT, the N-type heavily doped diffused layers 102 are formed. The N-type lightly doped diffused layers 90 and the N-type heavily doped diffused layers 102 form the N-type source/drain diffused layers 104** of the LDD structure.

Thus, the first low voltage N-channel transistor 111N including the gate electrode 34*d* and the source/drain diffused layers 104 is formed. The second low voltage N-channel transistor 113N including the gate electrode 34*d* and the source/drain diffused layers 104 is formed. The sector select transistor SST including the gate electrode 34*d* and the source/drain diffused layers 104 is formed. The voltage buffer transistor BT including the gate electrode 34*d* and the source/drain diffused layers 104 is formed.

The first low voltage N-channel transistor 111N is used in the low voltage circuits of the column decoder 12, the second row decoder 16, sense amplifier 13, etc. The second low voltage N-channel transistor 113N is used in the low voltage circuits of the first control circuit 23, the second control circuit 29, etc.

Then, the photoresist film is released.

Then, on the entire surface, a photoresist film (not illustrated) is formed by spin coating.

Next, by photolithography, an opening (not illustrated) exposing the region 8P for the first low voltage P-channel transistor to be formed in and an opening (not illustrated) exposing the region 9P for the second low voltage P-channel transistor to be formed in are formed in the photoresist film.

Then, with the photoresist film as the mask, a P-type dopant impurity is implanted into the semiconductor substrate 20. Thus, in the semiconductor substrate 20 on both sides of the gate electrode 34*d* of the first low voltage P-channel transistor 111P, the P-type heavily doped diffused layers 106 are formed. In the semiconductor substrate 20 on both sides of the gate electrode 34*d* of the second low voltage P-channel transistor 113P, the P-type heavily doped diffused layers 106 are formed. The P-type lightly doped diffused layers 92 and the P-type heavily doped diffused layer 106 form the P-type source/drain diffused layers 108 of the LDD structure.

Thus, the first low voltage P-channel transistor 111P including the gate electrode 34*d* and the source/drain diffused layers 108 is formed. The second low voltage P-channel transistor 113P including the gate electrode 34*d* and the source/drain diffused layers 108 is formed. The first low voltage P-channel transistor 111P is used in the low voltage circuits of the column decoder 12, the second row decoder 16, the sense amplifier 13, etc. The second low voltage P-channel transistor 113P is used in the low voltage circuits the first control circuit 23, the second control circuit 29, etc.

Figure 49A:
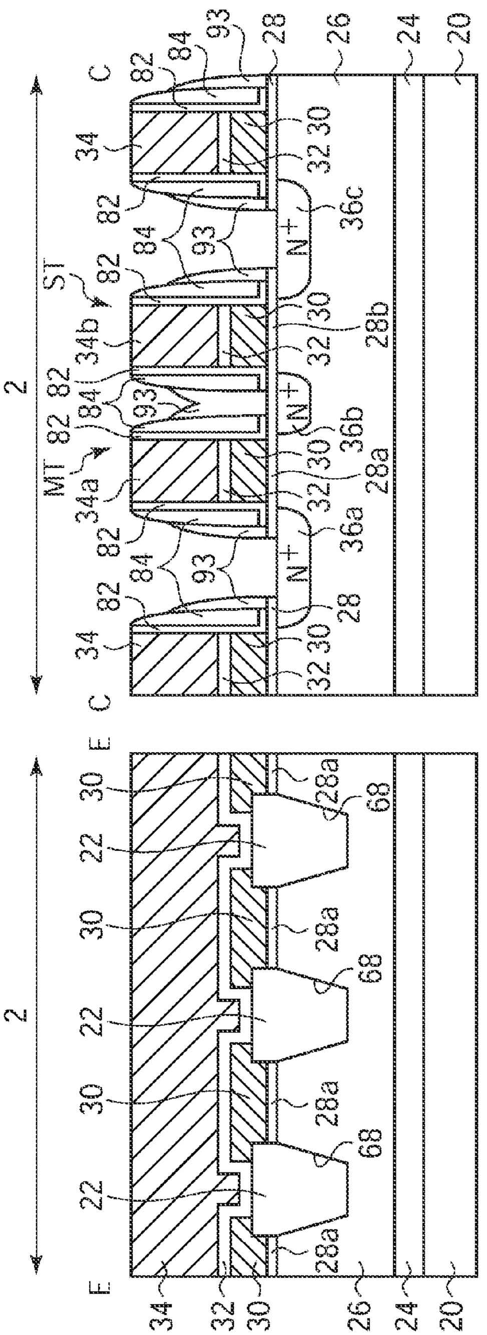
Figure 49B:
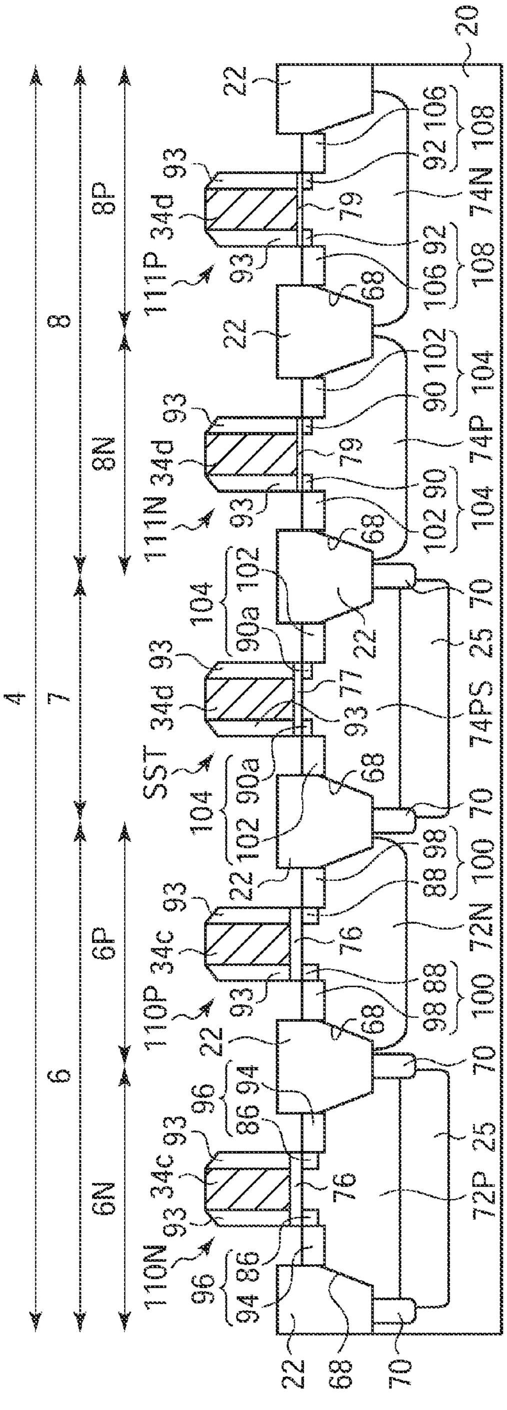
Figure 50:
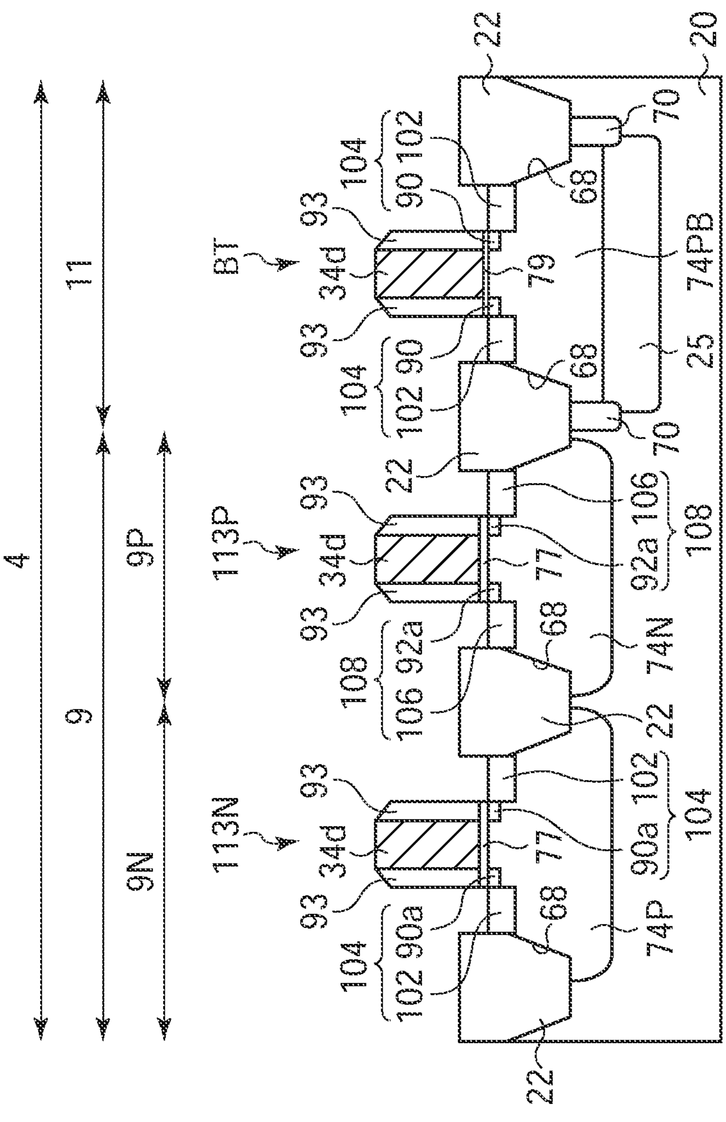
Figure 51A:
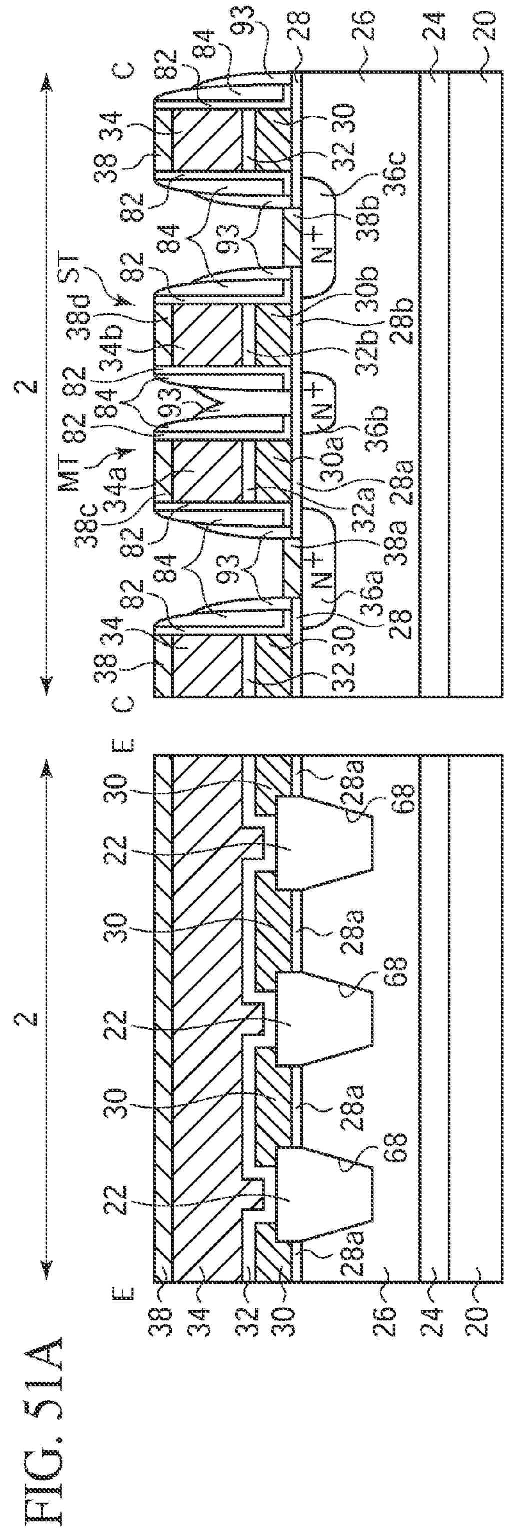
Figure 51B:
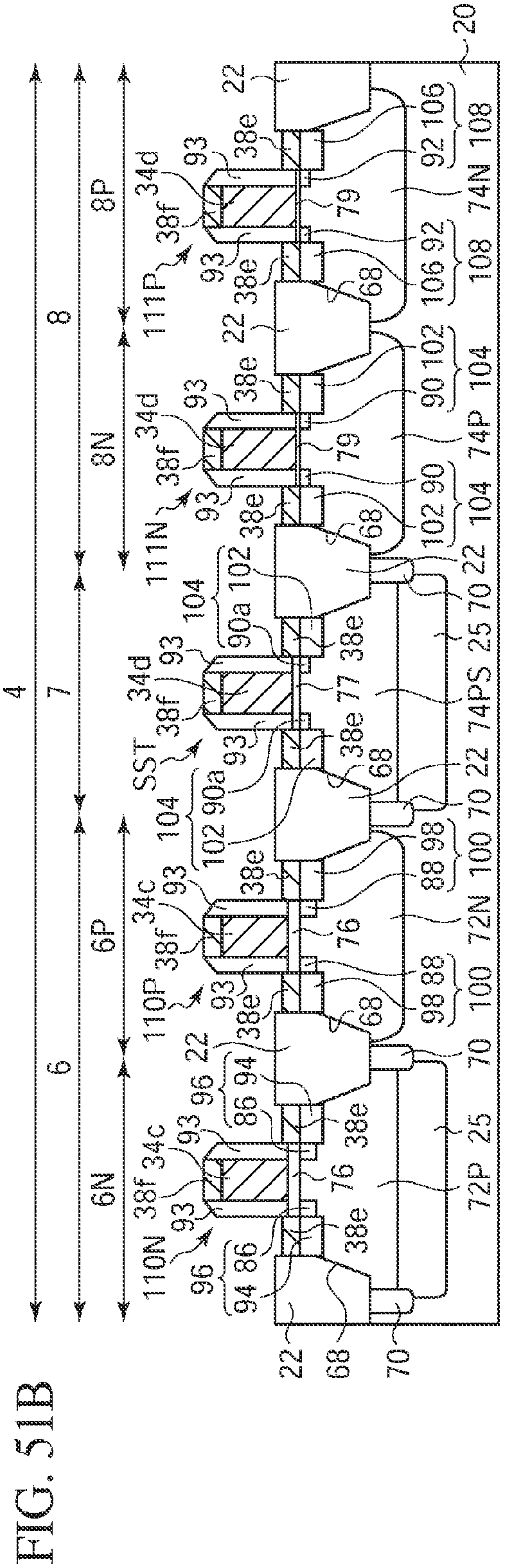
Figure 52:
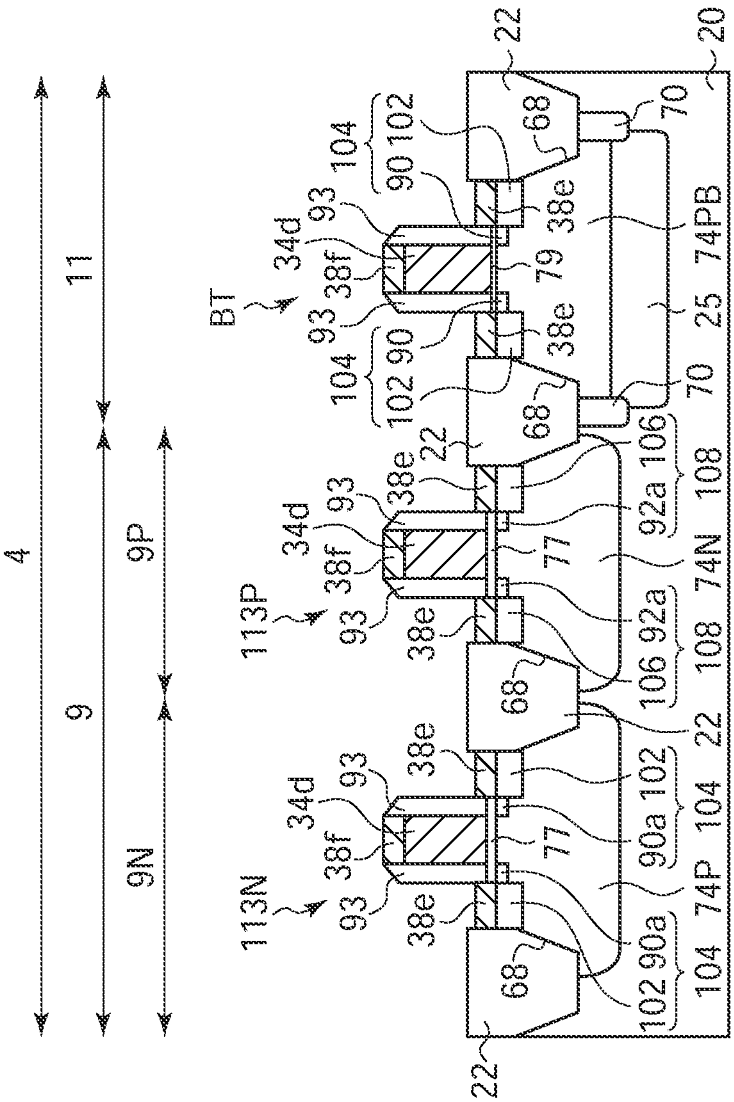

Then, the photoresist film is released (see FIGS. 49A to 50).

Next, the 10 nm-film thickness cobalt film is formed on the entire surface by, e.g., sputtering.

Next, in the same way as in the method of manufacturing the nonvolatile semiconductor memory device according to the first embodiment described with reference to FIG. 21, the cobalt silicide films 38*a*-38*f* are formed. Then, those of the cobalt films, which have not reacted are etched off.

The cobalt silicide film 38*b* formed on the drain diffused layers 36*c* of the select transistors ST functions as the drain electrodes. The cobalt silicide film 38*a* formed on the source diffused layers 36*a* of the memory cell transistors MT function as the source electrodes.

The cobalt silicide film 38*e* formed on the source/drain diffused layers 96, 100 of the high withstand voltage transistors 110N, 110P functions as the source/drain electrodes. The cobalt silicide layer 38*e* formed on the source/drain diffused layers 104, 108 of the first low voltage transistors 111N, 111P and the second low voltage transistor 113N, 113P function as the source/drain electrodes. The cobalt silicide film 38*e* formed on the source/drain diffused layers 104 of the sector select transistor SST and the voltage buffer transistor BT function as the source/drain electrodes (see FIGS. 51A to 52).

Figure 53:
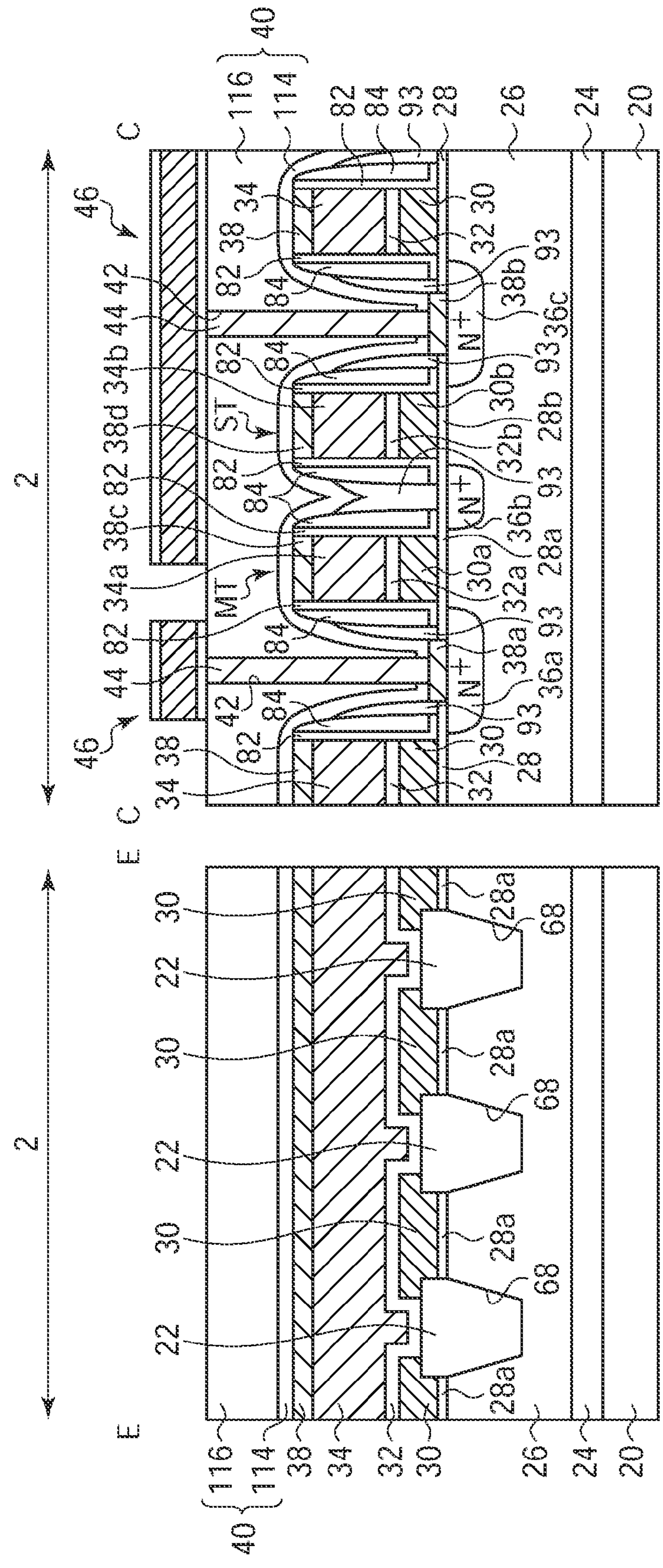
Figure 54:
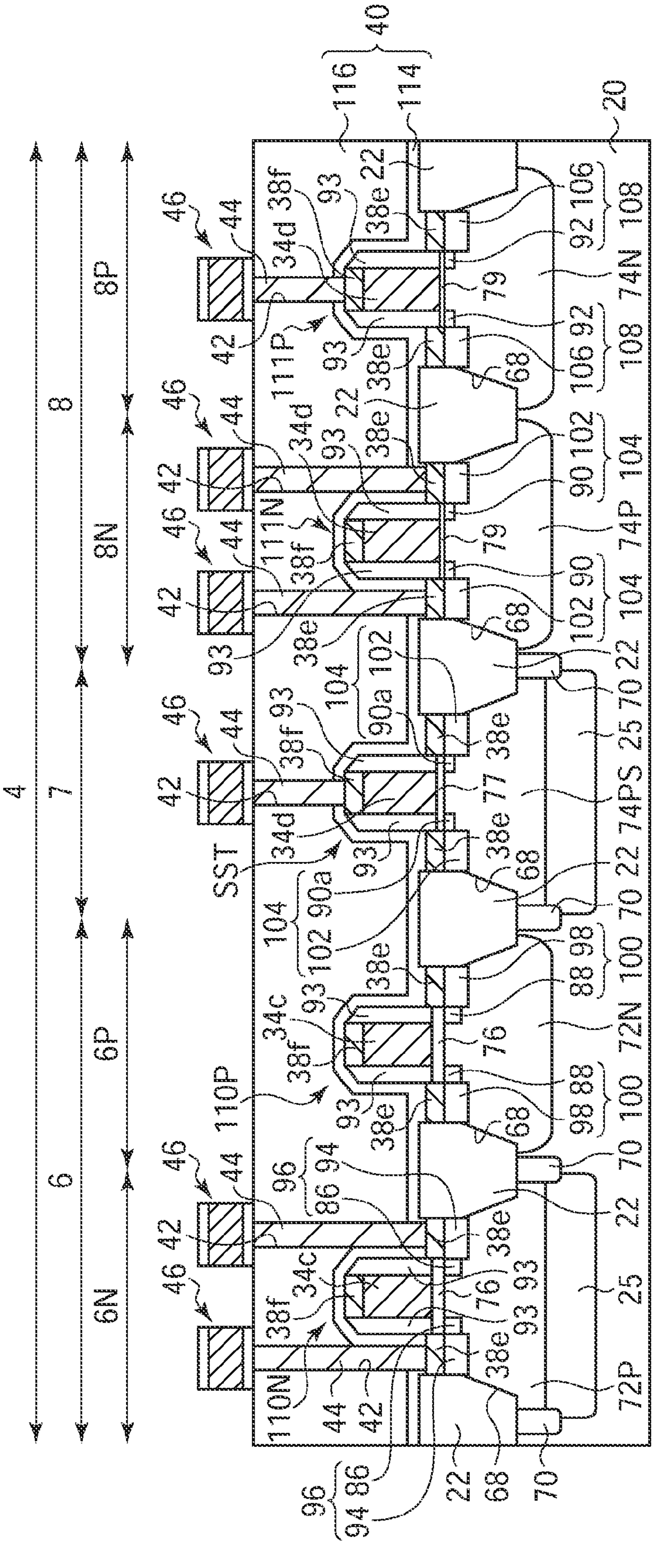

Then, as illustrated in FIGS. 53 and 54, the 100 nm-film thickness silicon nitride film 114 is formed on the entire surface by, e.g., CVD. The silicon nitride film 114 functions as the etching stopper.

Next, on the entire surface, the 1.6 μm-film thickness silicon oxide film 116 is formed by CVD. Thus, the inter-layer insulation film 40 of the silicon nitride film 114 and the silicon oxide film 116 is formed.

Next, the surface of the inter-layer insulation film 40 is planarized by CMP.

Next, by photolithography, the contact holes 42 arriving at the source/drain electrodes 38*a*, 38*c*, the contact holes 42 arriving at the cobalt silicide films 38*e*, and the contact holes 42 arriving at the cobalt silicide films 38*f* are formed.

Next, on the entire surface, the barrier film (not illustrated) of Ti film and TiN film is formed by sputtering.

Then, on the entire surface, the 300 nm-film thickness tungsten film 44 is formed by, e.g., CVD.

Next, by CMP, the tungsten film 44 and the barrier film are polished until the surface of the inter-layer insulation film 40 is exposed. Thus, the conductor plugs 44 of, e.g., tungsten are buried in the contact holes 42.

Next, by, e.g., sputtering, the layered film 46 of a Ti film, a TiN film, an Al film, a Ti film and a TiN film sequentially stacked is formed on the inter-layer insulation film 40 with the conductor plugs 44 buried in.

Next, by photolithography, the layered film 46 is patterned. Thus, the interconnections (the first metal interconnection layers) 46 formed of the layered film are formed (see FIGS. 53 to 55).

Then, in the same way as in the method of manufacturing the nonvolatile semiconductor memory device described with reference to FIGS. 24 and 25, the multilayer interconnection structure is formed.

Thus, the nonvolatile semiconductor memory device according to the present embodiment is manufactured.

[c] Third Embodiment

Figure 55:
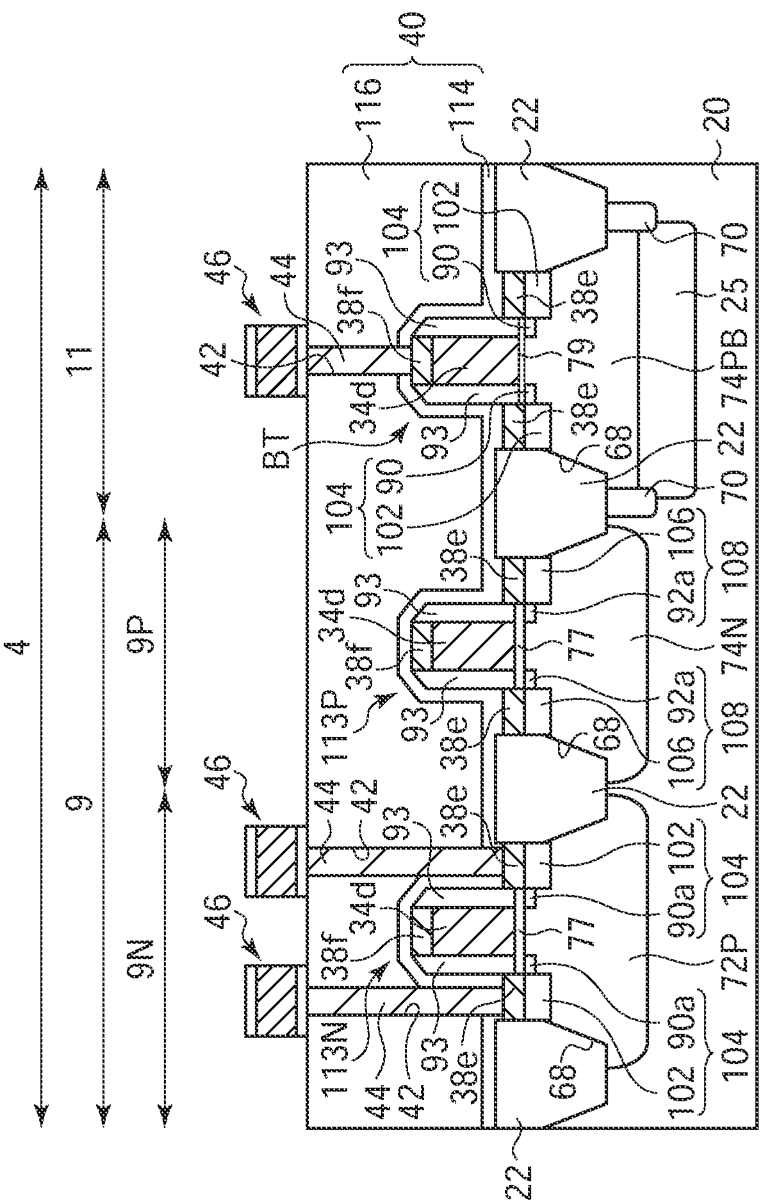

The nonvolatile semiconductor memory device according to a third embodiment, its reading method, its writing method, its erasing method and the method of manufacturing the nonvolatile semiconductor memory device will be described with reference to FIGS. 56 to 60. The same reference numbers of the present embodiment as those of the nonvolatile semiconductor memory device, etc. according to the first or the second embodiment illustrated in FIGS. 1 to 55 are represented by the same reference numbers not to repeat or to simplify the description.

(Nonvolatile Semiconductor Memory Device)

Figure 56:
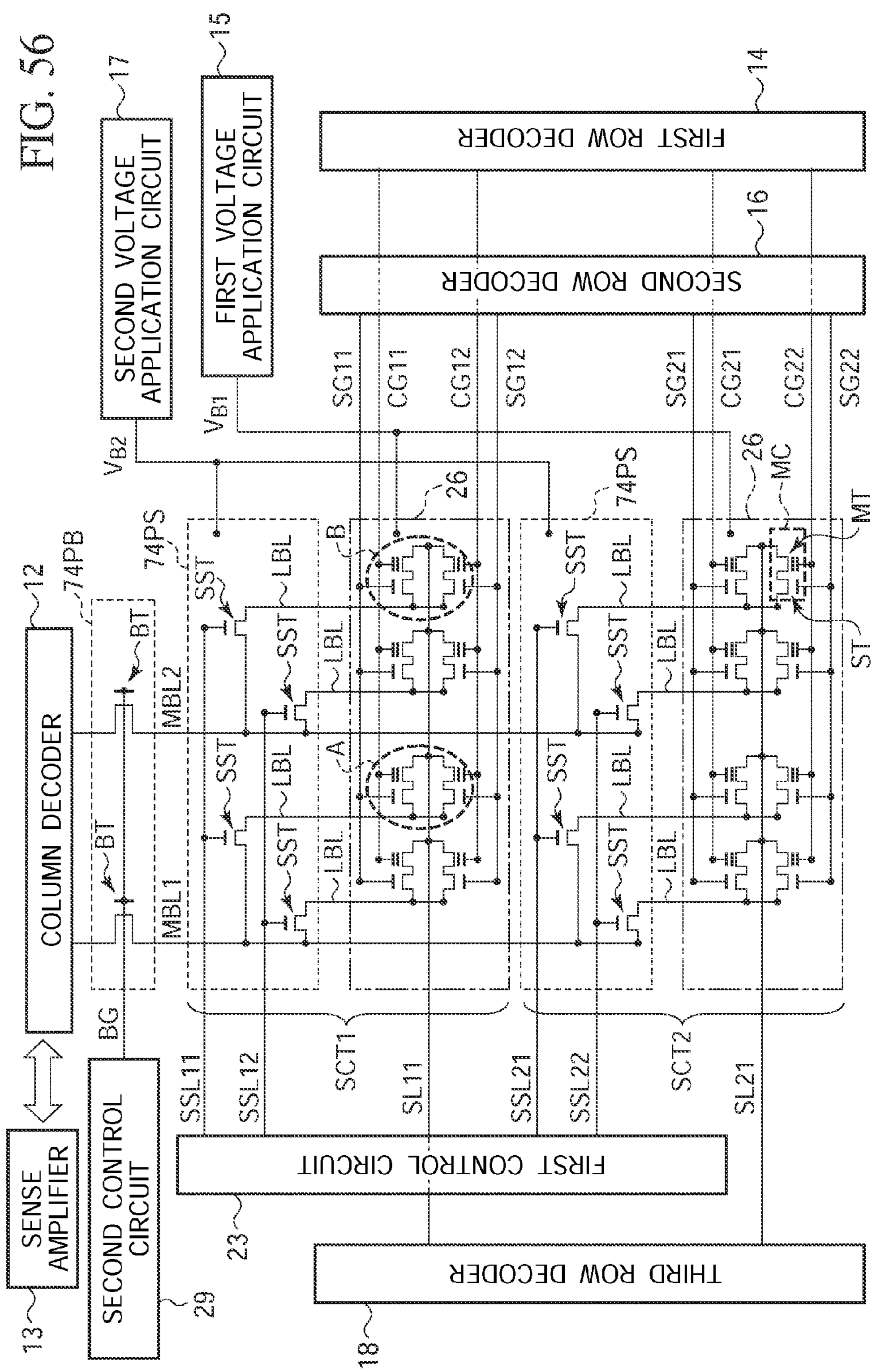
FIG. 56 is a circuit diagram of a nonvolatile semiconductor memory device according to a third embodiment.
Figure 57A:
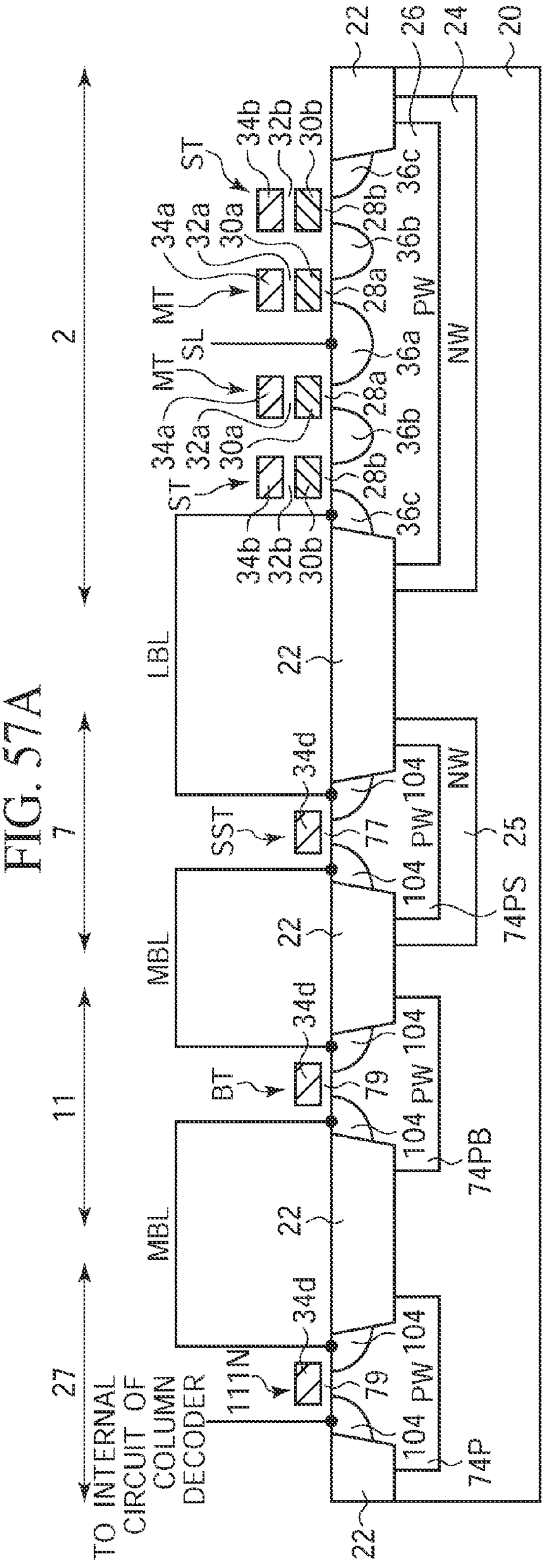
FIG. 57 is sectional views of the nonvolatile semiconductor memory device according to the third embodiment.
Figure 57B:
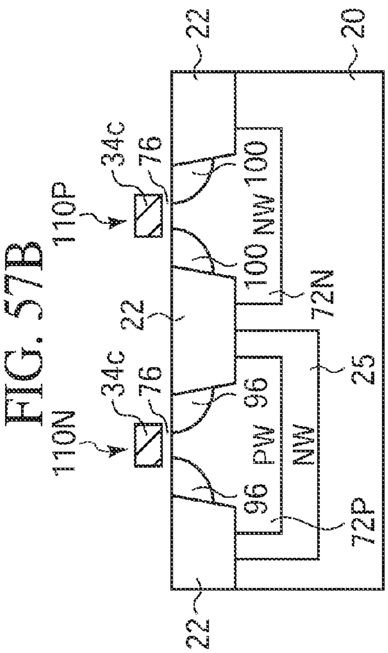

The nonvolatile semiconductor memory device according to the present embodiment will be described with reference to FIGS. 56 to 58. FIG. 56 is the circuit diagram of the nonvolatile semiconductor memory device according of the present embodiment. FIGS. 57A and 57B are sectional views of the nonvolatile semiconductor memory device according to the present embodiment.

The nonvolatile semiconductor memory device according to the present embodiment is characterized mainly in that the region 11 for the voltage buffer transistor formed in does not have the triple well structure.

As illustrated in FIGS. 57A and 57B, in the region 11 for the voltage buffer transistor formed in, a P-type well 74PB is formed. In the present embodiment, in the region 11 for the voltage buffer transistor formed in, the N-type well (N-type diffused layer) 25 (see FIG. 36) is not formed. That is, the region 11 for the voltage buffer transistor formed in does not have the triple well structure.

On the P-type well 74PB, the voltage buffer transistor BT is formed. That is, on the P-type well 74PB, the gate electrode 34*d* is formed with the gate insulation film 79 formed therebetween. In the semiconductor substrate 20 on both sides of the gate electrode 34*d*, the source/drain diffused layers 104 are formed. Thus, on the P-type well 74PB, the voltage buffer transistor BT including the gate electrode 34*d* and the source/drain diffused layers 104 is formed.

As illustrated in FIG. 56, in the present embodiment, the third voltage application circuit 19 (see FIG. 27), which applies a voltage to the P-type well 74PB is not provided.

FIG. 58 is a view of the species of the transistors used in the respective constituent elements, the withstand voltage of the transistors, and the film thickness of the gate insulation films of the transistors.

As illustrated in FIG. 58, as the sector select transistor SST, a low voltage transistor (3 V Tr) of, e.g., a 3 V-rated voltage is used. The withstand voltage between the source/drain diffused layers 104 of the sector select transistor SST and the P-type well 74PS is, e.g., about 6 V. The withstand voltage between the gate electrode 34*d* and the source/drain diffused layer 104, of the sector select transistor SST is, e.g., about 6 V. The film thickness of the gate insulation film 77 of the sector select transistor SST is, e.g., about 6 nm.

As the voltage buffer transistor BT, a low voltage transistor (1.8 V Tr) of, e.g., a 1.8 V rated voltage is used. The withstand voltage between the source/drain diffused layers 104 of the voltage buffer transistor BT and the P-type well 74PB is, e.g., about 6 V. On the other hand, the withstand voltage between the gate electrode 34*d* and the source/drain diffused layers 104, of the voltage buffer transistor BT is, e.g., about V. That is, the withstand voltage between the source/drain diffused layers 104 of the voltage buffer transistor BT and the P-type well 74PB is higher than the withstand voltage between the gate electrode 34*d* and the source/drain diffused layers 104. The film thickness of the gate insulation film 79 of the voltage buffer transistor BT is, e.g., about 3 nm.

In the low voltage circuit of the column decoder 12, first low voltage transistors (1.8 V Tr) 111N, 111P of, e.g., a 1.8 V rated voltage are used. The withstand voltage between the source diffused layers 104 of the first low voltage transistors 111N, 111P used in the column decoder 12 and the P-type well 74P is, e.g., about 6V. On the other hand, the withstand voltage between the gate electrode 34*d* and the source/drain diffused layer 104 of the first low voltage transistors 111N, 111P used in the column decoder 12 is, e.g., about 3 V. That is, the withstand voltage between the source/drain diffused layers 104 of the first low voltage transistors 111N, 111P used in the column decoder 12 and the P-type well 74P is higher than the withstand voltage between the gate electrodes 34*d* and the source/drain diffused layers 104. The film the thickness of the gate insulation films 79 of the first low voltage transistors 111N, 111P used in the column decoder 12 is, e.g., about 3 nm.

In the sense amplifier 13, the first low voltage transistors (1.8 V Tr) 111N, 111P of, e.g., a 1.8 V rated voltage are used. The withstand voltage between the source/drain diffused layers 104 of the first low voltage transistors 111N, 111P used in the sense amplifier 13 and the P-type well 74P is, e.g., about 6 V. On the other hand, the withstand voltage between the gate electrodes 34*d* and the source/drain diffused layers 104, of the first low voltage transistors 111N, 111P used in the sense amplifier 13 is, e.g., about 3 V. That is, the withstand voltage between the source/drain diffused layers 104 of the first low voltage transistors 111N, 111P used in the sense amplifier 13 is higher than the withstand voltage between the gate electrodes 34*d* and the source/drain diffused layers 104. The film thickness of the gate insulation films 79 of the first low voltage transistors 111N, 111P used in the column decoder 12 is, e.g., about 3 nm.

In the first row decoder 14, high withstand voltage transistors (10 V Tr) 110N, 110P of, e.g., a 10V rated voltage are used. The withstand voltage of the high withstand voltage transistors 110N, 110P used in the first row decoder 14 is, e.g., about 12 V. The film thickness of the gate insulation films 76 of the high withstand voltage transistors 110N, 110P used in the first row decoder 14 is, e.g., about 16 nm.

In the second row decoder 16, the first low voltage transistors (1.8 V Tr) 111N, 111P of, e.g., a 1.8 V rated voltage are used. The withstand voltage between the source/drain diffused layers 104 of the first low voltage transistors 111N, 111P used in the second row decoder 16 and the P-type well 74P is, e.g., about 6 V. On the other hand, the withstand voltage between the gate electrodes 34*d* and the source/drain diffused layers 104, of the first low voltage transistors 111N, 111P used in the second row decoder 16 is, e.g., about 3 V. That is, the withstand voltage between the source/drain diffused layers 104 of the first low voltage transistors 111N, 111P used in the second row decoder 16 and the P-type well 74P is higher than the withstand voltage between the gate electrodes 34*d* and the source/drain diffused layers 104. The film thickness of the gate insulation films 79 of the first low voltage transistors 111N, 111P used in the second row decoder 16 is, e.g., about 3 nm.

In the third row decoder 18, high withstand voltage transistors (10 V Tr) 110N, 110P of, e.g., a 10 V rated voltage are used. The withstand voltage of the high withstand voltage transistors 110N, 110P used in the third row decoder 18 is, e.g., about 12 V. The film thickness of the gate insulation films 76 of the high voltage transistors 110N, 110P used in the third row decoder 18 is, e.g., about 16 nm.

In the low voltage circuit of the first control circuit 23, second low voltage transistors (3 V Tr) 113N, 113P of, e.g., a 3 V rated voltage are used. The withstand voltage of the second low voltage transistors 113N, 113P used in the first control circuit 23 is, e.g., about 6 V. The film thickness of the gate insulation films 77 of the second low voltage transistors 113N, 113P used in the first control circuit 23 is, e.g., about 6 nm.

In the second control circuit 29, the second low voltage transistors (3 V Tr) 113N, 113P of, e.g., a 3 V rated voltage are used. The withstand voltage of the second low voltage transistors 113N, 113P used in the second control circuit 29 is, e.g., about 6 V. The film thickness of the gate insulation films 77 of the second low voltage transistors 113N, 113P used in the second control circuit 29 is, e.g., about 6 nm.

In the first voltage application circuit 15, the high withstand voltage transistors (10 V Tr) 110N, 110P of, e.g., a 10 V rated voltage are used. The withstand voltage of the high withstand voltage transistors 110N, 110P used in the first voltage application circuit 15 is, e.g., about 12 V. The film thickness of the gate insulation films 76 of the high withstand voltage transistors 110N, 110P used in the first voltage application circuit 15 is, e.g., about 16 nm.

In the second voltage application circuit 17, the high withstand voltage transistors (10 V Tr) 110N, 110P of, e.g. a 10 V rated voltage are used. The withstand voltage of the high withstand voltage transistors 110N, 110P used in the second voltage application circuit 17 is, e.g., about 12 V. The film thickness of the gate insulation films 76 of the high withstand voltage transistors 110N, 110P used in the second voltage application circuit 17 is, e.g., about 16 nm.

In the present embodiment, wherein the withstand voltage between the P-type well 74PB of the voltage buffer transistor BT and the source/drain diffused layers 104 is relatively high, it is not necessary to apply a bias voltage to the P-type well 74PB when information written in the memory cell transistors MT is erased. When information written in the memory cell transistors MT is erased, a bias voltage is applied to the gate electrode 34*d* of the voltage buffer transistor BT, whereby breakage of the voltage buffer transistors BT can be prevented. As in the present embodiment, the region 11 for the voltage buffer transistor formed in may not have the triple well structure.

(Operation of the Nonvolatile Semiconductor Memory Device)

Figure 60:
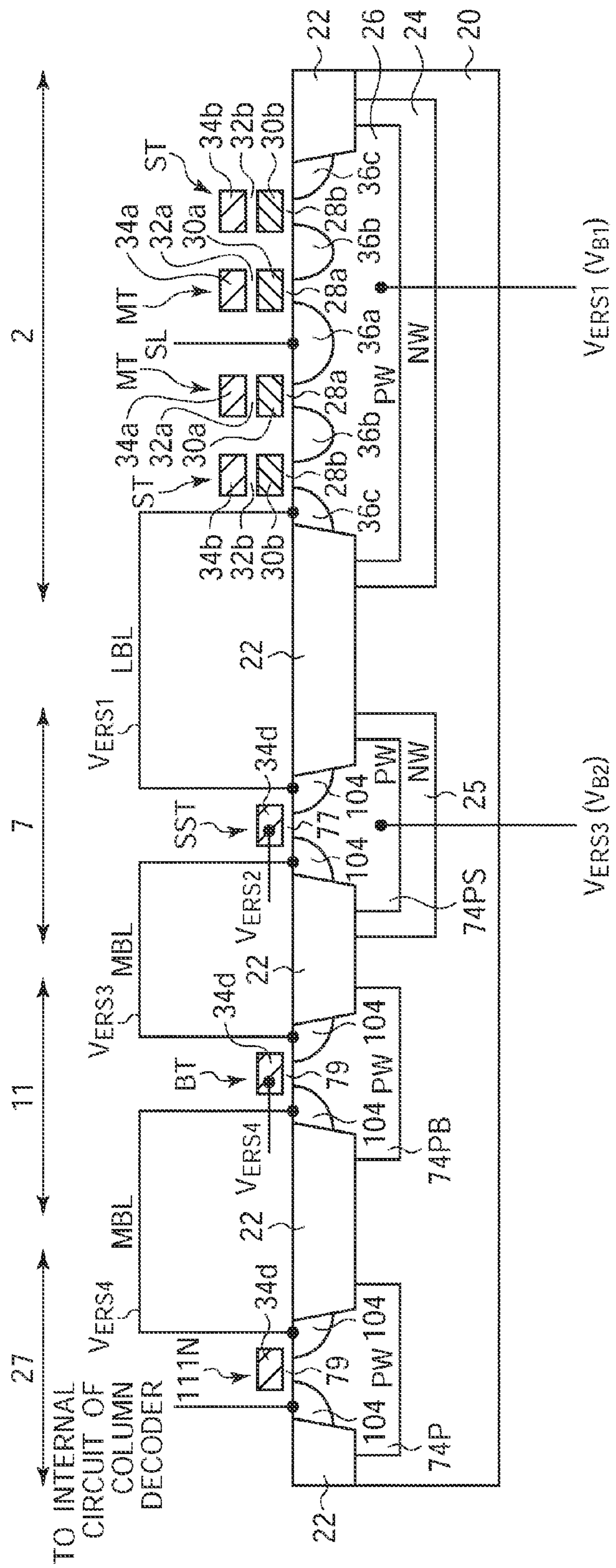
FIG. 60 is a sectional view of the nonvolatile semiconductor memory device according to the third embodiment, which illustrates the erasing method.

Next, the operation method of the nonvolatile semiconductor memory device according to the present embodiment will be described with reference to FIGS. 59 and 60. FIG. 59 is a view illustrating the reading method, the writing method and erasing method of the nonvolatile semiconductor device according to the present embodiment. In FIG. 59, F indicates floating.

(Reading Method)

First, the reading method of the nonvolatile semiconductor memory according to the present embodiment will be described with reference to FIG. 59.

The reading method will be described here by means of the example that information written in the memory cell MC enclosed by the broken line A and the memory cell MC enclosed by the broken line B in FIG. 56 is read.

When the information written in the memory cell transistors MT is read, the potentials of the respective parts are set as follows.

That is, the potential of the sector select line SSL11 connected to the sector select transistors SST connected to the memory cell MC to be selected is set at, e.g., 1.8 V. On the other hand, the potentials of the sector select lines SSL12, SSL21, SSL22 other than the selected sector select lines SSL11 are set at 0 V.

The potential BG of the gate of the voltage buffer transistor BT is set at, e.g., 1.8 V.

The potentials of the main bit lines (bit lines) MBL1, MBL2 connected to the sector select transistors SST connected to the memory cells MC to be selected are set at, e.g., 0.5 V.

The potentials of the first word lines CG11, CG12, CG21, CG22 are set always at 1.8 V.

The potential of the second word line SG11 connected to the memory cells MC to be selected is set at, e.g., 1.8 V. On the other hand, the potentials of the second word lines SG12, SG21, SG22 other than the selected word line SG11 are set at 0 V.

The potentials $V_{B1}$ of the P-type wells 26 are set at 0 V. The potentials $V_{B2}$ of the P-type wells 74PS are set at 0 V. The potentials of the source lines SL11, SL21 are set at 0 V.

In the present embodiment as well, as the sector select transistor SST and the voltage buffer transistor BT, low voltage transistors are used, whereby when information written in the memory cell transistors MT is read, sufficiently large read currents can be obtained. Thus, according to the present embodiment, information written in the memory cell transistors MT can be speedily judged, and consequently, information written in the memory cell transistors MT can be speedily read.

(Writing Method)

Next, the writing method of the nonvolatile semiconductor memory device according to the present embodiment will be described with reference to FIG. 59.

The writing method will be described here by means of the example information is written in the memory cell MC enclosed by the broken line A in FIG. 56.

When information is written in the memory cell transistor MT, the potentials of the respective parts are set as follows.

That is, the potential of the sector select line SSL11 connected to the sector select transistor SST connected to the memory cell MC (Memory cell A) to be selected is set at, e.g. 3 V. On the other hand, the potentials of the sector select lines SSL12, SSL21, SSL22 other than the selected sector select line SSL11 are set at 0 V.

The potential BG of the gate of the voltage buffer transistor BT is set at, e.g., 3 V.

The potential of the main bit line (bit line) MBL1 connected to the sector select transistor SST connected to the memory cell MC to be selected is set at, e.g., 0 V. On the other hand, the potential of the main bit line MBL2 other than the selected main bit line MBL1 is set floating.

The potential of the first word line CG11 connected to the memory cell MC to be selected is set at, e.g., 9 V. On the other hand, the potentials of the first word lines CG12, CG21, CG22 other than the selected first word line CG11 are set at 0 V.

The potential of the second word line SG11 connected to the memory cell MC to be selected is set at, e.g., 2.5 V. On the other hand, the potentials of the second word lines SG12, SG21, SG22 other than the selected second word line SG11 are set at 0 V.

The potential of the source line SL11 connected to the memory cell MC to be selected is set at, e.g., 5.5 V. On the other hand, the potential of the source line SL21 other than the selected source line SL11 is set floating.

The potentials $V_{B1}$ of the P-type wells 26 are set at 0 V. The potentials $V_{B2}$ of the P-type wells 74PS are set at 0 V.

With the potentials of the respective parts set as follows, electrons flow between the source diffused layer 36*a* and the drain diffused layer 36*b*, of the memory cell transistor MT, and the electrons are introduced into the floating gate 30*a* of the memory cell transistor MT. Thus, a charge is accumulated in the floating gate 30*a* of the memory cell transistor MT, and information is written in the memory cell transistor MT.

(Erasing Method)

Next, the erasing method of the nonvolatile semiconductor memory device according to the present embodiment will be described with reference to FIGS. 59 and 60. FIG. 60 is a sectional view of the nonvolatile semiconductor memory device according to the present embodiment, which illustrates the erasing method.

The erasing of information written in the memory cell array is made for, e.g., the respective sectors SCT. The erasing method will be described by means of the example that information written in a plurality of the memory cells MC exsisting in the first sector SCT1 is erased in a lump.

In the present embodiment, information written in the memory cell transistors MT is erased as follows.

When information written the memory cell transistors MT is erased, the potentials of the main bit lines MBL1, MBL2 are set always floating. When information written in the memory cell transistors MT is erased, the potentials of the source lines SL11, SL21 are set always floating. The potential of the semiconductor substrate 20 is set at 0 V (ground). The potentials of the gates SG11, SG12, SG21, SG22 of the select transistors ST are set always floating.

When information written in the memory cell transistors MT is erased, first, the potential BG of the gate of the voltage buffer transistor BT is set at the fourth potential $V_{ERS4}$ by the second control circuit 29. The potential (fourth potential) $V_{ERS4}$ of the gate of the voltage buffer transistor BT is, e.g., 3 V here.

Next, by the second voltage application circuit 17, the potential $V_{B2}$ of the P-type well 74PS is set at the third potential $V_{ERS3}$. The third potential $V_{ERS3}$ is, e.g., 6 V here.

The potentials of the sector select lines SSL11, SSL12, SSL21, SSL22 are set at the second potential $V_{ERS2}$. The potentials (second potential) $V_{ERS2}$ of the sector select lines SSL11, SSL12, SSL21, SSL22 are, e.g., 5 V.

Next, by the first voltage application circuit 15, the potential $V_{B1}$ of the P-type well 26 is set at the first potential $V_{ERS1}$. The first potential $V_{ERS1}$ is, e.g., 9 V here.

Next, the potentials of the first word lines CG11, CG12 connected to the memory cells MC in the first sector SCT1 to be erased are set at, e.g., −9 V. On the other hand, the potentials of the word lines CG21, CG22 connected to the memory cells MC in the second sector SCT not to be erased are set, e.g., floating.

With the potentials of the first word lines CG11, CG12 set at, e.g., −9 V, chares are withdrawn from the floating gates 30*a* of the memory cell transistors MT. Thus, no charges are stored in the floating gates 30*a* of the memory cell transistors MT, and information in the memory cell transistors MT is erased.

As described above, when information written in the memory cell transistors MT is erased, the potential (the first potential) $V_{ERS1}$ of the P-type well 26 is set at, e.g., 9 V. With the potential $V_{ERS1}$ of the P-type well 26 set at 9 V, the potential $V_{ERS1}$ of the source diffused layers 104 of the sector select transistors SST are, e.g., about 8.5-8.7 V. The potential $V_{ERS1}'$ of the source diffused layers 104 is lower than the potential $V_{ERS1}$ of the P-type well 26 because voltage drops are caused by the diodes formed by the P-type well 26 and the drain diffused layers 36*c*.

With the potential (the third potential) $V_{ERS3}$ of the P-type well 74PS set at, e.g., 6 V, the potential difference ($V_{ERS1}'-V_{ERS3}$) between the source diffused layers 104 of the sector select transistors SST and the P-type well 74P is, e.g., about 2.5-2.7 V. The withstand voltage of the second low voltage transistor used in the sector select transistors SST is, e.g., about V as described above, and accordingly, no breakage takes place between the source diffused layers 104 of the sector select transistors SST and the P-type well 74PS.

With the potential (the second potential) $V_{ERS2}$ of the sector select line SSL set at, e.g., 5 V, the potential difference ($V_{ERS1}'-V_{ERS2}$) between the gate electrodes 34*d* and the source diffused layers 104, of the sector select transistors SST is, e.g., about 3.5-3.7 V. The withstand voltage of the second low voltage transistor used in the sector select transistors SST is, e.g., about 6 V as described above, and accordingly, no breakage takes place between the gate electrodes 34*d* and the source diffused layers 104, of the sector select transistors SST.

With the potential (the third potential) $V_{ERS3}$ of the P-type well 74PS set at, e.g., 6 V, the potential $V_{ERS3}'$ of the source diffused layer 104 of the voltage buffer transistor BT is, e.g., about 5.5-5.7 V. The potential $V_{ERS3}'$ of the source diffused layer 104 is lower than the potential $V_{ERS3}$ of the P-type well 74PS, because voltage drops are caused by the diodes formed by the P-type well 74PS and the drain diffused layer 104.

The potential of the P-type well 74PB is equal to the potential of the semiconductor substrate 20 and 0 V (ground). The potential difference between the source diffused layer 104 of the voltage buffer transistor BT and the P-type well 74PB is, e.g., about 5.5-5.7 V. The withstand voltage between the source diffused layer 104 of the voltage buffer transistor BT and the P-type well 74PB is, e.g., about 6 V as described above, and accordingly, no breakage takes place between the source diffused layer 104 of the voltage buffer transistor BT and the P-type well 74PB.

With the potential (the fourth potential) $V_{ERS4}$ of the gate BG of the voltage buffer transistor BT set at, e.g., 3 V, the potential difference between the gate electrode 34*d* and the source diffused layer 104, of the voltage buffer transistor BT is, e.g., about 2.5-2.7 V. The withstand voltage of the voltage buffer transistor BT is, e.g., about 3 V as described, and accordingly, no breakage takes place between the gate electrode 34*d* and the source diffused layer 104 of the voltage buffer transistor BT.

The potential of the source diffused layer 104 of the first low voltage transistor 111N used in the column decoder 12 becomes a potential $V_{ERS4}'$ which is lower by the threshold voltage than the potential of the gate electrode 34*d* of the voltage buffer transistor BT. With the potential of the gate electrode 34*d* of the voltage buffer transistor BT being, e.g., at 3 V and the threshold voltage of the voltage buffer transistor BT being, e.g., 0.4 V, the potential $V_{ERS4}'$ of the source diffused layer 104 of the first low voltage transistor 111N of the column decoder 12 becomes 2.6 V. The withstand voltage between the source diffused layer 104 of the first low voltage transistor 111N used in the column decoder 12 and the P-type well 74P is about 6 V, and accordingly no breakage takes place in the first low voltage transistor 111N of the column decoder 12.

The potentials of the respective parts are not limited to the above.

The respective potentials $V_{ERS1}$, $V_{ERS3}$ are so set that the difference between the potential (the first potential) $V_{ERS1}$ of the P-type well 26 and the potential (the third potential) $V_{ERS3}$ of the P-type well 74PS is smaller than the withstand voltage of the sector select transistors SST.

More strictly, the respective potentials $V_{ERS1}$, $V_{ERS3}$ are so set that the difference between the potential $V_{ERS1}'$ of the source diffused layer 104 of the sector select transistor SST and the potential $V_{ERS3}$ of the P-type well 74PS is smaller than the withstand voltage of the sector select transistor SST.

The respective potentials $V_{ERS1}$, $V_{ERS2}$ are so set that the difference between the potential (the second potential) $V_{ERS2}$ of the gate electrode 34*d* of the sector select transistors SST and the potential (the first potential) $V_{ERS1}$ of the P-type well 26 is smaller than the withstand voltage of the sector select transistors SST.

More specifically, the respective potentials $V_{ERS1}$, $V_{ERS2}$ are so set that the difference between the potential $V_{ERS2}$ of the gate electrodes 34*d* and the source diffused layers 104, of the sector select transistors SST is smaller than the withstand voltage of the sector select transistors SST.

The potential $V_{ERS3}$ of the P-type well 74PS is so set that the potential (the third potential) $V_{ERS3}$ of the P-type well 74PS is smaller than the withstand voltage of the voltage buffer transistor BT.

More strictly, the third potential $V_{ERS3}$ is so set that the difference between the potential $V_{ERS3}'$ of the source diffused layer 104 of the voltage buffer transistor BT and the potential of the P-type well 74PB is smaller than the withstand voltage of the voltage buffer transistor BT.

The respective potentials $V_{ERS3}$, $V_{ERS4}$ are so set that the difference between the potential (the fourth potential) $V_{ERS4}$ of the gate electrode 34*d* of the voltage buffer transistor BT and the potential (the third potential) $V_{ERS3}$ of the P-type well 74PS is smaller than the withstand voltage of the voltage buffer transistor BT.

More strictly, the respective potentials $V_{ERS3}$, $V_{ERS4}$ are so set that the difference between the potential $V_{ERS4}$ of the gate electrode 34*d* of the voltage buffer transistor BT and the potential $V_{ERS3}'$ of the source diffused layer 104 thereof is smaller than the withstand voltage of the voltage buffer transistor BT.

The fourth potential $V_{ERS4}$ is so set that the potential (the fourth potential) $V_{ERS4}$ of the gate electrode 34*d* of the voltage buffer transistor BT is smaller than the withstand voltage of the low voltage transistor 111N of the column decoder 12.

More strictly, the fourth potential $V_{ERS4}$ is so set that the difference between the potential $V_{ERS4}'$ of the source diffused layer 104 of the low voltage transistor 111N of the column decoder 12 and the P-type well 74P is smaller than the withstand voltage of the low voltage transistor 111N of the column decoder 12.

With all the first potential $V_{ERS1}$ to the fourth potential $V_{ERS4}$ being positive, the second potential $V_{ERS2}$ is set lower than the first potential $V_{ERS1}$, and the third potential $V_{ERS3}$ is also set lower than the first potential $V_{ERS1}$. The fourth potential $V_{ERS4}$ is set lower than the third potential $V_{ERS3}$.

As described above, in the present embodiment, the withstand voltage between the P-type well 74PB and the source/drain diffused layers 104, of the voltage buffer transistor BT is relatively high, whereby when information is erased, it is not necessary to apply a bias voltage to the P-type well 74PB. When information written in the memory cell transistors MT is erased, a bias voltage is applied to the gate electrode 34*d* of the voltage buffer transistor BT, whereby the breakage in the voltage buffer transistor BT can be prevented. As in the present embodiment, the region 11 for the voltage buffer transistor formed in may not have the triple well structure.

The erasing method has been described here by means of the example that when information written in the memory cell transistor MT is erased, the potential $V_{ERS2}$ of the sector select lines SSL is set at, e.g., 5 V. The potential of the sector select lines SSL may be floating. Even with the potential of the sector select lines SSL set floating when information written in the memory cell transistors MT is erased, the occurrence of breakage in the sector select transistors SST upon an erasing can be prevented.

[d] Fourth Embodiment

The nonvolatile semiconductor memory device according to a fourth embodiment, its reading method, writing method and erasing method, and the method of manufacturing the semiconductor memory device will be described with reference to FIGS. 61 to 65. The same members of the present embodiment as those of the nonvolatile semiconductor memory device, etc. according to the first to the third embodiments illustrated in FIGS. 1 to 60 are represented by the same reference numbers not to repeat or to simplify the description.

(Nonvolatile Semiconductor Memory Device)

Figure 61:
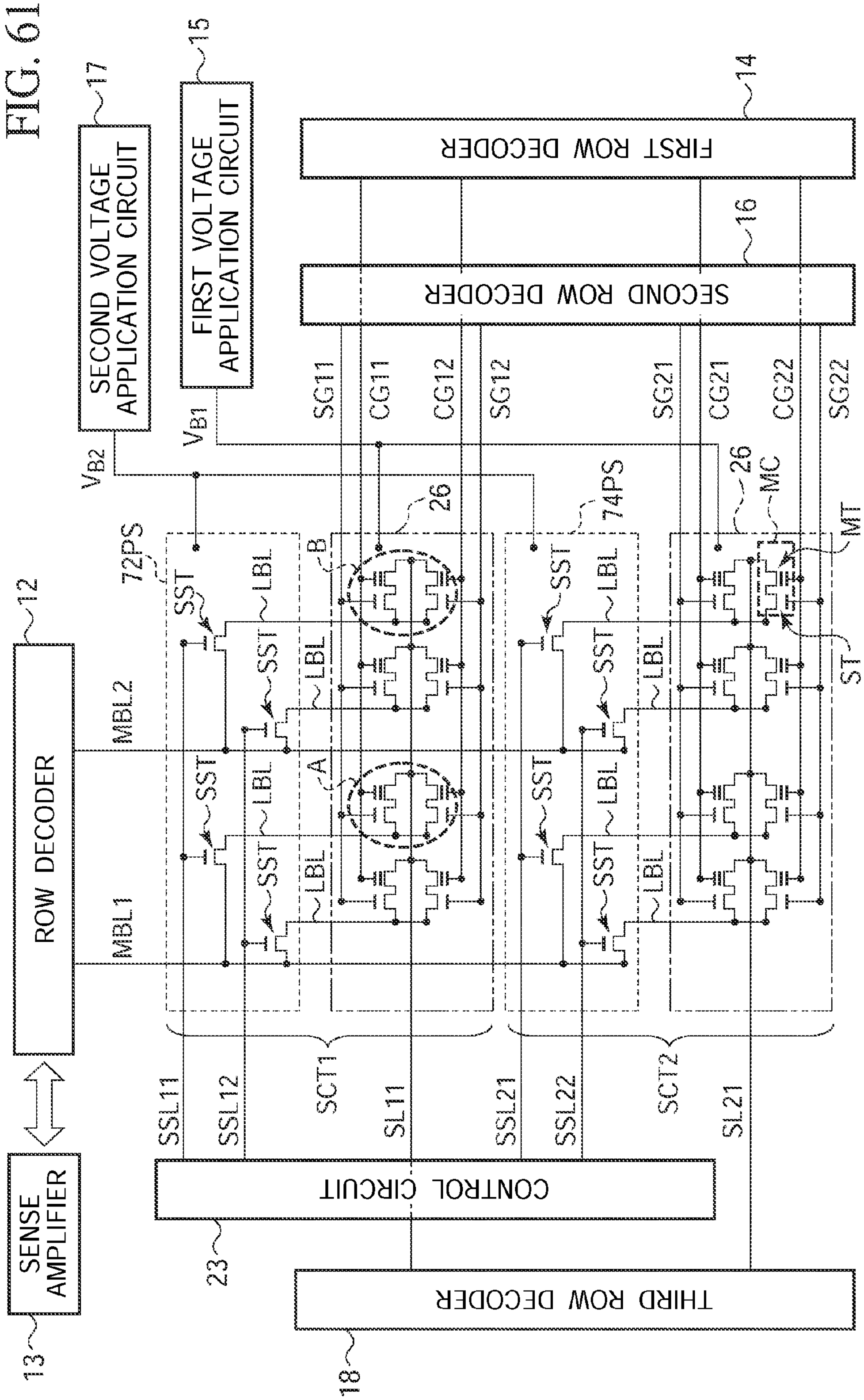
FIG. 61 is a circuit diagram of a nonvolatile semiconductor memory device according to a fourth embodiment.
Figure 62A:
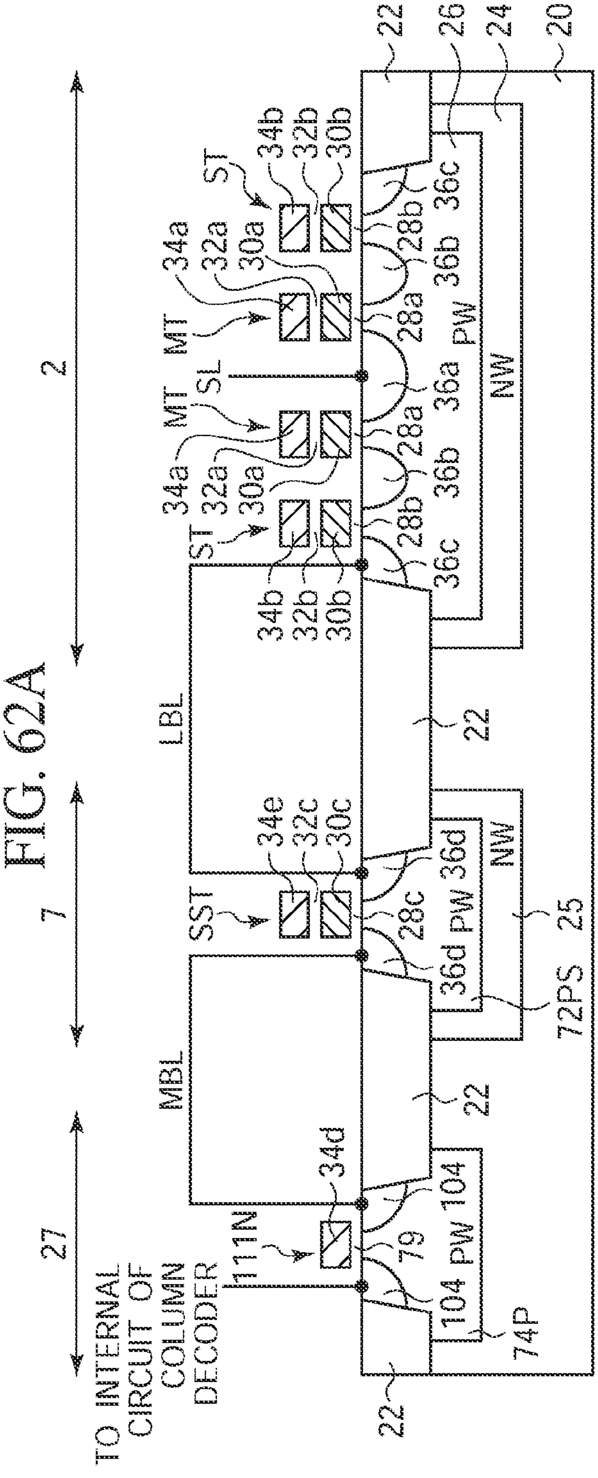
FIGS. 62A and 62B are sectional views of the nonvolatile semiconductor memory device according to the fourth embodiment, which illustrate the method.
Figure 62B:
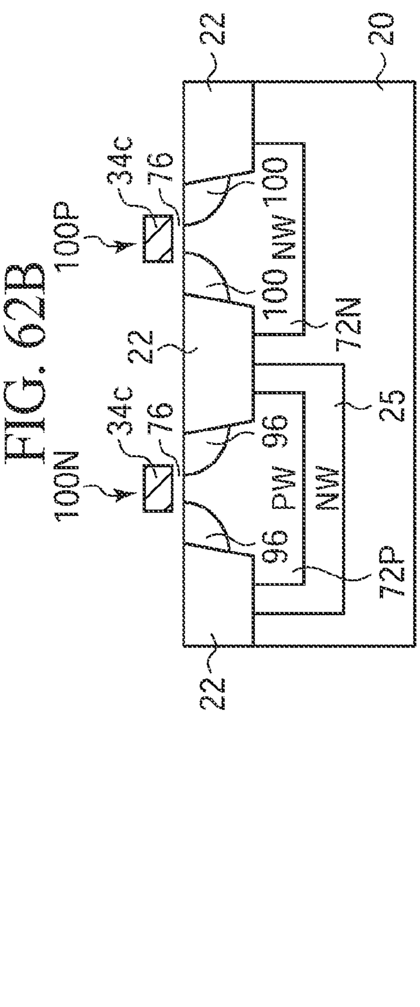

First, the nonvolatile semiconductor memory device according to the present embodiment will be described with reference to FIGS. 61 to 63. FIG. 61 is the circuit diagram of the nonvolatile semiconductor memory device according to the present embodiment. FIGS. 62A and 62B are sectional views of the nonvolatile semiconductor memory device according to the present embodiment.

The nonvolatile semiconductor memory device according to the present embodiment is characterized mainly in that as the sector select transistors SST, substantially the same transistors as the memory cell transistors MT and the sector select transistors ST are used.

As illustrated in FIG. 61, in the present embodiment, the voltage buffer transistor BT (see FIG. 27), the well 74PB (see FIG. 27), the second control circuit 29 (see FIG. 27) and the third voltage application circuit 19 (see FIG. 27) are not provided.

The drains of the sector select transistors SST are connected to the column decoder 12 by the main bits MBL without the voltage buffer transistor BT (see FIG. 27).

As illustrated in FIGS. 62A and 62B, in the region 7 for the sector select transistor formed in, an N-type well (N-type diffused layer) 25 is formed. In the N-type well 25, a P-type well 72PS is formed.

On the P-type well 72PS, a gate electrode 30*c* is formed with a gate insulation film 28*c* formed therebetween.

The gate insulation film 28*c* of the sector select transistor SST is formed of the same insulation film as the tunnel insulation films 28*a* of the memory cell transistors MT and the gate insulation films 28*b* of the select transistors ST. Accordingly, the film thickness of the gate insulation film 28*c* of the sector select transistor SST is equal to the film thickness of the tunnel insulation film 28*a* of the memory cell transistors MT and the film thickness of the gate insulation films 28*b* of the sector select transistors SST.

The gate electrode 30*c* of the sector select transistor SST is formed of the same conduction film (polysilicon film) of the floating gates 30*a* of the memory cell transistors MT and the select gates 30*b* of the select transistors ST. Accordingly, the thickness of the gate electrode 30*c* of the sector select transistor SST is equal to the thickness of the floating gates 30*a* of the memory cell transistors MT and the select gates 30*b* of the select transistors ST.

On the gate electrode 30*b* of the sector select transistor SST, a polysilicon layer (conduction layer) 34*e* is formed with an insulation film 32*c* formed therebetween. The insulation film 32*c* of the sector select transistor SST is formed of the same insulation film as the insulation films 32*a* of the memory cell transistors MT and the insulation films 32*b* of the select transistors ST. Thus, the film thickness of the insulation film 32*c* of the sector select transistor SST is equal to the film thickness of the insulation film 32*a* of the memory cell transistor MT and the film thickness of the insulation film 32*b* of the select transistor ST. The polysilicon film 34*e* of the sector select transistor SST is formed of the same conduction film as the control gates 34*a* of the memory cell transistors MT and the polysilicon films 34*b* of the select transistors ST. Thus, the thickness of the polysilicon film 34*e* of the sector select transistors SST is equal to the thickness of the control gates 34*a* of the memory cell transistors MT and the thickness of the polysilicon films 34*b* of the select transistors ST.

In the semiconductor substrate 20 on both sides of the gate electrode 30*b* of the sector select transistor SST, N-type impurity diffused layers 36*d* are formed. The source/drain diffused layers 36*d* of the sector select transistor SST simultaneously with forming the source/drain diffused layers 36*a*-36*c* of the select transistors ST and the memory cell transistors MT.

Thus, the sector select transistor SST including the gate electrode 30*c*, the polysilicon film 34*e* and the source/drain diffused layers 104 is formed on the P-type well 72PS. Thus, in the present embodiment, as the sector select transistor SST, substantially the same transistors as the memory cell transistors MT and the select transistors ST are used. The structures of the details of the sector select transistor SST are not essentially the same as those of the memory cell transistors MT and the sector select transistors SST.

FIG. 63 is a view of the species of the transistors used in the respective constituent elements, the withstand voltage of the transistors and the film thickness of the gate insulation films of the transistors.

As illustrated in FIG. 63, as the sector select transistors SST, the same transistors (P1Tr) as the memory cell transistors MT and the select transistors ST. The withstand voltage of the sector select transistors SST is, e.g., about 8 V. That is, the withstand voltage of the sector select transistors SST is relatively high, which is the same as the withstand voltage of the memory cell transistors MT and the select transistors ST. The film thickness of the gate insulation films 28*c* of the sector select transistors SST is, about 8-12 nm.

In the column decoder 12, the first low voltage transistors (1.8 V Tr) 111N, 111P (see FIG. 54) of, e.g., a 1.8 V-rated voltage are used. The withstand voltage of the first low voltage transistors 111N, 111P used in the column decoder 12 is, e.g., about 3 V. The film thickness of the gate insulation films 79 of the first low voltage transistors 111N, 111P used in the column decoder 12 is, e.g., about 3 nm.

In the sense amplifier 13, the first low voltage transistors (1.8 V Tr) 111N, 111P of, e.g., a 1.8 V rated voltage are used. The withstand voltage of the low voltage transistors 111N, 111P used in the sense amplifier 13 is, e.g., about 3 V. The film thickness of the gate insulation films 79 of the low voltage transistors 111N, 111P used in the column decoder 12 is, e.g., about 3 nm.

In the first row decoder 14, high withstand voltage transistors (10 V Tr) 110N, 110P of, e.g., a 10 V rated voltage are used. The withstand voltage of the high withstand voltage transistors 110N, 110P used in the first row decoder 14 is, e.g., about 12 V. The film thickness of the gate insulation film 76 of the high withstand voltage transistors 110N, 110P used in the first row decoder 14 is, e.g., about 16 nm.

In the second row decoder 16, the first low voltage transistors (1.8 V Tr) 111N, 111P of, e.g., a 1.8 V rated voltage are used. The withstand voltage of the low voltage transistors 111N, 111P used in the second row decoder 16 is, e.g., about 3 V. The film thickness of the gate insulation films 79 of the low voltage transistors 111N, 111P used in the second row decoder 16 is, e.g., about 3 nm In the third row decoder 18, the high withstand voltage transistors (10 V Tr) 110N, 110P of, e.g., a 10 V rated voltage are used. The withstand voltage of the high withstand voltage transistors 110N, 110P used in the third row decoder 18 is, e.g., about 12 V. The film thickness of the gate insulation films 76 of the high withstand voltage transistors 110N, 110P used in the third row decoder 18 is, e.g., about 16 nm.

In the control circuit 23, the low voltage transistors (1.8 V Tr) 111N, 111P of, e.g., a 1.8 V rated voltage are used. The withstand voltage of the low voltage transistors 111N, 111P used in the control circuit 23 is, e.g., about 3 V. The film thickness of the gate insulation films 79 of the low voltage transistors 111N, 111P used in the control circuit 23 is, e.g., about 3 nm.

In the first voltage application circuit 15, the high withstand voltage transistors (10 V Tr) 110N, 110P of, e.g., a 10 V rated voltage are used. The withstand voltage of the high withstand voltage transistors 110N, 110P used in the first voltage application circuit 15 is, e.g., about 12 V. The film thickness of the gate insulation films 76 of the high withstand voltage transistors 110N, 110P used in the first voltage application circuit 15 is, e.g., about 16 nm.

In the second voltage application circuit 17, the first low voltage transistors (1.8 V Tr) 111N, 111P of, e.g., a 1.8 V rated voltage are used. The withstand voltage of the low voltage transistors 111N, 111P used in the second voltage application circuit 17 is, e.g., about 3V. The film thickness of the gate insulation films 79 of the low voltage transistors 111N, 111P used in the second voltage application circuit 17 is, e.g., about 3 nm.

(Operation of the Nonvolatile Semiconductor Memory Device)

Figure 65:
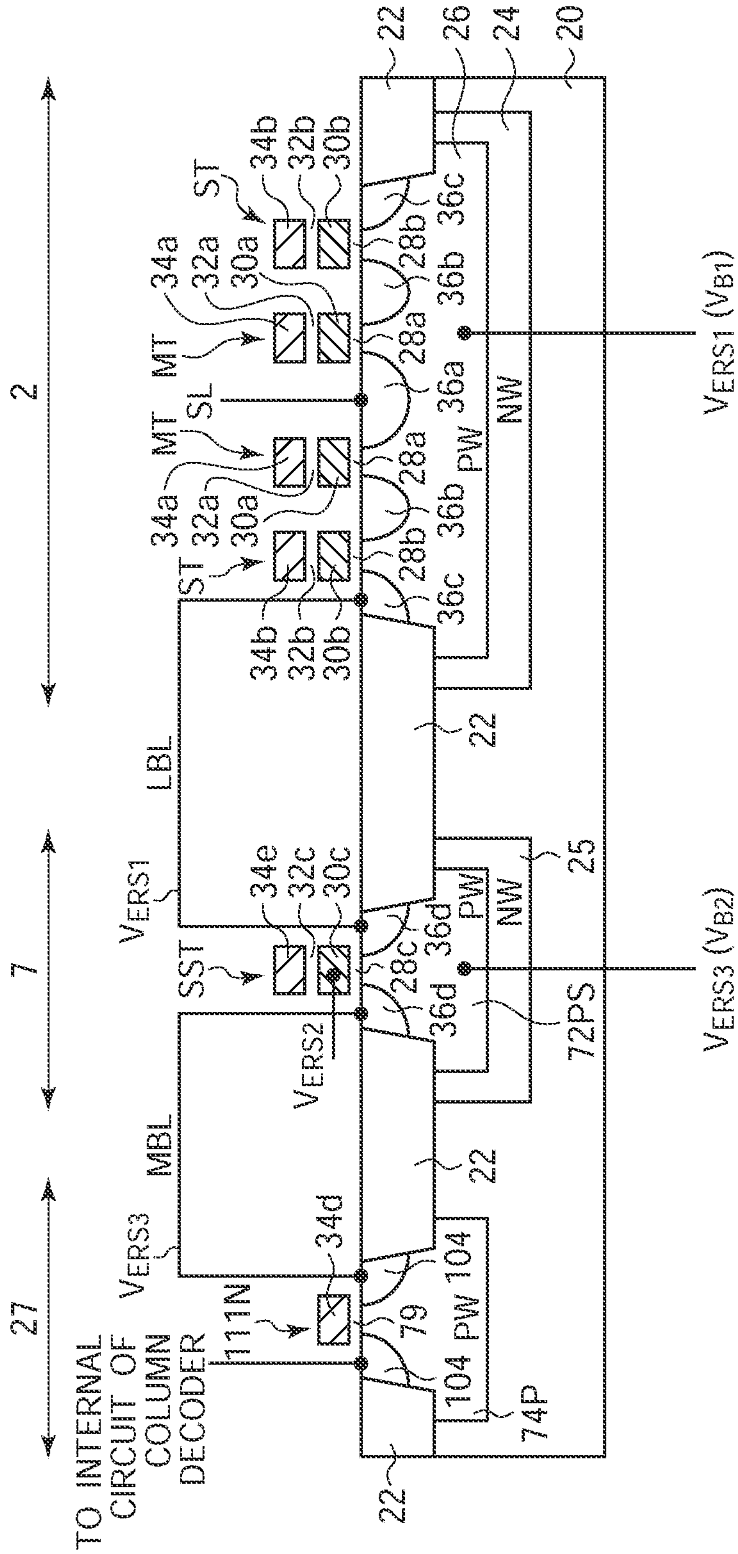
FIG. 65 is a sectional view of a nonvolatile semiconductor memory device according to a fourth embodiment, which illustrates the erasing method.

The operation method of the nonvolatile semiconductor memory device according to the present embodiment will be described with reference to FIGS. 64 and 65. FIG. 64 is a view illustrating the reading method, the writing method and the erasing method of the nonvolatile semiconductor memory device according to the present embodiment. In FIG. 64, F indicates floating.

(Reading Method)

First, the reading method of the nonvolatile semiconductor memory device according to the present embodiment will be described with reference to FIG. 64.

The reading method will be described here by means of the example that information written in the memory cell MC enclosed by the broken line A and the memory cell MC enclosed by the broken line B in FIG. 61 is erased.

When information written in the memory cell transistors MT is read, the potentials of the respective parts are set as follows.

That is, the potentials of the sector select lines SSL11 connected to the sector select line SST connected to the memory cells MC to be selected are set at, e.g., 1.8 V. On the other hand, the sector select lines SSL12, SSL21, SSL22 other than the selected sector select line SSL11 are set at 0 V.

The potentials of the main bit lines (bit lines) MBL1, MBL2 connected to the sector select transistors SST connected to the memory cells MC to be selected are set at, e.g., 0.5 V.

The potentials of the first word lines CG11, CG12, CG21, CG22 are set always at 1.8 V.

The second word line SG11 connected to the memory cells MC to be selected are set at, e.g., 1.8 V. On the other hand, the potentials of the second word lines SG12, SG21, SG22 other than the selected second word line SG11 are set at 0 V.

The potentials $V_{B1}$ of the P-type wells 26 are set at 0 V. The potentials $V_{B2}$ of the P-type wells 72PS are set at 0 V. The potentials of the source lines SL11, SL21 are set at 0 V.

In the present embodiment as well, as the sector select transistors SST, the low voltage transistors are used, whereby when information written in the memory cell transistors MT is read, sufficiently large read currents can be obtained. Thus, according to the present embodiment, information written in the memory cell transistors MT can be speedily judged, and consequently information written in the memory cell transistors MT can be speedily read.

(Writing Method)

Next, the writing method of the nonvolatile semiconductor memory device according to the present embodiment will be described with reference to FIG. 64.

The writing method will be described here by means of the example that information is written in the memory cell MC enclosed by the broken line A in FIG. 61.

When information is written in the memory cell transistor MT, the potentials of the respective parts are set as follows.

That is, the potential of the sector select line SSL11 connected to the sector select transistor SST connected to the memory cell MC (memory cell A) to be selected is set at, e.g., 1.8 V. On the other hand, the potentials of the sector select lines SSL12, SSL21, SSL22 other than the selected sector select line SSL11 are set at 0 V.

The potential of the main bit line (bit line) MBL1 connected to the sector select transistor SST connected to the memory cell MC to be selected is set at, e.g., 0 V. On the other hand, the potential of the main bit line MBL2 other than the selected main bit line MBL1 is set floating.

The potential of the first word line CG11 connected to the memory cell MC to be selected is set at, e.g., 9 V. On the other hand, the potentials of the first word lines CG12, CG21, CG22 other than the selected first word line CG11 are set at, e.g., 0 V.

The potential of the second word line SG11 connected to the memory cell MC to be selected is set at, e.g., 2.5 V. On other hand, the potentials of the second word line SG12, SG21, SG22 other than the selected second word line SG11 are set at 0 V.

The potential of the source line SL11 connected to the memory cell MC to be selected is set at, e.g., 5.5 V. On the other hand, the potential of the source line SL21 other than the selected source line SL11 is set floating.

The potentials $V_{B1}$ of the P-type wells 26 are set at 0 V. The potentials $V_{B2}$ of the P-type wells 72PS are set at 0 V.

With the potentials of the respective parts set as above, electrons flow between the source diffused layer 36*a* and the drain diffused layer 36*b*, of the memory cell transistor MT, and electrons are introduced into the floating gate 30*a* of the memory cell transistor MT. Thus, a charge is stored in the floating gate 30*a* of the memory cell transistor MT, and information is written in the memory cell transistor MT.

(Erasing Method)

Next, the erasing method of the nonvolatile semiconductor memory device according to the present embodiment will be described with reference to FIGS. 64 and 65. FIG. 65 is a sectional view of the nonvolatile semiconductor memory device according to the present embodiment, which illustrates the erasing method.

The erasing of information written in the memory cell array is made for, e.g., each sector. The erasing will be described here by means of the example that information written in a plurality of memory cells MC exsisting in the first sector SCT1 is erased in a lump.

In the present embodiment, information written in the memory cell transistors MT is erased as follows.

When information written in the memory cell transistors MT is erased, the potentials of the main bit lines MBL1, MBL2 are set always floating. When information written in the memory cell transistors MT is erased, the potentials of the source lines SL11, SL21 are set always floating. The potential of the semiconductor substrate 20 is set at 0 V (ground). The gates SG11, SG12, SG21, SG22 of the select transistors ST are set always floating.

When information written in the memory cell transistors MT is erased, first, the potentials $V_{B2}$ of the P-type wells 72PS are set at the potential $V_{ERS3}$ by the second voltage application circuit 17. The third potential $V_{ERS3}$ is, e.g., 1.8 V here.

The potentials of the sector select lines SSL11, SSL12, SSL21, SSL22 are set at the second potential $V_{ERS2}$. The second potential $V_{ERS2}$ is, e.g., 1.8 V here.

Next, the potentials $V_{B1}$ of the P-type wells 26 are set at the first potential $V_{ERS1}$ by the first voltage application circuit 15. The first potential $V_{ERS1}$ is, e.g., 9 V here.

Then, the potentials of the first word lines CG11, CG12 connected to the memory cells MC in the first sector SCT1 to be erased are set at, e.g., −9 V. On the other hand, the potentials of the word lines CG21, CG22 connected to the memory cells MC in the second sector SCT2 not to be erased are set, e.g., floating.

With the potentials of the first word lines CG11, CG12 set at, e.g., −9 V, charges are withdrawn from the floating gates 30*a* of the memory cell transistors MT. Thus, no charges are stored in the floating gates 30*a* of the memory cell transistors MT, and information in the memory cell transistors MT is erased.

As describe above, when information written in the memory cell transistors MT is erased, the potentials (the first potential) $V_{ERS1}$ of the P-type wells 26 are set at, e.g., 9 V. With the potentials $V_{ERS1}$ of the P-type wells 26 set at 9 V, the potentials $V_{ERS1}'$ of the source diffused layers 104 of the sector select transistors SST are, e.g., about 8.5-8.7 V. The potentials $V_{ERS1}'$ of the source diffused layers 104 are lower than the potentials $V_{ERS1}$ of the P-type wells 26, because voltage drops are caused by the diodes formed by the P-type well 26 and the drain diffused layers 36*c*.

With the potential (the third potential) $V_{ERS3}$ of the P-type wells 72PS set at, e.g., 1.8 V, the potential difference ($V_{ERS1}'-V_{ERS3}$) between the source diffused layers 104 of the sector select transistors SST and the P-type wells 72PS is, e.g., about 6.7-6.9 V. The withstand voltage of the sector select transistors SST is, e.g., about 8 V as described above, and no breakage takes place between the P-type wells 72PS of the sector select transistors SST and the source diffused layers 104.

With the potential (the second potential) $V_{ERS2}$ of the sector select lines SSL set at, e.g., 1.8 V, the potential difference ($V_{ERS1}'-V_{ERS2}$) between the gate electrodes 34*d* and the source diffused layers 104, of the sector select transistors SST is, e.g., about 6.7-6.9 V. The withstand voltage of the sector select transistors SST is, e.g., about 8 V as described above, no breakage takes place between the gate electrodes 34*d* and the source diffused layers 104, of the sector select transistors SST.

With the potentials (the third potential) $V_{ERS3}$ of the P-type wells 72PS set at, e.g., 1.8 V, the potential $V_{ERS3}'$ of the source diffused layer 104 of the low voltage transistor 111N of the column decoder 12 is, e.g., about 1.3-1.5 V. The potential $V_{ERS3}'$ of the source diffused layer 104 of the low voltage transistor 111N of the column decoder 12 is lower than the potential $V_{ERS3}$ of the P-type wells 72PS, because voltage drops are caused by the diodes formed by the P-type wells 72PS and the drain diffused layers 104.

The withstand voltage of the low voltage transistor 111N used in the column decoder 12 is about 3 V as described above, whereby no breakage takes place in the first low voltage transistor 111N of the column decoder 12.

The potentials of the respective parts are not limited to the above.

The respective potentials $V_{ERS1}$, $V_{ERS3}$ are so set that the difference between the potential (the first potential) of the P-type well 26 and the potential (the third potential) of the P-type well 72PS is smaller than the withstand voltage of the sector select transistor SST.

More strictly, the respective potentials $V_{ERS1}$, $V_{ERS3}$ are so set that the difference between the potential $V_{ERS1}'$ of the source diffused layer 104 of the sector select transistor SST and the potential $V_{ERS3}$ of the P-type well 72PS is smaller than the withstand voltage of the sector select transistor SST.

The respective potentials $V_{ERS1}$, $V_{ERS2}$ are so set that the difference between the potential (the second potential) $V_{ERS2}$ of the gate electrode 30*b* of the sector select transistor SST and the potential (the first potential) of the P-type well 26 is smaller than the withstand voltage of the sector select transistor SST.

More strictly, the respective potentials $V_{ERS1}$, $V_{ERS2}$ are so set that the difference between the potential $V_{ERS2}$ of the gate electrode 34*d* and the potential $V_{ERS1}'$ of the source diffused layer 104, of the sector select transistor SST is smaller than the withstand voltage of the sector select transistor SST.

The third potential $V_{ERS3}$ is so set that the potential (the third potential) $V_{ERS3}$ of the P-type well 72PS is smaller than the withstand voltage of the low voltage transistor 111N of the column decoder 12.

More strictly, the third potential $V_{ERS3}$ is so set that the difference between the potential $V_{ERS3}'$ of the source diffused layer 104 of the low voltage transistor 111N of the column decoder 12 and the potential of the P-type well 72PS is smaller than the withstand voltage of the low voltage transistor 111N of the column decoder 12.

When the first potential $V_{ERS1}$ to the third potential $V_{ERS3}$ are all positive, the second potential $V_{ERS2}$ is set lower than the first potential $V_{ERS1}$, and the third potential $V_{ERS3}$ is also set lower than the first potential $V_{ERS1}$.

As described above, in the present embodiment, as the sector select transistor SST, the same transistor as the memory cell transistor MT and the select transistor ST, whereby the withstand voltage of the sector select transistor SST is relatively high. Accordingly, when information written in the memory cell transistor MT is erased, even with a relatively low voltage applied to the gate electrode 30*b* and the P-type well 72PS, of the sector select transistor SST, the sector select transistor SST does not beak. The voltage to be applied to the gate electrode 30*b* of the sector select transistor SST and the P-type well 72PS can be set relatively low, whereby without the voltage buffer transistor BT, the low transistor 111N whose withstand voltage is extremely low is usable in the column decoder 12.

(Method of Manufacturing the Nonvolatile Semiconductor Memory Device)

Next, the method of manufacturing the nonvolatile semiconductor memory device according to the present embodiment will be described with reference to FIGS. 66A to 78. FIGS. 66A to 78 are sectional views of the nonvolatile semiconductor memory device according to the present embodiment in the steps of the method of manufacturing the nonvolatile semiconductor memory device, which illustrate the method.

FIGS. 66A, 67A, 68A, 69A, 70A, 71A, 72A, 73A, 74A, 75A, 76A and 77 illustrate the memory cell array region 2. The views on the left sides of the views of FIGS. 66A, 67A, 68A, 69A, 70A, 71A, 72A, 73A, 74A, 75A, 76A and 77 correspond to the E-E' section in FIG. 29. The views on the right sides of the views of FIGS. 66A, 67A, 68A, 69A, 70A, 71A, 72A, 73A, 74A, 75A, 76A and 77 correspond to the C-C' section in FIG. 29.

FIGS. 66B, 67B, 68B, 69B, 70B, 71B, 72B, 73B, 74B, 75B, 76B and 78 illustrate the peripheral circuit region 4. The views on the left sides of FIGS. 66B, 67B, 68B, 69B, 70B, 71B, 72B, 73B, 74B, 75B, 76B and 78 illustrate the region 6 for the high withstand voltage transistor to be formed in. The views on the left sides of the region 6 for the high withstand voltage transistor to be formed in illustrate the region 6N for the high withstand N-channel transistor to be formed in. The views on the right sides of the region 6N for the high withstand voltage N-channel transistor to be formed in illustrate the region 6P for the high withstand voltage P-channel transistor to be formed in.

The views right of the views of the region 6P for the high withstand voltage P-channel transistor to be formed in illustrate the region 7 for the sector select transistor to be formed in.

The views on the right sides of FIGS. 66B, 67B, 68B, 69B, 70B, 71B, 72B, 73B, 74B, 75B, 76B and 78 illustrate the region 8 for the first low voltage transistor to be formed in. The views on the left sides of the region 8 for the first low voltage transistor to be formed in illustrate the region 8N for the first low voltage N-channel transistor to be formed in. The views on the right sides of the region 8 for the low voltage transistor to be formed in illustrate the region 8P for the first low voltage P-channel transistor to be formed in.

First, the step of preparing the semiconductor substrate 20 to the step of growing the sacrifice oxide film 69 are the same as those of the method of manufacturing the nonvolatile semiconductor memory device according to the first embodiment described above with reference to FIGS. 10A to 12B, and their description will not be repeated.

Figure 66A:
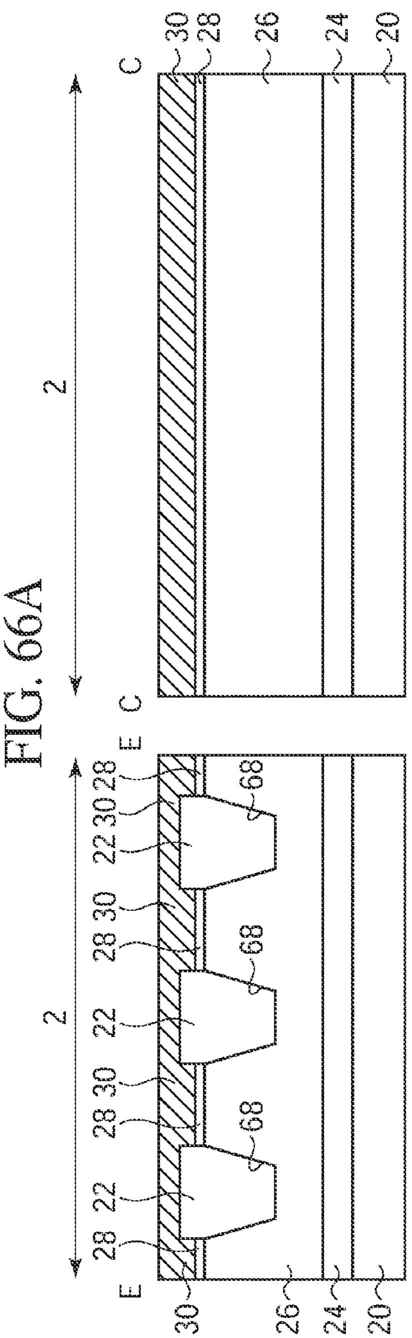
FIGS. 66A to 78 are sectional views of a nonvolatile semiconductor memory device according to the fourth embodiment in the steps of the method of manufacturing the nonvolatile semiconductor memory device, which illustrate the method.
Figure 66B:
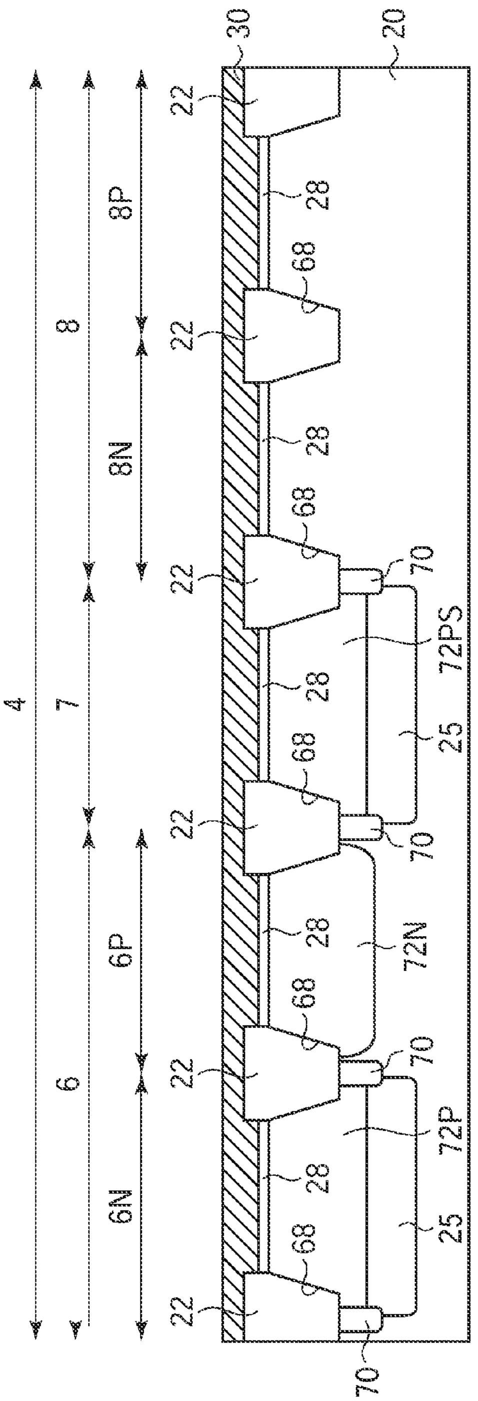

Next, as illustrated in FIGS. 66A and 66B, into the memory cell array region 2, an N-type dopant impurity is implanted deep to thereby form an N-type buried diffused layer 24. Also into the region 6N for the high withstand voltage N-channel transistor to be formed in, the N-type dopant impurity is implanted deep to thereby form an N-type buried diffused layer 25. Into the region 7 for the sector select transistor to be formed in, the N-type dopant impurity is implanted deep to thereby form an N-type buried diffused layer 25. Into the memory cell array region 2, a P-type dopant impurity is implanted shallower than the buried diffused layer 24 to thereby form the P-type well 26. Into the region 6N for the high withstand voltage N-channel transistor to be formed in, the P-type dopant impurity is implanted shallower than the buried diffused layer 25 to thereby form the P-type well 72P. Into the region 7 for the sector select transistor to be formed in, the P-type dopant impurity is implanted shallower than the buried diffused layer 25 to thereby form the P-type well 72PS.

Next, into the region 6N for the high withstand voltage N-channel transistor to be formed in, the N-type diffused layer 70 is formed in a frame shape. The frame-shaped diffused layer 70 is formed from the surface of the semiconductor substrate 20 to the peripheral edge of the buried diffused layer 25. The P-type well 72P is enclosed by the buried diffused layer 25 and the diffused layer 70.

Also into the region 7 for the sector select transistor to be formed in, the N-type diffused layer 70 is formed in a frame shape. The frame-shaped diffused layer 70 is formed from the surface of the semiconductor substrate 20 to the peripheral edge of the buried diffused layer 25.

Although not illustrated, the P-type well 26 of the memory cell array region 2 is also enclosed by the buried diffused layer 24 and the frame-shaped diffused layer 70.

Next, into the region 6P for the high withstand voltage P-channel transistor to be formed in, an N-type dopant impurity is implanted to thereby form the N-type well 72N.

Next, in the memory cell array region 2, channel doping is made (not illustrated).

Next, In the region 6N for the high withstand voltage N-channel transistor to be formed in and the region 6P for the high withstand voltage P-channel transistor to be formed in, channel doping is made (not illustrated).

Next, in the region 7 for the sector select transistor to be formed in, channel doping is made (not illustrated).

Next, the sacrifice oxide film 69 exsisting on the surface of the semiconductor substrate 20 (see FIGS. 13A and 13B) is etched off.

Next, on the entire surface, the 10 nm-film thickness tunnel insulation film 28 is formed by thermal oxidation.

Next, on the entire surface, the 90 nm-film thickness polysilicon film 30 is formed by, e.g., CVD. As the polysilicon film 30, impurity-doped polysilicon film is formed.

Figure 67A:
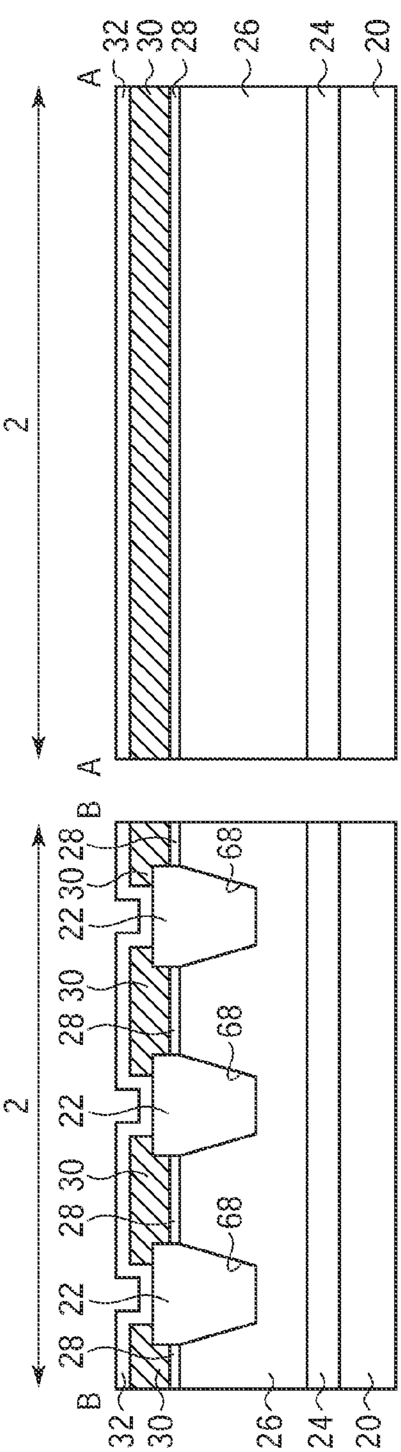
Figure 67B:
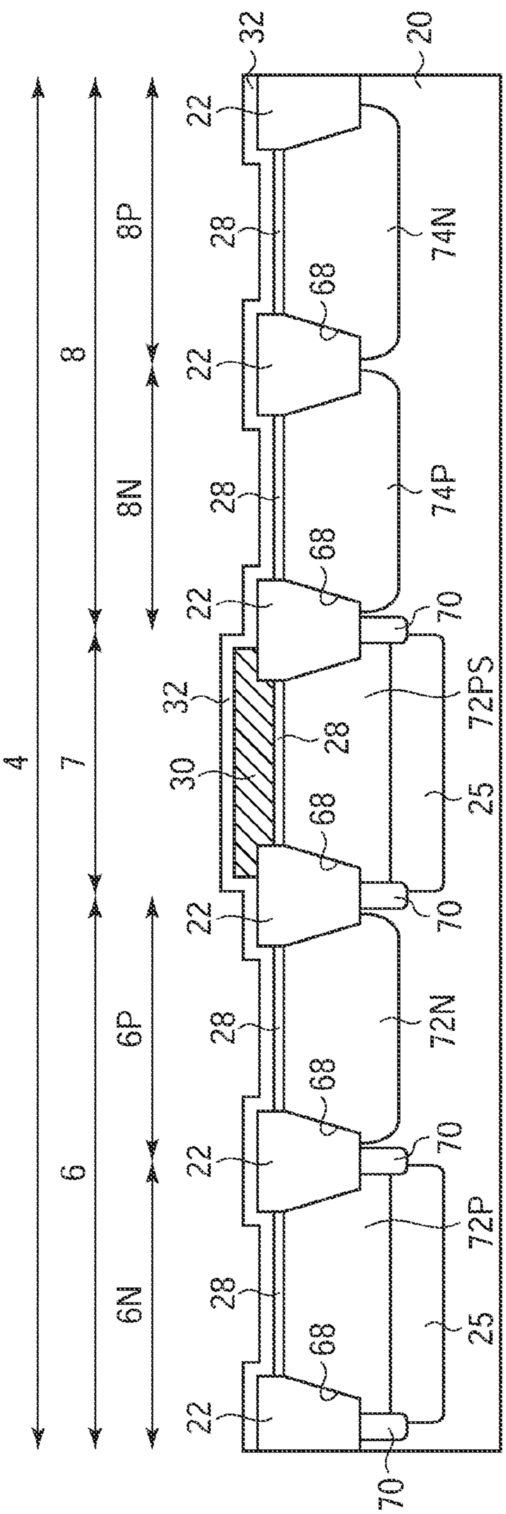

Next, as illustrated in FIGS. 67A and 67B, the polysilicon film 30 in the memory cell array region 2 is patterned, and the polysilicon film 30 in the peripheral circuit region 4 is etched off.

Next, on the entire surface, the insulation film (ONO film) 32 of a silicon oxide film, a silicon nitride film and a silicon oxide film sequentially stacked is formed. The insulation film 32 is for insulating the floating gates 30*a* and the control gates 34*a* from each other.

Then, into the region 8N for the first low voltage N-channel transistor to be formed in, a P-type dopant impurity is implanted to thereby form the P-type well 74P.

Next, into the region 8P for the first low voltage P-channel transistor to be formed in, an N-type dopant impurity is implanted to thereby form the N-type well 74N.

Figures 68A, 68B:
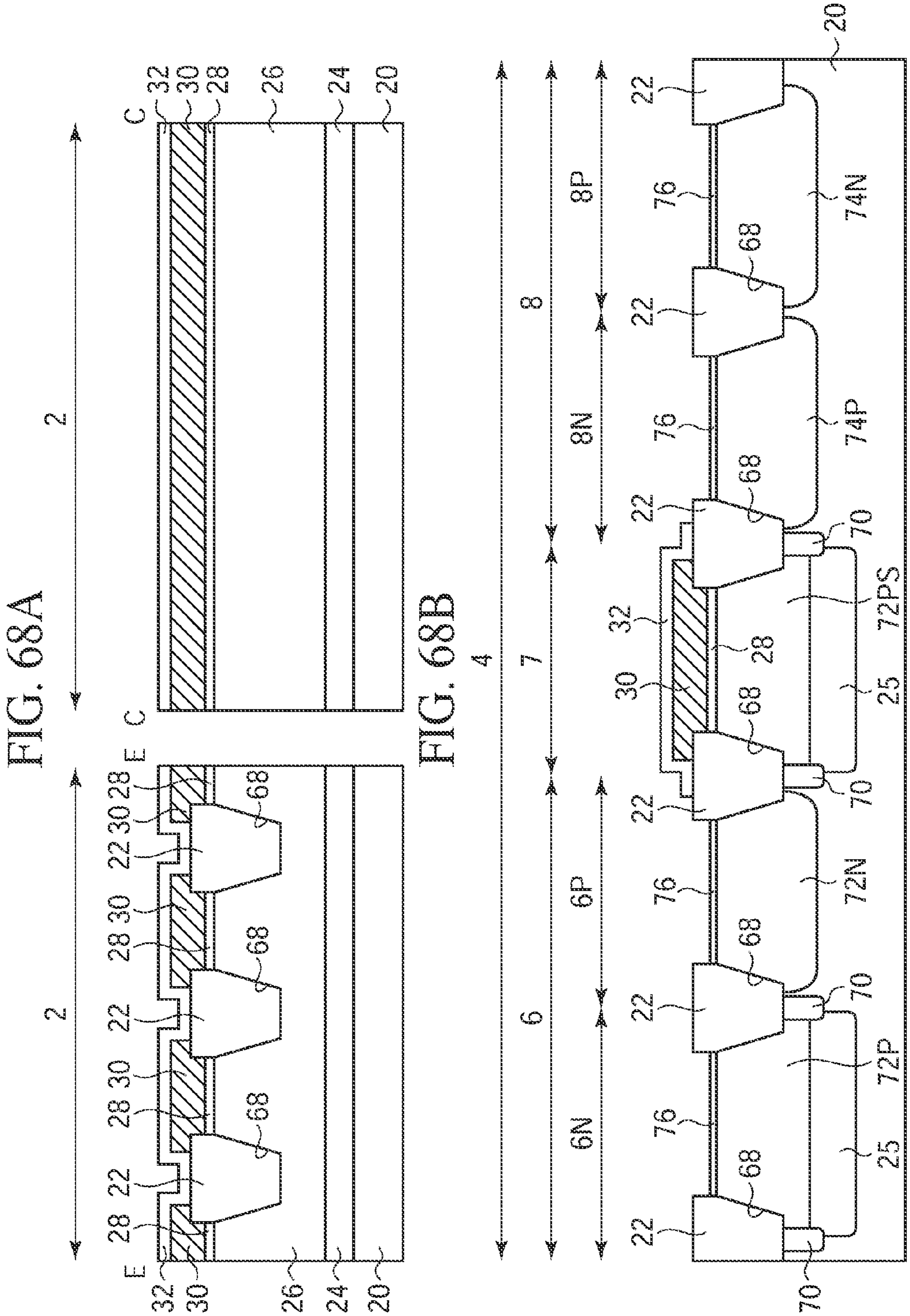

Next, as illustrated in FIGS. 68A and 68B, the insulation film (ONO film) 32 exsisting in the region 6 for the high withstand voltage transistor to be formed in and the region 8 for the first low voltage transistor to be formed in is etched off. In the memory cell array region 2 and the region 7 for the sector select transistor to be formed in, the insulation film 32 remains.

Then, in the region 8N for the first low voltage N-channel transistor to be formed in, and in the region 8P for the first low voltage P-channel transistor to be formed in, channel doping is made (not illustrated).

Next, on the entire surface, the gate insulation film 76 of, e.g., a 15 nm-film thickness is formed by thermal oxidation (see FIGS. 68A and 68B).

Next, by wet etching, the gate insulation film 76 in the region 8 for the first low voltage transistor to be formed in is removed.

Figure 69A:
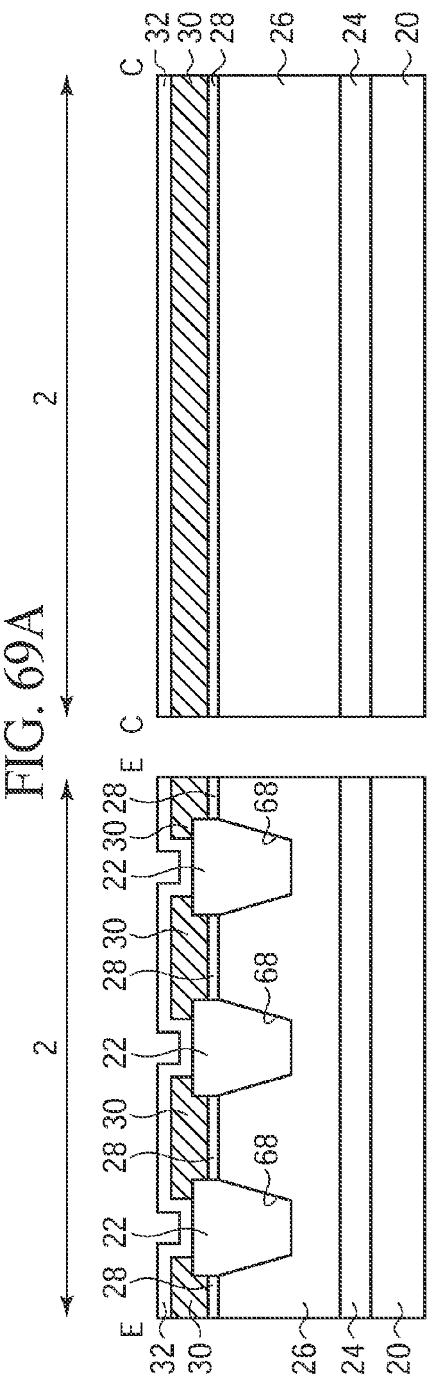
Figure 69B:
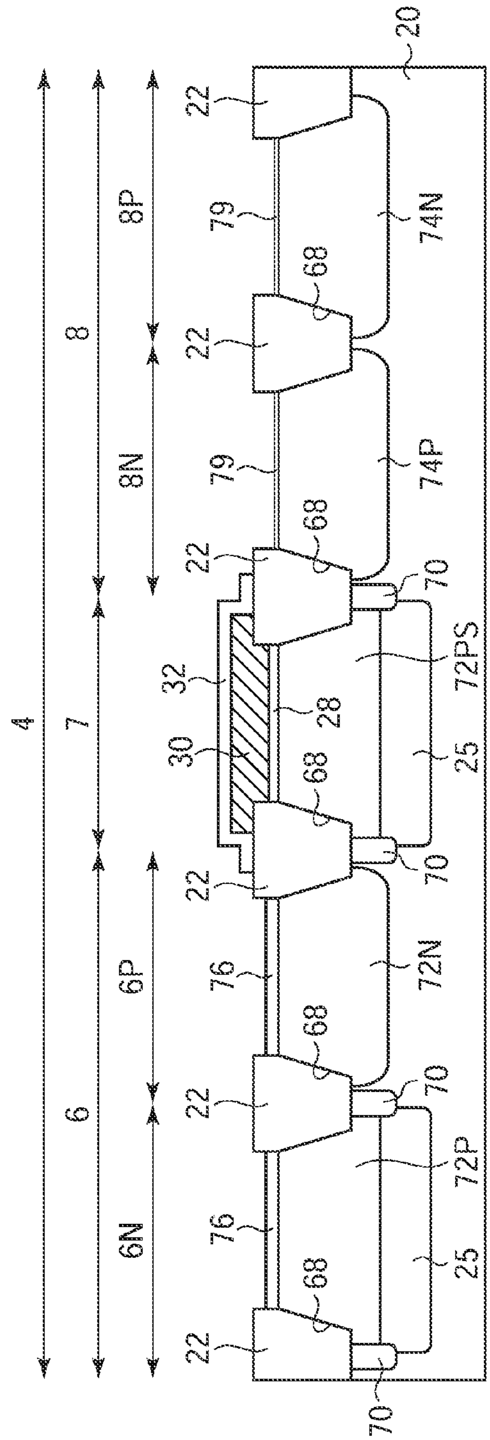

Next, on the entire surface, the gate insulation film 79 of, e.g., a 3 nm-film thickness is formed by thermal oxidation (see FIGS. 69A and 69B). Thus, in the region 8 for the first low voltage transistor to be formed in, the gate insulation film 79 of, e.g., a 3 nm-film thickness is formed. In the region 6 for the high voltage transistor to be formed in, the film thickness of the gate insulation film 76 is, e.g., about 16 nm.

Then, on the entire surface, a polysilicon film 34 of, e.g., a 180 nm-film thickness is formed by, e.g., CVD.

Figure 70A:
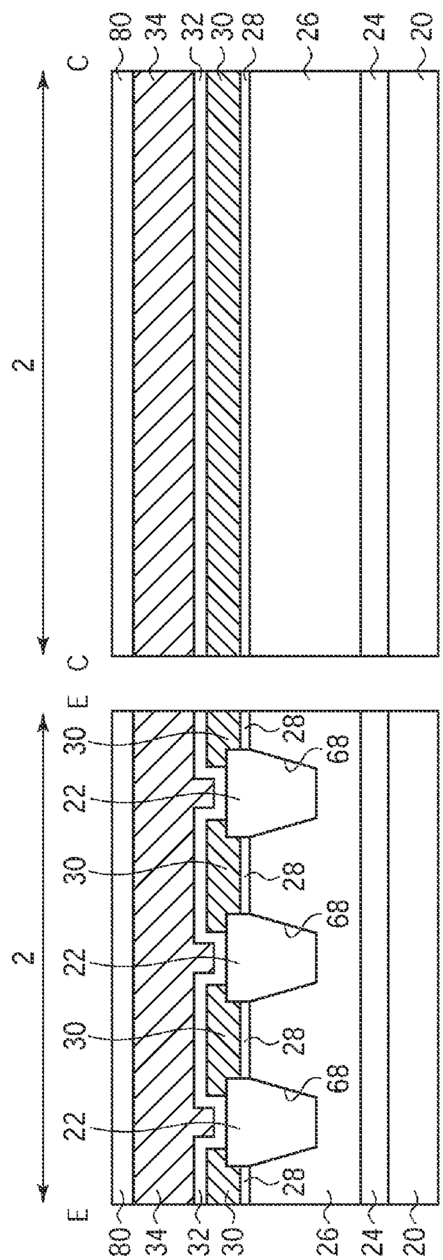
Figure 70B:
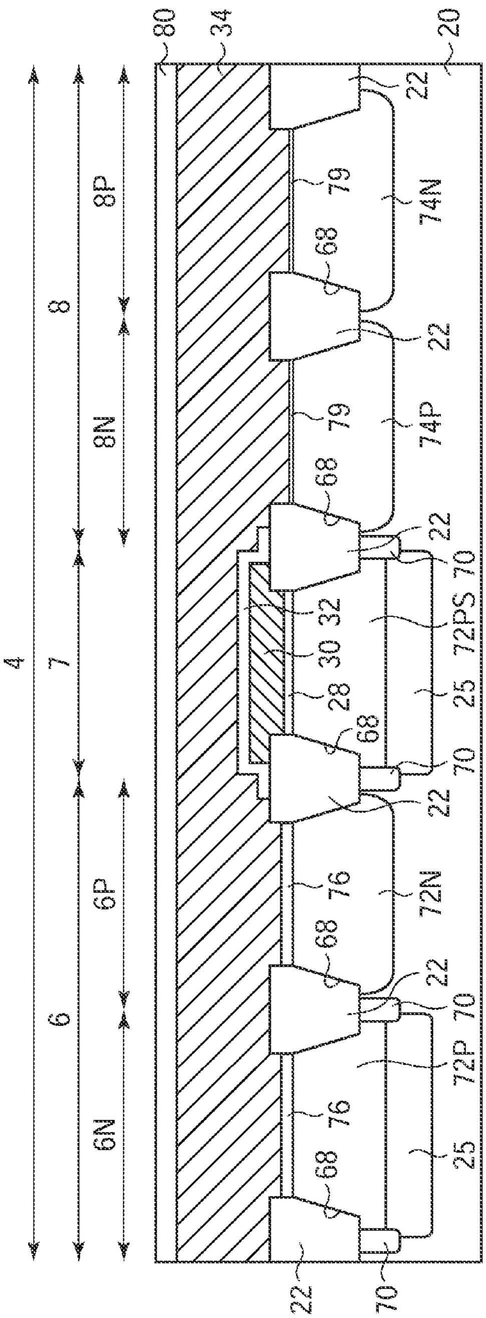

Then, on the entire surface the antireflection film 80 is formed (see FIGS. 70A and 70B).

Figure 71A:
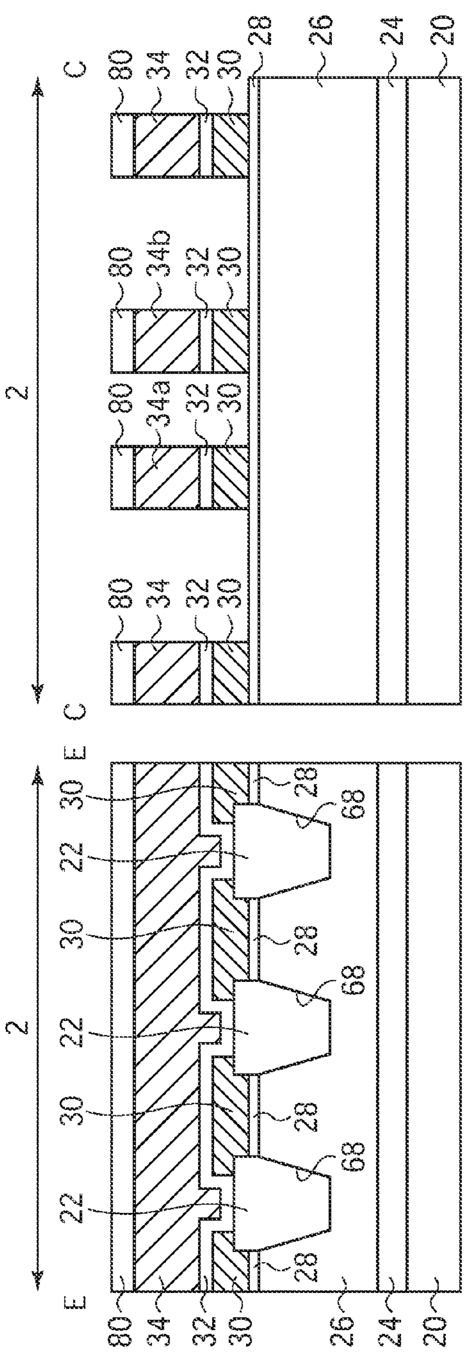
Figure 71B:
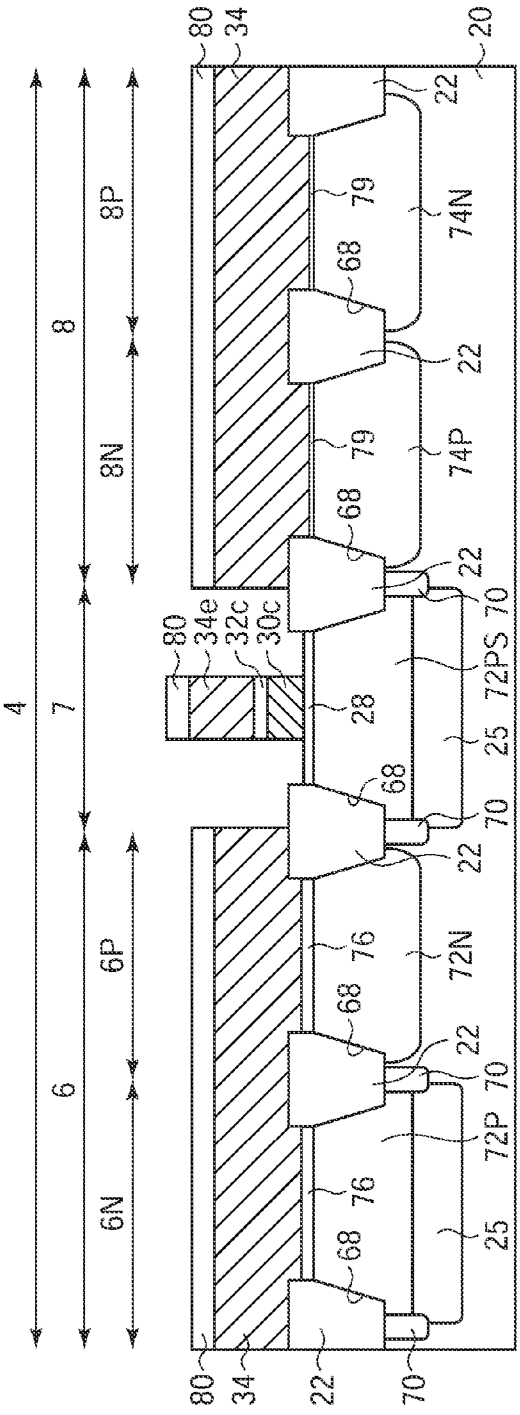
Figure 72A:
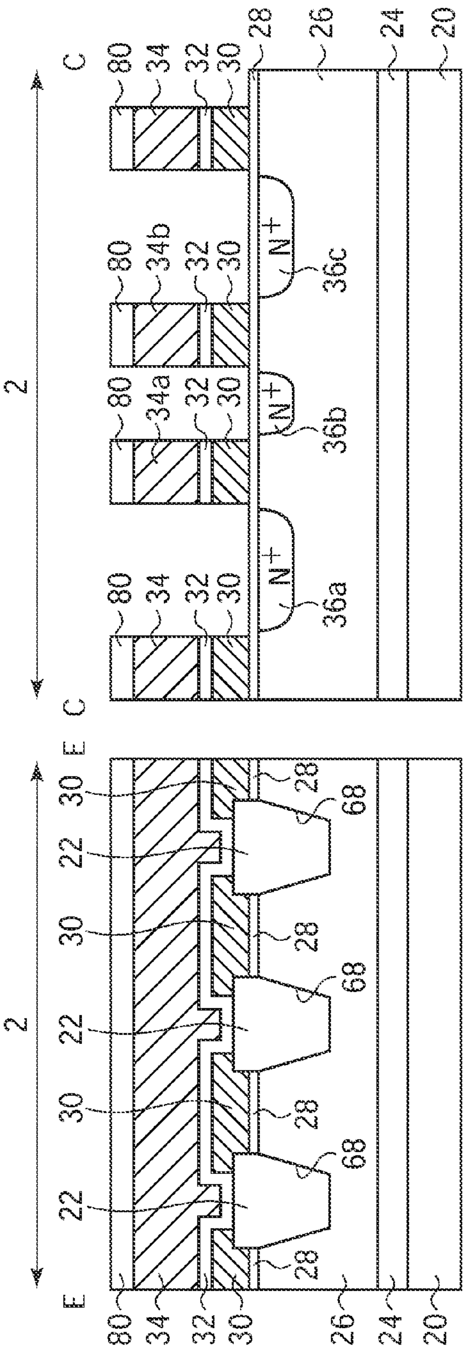
Figure 72B:
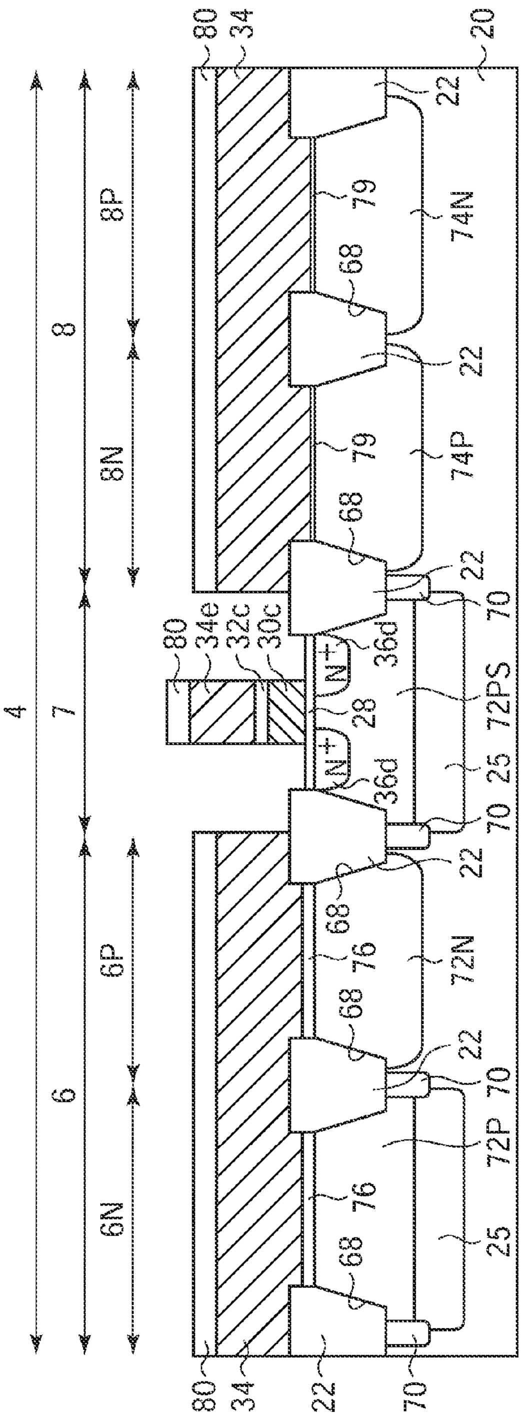

Then, as illustrated in FIGS. 71A and 71B, by photolithography, the antireflection film 80, the polysilicon film 34, the insulation film 32 and the polysilicon film 30 are dry etched. Thus, the layered structure including the floating gate 30*a* of polysilicon and the control gate 34*a* of polysilicon is formed in the memory cell array region 2. The layered structure including the select gate 30*b* of polysilicon and the polysilicon film 34*b* is formed in the memory cell array region 2. The layered structure including the gate electrode 30*c* of polysilicon and the polysilicon film 34*e* is formed in the region 7 for the sector select transistor to be formed in.

Next, in the region where the interconnection (the first metal interconnection) and the sector select gate 30*b* are to be connected, the polysilicon film 34*b* is etched off (not illustrated).

Next, by thermal oxidation, the silicon oxide film (not illustrated) is formed on the side wall of the floating gate 30*a*, the side wall of the control gate 34*a*, the side wall of the select gate 30*b* and the side wall of the polysilicon film 34*b*.

Next, on the entire surface, a photoresist film (not illustrated) is formed by spin coating.

Next, by photolithography, an opening (not illustrated) exposing the memory cell array region 2 and an opening (not illustrated) exposing the region 7 for the sector select transistor to be formed in are formed in the photoresist film.

Next, with the photoresist film as the mask, an N-type dopant impurity is implanted into the semiconductor substrate 20. Thus, the impurity diffused layers 36*a*-36*c* are formed in the semiconductor substrate 20 on both sides of the floating gate 30*a* and in the semiconductor substrate 20 on both sides of the select gate 30*b*. In the semiconductor substrate 20 on both sides of the gate electrode 30*c* of the sector select transistor SST, the impurity diffused regions 36*d* are formed. Then, the photoresist film is released.

Thus, as illustrated in FIG. 72, a memory cell transistor MT including the floating gate 30*a*, the control gate 34*a* and the source/drain diffused layers 36*a*, 36*b* is formed. A select transistor ST including the select gate 30*b* and the source/drain diffused layers 36*b*, 36*c* is formed. The sector select transistor SST including the gate electrode 30*c* and the source/drain diffused layer 36*d* is formed.

Figure 73A:
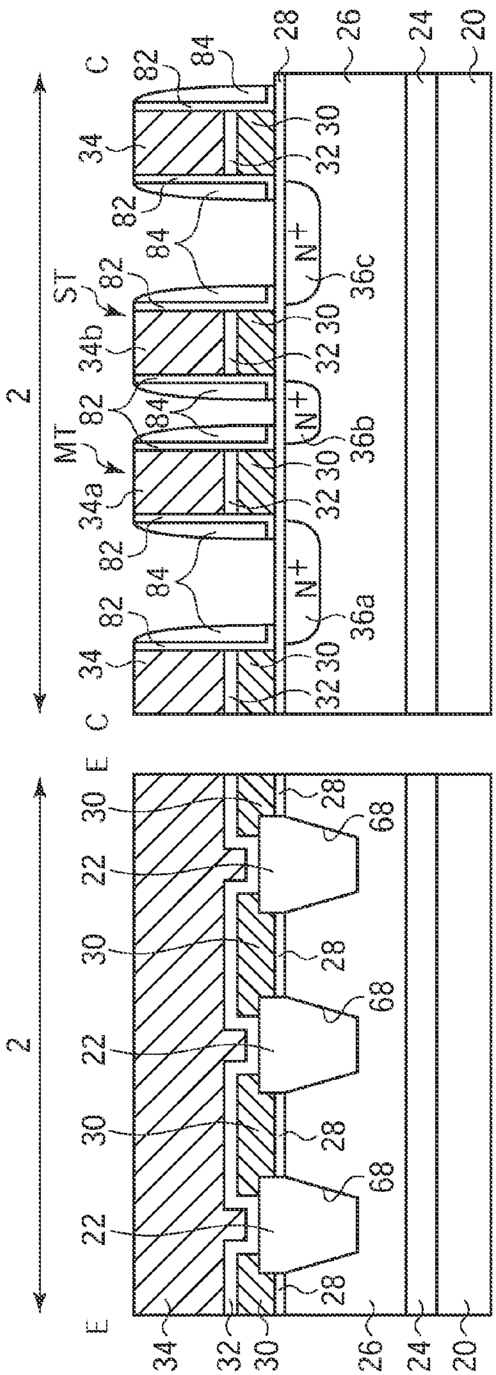
Figure 73B:
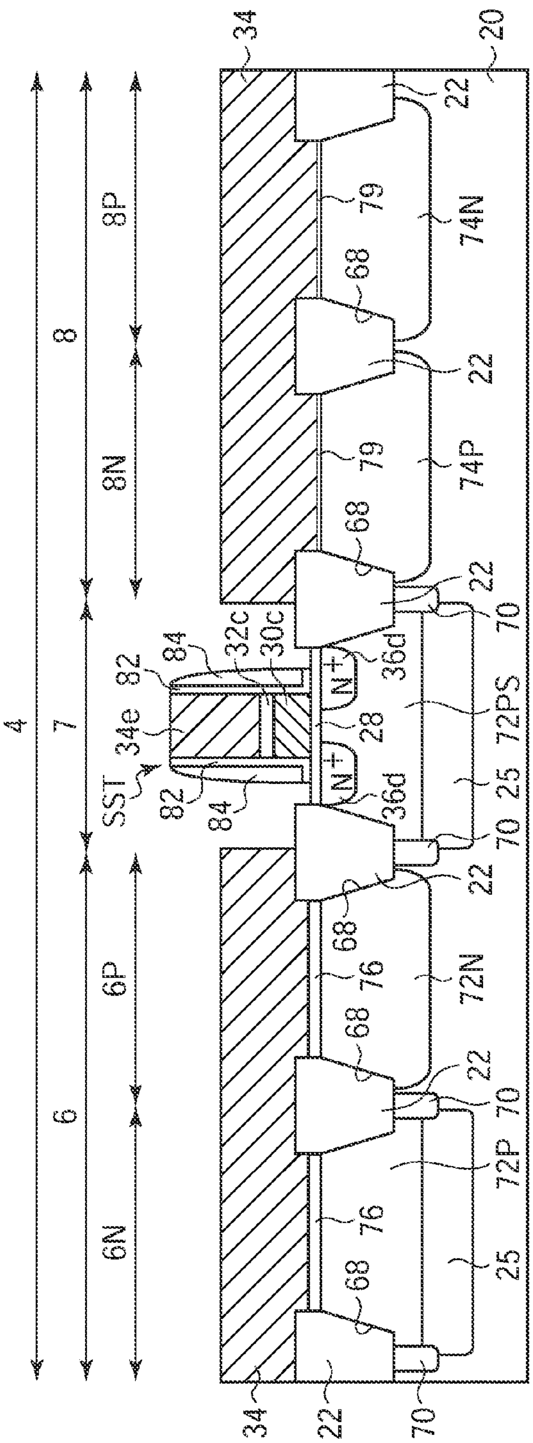

Next, as illustrated in FIGS. 73A and 73B, by thermal oxidation, the silicon oxide film 82 is formed on the side wall of the floating gate 30*a*, the side wall of the control gate 34*a*, the side wall of the select gate 30*b* and the side wall of the polysilicon film 34*b*.

Next, by, e.g., CVD, the 50 nm-film thickness silicon nitride film 84 is formed.

Next, by dry etching, the silicon nitride film anisotropically etched to thereby form the sidewall insulation films 84 of silicon nitride film. At this time, the antireflection film 80 is etched off.

Figure 74A:
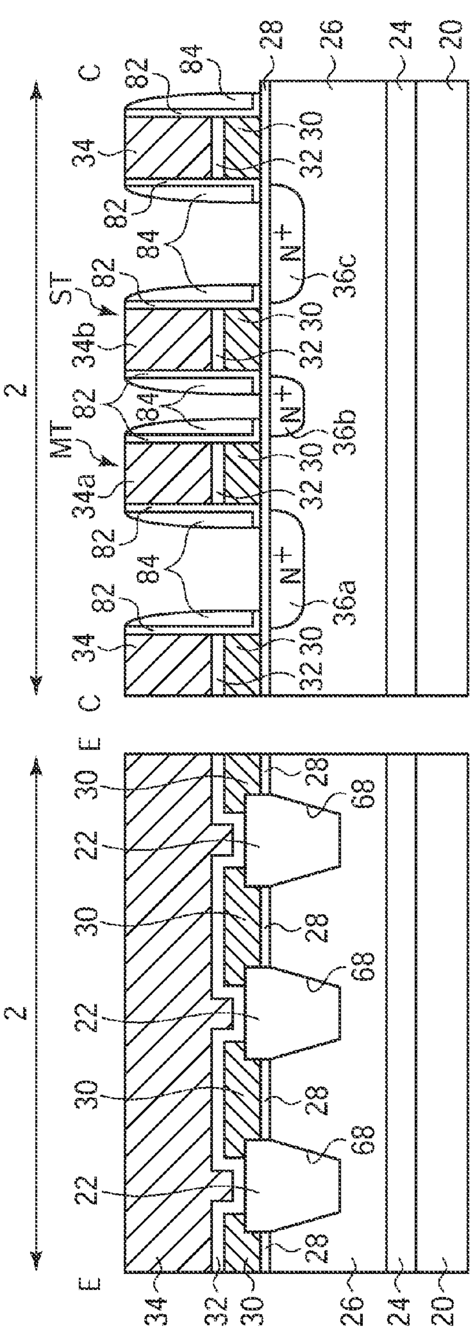
Figure 74B:
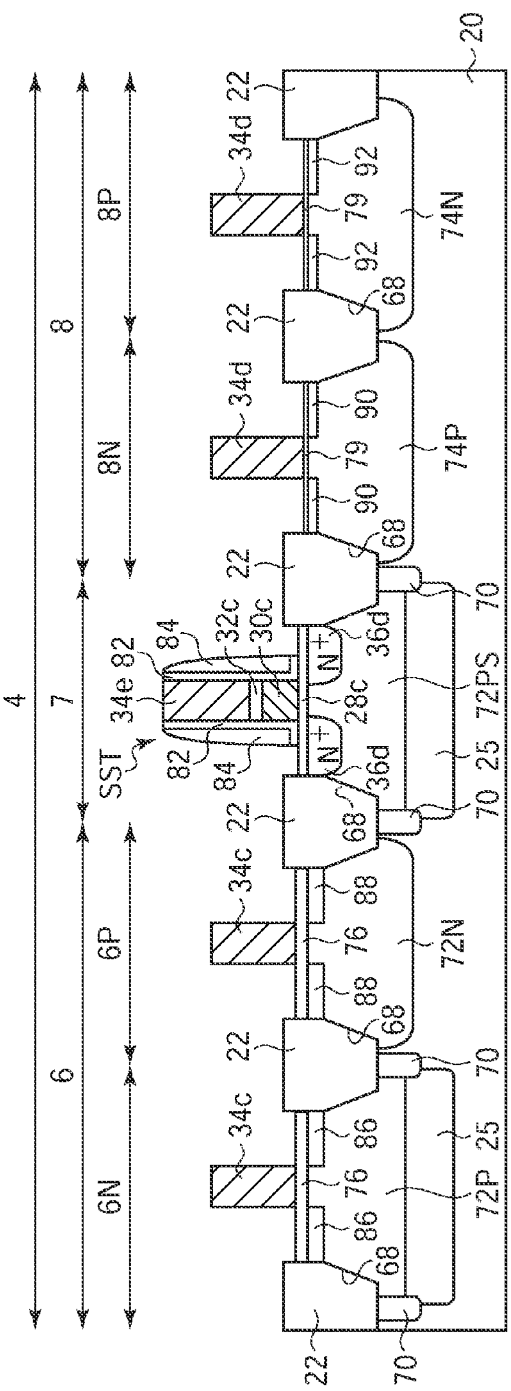

Next, as illustrated in FIGS. 74A and 74B, by photolithography, the polysilicon film 34 in the peripheral circuit region 4 is patterned. Thus, in the region 6 for the high withstand voltage transistor to be formed in, the gate electrodes 34*c* of the high voltage transistors 110N, 110P, formed of the polysilicon film 34 are formed. In the region 8 for the first low voltage transistor to be formed in, the gate electrodes 34*d* of the first low voltage transistors 111N, 111P, formed of the polysilicon 34 are formed.

Next, on the entire surface, a photoresist film (not illustrated) is formed by spin coating.

Next, by photolithography, an opening (not illustrated) exposing the region 6N for the high voltage N-channel transistor to be formed in is formed in the photoresist film.

Then, with the photoresist film as the mask, an N-type dopant impurity is implanted into the semiconductor substrate 20. Thus, in the semiconductor substrate 20 on both sides of the gate electrode 34*c* of the high withstand voltage N-channel transistor 110N, the N-type lightly doped diffused layers 86 are formed. Then, the photoresist film is released.

Next, on the entire surface, a photoresist film (not illustrated) is formed by spin coating.

Next, by photolithography, an opening (not illustrated) exposing the region 6P for the high withstand voltage P-channel transistor to be formed in is formed in the photoresist film.

Then, with the photoresist film as the mask, a P-type dopant impurity is implanted into the semiconductor substrate 20. Thus, in the semiconductor substrate 20 on both sides of the gate electrode 34*c* of the high withstand voltage P-channel transistor 110P, the P-type lightly doped diffused layers 88 are formed. Then, the photoresist film is released.

Next, on the entire surface, a photoresist film (not illustrated) is formed by spin coating.

Next, by photolithography, an opening (not illustrated) exposing the region 8N for the first low voltage N-channel transistor to be formed in is formed in the photoresist film.

Next, with the photoresist film as the mask, an N-type dopant impurity is implanted into the semiconductor substrate 20. Thus, in the semiconductor substrate 20 on both sides of the gate electrode 34*d* of the first low voltage N-channel transistor 111N, the N-type lightly doped diffused layers 90 are formed. Then, the photoresist film is released.

Next, on the entire surface, a photoresist film (not illustrated) is formed by spin coating.

Then, by photolithography, an opening (not illustrated) exposing the region 8P for the first low voltage P-channel transistor to be formed in is formed in the photoresist film.

Next, with the photoresist film as the mask, a P-type dopant impurity is implanted into the semiconductor substrate 20. Thus, in the semiconductor substrate 20 on both sides of the gate electrode 34*d* of the first low voltage P-channel transistor 111P, the P-type lightly doped diffused layers 92 are formed. Then, the photoresist film is released.

Next, the 100 nm-film thickness silicon oxide film 93 is formed by, e.g., CVD.

Figure 75A:
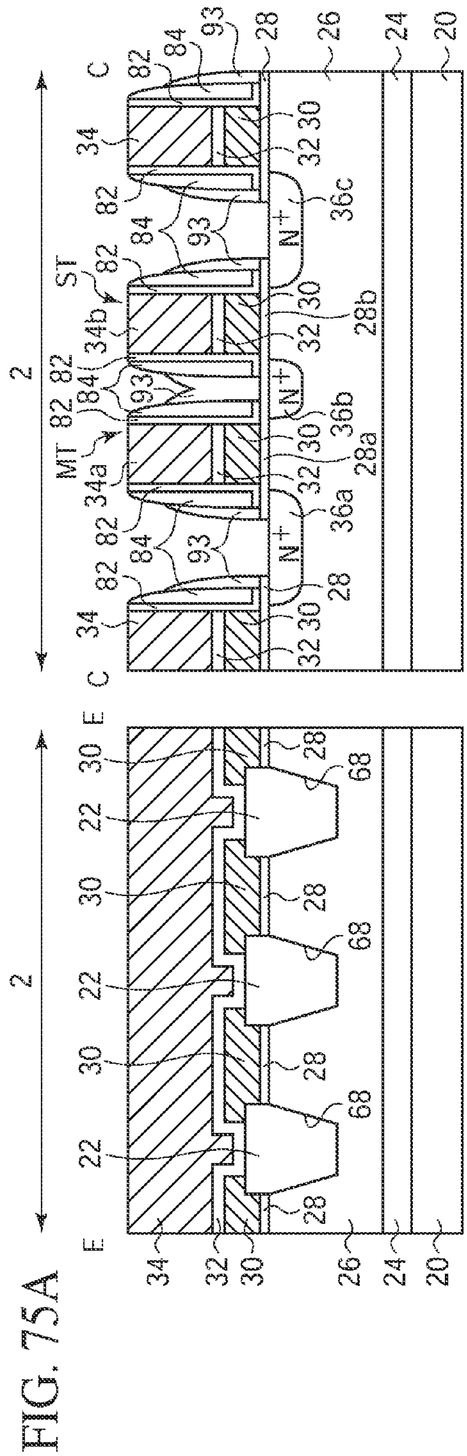
Figure 75B:
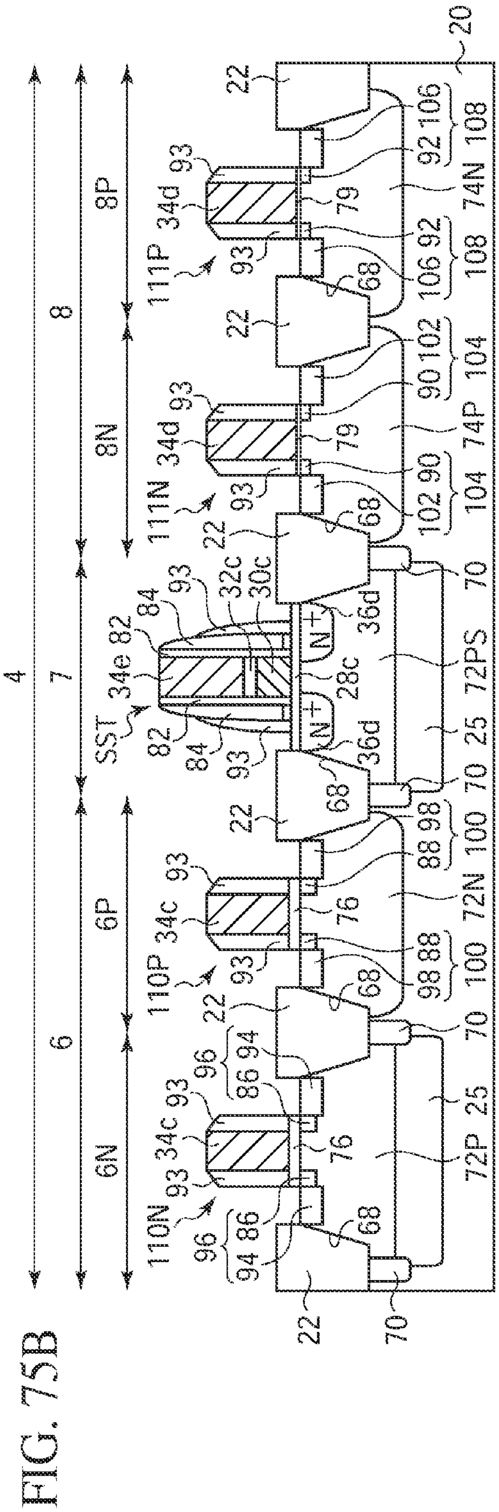
Figures 76A, 76B:
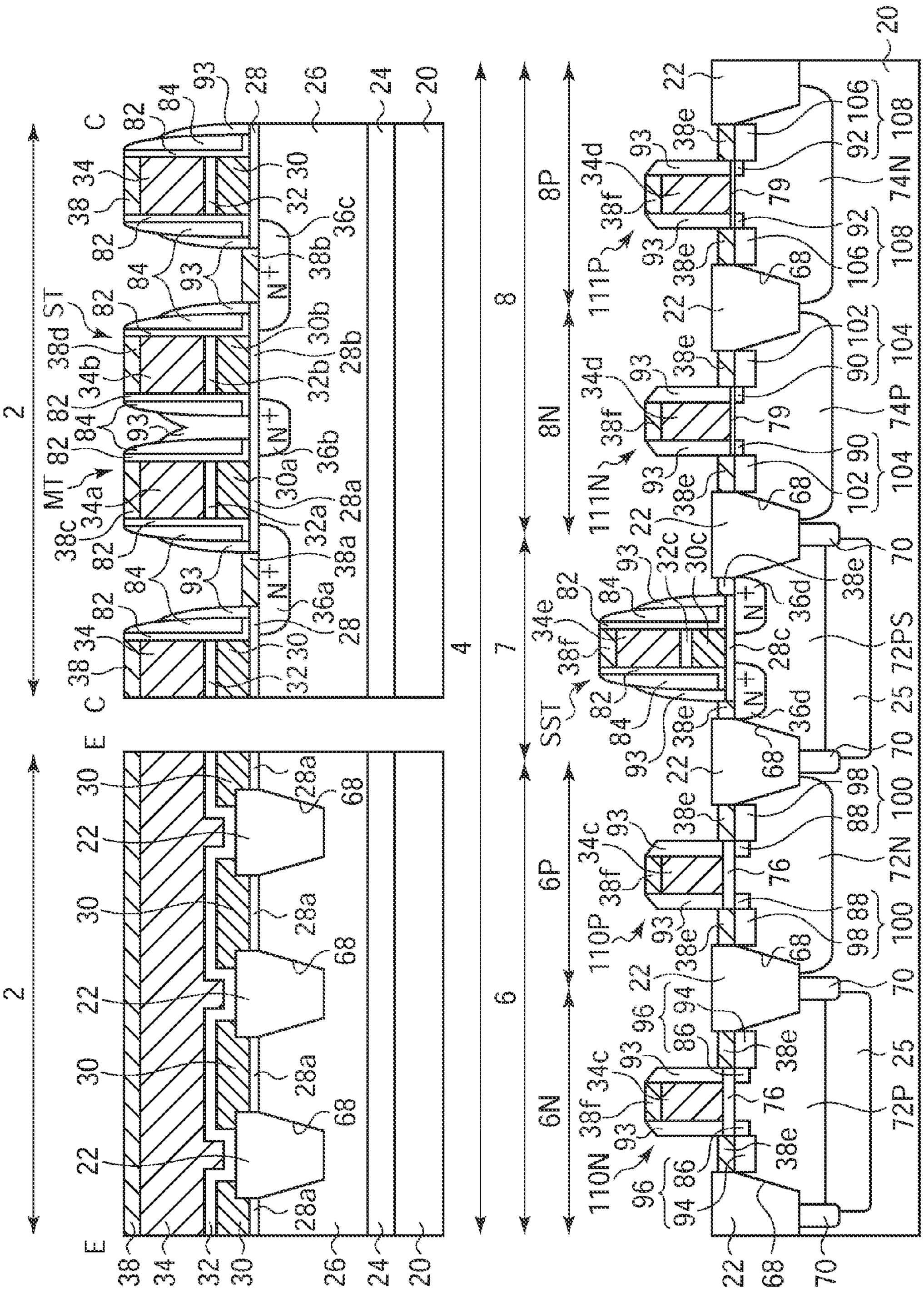
Figure 77:
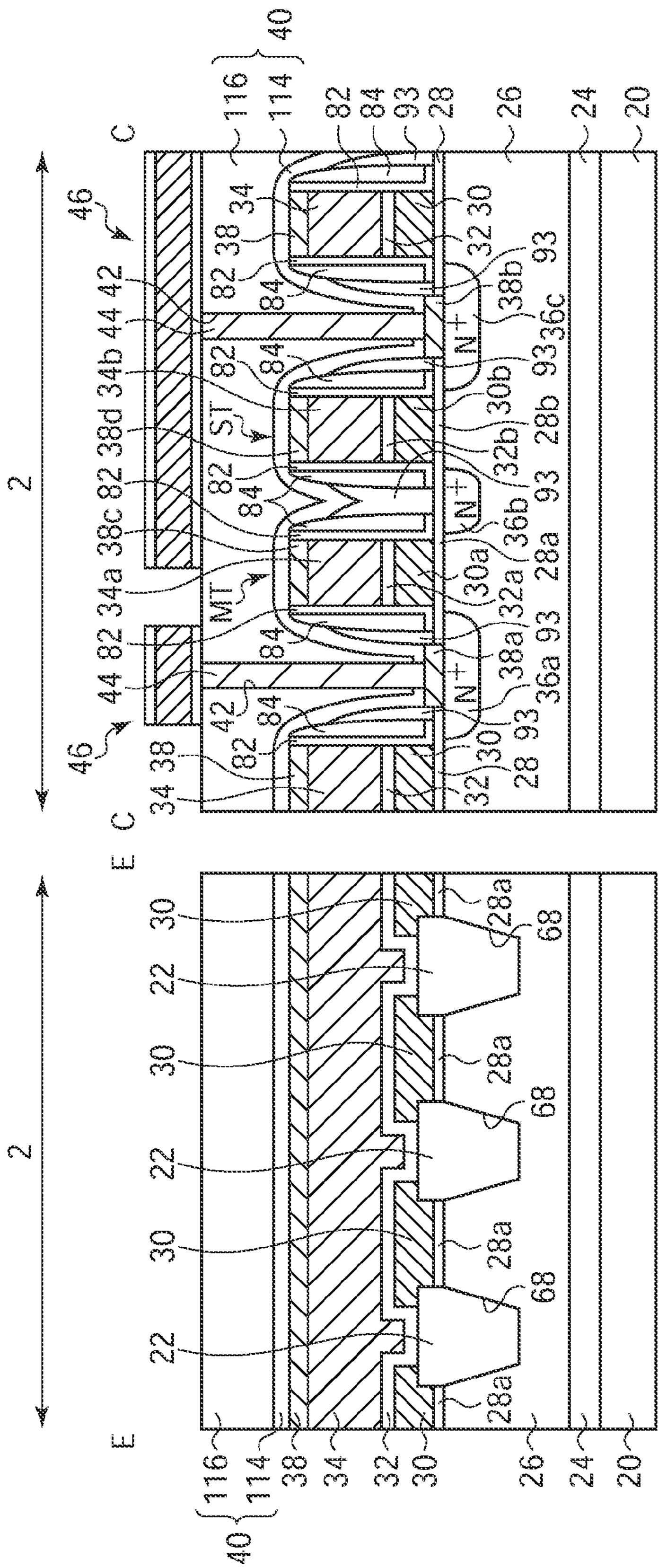
Figure 78:
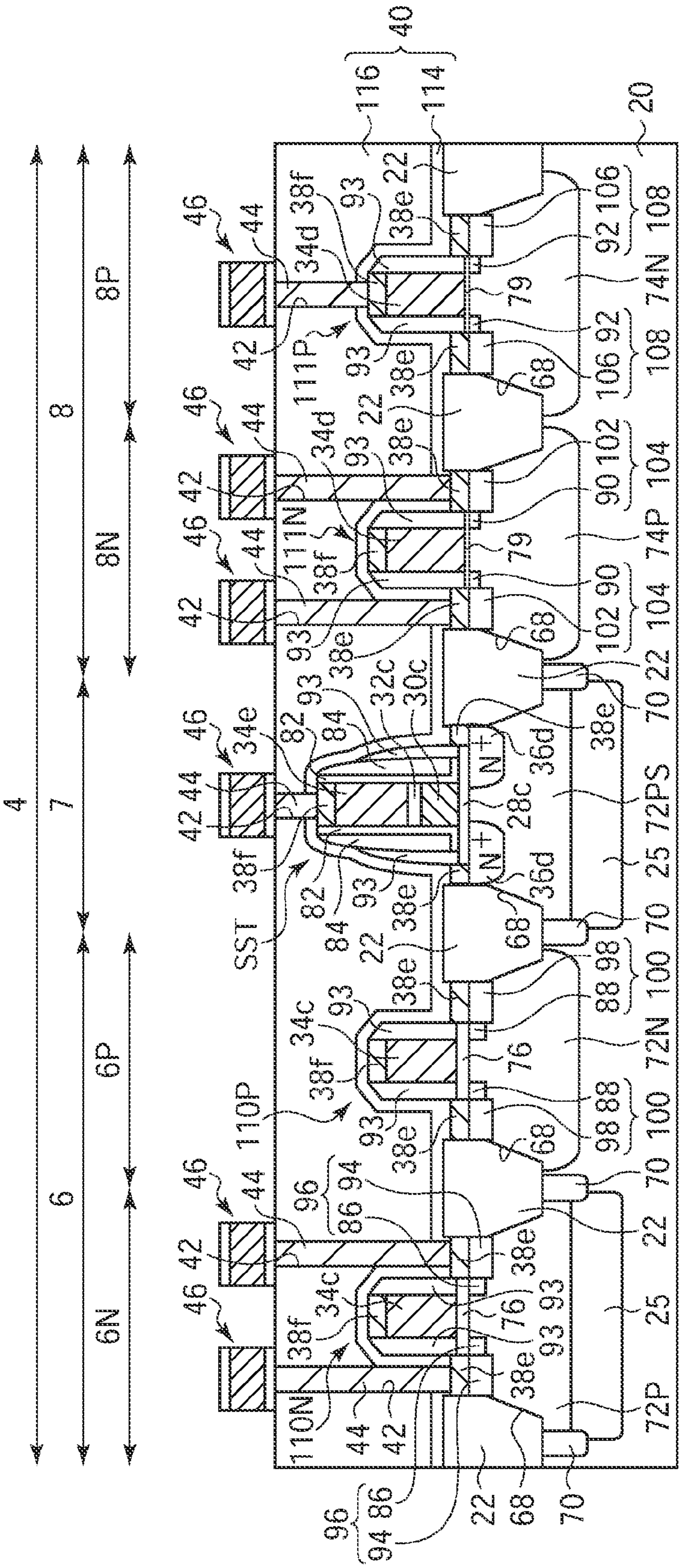

Next, by dry etching, the silicon oxide film 93 is anisotropically etched. Thus, as illustrated in FIGS. 75A and 75B, on the side wall of the layered structure including the floating gate 30*a* and the control gate 34*a*, the sidewall insulation film 93 of silicon oxide film is formed. On the side wall of the layered structure including the select gate 30*b* and the polysilicon film 34*b*, the sidewall insulation film 93 of silicon oxide film is formed. On the side wall of the layered structure including the gate electrode 30*c* and the polysilicon film 34*e*, the sidewall insulation film 93 of silicon oxide film is formed. On the side walls of the gate electrodes 34*c*, 34*d*, the sidewall insulation film 93 of silicon oxide film is formed.

Next, on the entire surface, a photoresist film (not illustrated) is formed by spin coating.

Next, by photolithography, an opening (not illustrated) exposing the region 6N for the high withstand voltage N-channel transistor to be formed in is formed in the photoresist film.

Next, with the photoresist film as the mask, an N-type dopant impurity is implanted into the semiconductor substrate 20. Thus, in the semiconductor substrate 20 on both sides of the gate electrode 34*c* of the high withstand voltage N-channel transistor, the N-type heavily doped diffused layers 94 are formed. The N-type lightly doped diffused layers 86 and the N-type heavily-doped diffused layers 94 form the N-type source/drain diffused layers 96 of the LDD structure are formed. Thus, the high withstand voltage N-channel transistor 110N including the gate electrode 34*c* and the source/drain diffused layers 96 is formed. The high withstand voltage N-channel transistor 110N is used in the high voltage circuits of the first row decoder 14, the third row decoder 18, the first voltage application circuit 15, etc.

Then, the photoresist film is released.

Next, on the entire surface, a photoresist film (not illustrated) is formed by spin coating.

Next, by photolithography, an opening (not illustrated) exposing the region 6P for the high withstand voltage P-channel transistor to be formed in is formed in the photoresist film.

Next, with the photoresist film as the mask, a P-type dopant impurity is implanted into the semiconductor substrate 20. Thus, in the semiconductor substrate 20 on both sides of the gate electrode 34*c* of the high withstand voltage P-channel transistor 110P, the P-type heavily doped diffused layer 98 is formed. The P-type lightly doped diffused layer 88 and the P-type heavily doped diffused layer 98 form the P-type source/drain diffused layer 100 of the LDD structure. Thus, the high withstand voltage P-channel transistor 110P including the gate electrode 34*c* and the source/drain diffused layers 100 is formed. The high withstand voltage P-channel transistor 110P is used in the high voltage circuits of the first row decoder 14, the third row decoder 18, the first voltage application circuit 15, etc. Then, the photoresist film is released.

Next, on the entire surface, a photoresist film (not illustrated) is formed by spin coating.

Next, by photolithography, an opening (not illustrated) exposing the region 8N for the first low voltage N-channel transistor to be formed in is formed in the photoresist film.

Next, with the photoresist film as the mask, an N-type dopant impurity is implanted into the semiconductor substrate 20. Thus, in the semiconductor substrate 20 on both sides of the gate electrode 34*d* of the first low voltage N-channel transistor 111N, the N-type heavily doped diffused layers 102 are formed. The N-type lightly doped diffused layers 90 and the N-type heavily doped diffused layer 102 form the N-type source/drain diffused layers 104 of the LDD structure.

Thus, the first low voltage N-channel transistor 111N including the gate electrode 34*d* and the source/drain diffused layers 104 is formed.

The first low voltage N-channel transistor 111N is used in the low voltage circuits of the column decoder 12, the second row decoder 16, the control circuit 23, the second voltage application circuit 17, the sense amplifier 13, etc.

Then, the photoresist film is released.

Next, on the entire surface, a photoresist film (not illustrated) is formed by spin coating.

Then, by photolithography, an opening (not illustrated) exposing the region 8P for the first low voltage P-channel transistor to be formed in is formed in a photoresist film.

Next, with the photoresist film as the mask, a P-type dopant impurity is implanted into the semiconductor substrate 20. Thus, in the semiconductor substrate 20 on both sides of the gate electrode 34*d* of the first low voltage P-channel transistor 111P, the P-type heavily doped diffused layers 106 are formed. The P-type lightly doped diffused layers 92 and the P-type heavily doped diffused layers 106 form the P-type source/drain diffused layers 108 of the LDD structure.

Thus, the first low voltage P-channel transistor 111P including the gate electrode 34*d* and the source/drain diffused layers 108 is formed. The first low voltage P-channel transistor 111P is used in the low voltage circuits of the column decoder 12, the second row decoder 16, the control circuit 23, the second voltage application circuit 17, the sense amplifier 13, etc.

Then, the photoresist film is released.

Next, by, e.g., sputtering, the 10 nm-film thickness cobalt film is formed on the entire surface.

Then, in the same way as in the method of manufacturing the nonvolatile semiconductor memory device according to the first embodiment described above with reference to FIGS. 21A and 21B, the cobalt silicide films 38*a*-38*f* are formed. Then, the unreacted cobalt film is etched off.

The cobalt silicide film 38*b* formed on the drain diffused layer 36*c* of the select transistor ST functions as the drain electrode. The cobalt silicide film 38*a* formed on the source diffused layer 36*a* of the memory cell transistor MT functions as the source electrode. The cobalt silicide films 38*e* formed on the source/drain diffused layers 36*d* of the sector select transistor SST function as the source/drain electrodes.

The cobalt silicide film 38*e* formed on the source/drain diffused layers 96, 100 of the high withstand voltage transistors 110N, 110P function as the source/drain electrodes. The cobalt silicide films 38*e* formed on the source/drain diffused layers 104, 108 of the first low voltage transistors 111N, 111P function as the source/drain electrodes (see FIGS. 76A and 76B).

Next, on the entire surface, the 100 nm-film thickness silicon nitride film 114 is formed by, e.g., CVD. The silicon nitride film 114 functions as the etching stopper.

Next, on the entire surface, the 1.6 μm-film thickness silicon oxide film 116 is formed by CVD. Thus, the inter-layer insulation film 40 formed of the silicon nitride film 114 and the silicon oxide film 116 is formed.

Next, the surface of the inter-layer insulation film 40 is planarized by CMP.

Next, by photolithography, the contact holes 42 arriving at the source/drain electrodes 38*a*, 38*c*, the contact holes 42 arriving at the cobalt silicide films 38*e* and the contact holes 42 arriving at the cobalt silicide films 38*f* are formed.

Next, on the entire surface, the barrier layer (not illustrated) of a Ti film and a TiN film is formed by sputtering.

Next, on the entire surface, the 300 nm-film thickness tungsten film 44 is formed by, e.g., CVD.

Next, the tungsten film 44 and the barrier film are polished by CMP until the surface of the inter-layer insulation film 40 is exposed. Thus, in the contact holes 42, the conductor plugs 44 of, e.g., tungsten are buried.

Next, by, e.g., sputtering, on the inter-layer insulation film 40 with the conductor plugs 44 buried in, the layered film 46 of a Ti film, a TiN film, an Al film, a Ti film and a TiN film are sequentially stacked is formed.

Next, by photolithography, the layered film 46 is patterned. Thus, the interconnections (the first metal interconnection layers) 46 of the layered film are formed (see FIGS. 77 and 78).

Then, in the same way as in the method of manufacturing the nonvolatile semiconductor memory device described above with reference to FIGS. 24 and 25, the multilayer interconnection structure is formed.

Thus, the nonvolatile semiconductor memory device according to the present embodiment is manufactured.

Modified Embodiments

The present invention is not limited to the above-described embodiments and can cover other various modifications.

For example, the first embodiment has been described by means of the example that the memory cell MC is formed of the memory cell transistors MT, but the memory cell MC may be formed of the memory cell transistor MT and the select transistor ST, as in the second embodiment.

The second to the fourth embodiments have been described by means of the example that the memory cell MC is formed of the memory cell transistor MT and the select transistor ST, but the memory cell MC may be formed of the memory cell transistor MT, as in the first embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

INDUSTRIAL APPLICABILITY

The nonvolatile semiconductor memory device according to the present embodiment and its writing method are useful to provide a nonvolatile semiconductor memory device of high operation speed.

What is claimed is:

1. A nonvolatile semiconductor memory device comprising:

- a substrate;
- a memory cell transistor located on a first well and comprising a control gate insulation film, a control gate located on the control gate insulation film, a first source and a first drain, the first well being formed in the substrate and being electrically isolated from the substrate;
- a memory cell comprising the memory cell transistor;
- a memory cell array comprising a plurality of the memory cells arranged in a matrix;
- a first bit line electrically connected to a plurality of the first drains located in a first column of the memory cell array;
- a word line electrically connected to a plurality of the control gate electrodes located in a first row of the memory cell array;
- a column decoder electrically connected to a second bit line and controlling electric potential of the second bit line;
- a first transistor located on a second well and comprising a first gate insulation film, a first gate electrode, a second source and a second drain, the second well being electrically isolated from the first well, the first transistor being located between the first bit line and second bit line, the second source being electrically connected to the first bit line, the second drain being electrically connected to the column decoder via the second bit line, the second well being formed in the substrate and being isolated from the substrate;
- a row decoder electrically connected to the word line and controlling electric potential of the word line, the row decoder comprising a second transistor, the second transistor comprising a second gate insulation film, a second gate electrode, a third source and a third drain, the first gate insulation film being thinner than the second gate insulation film;
- a first control unit controlling electric potential of the first gate electrode;
- a first voltage application unit for applying first voltage to the first well; and
- a second voltage application unit for applying second voltage to the second well.

2. The nonvolatile semiconductor memory device according to claim 1, further comprising

- a third transistor located between the first transistor and the column decoder, the third transistor comprising a fourth source, a fourth drain, a third gate electrode and a third gate insulation film,
- the fourth source electrically connected to the second drain,
- the fourth drain electrically connected to the column decoder.

3. The nonvolatile semiconductor memory device according to claim 2, wherein

- the third transistor is located on a third well electrically isolated from the first well and the second well, and which further comprises
- a third voltage application unit for applying third voltage to the third well; and
- a second control unit for controlling the electric potential of the third gate electrode.

4. The nonvolatile semiconductor memory device according to claim 3, wherein

- the third gate insulation film is thinner than the first gate insulation film.

5. The nonvolatile semiconductor memory device according to claim 1, wherein information written in the memory cell is erased with the first well set at first electric potential, the first gate set at second electric potential lower than the first electric potential and the second well set at third electric potential lower than the first electric potential.

6. The nonvolatile semiconductor memory device according to claim 3, wherein information written in the memory cell is erased with the first well set at first electric potential, the first gate electrode set at second electric potential lower than the first electric potential, the second well set at third electric potential lower than the first electric potential, the third gate electrode set at fourth electric potential lower than the third electric potential and the third well set at fifth electric potential lower than the third electric potential.

7. The nonvolatile semiconductor memory device according to claim 1, wherein the memory cell transistor includes a tunnel insulation film located on the first well and a floating gate located on the tunnel insulation film and the control gate insulation film located on the floating gate, the first gate insulation film and the tunnel insulation film being composed of a first insulation material, the first gate electrode and the floating gate being composed of a first conduction material, the first transistor further including a conduction layer formed over the first gate electrode with a first insulation film formed therebetween, the first insulation film and the control gate insulation film being composed of a second insulation material, and the conduction layer and the control gate being composed of a second conduction material.

8. The nonvolatile semiconductor memory device according to claim 1, wherein withstand voltage between the second source and the second drain is lower than voltage to be applied to the first well when information written in the memory cell is erased.

9. The nonvolatile semiconductor memory device according to claim 1, wherein the memory cell array is divided in a plurality of sectors, and the first transistor is a sector select transistor which select the sector.

10. An erasing method of a nonvolatile semiconductor memory device comprising a memory cell transistor located on a first well and comprising a control gate insulation film, a control gate located on the control gate insulation film, a first source and a first drain; a memory cell comprising a memory cell transistor; a memory cell array comprising a plurality of the memory cells arranged in a matrix; a first bit line electrically connected to a plurality of the first drains located in a first column of the memory cell array; a word line electrically connected to a plurality of the control gate electrodes located in a first row of the memory cell array; a column decoder electrically connected to a second bit line and controlling electric potential of the second bit line; a row decoder electrically connected to the word line and controlling electric potential of the word line; a first transistor located on a second well and comprising a first gate insulation film, a first gate electrode, a second source and a second drain; a second transistor comprising a second gate insulation film, a second gate electrode, a third source and a third drain; a first control unit controlling electric potential of the first gate electrode; a first voltage application unit for applying first voltage to the first well; and a second voltage application unit for applying second voltage to the second well, the first well being electrically isolated from the second well, the first transistor being located between the first bit line and second bit line, the second source being electrically connected to the first bit line, the second drain being electrically connected to the column decoder via the second bit line, the row decoder comprising the second transistor, the first gate insulation film being thinner than the second gate insulation film, information written in the memory cell is erased with the first well set at a first electric potential, the first gate electrode set at a second electric potential lower than the first electric potential or set at floating electrically, and the second well set at a third electric potential lower than the first electric potential.

11. The erasing method of the nonvolatile semiconductor memory device according to claim 10, further comprising a third transistor located between the first transistor and the column decoder, the third transistor comprising a fourth source, a fourth drain, a third gate electrode and a third gate insulation film, the fourth source electrically connected to the second drain, the fourth drain electrically connected to the column decoder, wherein the third transistor is located on a third well electrically isolated from the first well and the second well, when information written in the memory cell is erased, a gate electrode of the third transistor is set at a fourth electric potential lower than the third electric potential, and the third well is set at a fifth electric potential lower than the third electric potential.

12. The nonvolatile semiconductor memory device according to claim 1, wherein an electric potential of the first well which is applied the first voltage is different from an electric potential of the substrate; and an electric potential of the second well which is applied the second voltage is different from the electric potential of the substrate.

13. The nonvolatile semiconductor memory device according to claim 1, further comprising a third well formed in the substrate and located under the first well; and a fourth well formed in the substrate and located under the second well, and wherein the substrate, the first well and the second well has a first conductive type; and the third well and the fourth well has a second conductive type which is different from the first conductive type.

* * * * *